US011038120B2

(12) United States Patent
Yen et al.

(10) Patent No.: US 11,038,120 B2
(45) Date of Patent: Jun. 15, 2021

(54) ORGANIC COMPOUND AND ORGANIC ELECTROLUMINESCENCE DEVICE USING THE SAME

(71) Applicants: Feng-Wen Yen, Taipei (TW); Tsun-Yuan Huang, Nantou (TW)

(72) Inventors: Feng-Wen Yen, Taipei (TW); Tsun-Yuan Huang, Nantou (TW)

(73) Assignee: LUMINESCENCE TECHNOLOGY CORP., Hsin-Chu (TW)

( * ) Notice: Subject to any disclaimer, the term of this patent is extended or adjusted under 35 U.S.C. 154(b) by 225 days.

(21) Appl. No.: 16/251,037

(22) Filed: Jan. 17, 2019

(65) Prior Publication Data

US 2020/0235310 A1 Jul. 23, 2020

(51) Int. Cl.
*H01L 51/00* (2006.01)
*H01L 51/50* (2006.01)

(52) U.S. Cl.
CPC ...... *H01L 51/0072* (2013.01); *H01L 51/0059* (2013.01); *H01L 51/0067* (2013.01); *H01L 51/0073* (2013.01); *H01L 51/0074* (2013.01); *H01L 51/0094* (2013.01); *H01L 51/5016* (2013.01); *H01L 51/5096* (2013.01); *H01L 51/5072* (2013.01)

(58) Field of Classification Search
None
See application file for complete search history.

(56) References Cited

U.S. PATENT DOCUMENTS 9,911,922 B2 3/2018 Yen et al.
2015/0325800 A1* 11/2015 Ito .................... C07D 307/77 257/40
2017/0133600 A1* 5/2017 Pyo .................... H01L 51/0061
2017/0154931 A1* 6/2017 Yoo .................... H01L 51/5218
2020/0109138 A1* 4/2020 Yen .................... H01L 51/0073
2020/0136053 A1* 4/2020 Heo .................... H01L 51/5092

FOREIGN PATENT DOCUMENTS

KR 1020160107669 * 9/2016 ............ C09K 11/06
KR 1020180024306 * 8/2018 ........... C07D 307/00
WO WO-2017188679 A1 * 11/2017 ......... H01L 51/5092

* cited by examiner

*Primary Examiner* — Robert S Loewe

(57) ABSTRACT

The present invention discloses an organic compound represented by the following formula (1) and an organic electroluminescence device using the organic compound as the phosphorescent host material, the fluorescent host material, the fluorescent dopant material, the hole blocking material, or the electron transport material. The organic compound may lower a driving voltage and power consumption or increase a current efficiency or a half-life time of the organic electroluminescence device.

formula (1)

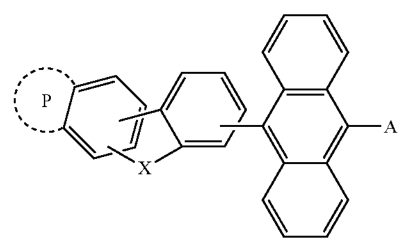

The same definition as described in the present invention.

14 Claims, 1 Drawing Sheet

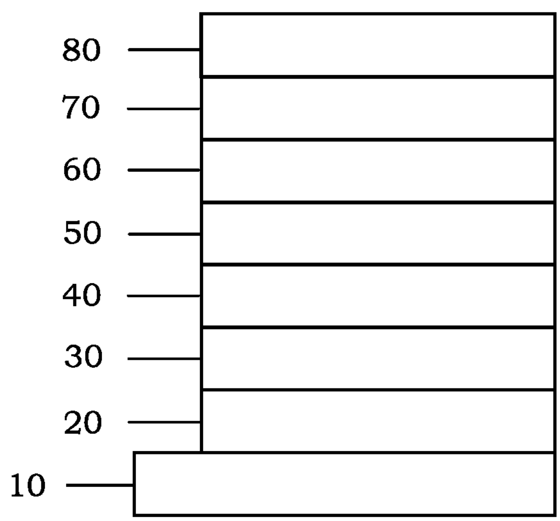
80
70
60
50
40
30
20
10

ORGANIC COMPOUND AND ORGANIC ELECTROLUMINESCENCE DEVICE USING THE SAME

FIELD OF INVENTION

The present invention relates to a novel organic compound and, more particularly, to an organic electroluminescence device using the organic compound.

BACKGROUND OF THE INVENTION

An organic electroluminescence (organic EL) device is an organic light-emitting diode (OLED) in which the light emitting layer is a film made from organic compounds, which emits light in response to the electric current. The light emitting layer containing the organic compound is sandwiched between two electrodes. The organic EL device is applied to flat panel displays due to its high illumination, low weight, ultra-thin profile, self-illumination without back light, low power consumption, wide viewing angle, high contrast, simple fabrication methods and rapid response time.

Typically, the organic EL device is composed of organic material layers sandwiched between two electrodes. The organic material layers include, e.g., hole injection layer (HIL), hole transporting layer (HTL), emitting layer (EML), electron transporting layer (ETL), and electron injection layer (EIL). The basic mechanism of organic EL involves the injection, transport, and recombination of carriers as well as exciton formation for emitting light. When an external voltage is applied across the organic EL device, electrons and holes are injected from the cathode and the anode, respectively. Electrons will be injected from the cathode into a LUMO (lowest unoccupied molecular orbital) and holes will be injected from the anode into a HOMO (highest occupied molecular orbital). Subsequently, the electrons recombine with holes in the light emitting layer to form excitons, which then deactivate to emit light. When luminescent molecules absorb energy to achieve an excited state, the exciton may either be in a singlet state or a triplet state, depending on how the spins of the electrons and holes have been combined. It is well known that the excitons formed under electrical excitation typically include 25% singlet excitons and 75% triplet excitons. In the fluorescence materials, however, the electrically generated energy in the 75% triplet excitons will be dissipated as heat for decay from the triplet state is spin forbidden. Therefore, a fluorescent electroluminescence device has only 25% internal quantum efficiency, which leads to the theoretically highest external quantum efficiency (EQE) of only 5% due to only ~20% of the light out-coupling efficiency of the device. In contrast to fluorescent electroluminescence devices, phosphorescent organic EL devices make use of spin-orbit interactions to facilitate intersystem crossing between singlet and triplet states, thus obtaining emission from both singlet and triplet states and the internal quantum efficiency of electroluminescence devices from 25% to 100%.

However, there is still a need for improvement in the case of use of those organic materials in an organic EL device of some prior art displays, for example, in relation to the half-life time, current efficiency or driving voltage of the organic EL device.

SUMMARY OF THE INVENTION

Accordingly, an object of the invention is to provide an organic compound and an organic EL device using the same, which can exhibit improved luminance, current efficiency, or half-life time.

Another object of the invention is to provide an organic compound and an organic EL device using the same, which may lower a driving voltage or increasing a current efficiency or half-life time of the organic EL device.

Still another object of the present invention is to provide an organic compound, which can be used as a phosphorescent host material, a fluorescent host material, or a fluorescent dopant material in the emitting layer, and/or an electron transporting material (ETM), or an hole blocking material (HBM) in an organic EL device to improve the power consumption, luminance, current efficiency, or life time.

According to the present invention, an organic compound which may be used in organic EL devices is disclosed. The organic compound may be represented by the following formula (1):

formula (1)

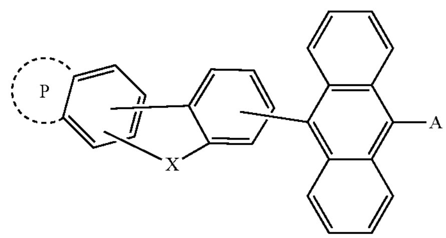

wherein A may represent one of the formula (2) to formula (6)

formula (2)

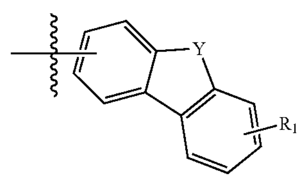

formula (3)

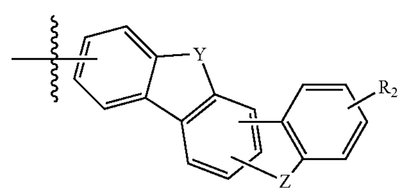

formula (4)

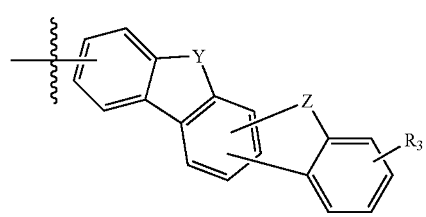

formula (5)

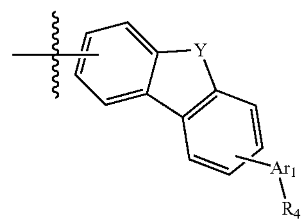

-continued formula (6)

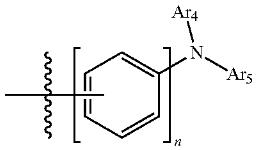

and wherein X may be a divalent bridge selected from the group consisting of 0, S, and $SiR_5R_6$. P may represent a substituted or unsubstituted fused ring hydrocarbons unit having two, three or four rings. $Ar_1$ may represent a substituted or unsubstituted fused ring hydrocarbon unit with one to two rings. The fused ring hydrocarbons unit may be, for example, a polycyclic aromatic hydrocarbons (PAHs) unit. The symbol m may represent an integer of 0 or 1. Y may be a divalent bridge selected from the group consisting of O, S, $SiR_7R_8$, $CR_9R_{10}$ and $NAr_2$. Z may be a divalent bridge selected from the group consisting of O, S, $CR_{11}R_{12}$, $SiRi_{13}R_{14}$ and $NAr_3$. $Ar_2$ and $Ar_3$ may independently represent a substituted or unsubstituted aryl group having 6 to 30 carbon atoms. $Ar_4$ and $Ar_5$ may independently represent a substituted or unsubstituted aryl group having 6 to 30 carbon atoms, or a substituted or unsubstituted heteroaryl group having 6 to 30 carbon atoms. $R_1$ to $R_{14}$ may be independently selected from the group consisting of a hydrogen atom, a halide, a substituted or unsubstituted alkyl group having 1 to 30 (e.g., 1, 3 or 6) carbon atoms, a substituted or unsubstituted aryl group having 6 to 30 carbon atoms, and a substituted or unsubstituted aralkyl group having 7 to 30 (e.g., 8 or 9) carbon atoms. The heteroaryl group may comprise, for example, a heteroaromatic PAHs unit having two, three, four, five or six rings. The heteroaromatic PAHs may contain an oxygen atom, a sulfur atom or one, two or three N atoms.

The substituted aryl group may be an aryl group substituted by an alkoxy group, or by a methyl or ethyl substituted heteroaromatic PAHs unit having two rings. The two-rings heteroaromatic PAHs may contain one or two N atoms.

P may represent a polycyclic aromatic hydrocarbons (PAHs) unit having two, three or four rings. P may comprise, for example, a naphthyl group, a phenanthrenyl group, a tetraphenyl group or a pyrenyl group. Each of the groups may be substituted by, for example, a methyl group, an ethyl group or an isopropyl group.

The present invention further discloses an organic electroluminescence device. The organic electroluminescence (EL) device comprises a pair of electrodes having a cathode and an anode. The organic EL device may comprise a light emitting layer and one or more layers of organic thin film layers between the pair of electrodes. The light emitting layer and/or the one or more organic thin film layers may comprise the organic compound of formula (1). The light emitting layer may be an emitting layer comprising an emitting host material and an emitting guest (dopant) material. The emitting host material may be doped with about 5% emitting guest material. The emitting layer may have a thickness of about 30 nm.

An organic EL device of the present invention may comprise an organic compound of formula (1), thereby lowering a driving voltage to about 3.2 V, increasing a current efficiency to about 48.6 cd/A, or increasing a half-life time to about 530 hours.

Alternatively, an organic EL device of may comprise an organic compound of formula (1) as a dopant material to collocate with a host material H1 or H2 to emit a green light, thereby lowering a driving voltage to about 5.3-5.6 V, increasing a current efficiency to about 46.3-48.6 cd/A, or increasing a half-life time to about 510-530 hours. The organic EL device of may comprise an organic compound of formula (1) as a dopant material to collocate with a host material H1 or H2 to emit a blue light, thereby lowering a driving voltage to about 3.4-4.2 V, increasing a current efficiency to about 5.7-7.4 cd/A, or increasing a half-life time to about 220-300 hours.

The organic EL device of may comprise an organic compound of formula (1) as a host material to emit a blue light, thereby lowering a driving voltage to about 3.2-4.1 V, increasing a current efficiency to about 5.3-7.6 cd/A, or increasing a half-life time to about 190-360 hours.

The organic EL device comprising an organic compound of formula (1) as an electron transporting material (ETM) may lower a driving voltage to about 3.8-4.0 V, increasing a current efficiency to about 5.5-6.0 cd/A, or increasing a half-life time to about 210-260 hours.

The organic EL device comprising an organic compound of formula (1) as a hole blocking material (HBM) may lower a driving voltage to about 3.7-4.0 V, increase a current efficiency to about 5.5-6.2 cd/A, or increase a half-life time to about 220-280 hours.

BRIEF DESCRIPTION OF THE DRAWINGS

The FIGURE is a schematic view showing an organic EL device according to an embodiment of the present invention.

DESCRIPTION OF THE PREFERRED EMBODIMENTS

What probed into the invention is the organic compound and organic EL device using the organic compound. Detailed descriptions of the production, structure and elements will be provided as follows such that the invention can be fully understood. Obviously, the application of the invention is not confined to specific details familiar to those skilled in the art. On the other hand, the common elements and procedures that are known to everyone are not described in details to avoid unnecessary limits of the invention. Some preferred embodiments of the present invention will now be described in greater detail as follows. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In one embodiment of the present invention, an organic compound which can be used as the phosphorescent host material, the fluorescent host material, or the fluorescent dopant material of the light emitting layer, and/or an electron transporting material (ETM), or a hole blocking material (HBM) in an organic EL device is disclosed. The organic compound is represented by the following formula (1):

formula (1)

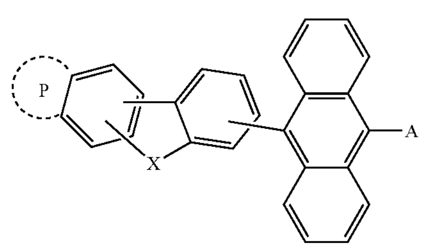

wherein A may represent one of the formula (2) to formula (6)

formula (2)

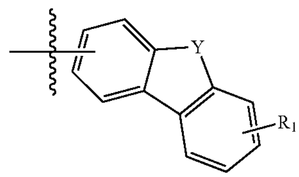

formula (3)

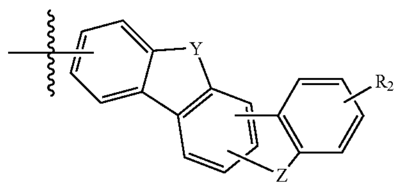

formula (4)

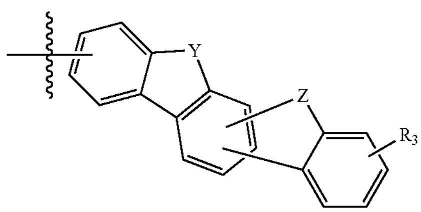

formula (5)

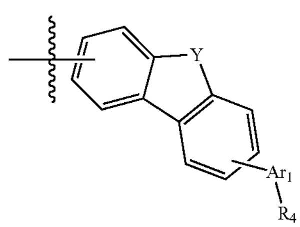

-continued formula (6)

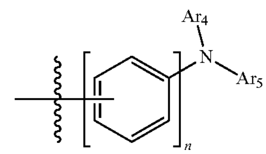

wherein X may be a divalent bridge selected from the group consisting of 0, S, and $SiR_5R_6$. P may represent a substituted or unsubstituted fused ring hydrocarbons unit having two, three or four rings. $Ar_1$ represent a substituted or unsubstituted fused ring hydrocarbon unit with one to two rings. The fused ring hydrocarbons unit may be, for example, a polycyclic aromatic hydrocarbons (PAHs) unit. m represents an integer of 0 or 1. Y is divalent bridge selected from the atom or group consisting from O, S, $SiR_7R_8$, $CR_9R_{10}$ and $NAr_2$. Z is divalent bridge selected from the atom or group consisting from O, S, $CR_{11}R_{12}$, $SiRi_{13}R_{14}$ and $NAr_3$. $Ar_2$ and $Ar_3$ represent a substituted or unsubstituted aryl group having 6 to 30 carbon atoms. $Ar_4$ and $Ar_5$ represent a substituted or unsubstituted aryl group having 6 to 30 carbon atoms, and a substituted or unsubstituted heteroaryl group having 6 to 30 carbon atoms; and $R_1$ to $R_{14}$ are independently selected from the group consisting of a hydrogen atom, a halide, a substituted or unsubstituted alkyl group having 1 to 30 (e.g., 1, 3 or 6) carbon atoms, a substituted or unsubstituted aryl group having 6 to 30 carbon atoms, a substituted or unsubstituted aralkyl group having 7 to 30 (e.g., 8 or 9) carbon atoms. The heteroaryl group may comprise, for example, a heteroaromatic PAHs unit having two, three, four, five or six rings. The heteroaromatic PAHs may contain an oxygen atom, a sulfur atom or one, two or three N atoms.

In certain embodiments, the substituted alkyl group, the substituted alkoxy group, the substituted aryl group, the substituted aralkyl group, or the substituted heteroaryl group is substituted by a halide, an alkyl group, an alkoxy group, or an aryl group.

The organic compound may be one of the following compounds:

EX1

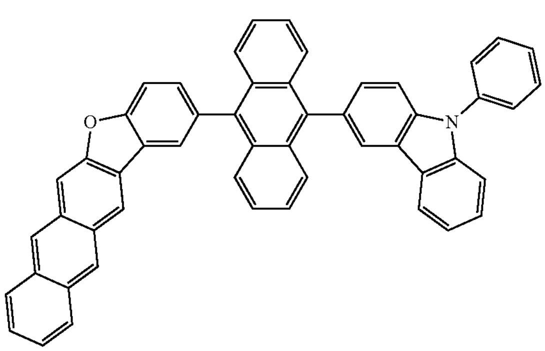

EX2

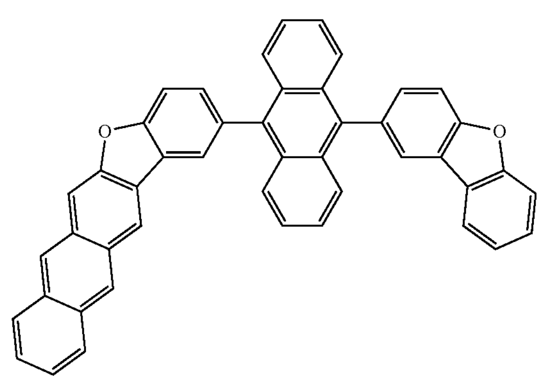

-continued
EX3
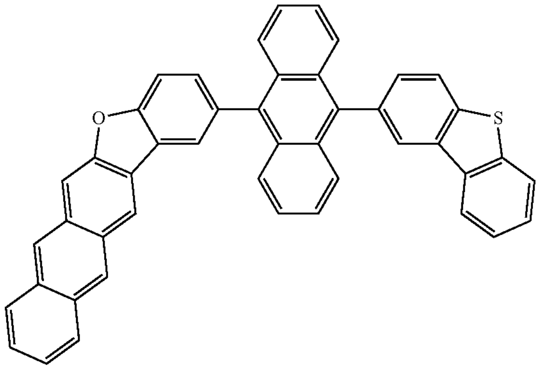
EX4
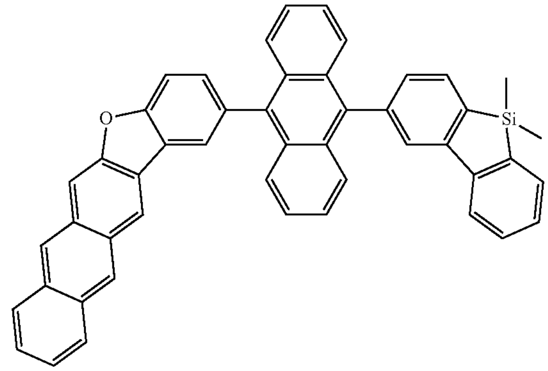
EX5
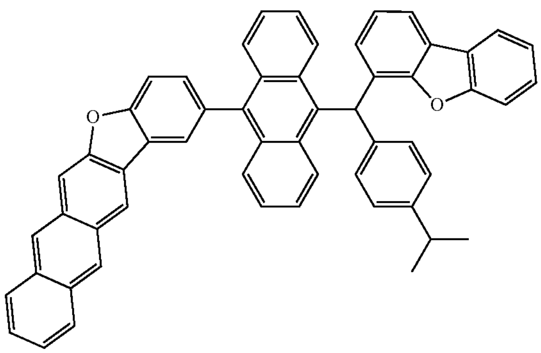
EX6
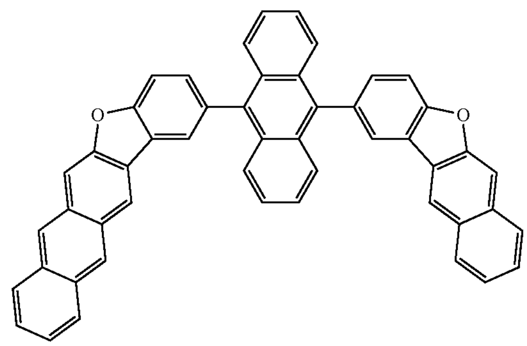
EX7
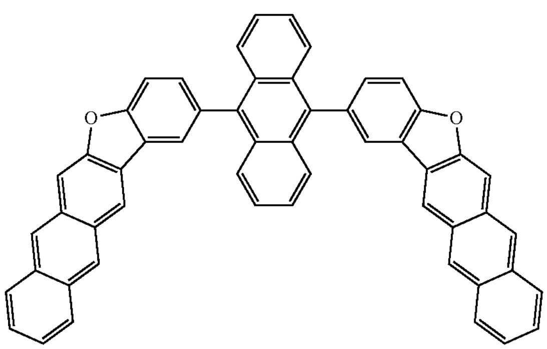
EX8
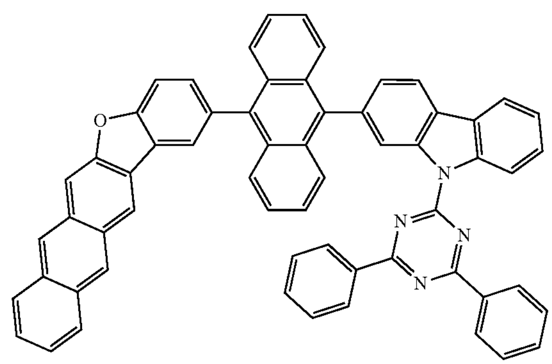
EX9
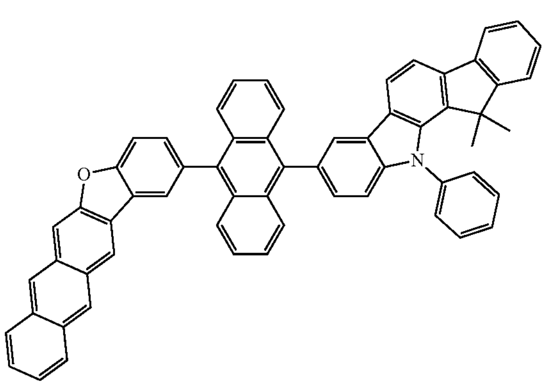
EX10
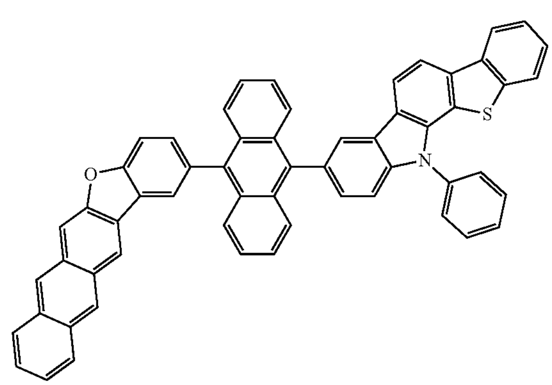

-continued
EX11
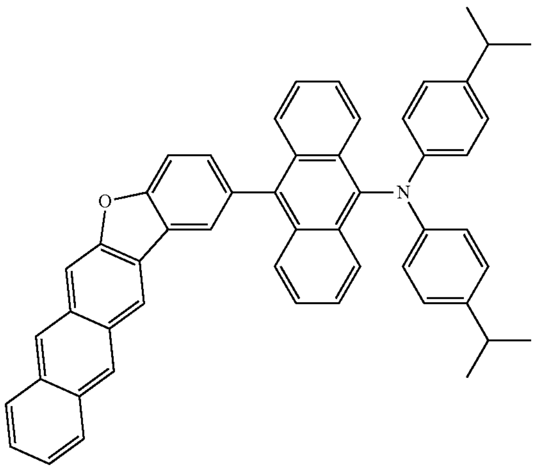
EX12
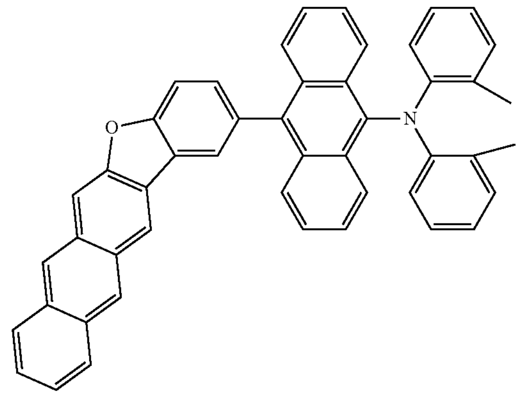
EX13
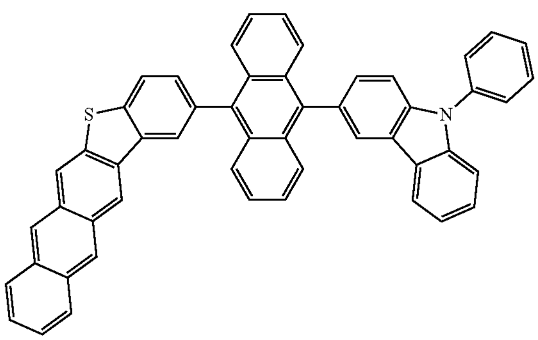
EX14
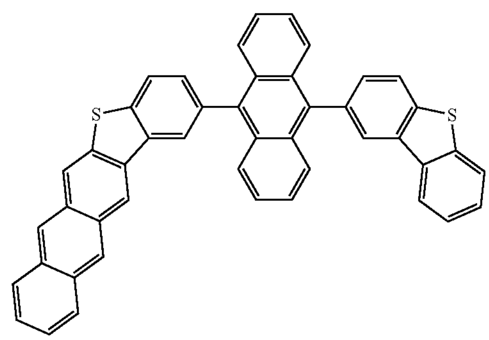
EX15
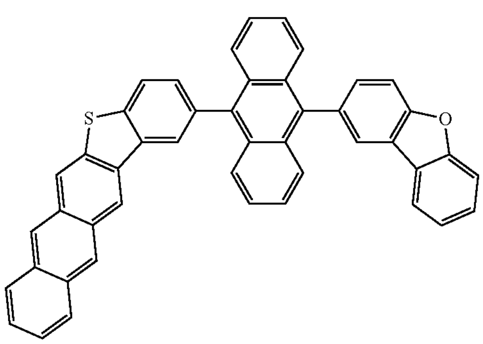
EX16
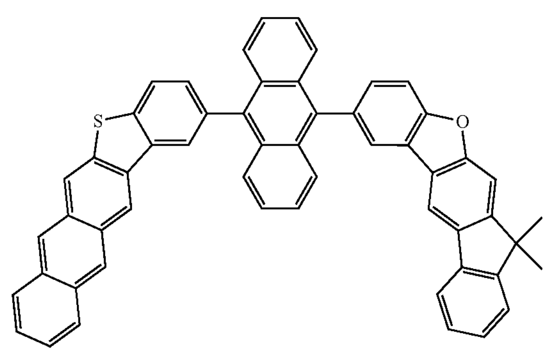
EX17
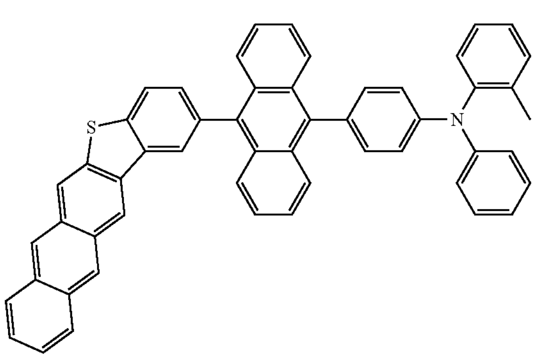
EX18
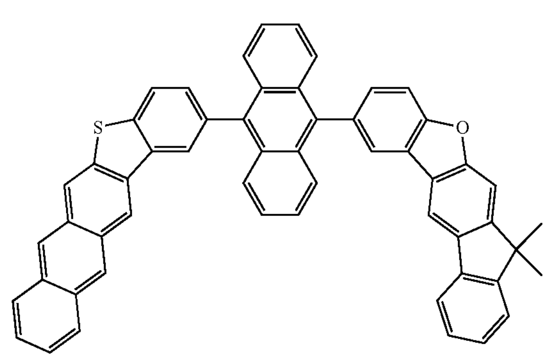

-continued
EX19
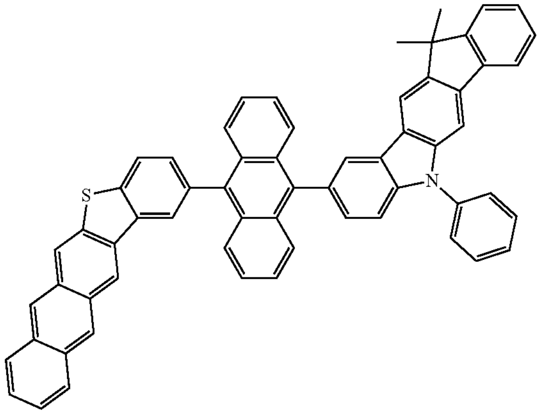
EX20
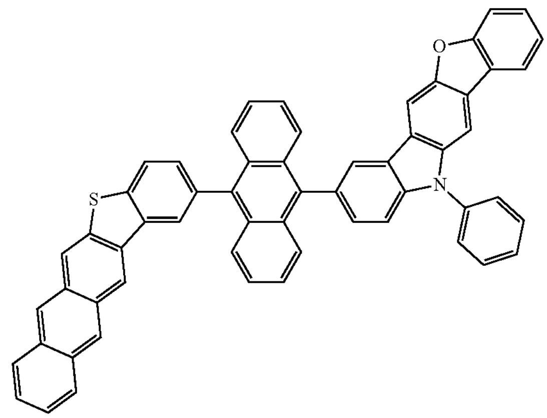
EX21
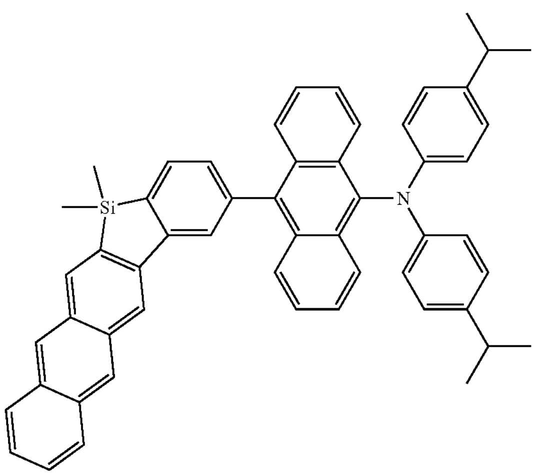
EX22
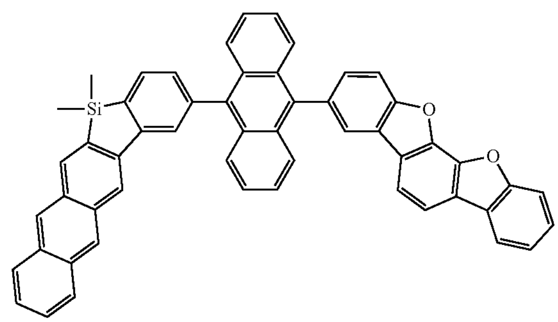
EX23
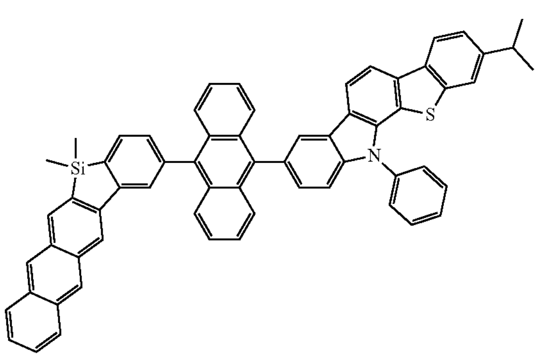
EX24
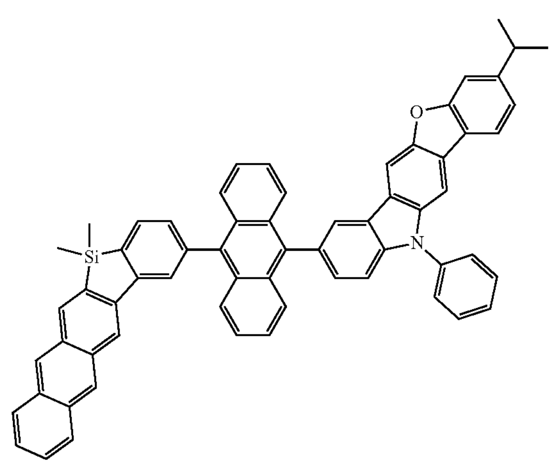

-continued
EX25
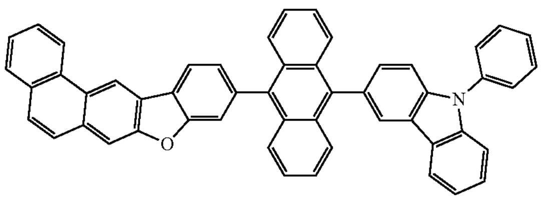
EX26
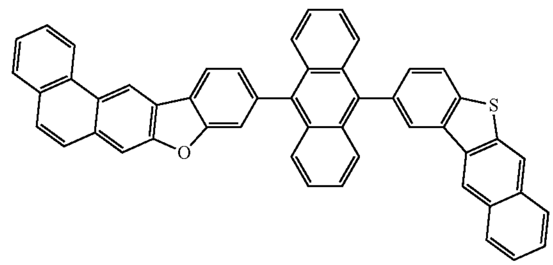
EX27
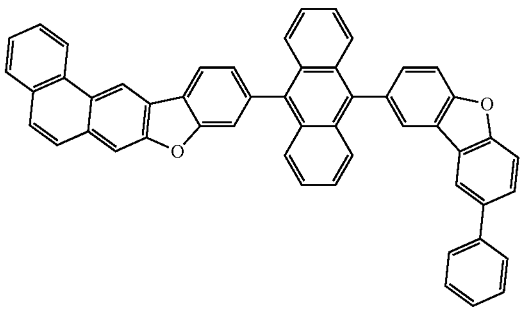
EX28
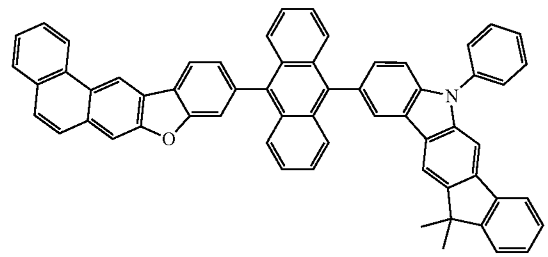
EX29
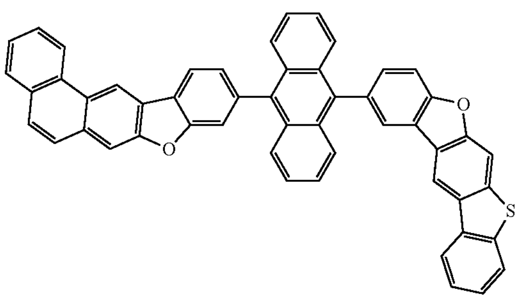
EX30
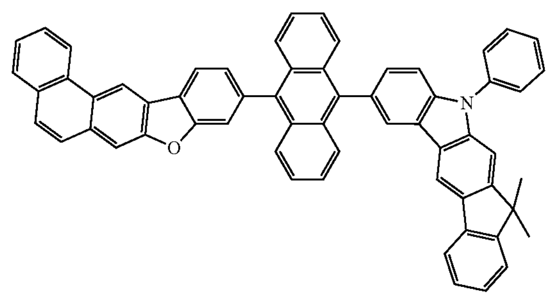
EX31
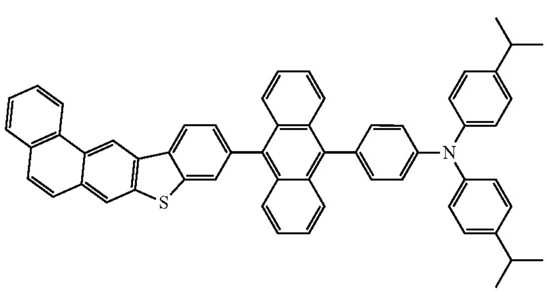
EX32
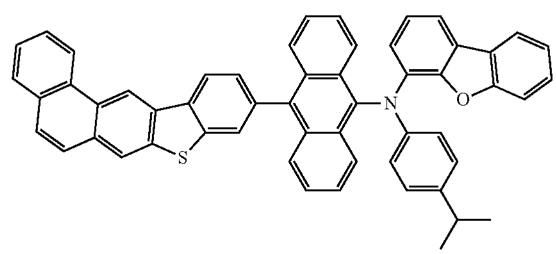
EX33
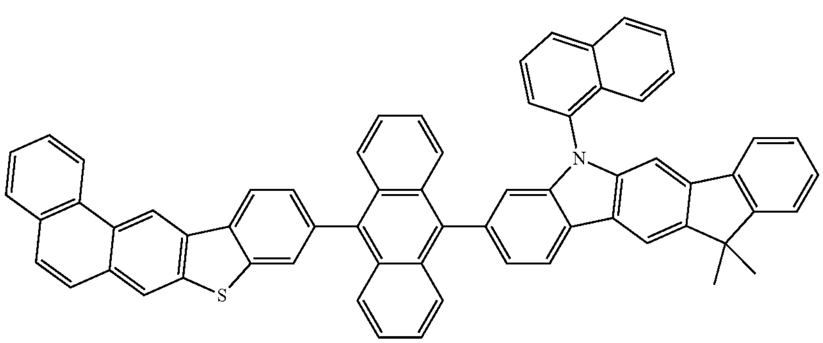

-continued
EX34
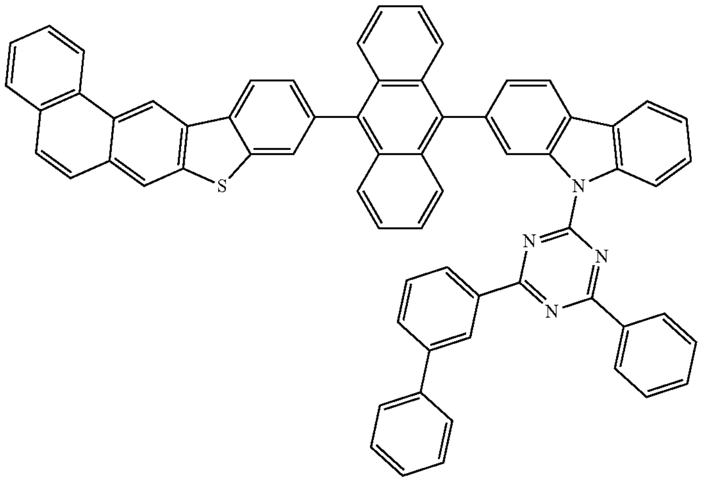
EX35
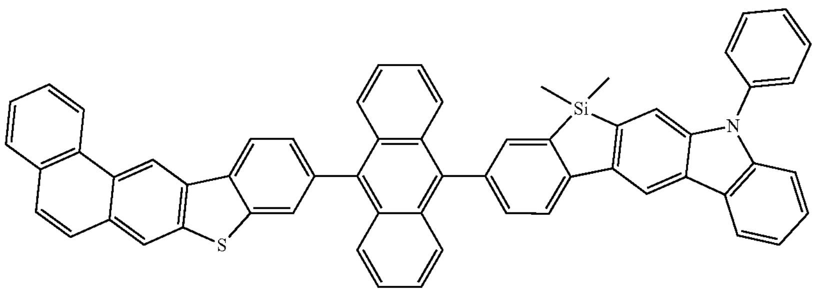
EX36
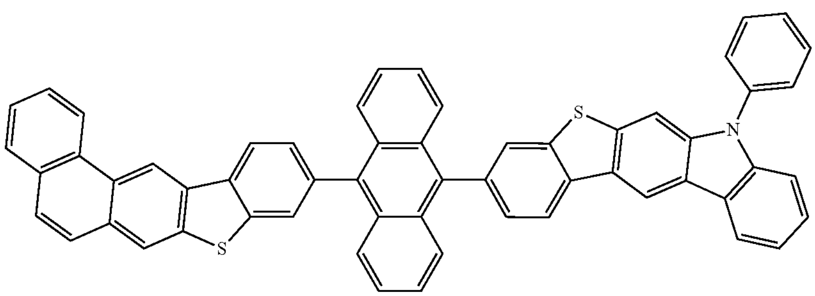
EX37
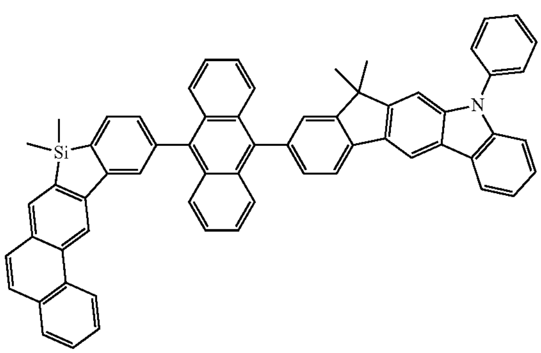
EX38
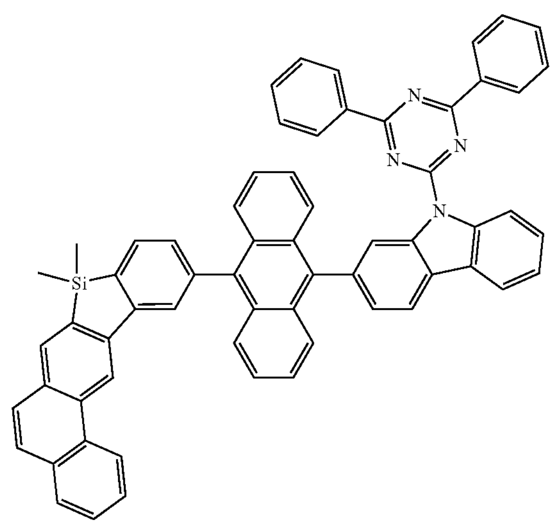

-continued
EX39
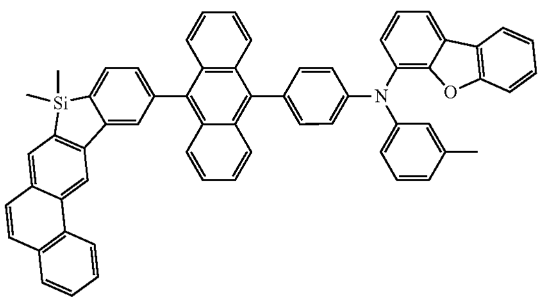
EX40
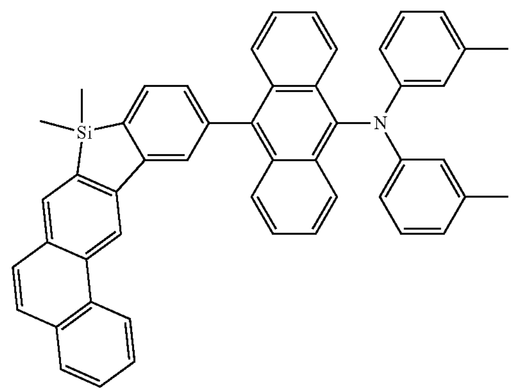
EX41
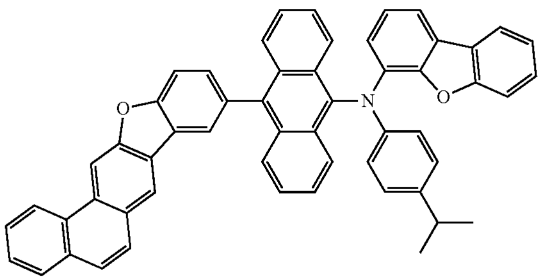
EX42
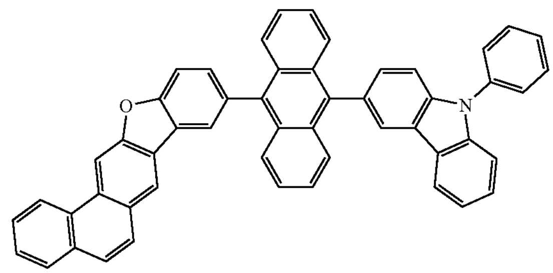
EX43
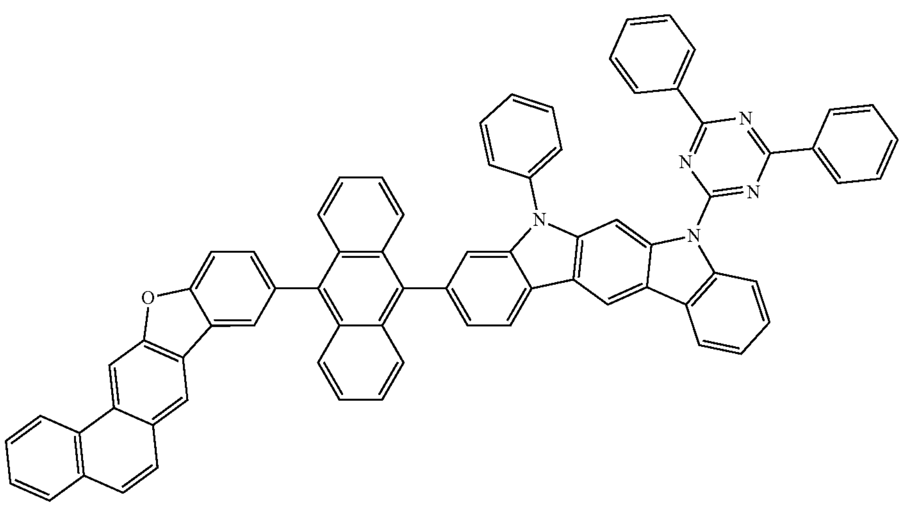
EX44
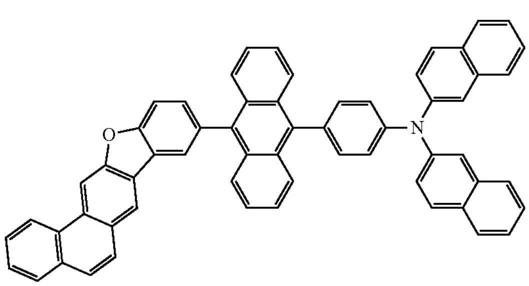
EX45
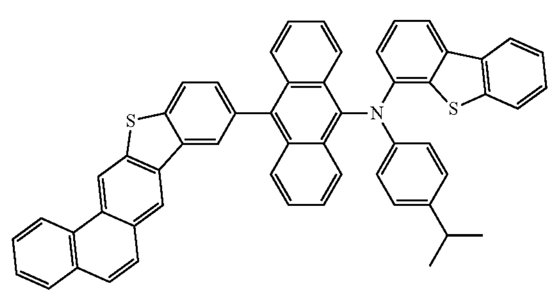

-continued
EX46
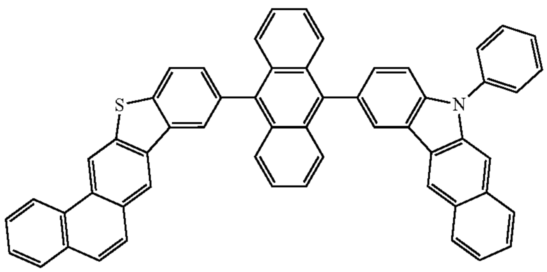
EX47
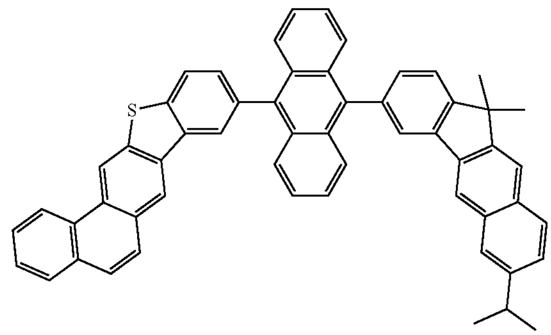
EX48
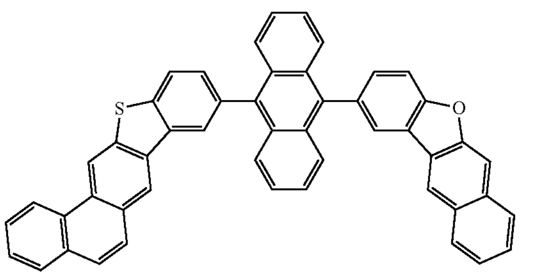
EX49
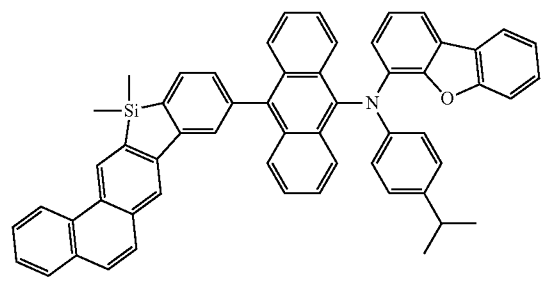
EX50
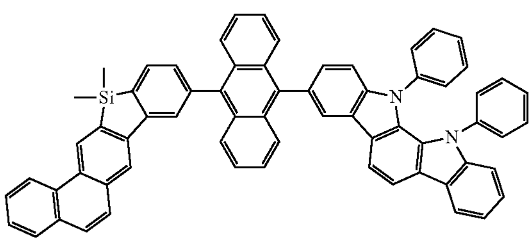
EX51
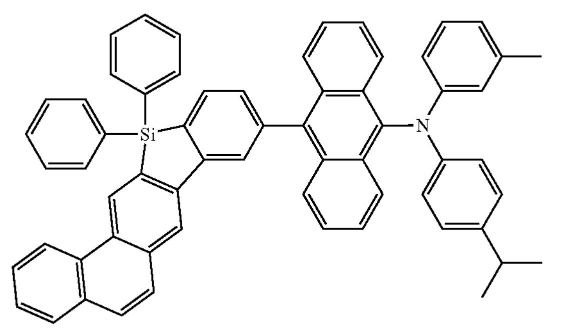
EX52
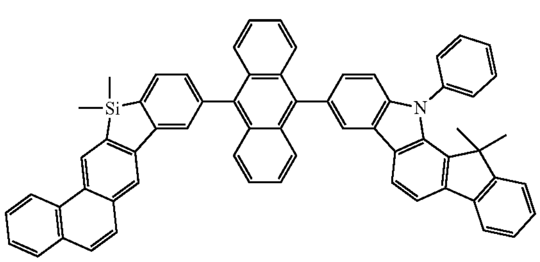
EX53
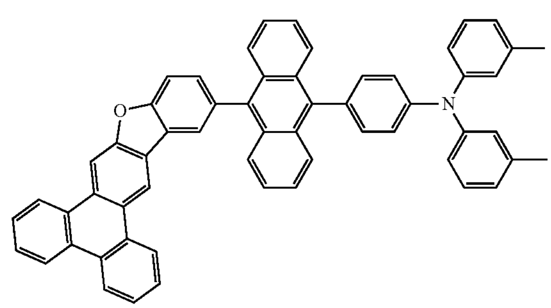

-continued
EX54
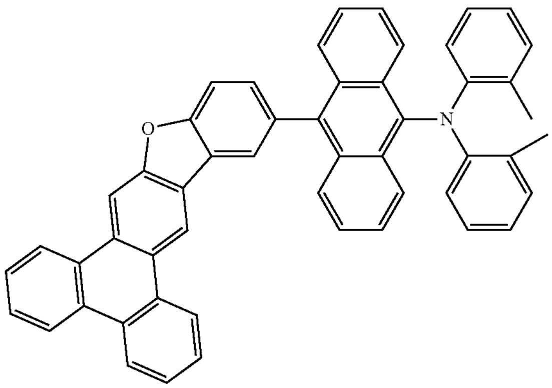
EX55
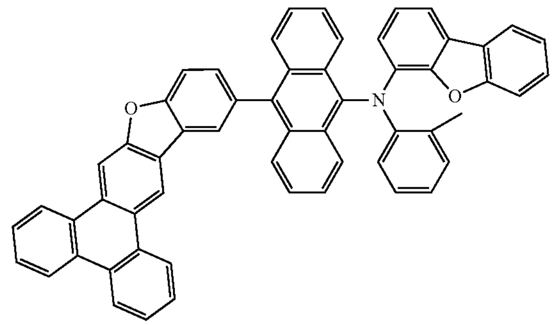
EX56
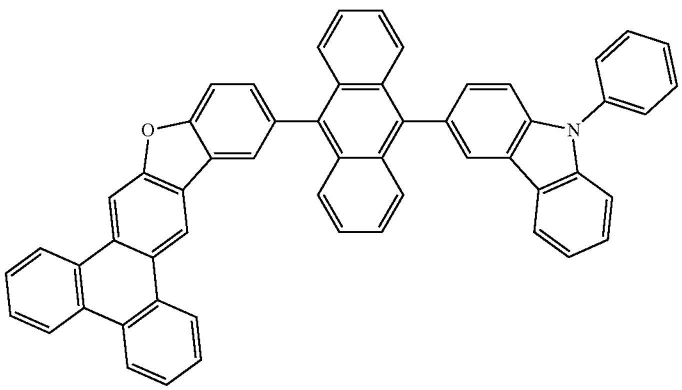
EX57
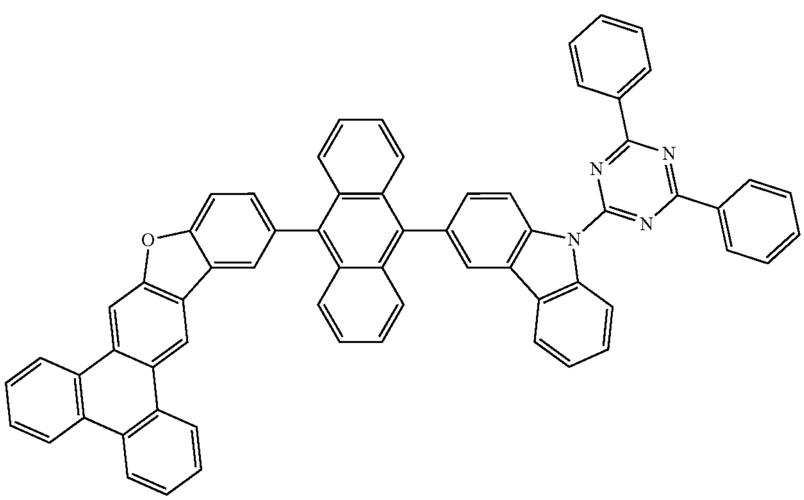
EX58
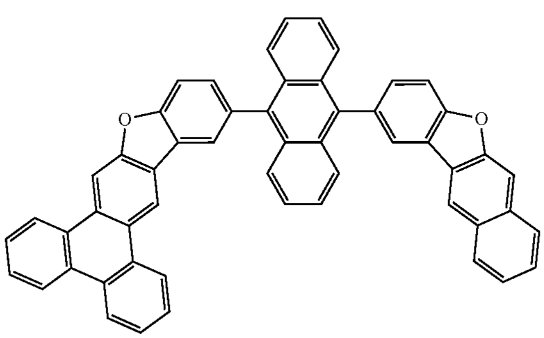
EX59
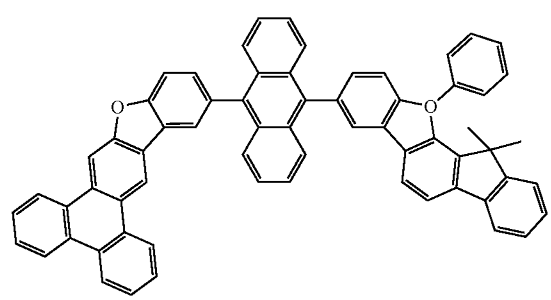

-continued
EX60
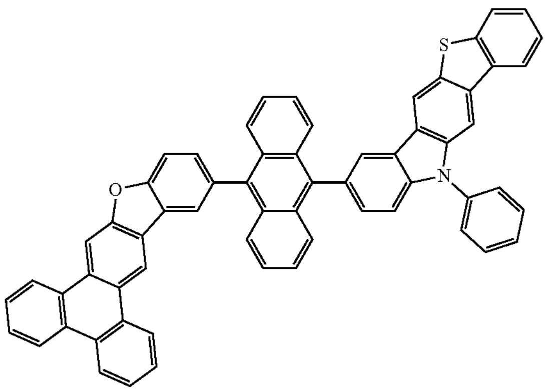
EX61
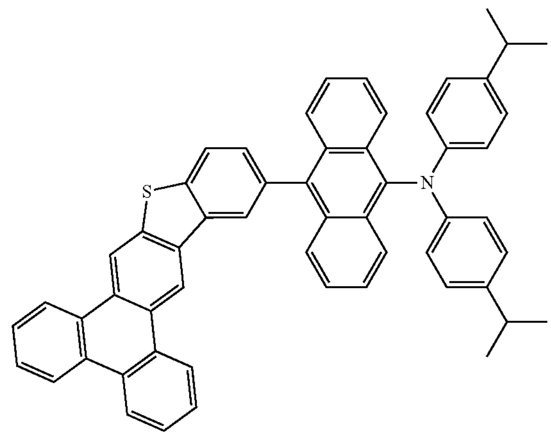
EX62
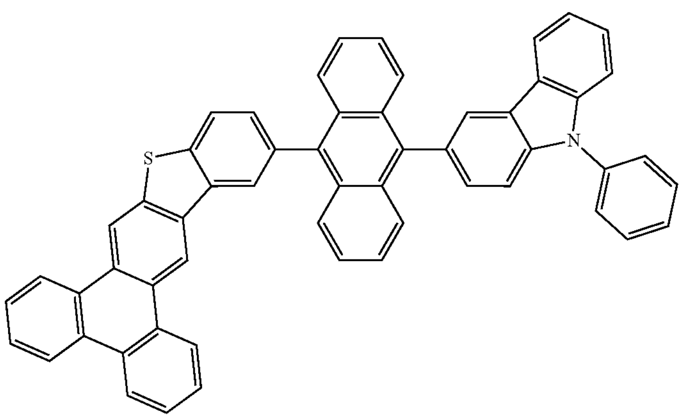
EX63
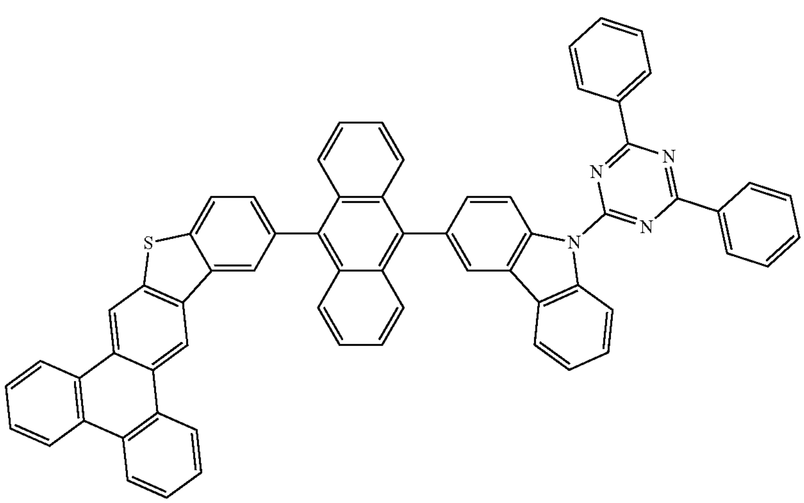

-continued
EX64
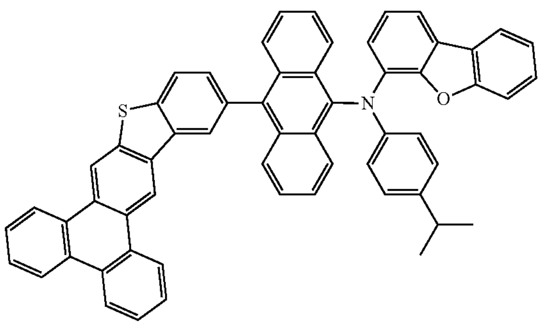
EX65
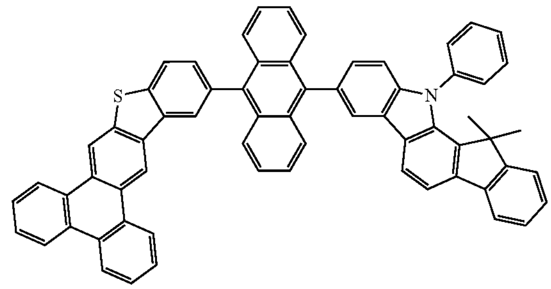
EX66
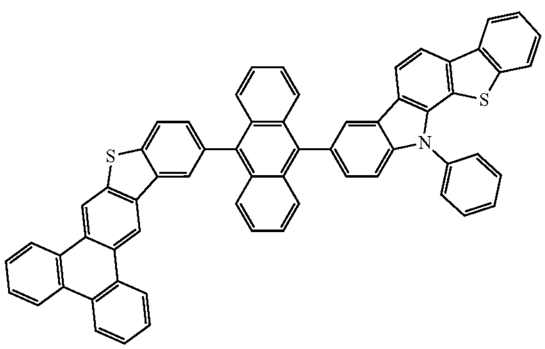
EX67
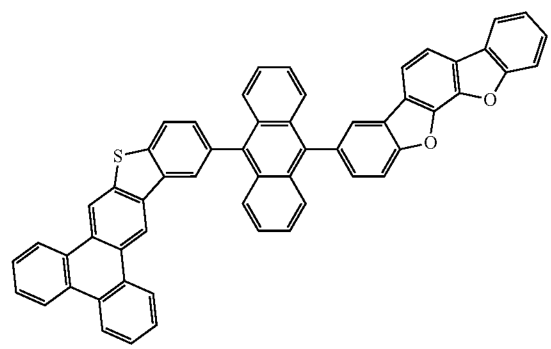
EX68
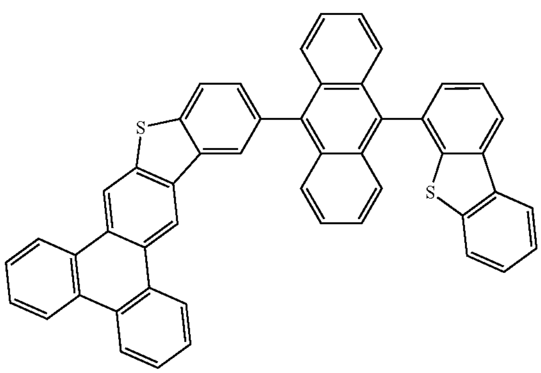
EX69
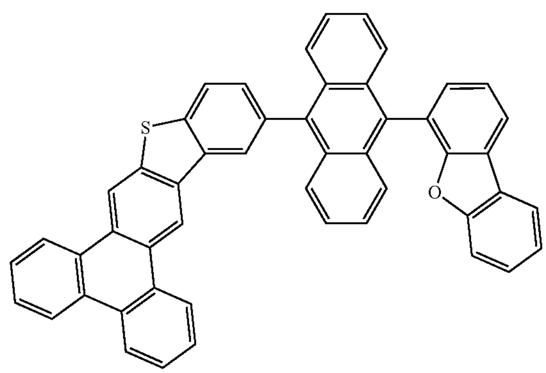
EX70
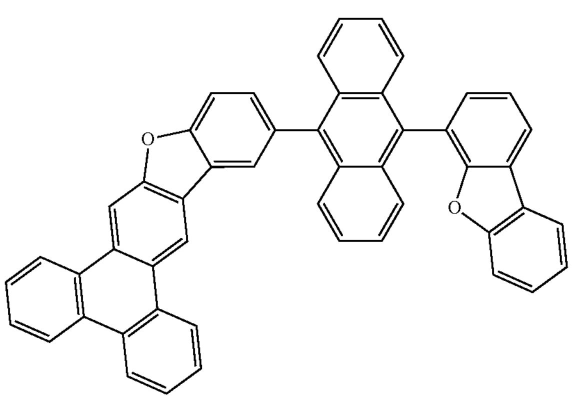

-continued
EX71
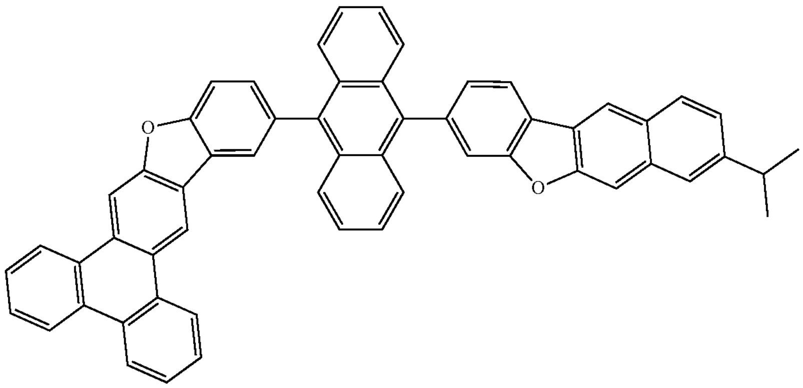
EX72
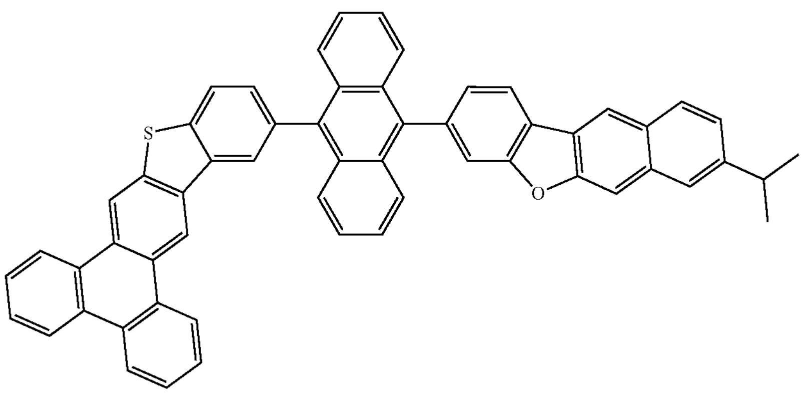
EX73
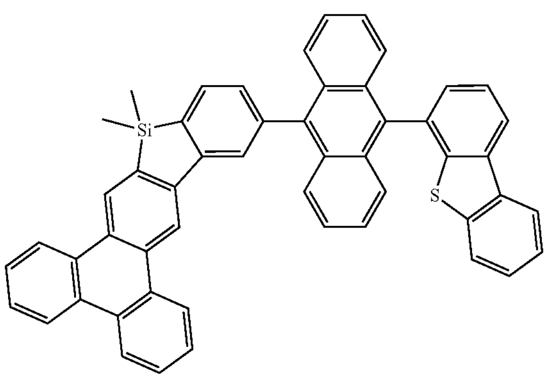
EX74
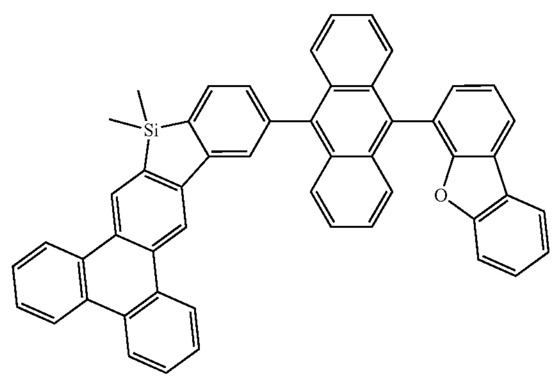
EX75
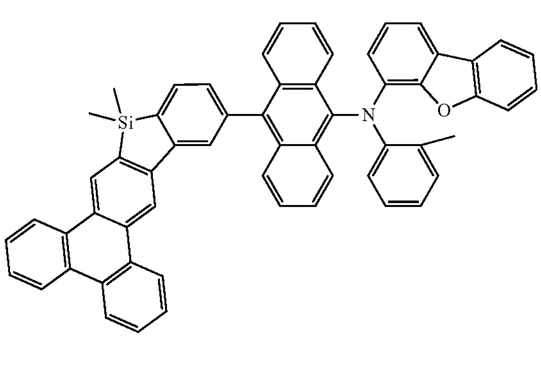
EX76
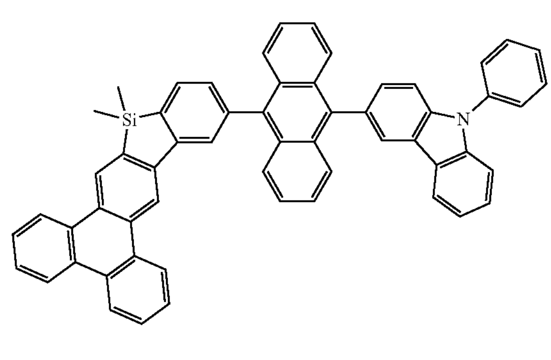

-continued
EX77
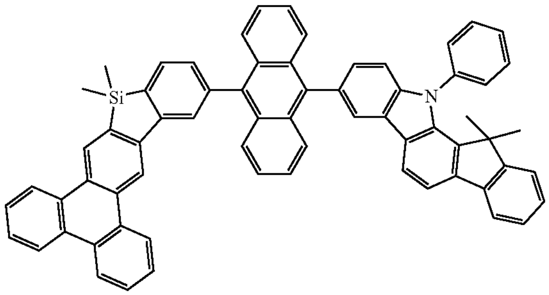
EX78
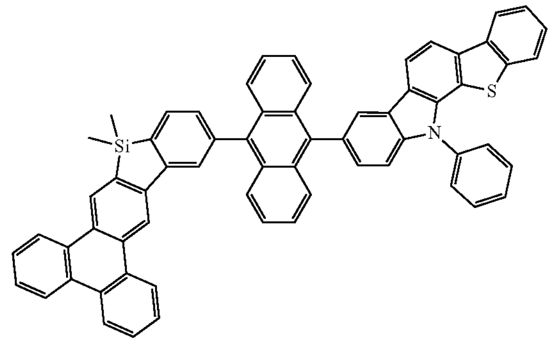
EX79
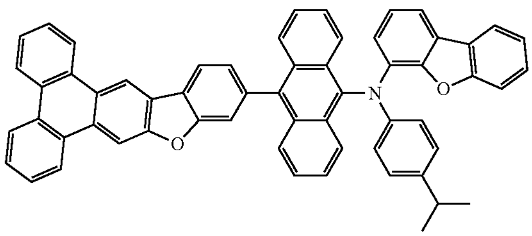
EX80
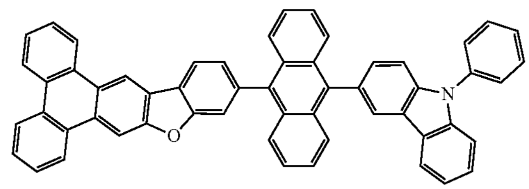
EX81
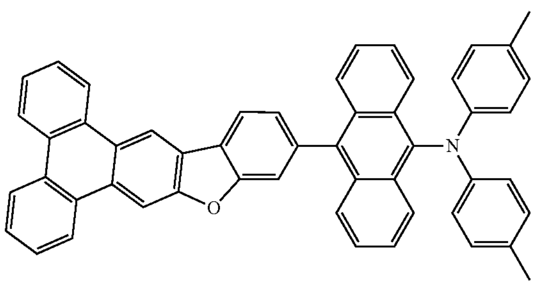
EX82
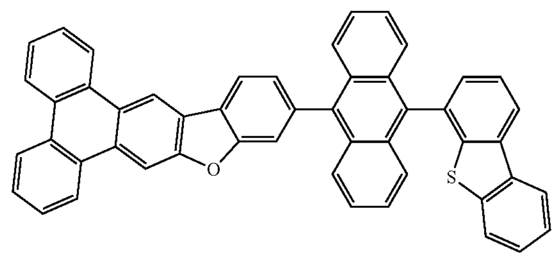
EX83
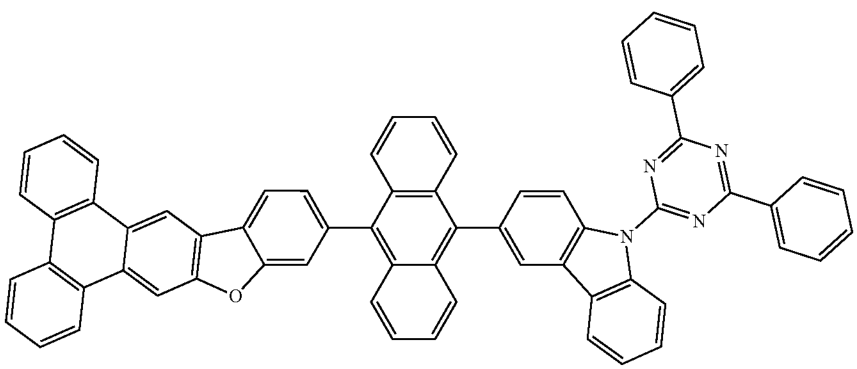
EX84
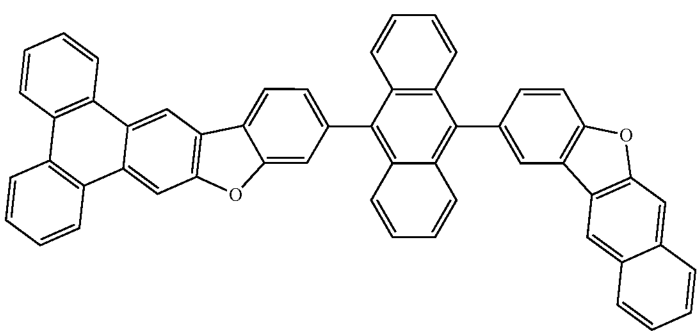

-continued
EX85
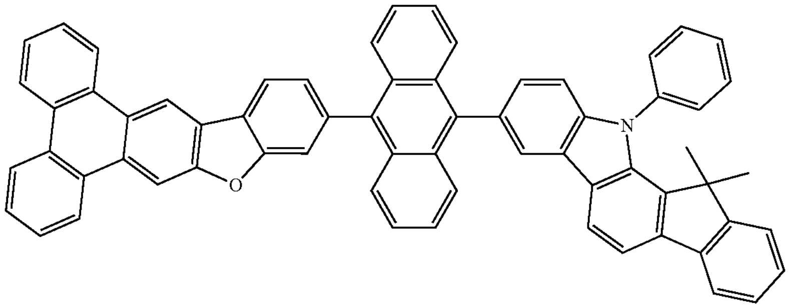
EX86
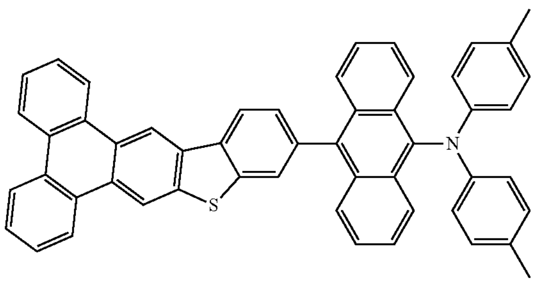
EX87
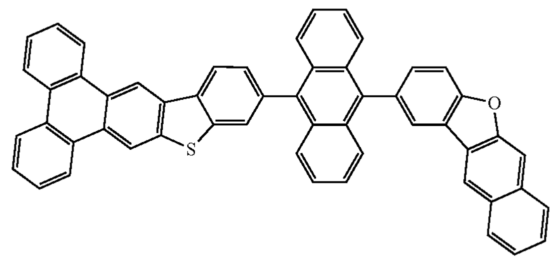
EX88
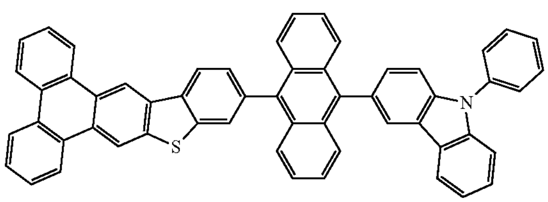
EX89
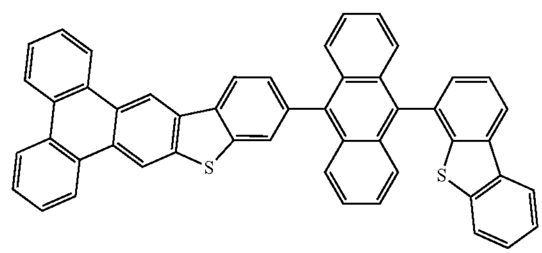
EX90
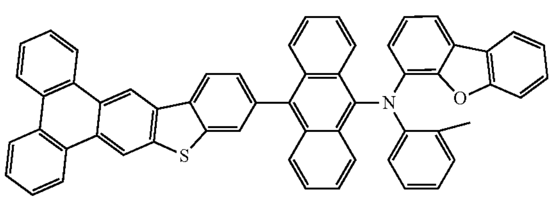
EX91
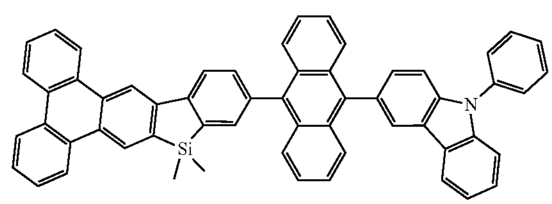
EX92
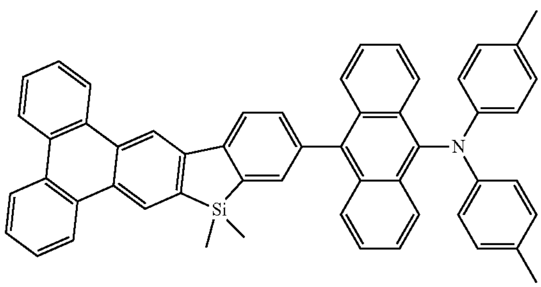
EX93
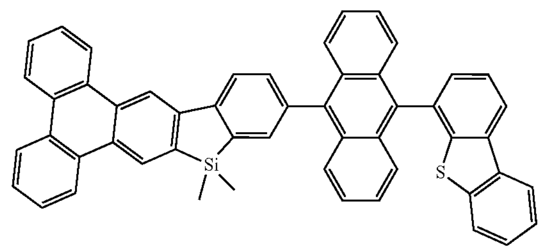

-continued
EX94
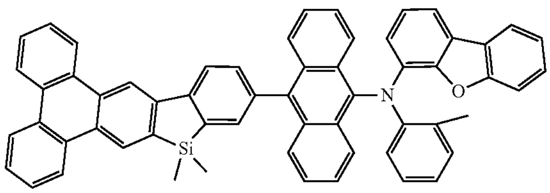
EX95
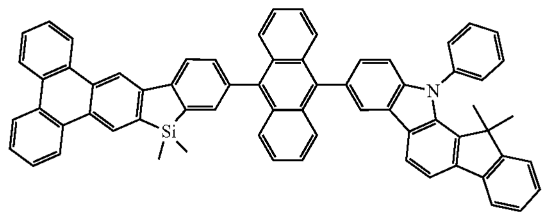
EX96
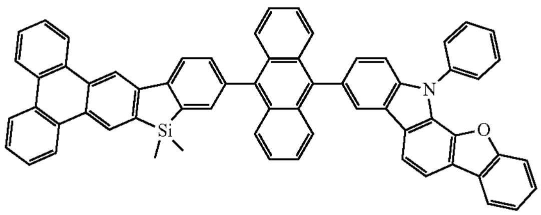
EX97
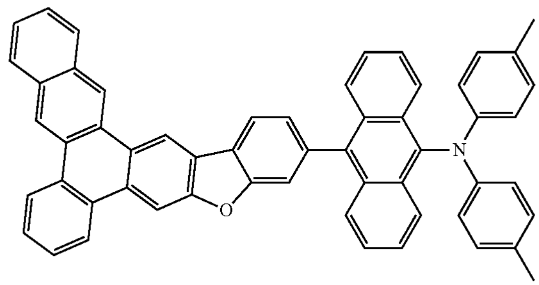
EX98
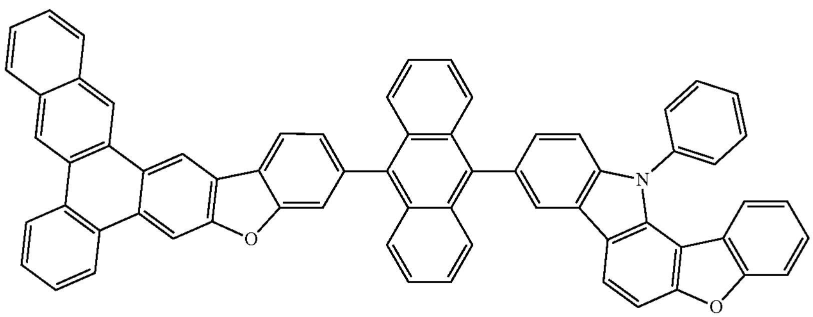
EX99
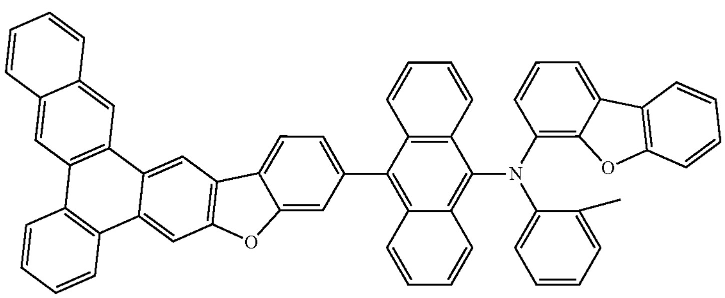
EX100
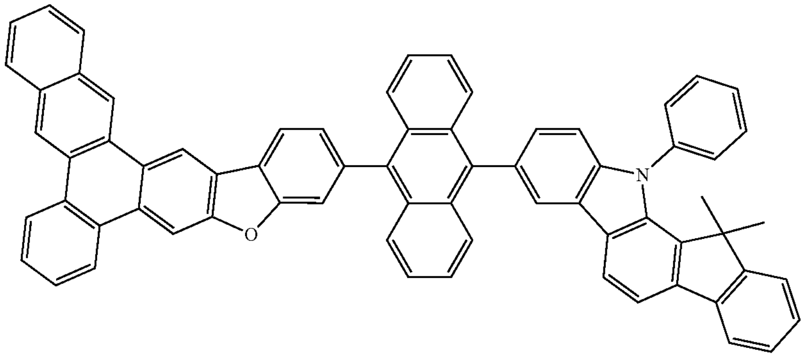

-continued
EX101
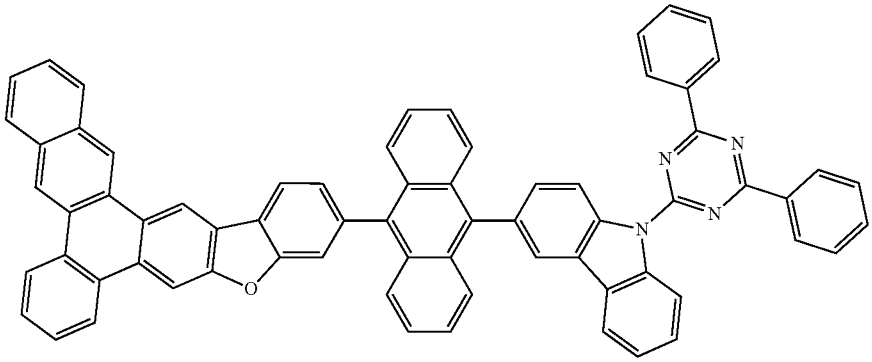
EX102
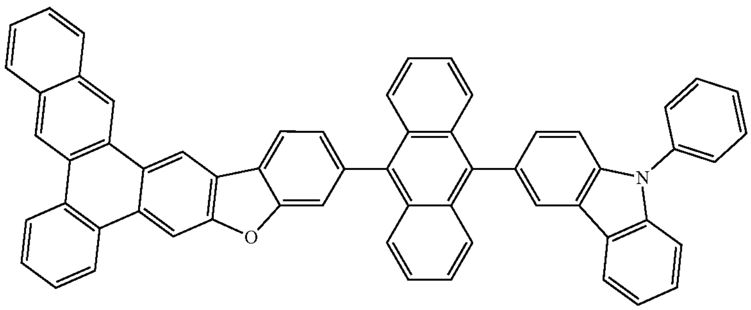
EX103
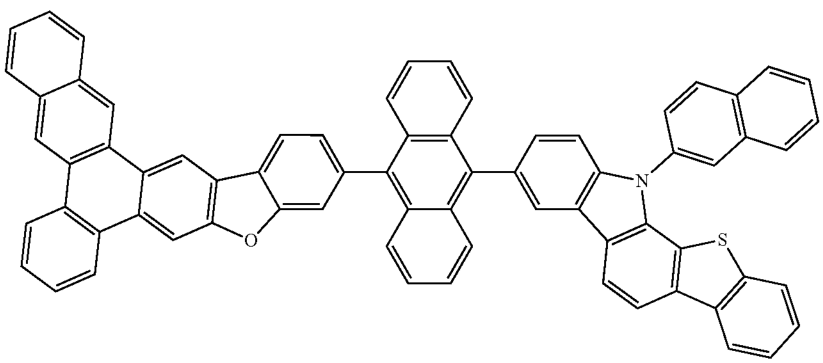
EX104
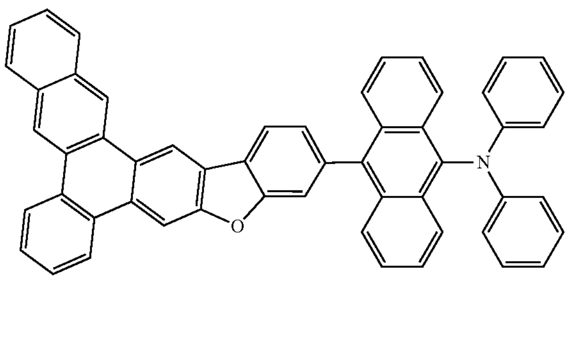

-continued
EX105
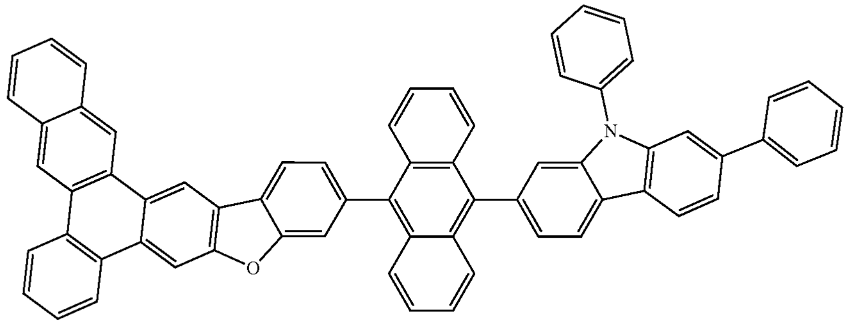
EX106
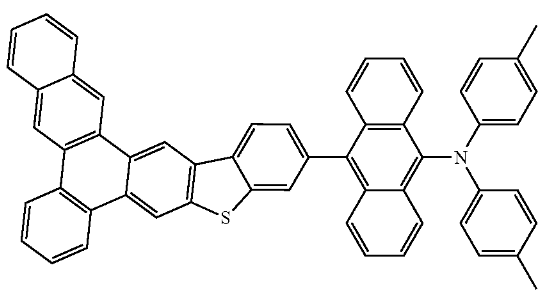
EX107
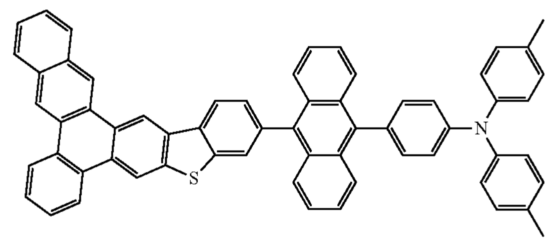
EX108
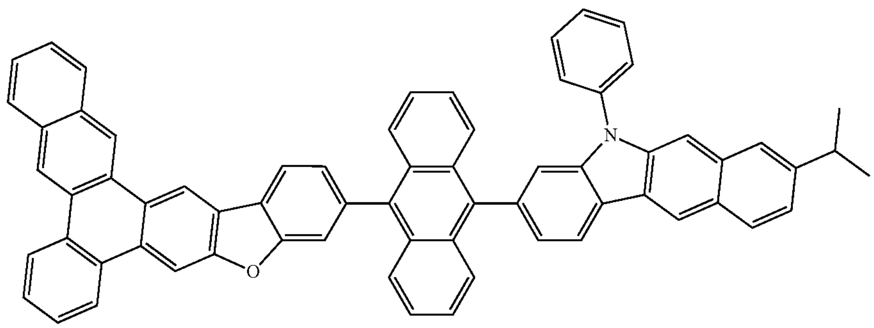
EX109
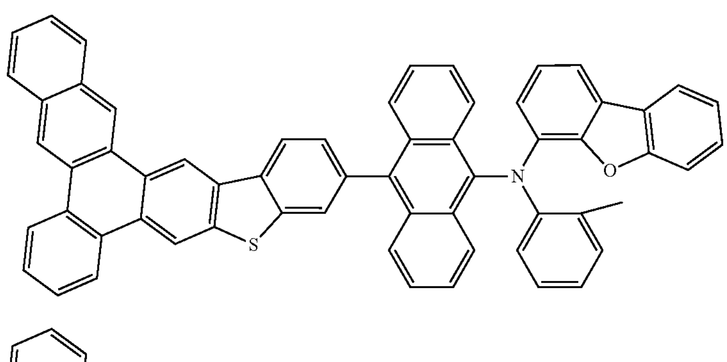
EX110
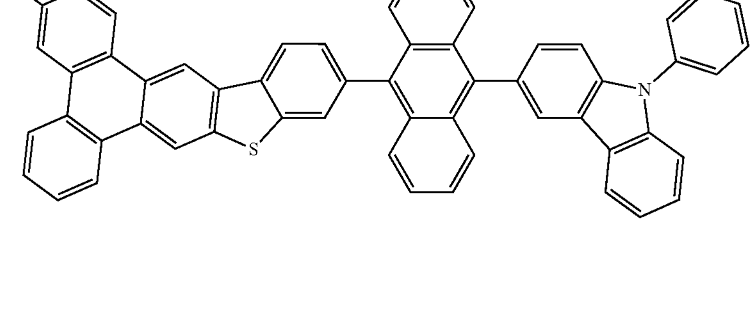

-continued
EX111
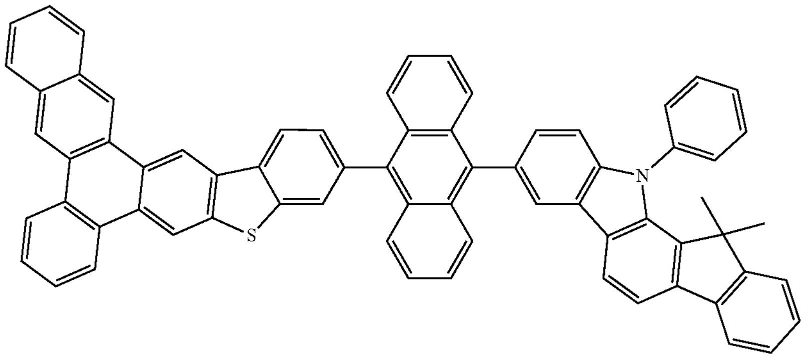
EX112
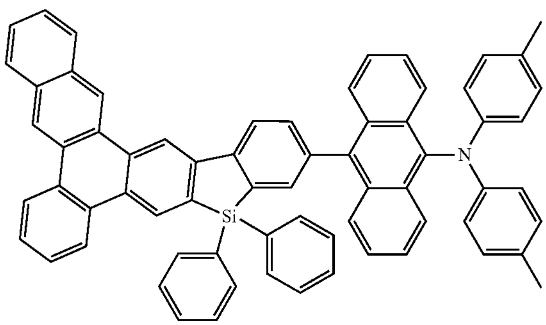
EX113
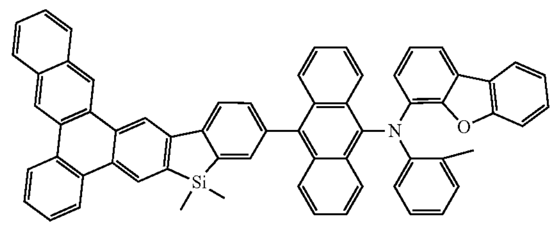
EX114
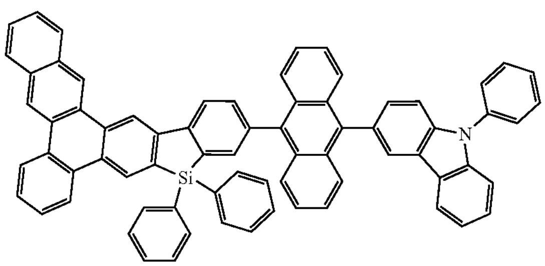
EX115
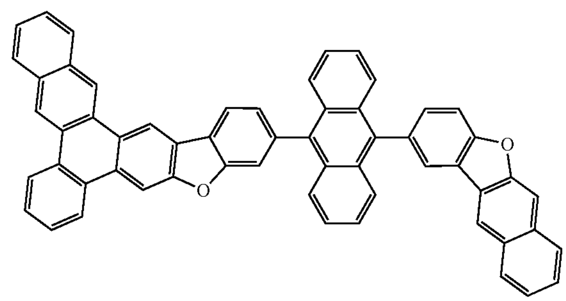
EX116
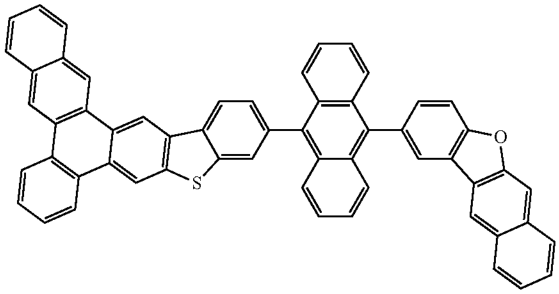
EX117
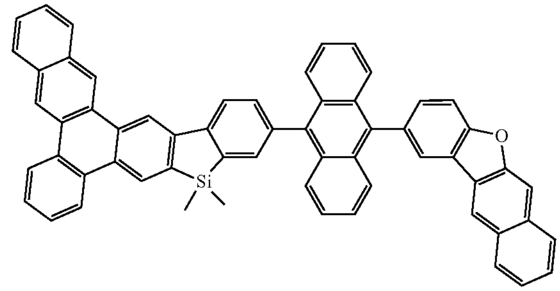

-continued
EX118
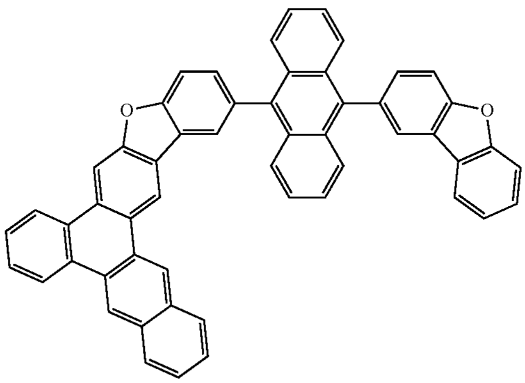
EX119
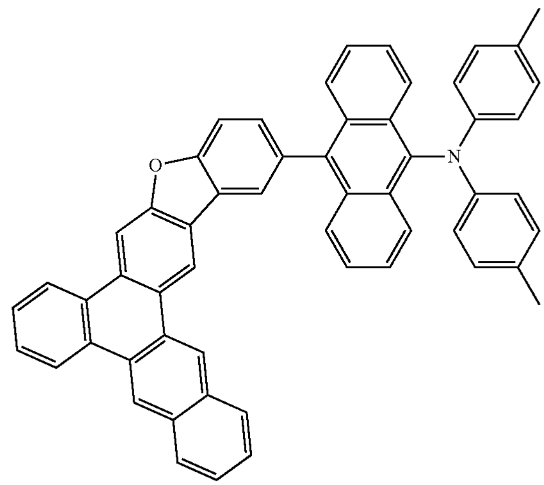
EX120
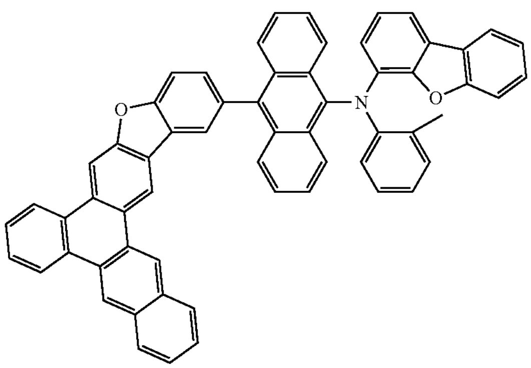
EX121
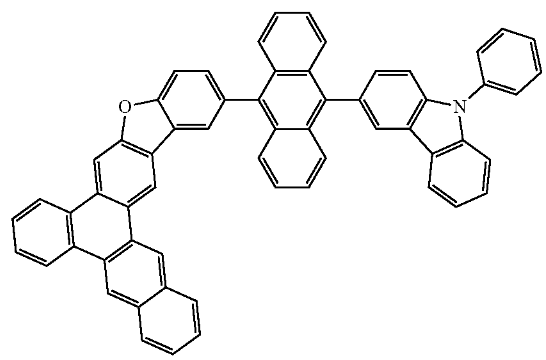
EX122
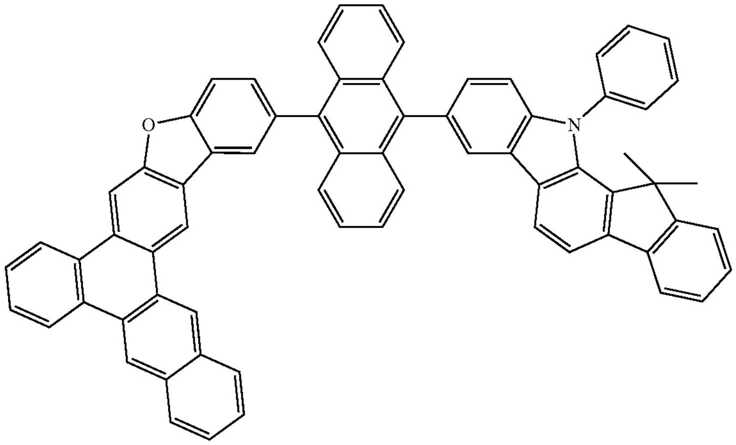

-continued
EX123
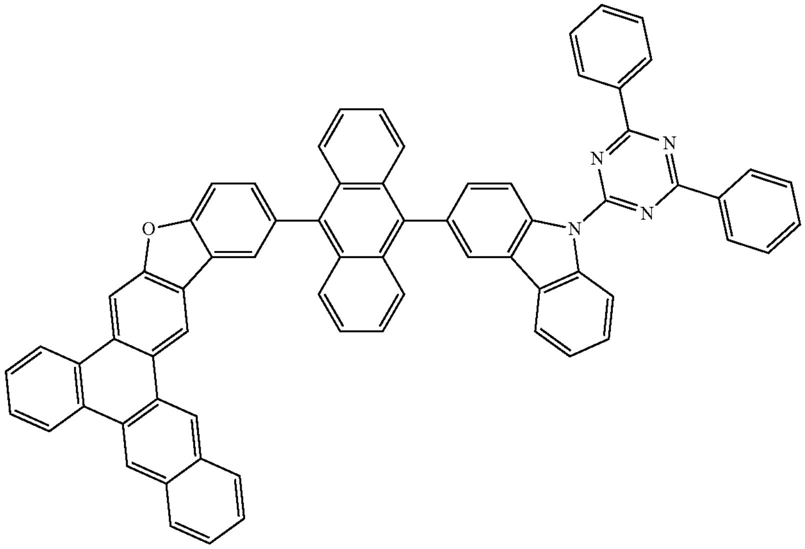
EX124
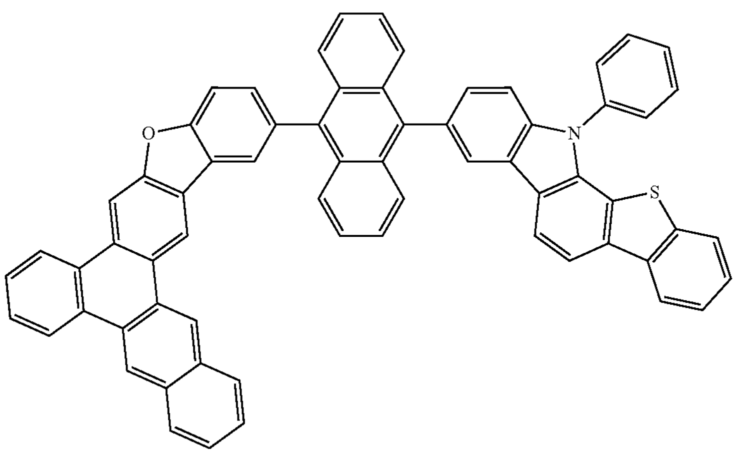
EX125
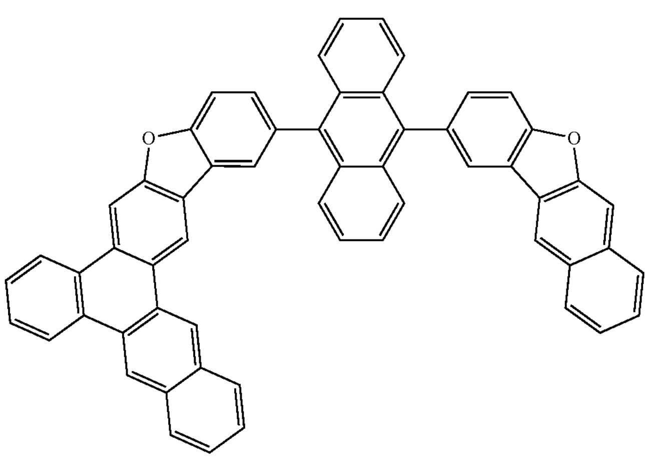

-continued
EX126
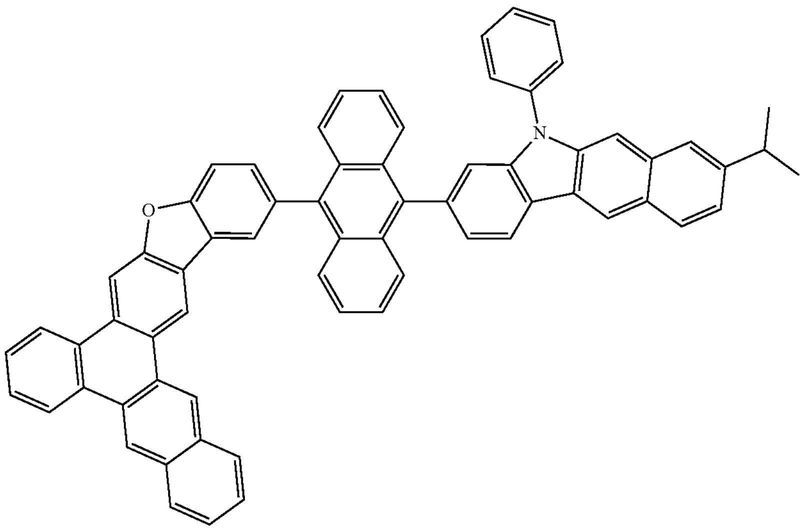
EX127
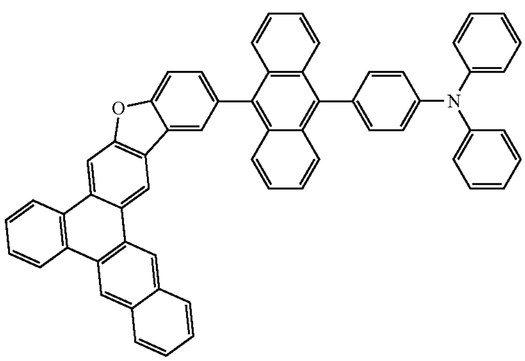
EX128
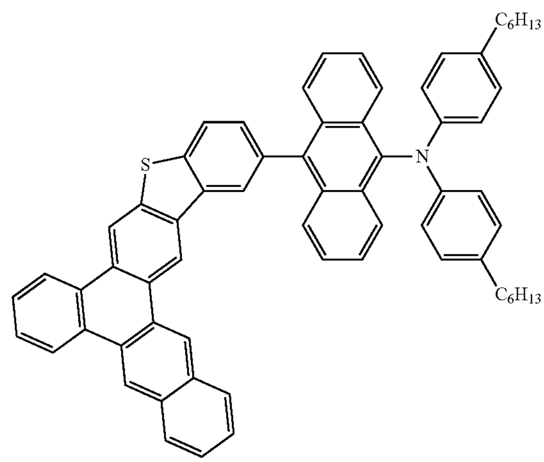
EX129
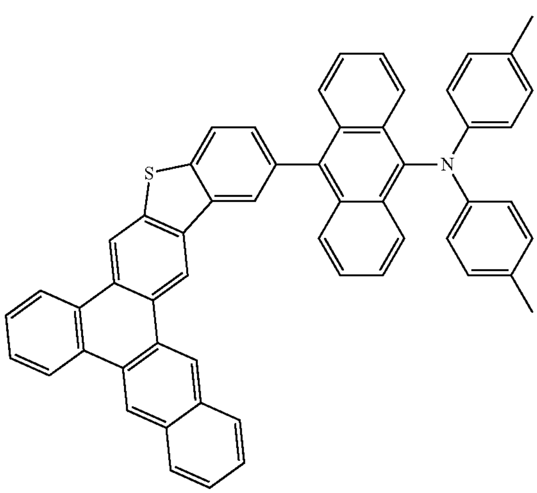
EX130
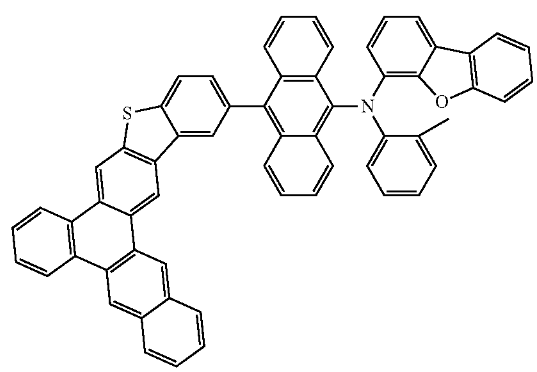

-continued
EX131
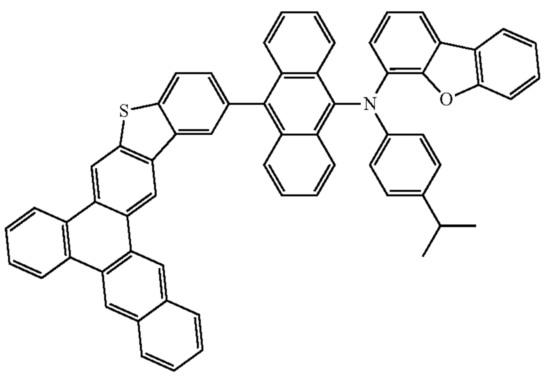
EX132
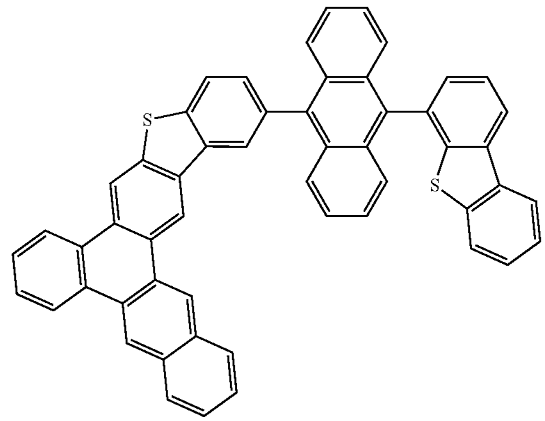
EX133
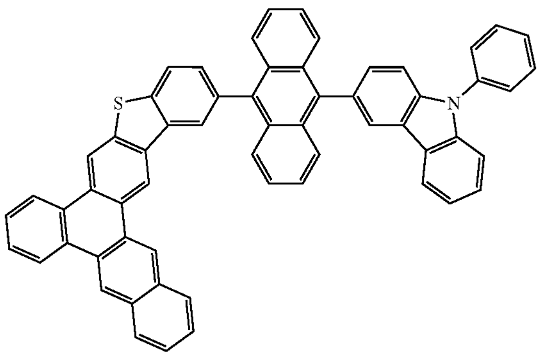
EX134
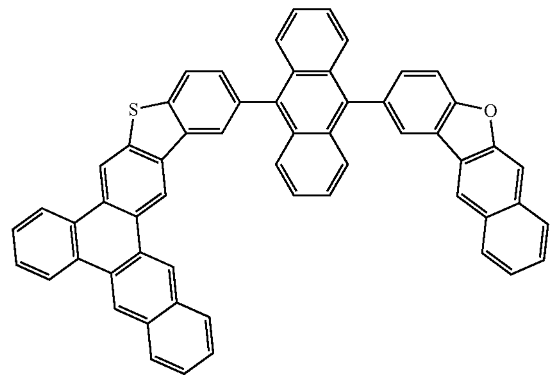
EX135
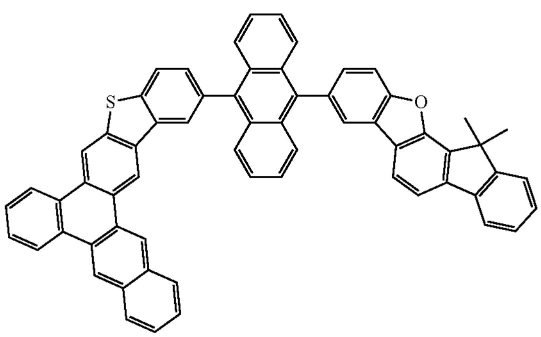
EX136
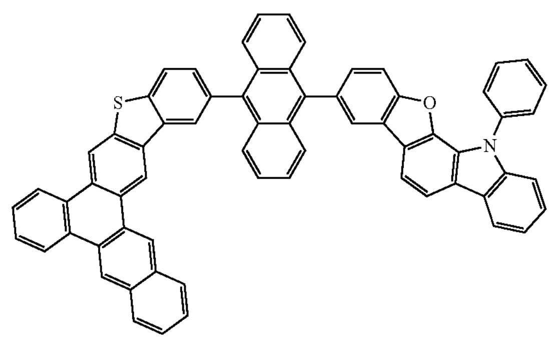
EX137
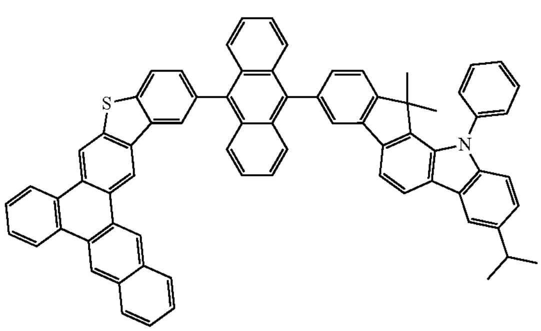
EX138
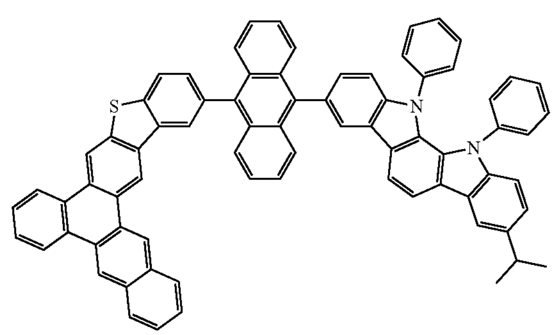

-continued
EX139
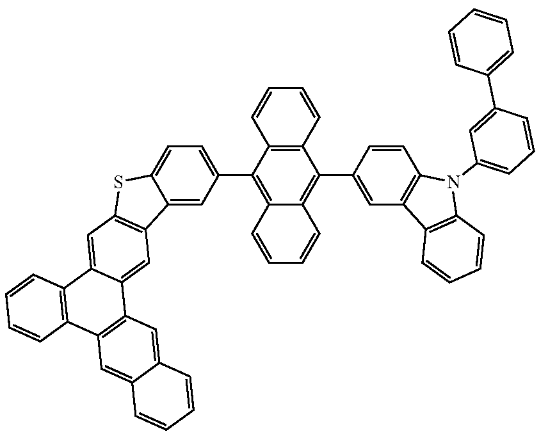
EX140
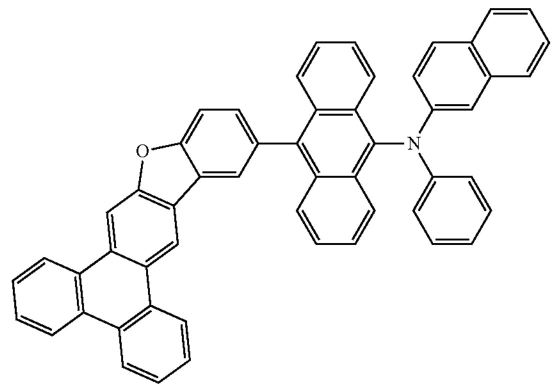
EX141
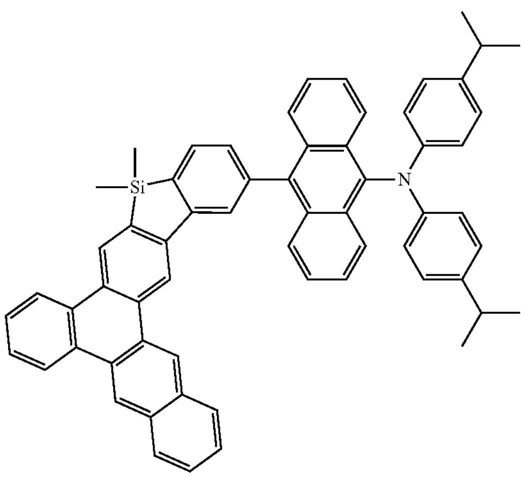
EX142
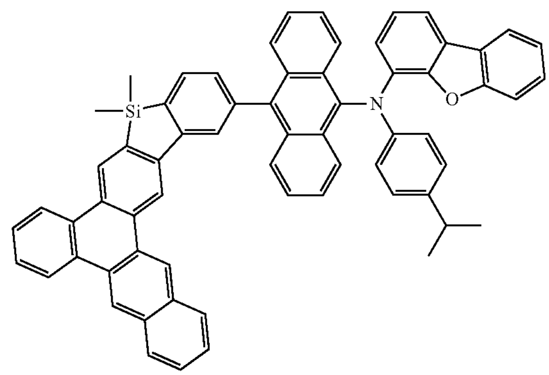
EX143
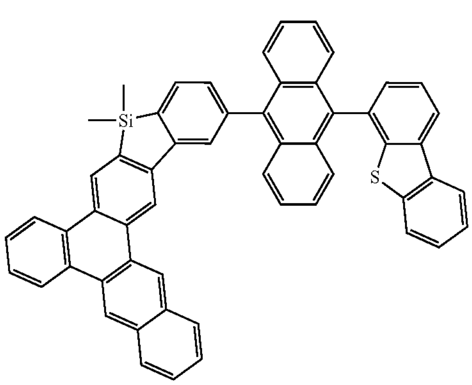
EX144
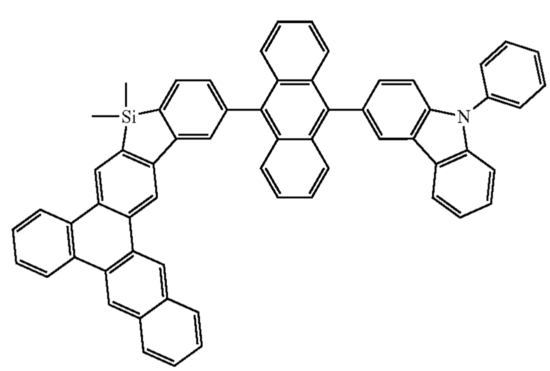

-continued
EX145
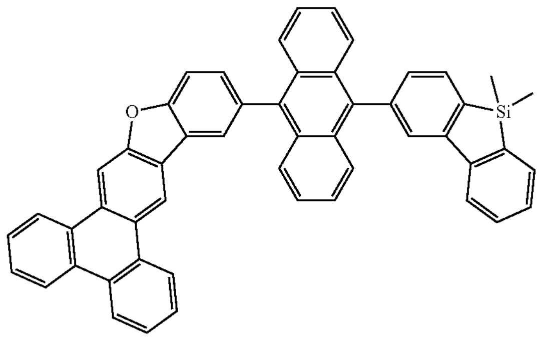
EX146
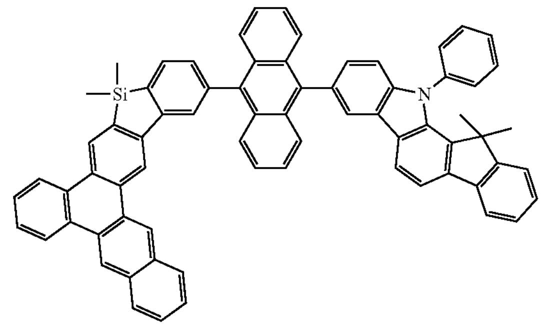
EX147
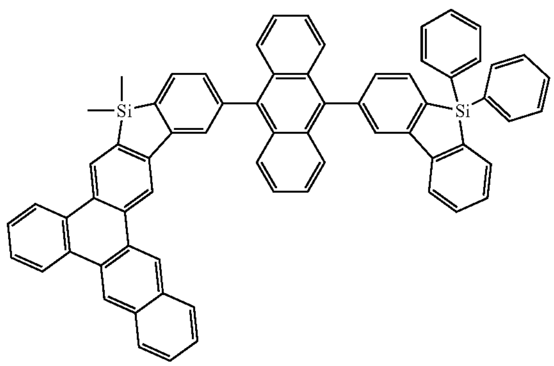
EX148
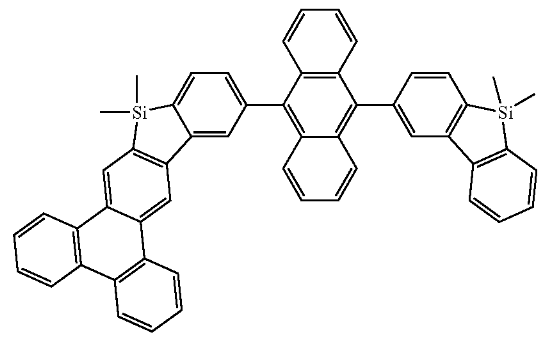
EX149
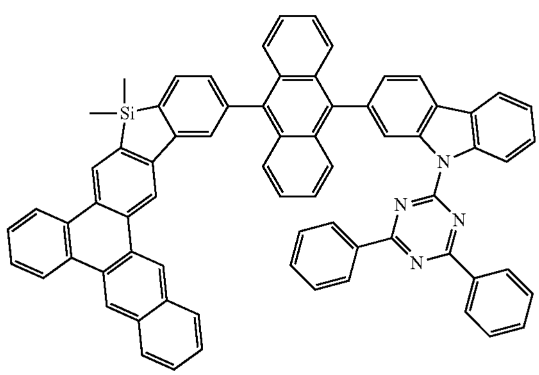
EX150
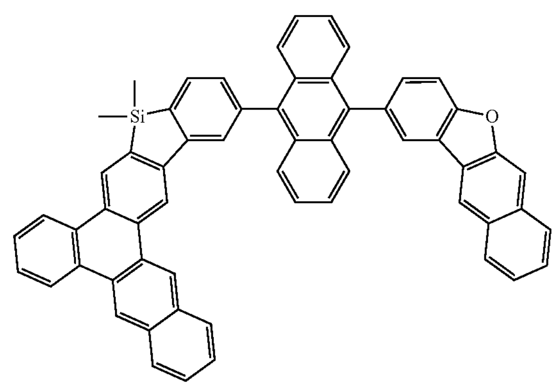
EX151
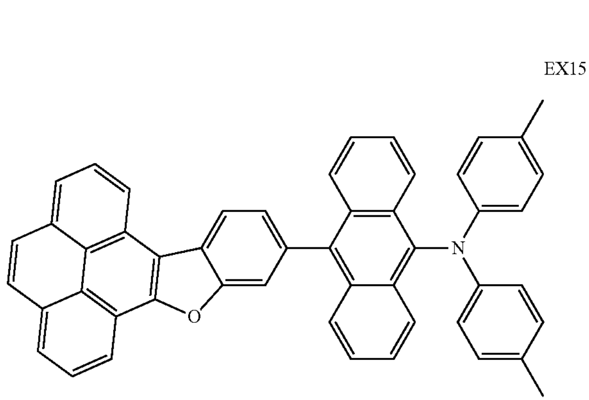
EX152
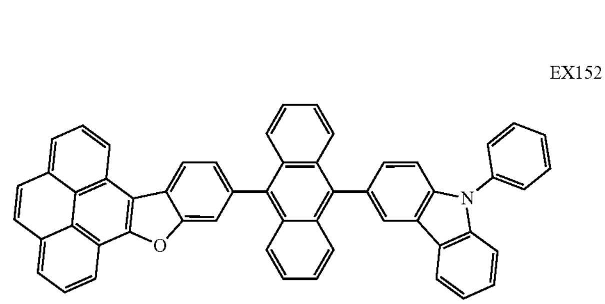

-continued
EX153
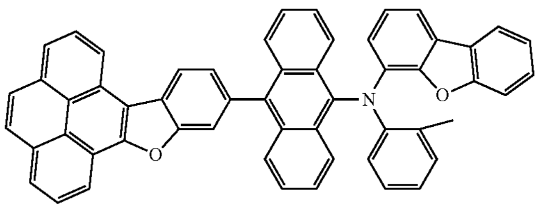
EX154
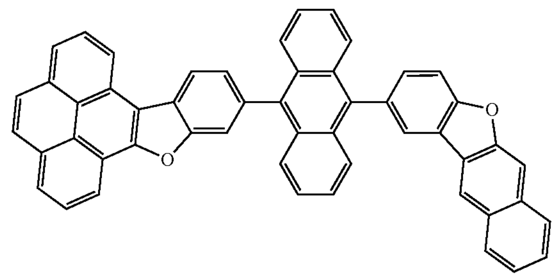
EX155
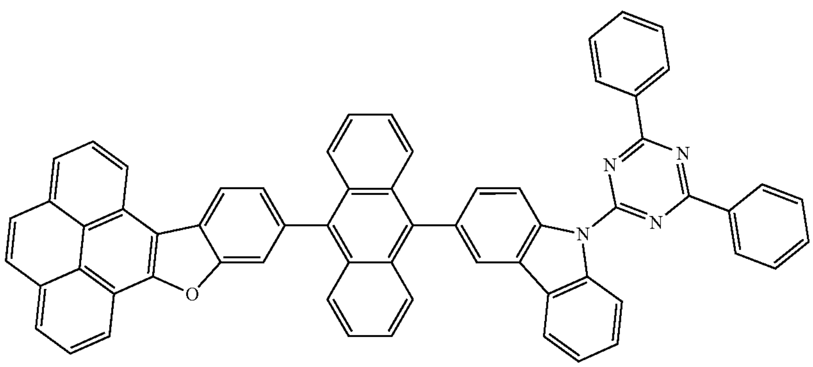
EX156
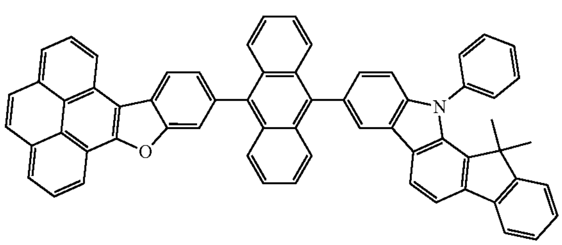
EX157
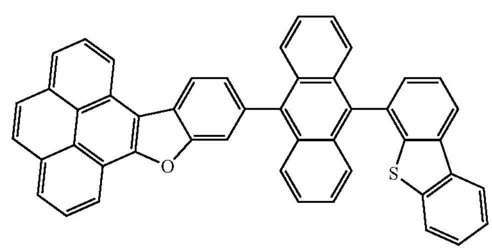
EX158
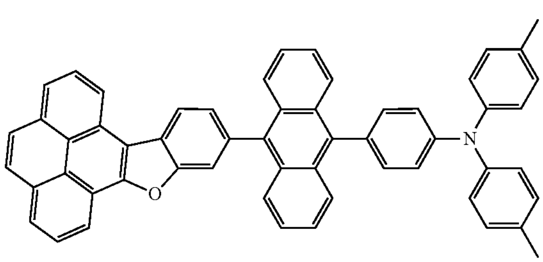
EX159
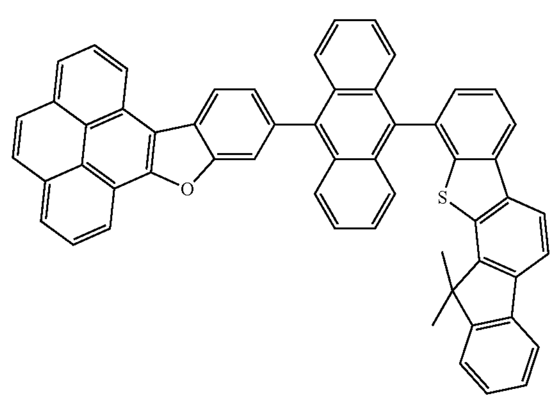

-continued
EX160
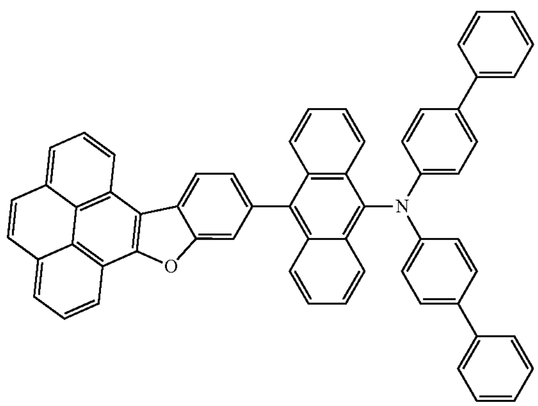
EX161
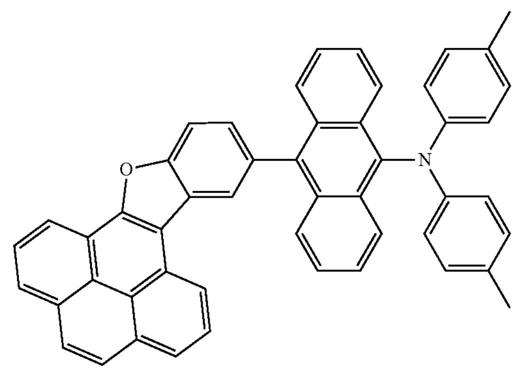
EX162
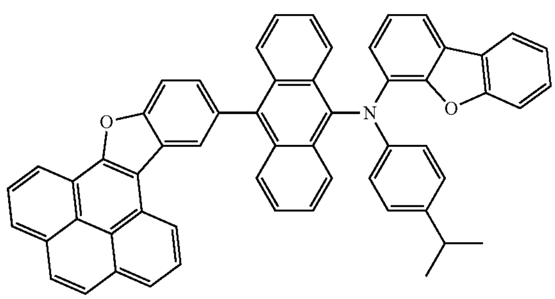
EX163
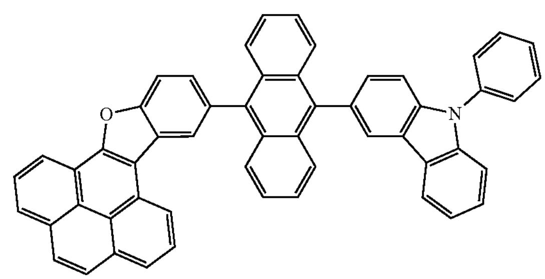
EX164
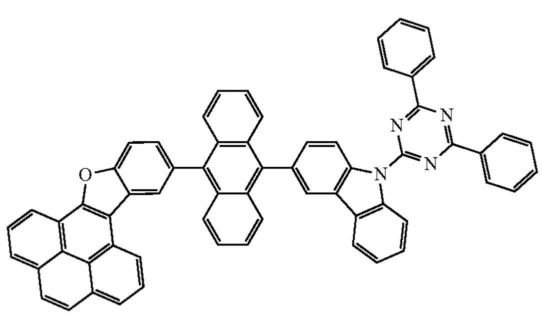
EX165
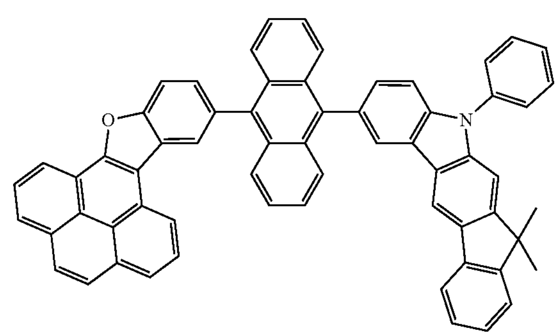
EX166
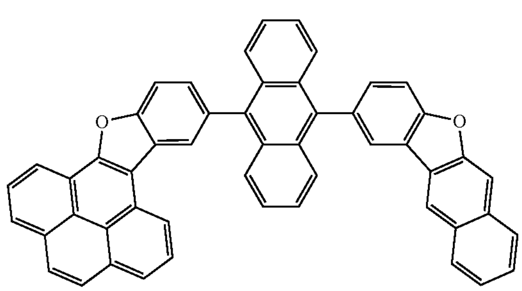
EX167
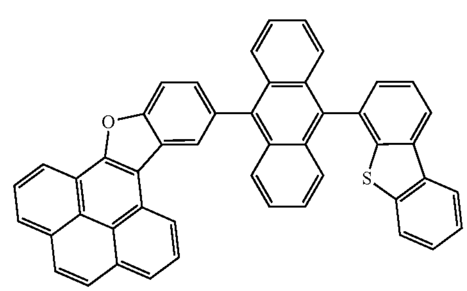

-continued
EX168
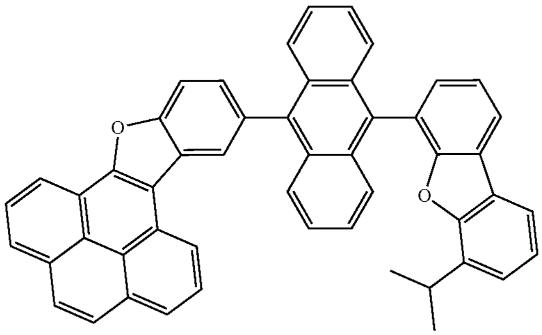
EX169
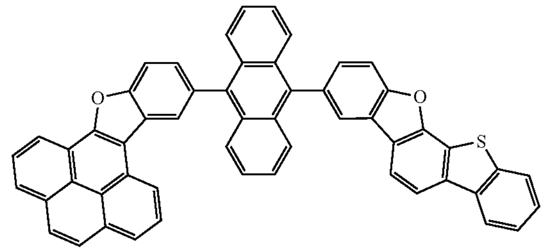
EX170
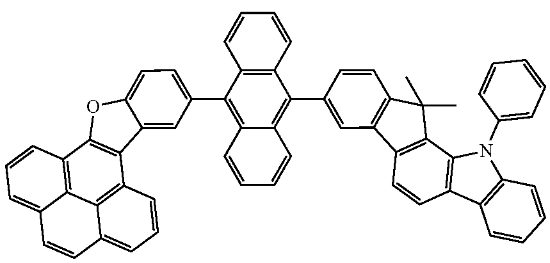
EX171
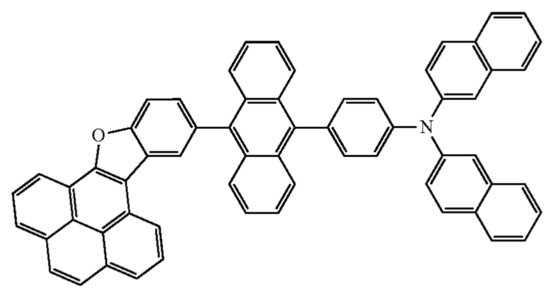
EX172
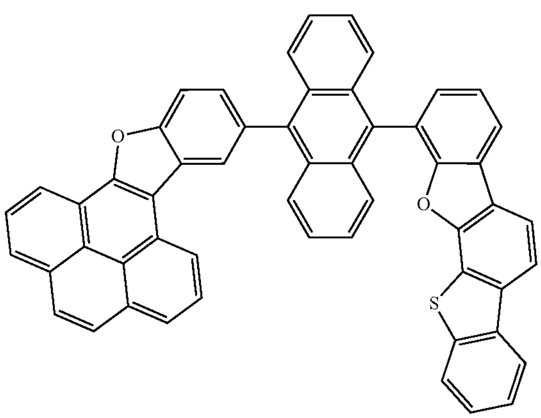
EX173
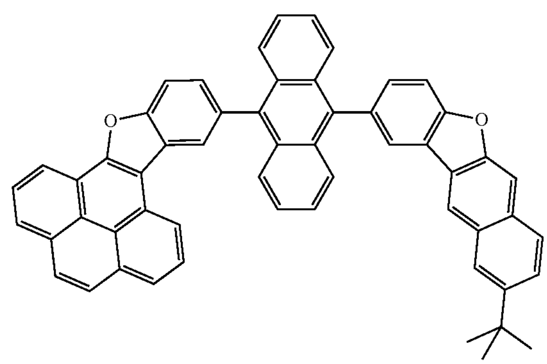
EX174
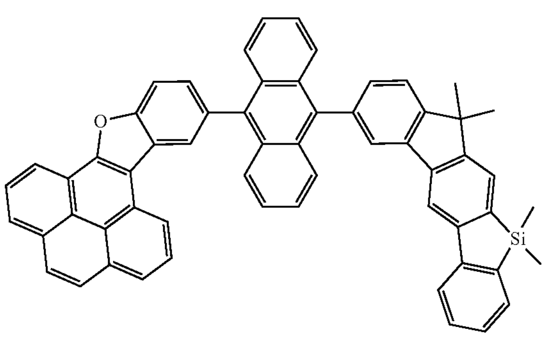
EX175
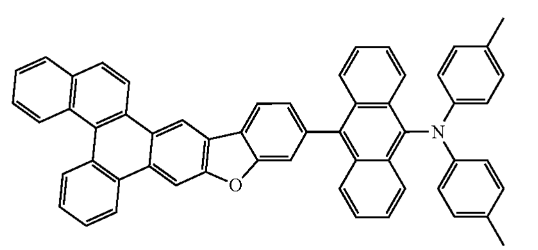

-continued
EX176
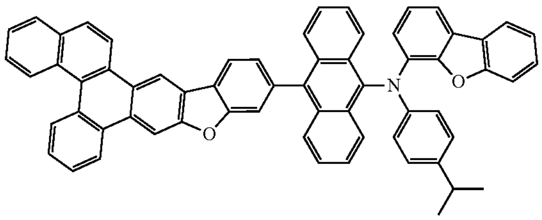
EX177
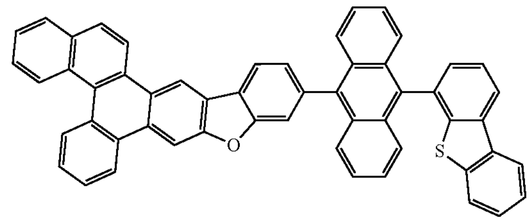
EX178
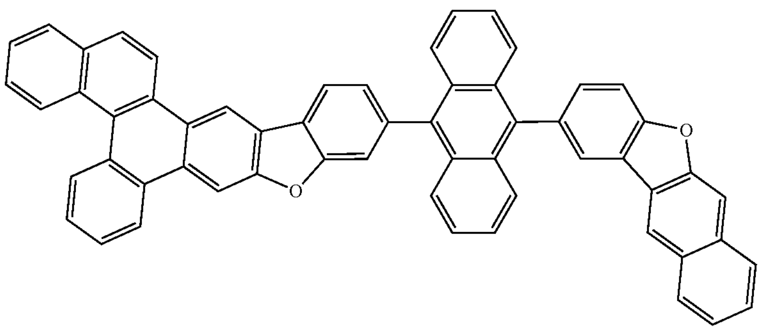
EX179
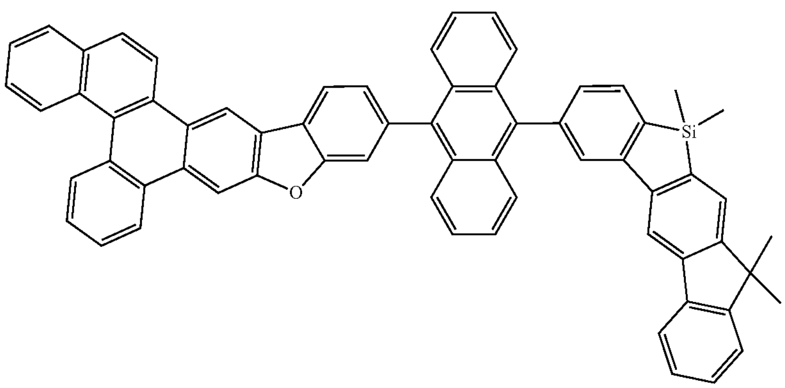
EX180
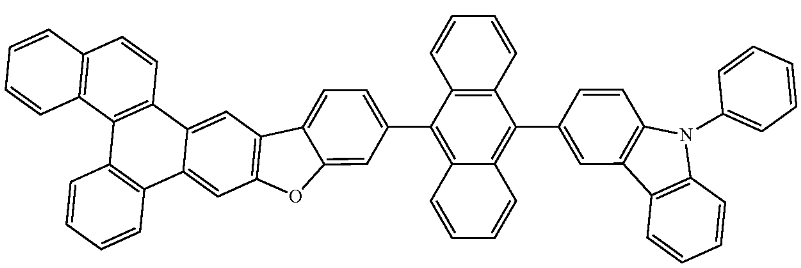
EX181
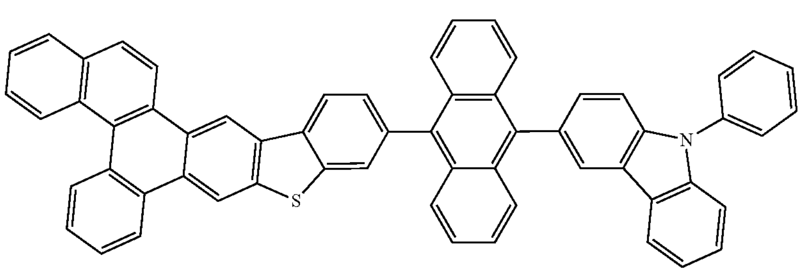

-continued
EX182
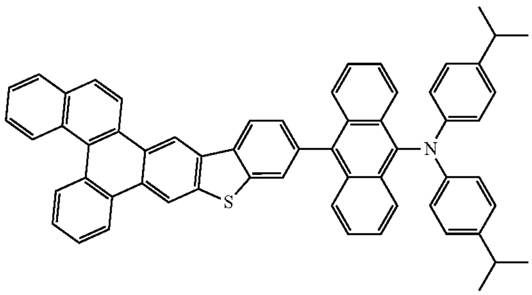
EX183
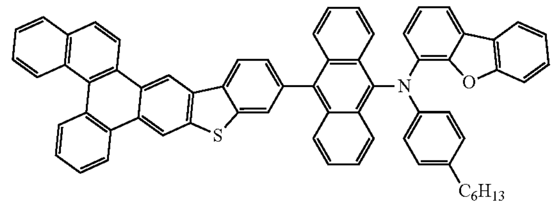
EX184
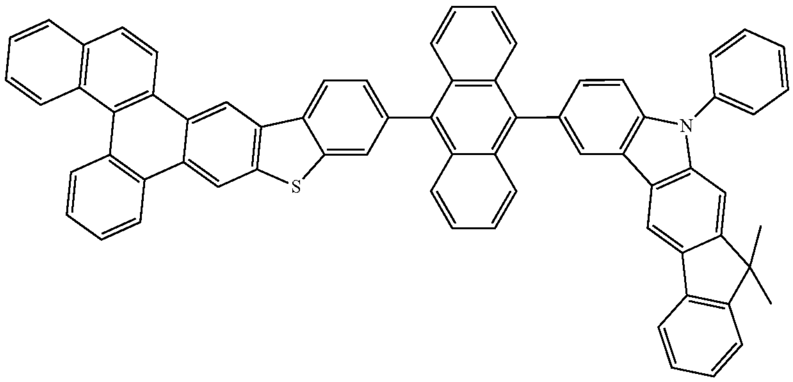
EX185
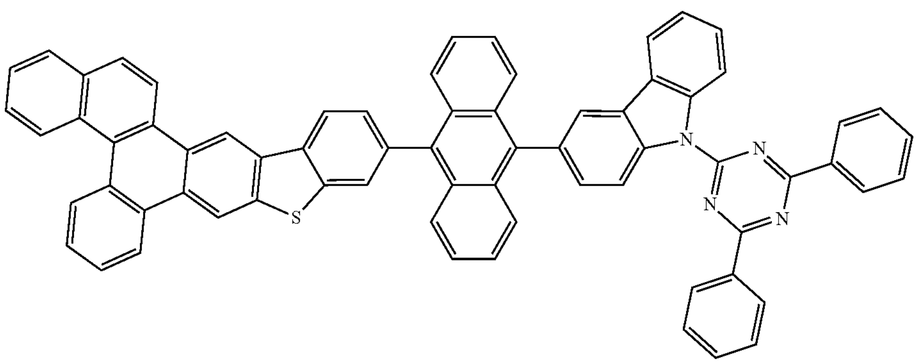
EX186
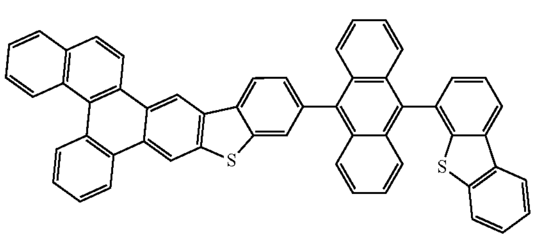
EX187
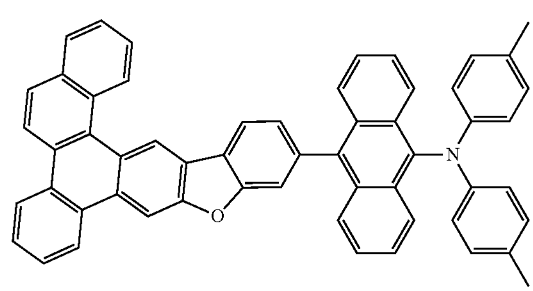

-continued
EX188
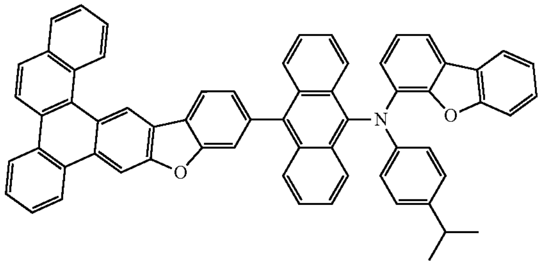
EX189
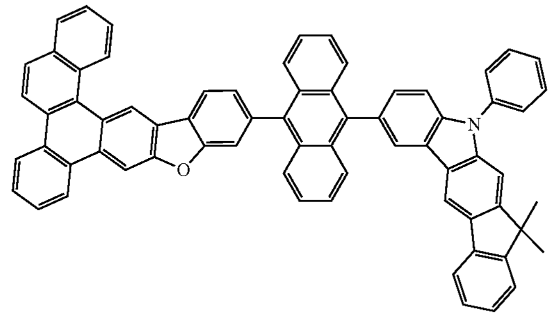
EX190
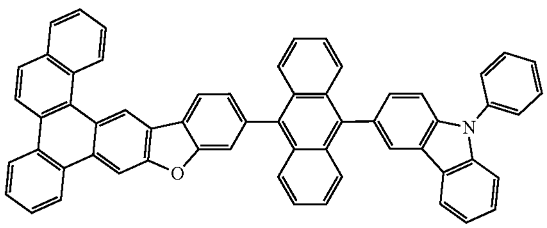
EX191
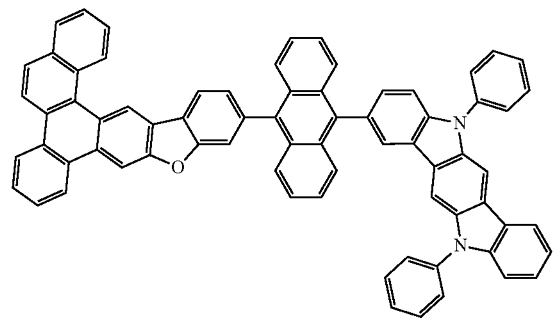
EX192
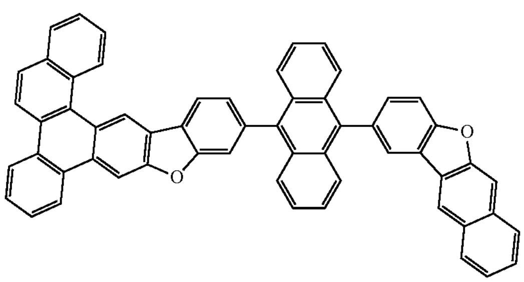
EX193
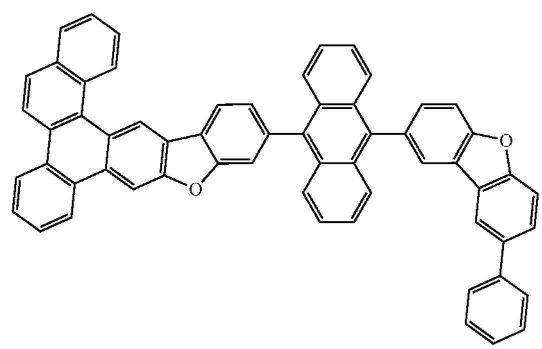
EX194
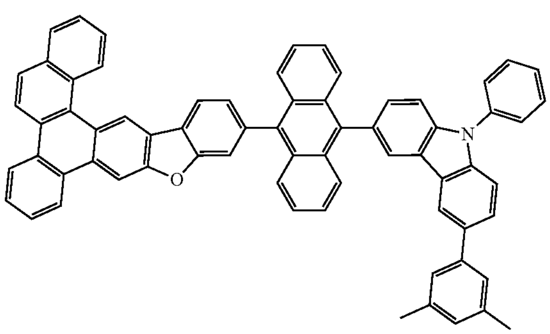
EX195
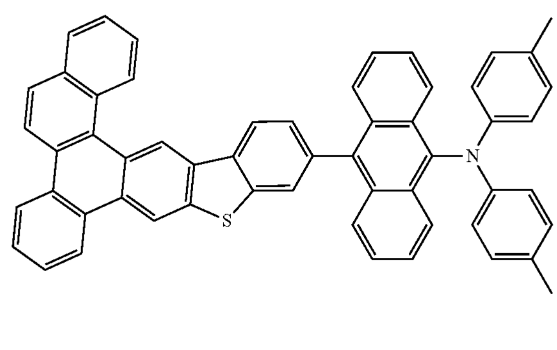

-continued
EX196
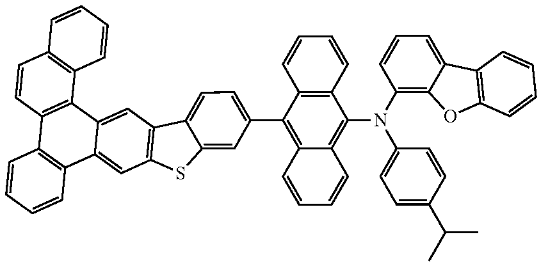
EX197
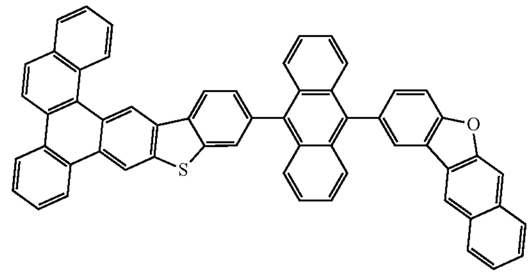
EX198
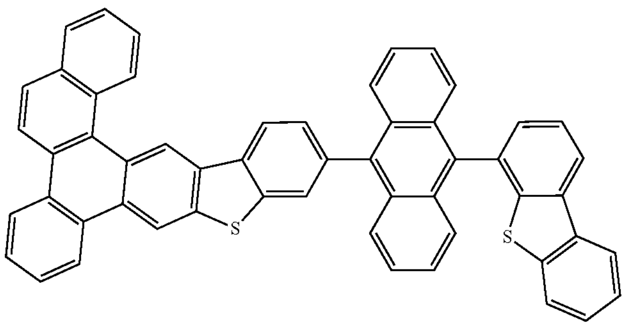
EX199
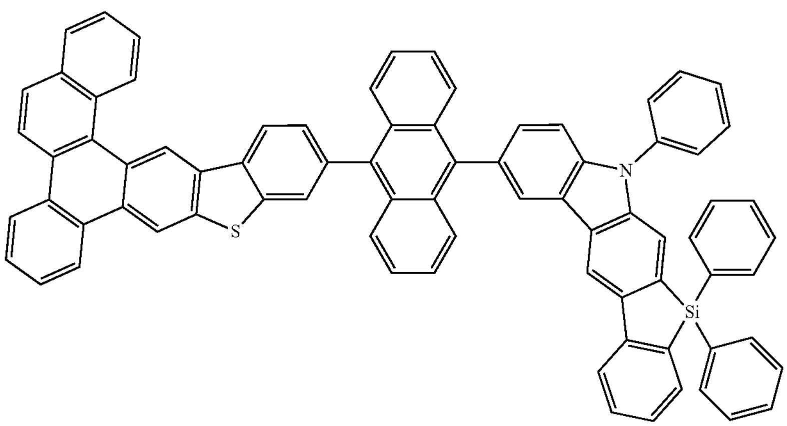
EX200
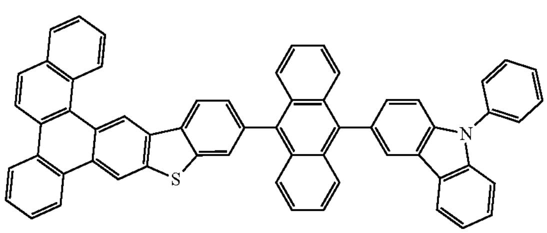
EX201
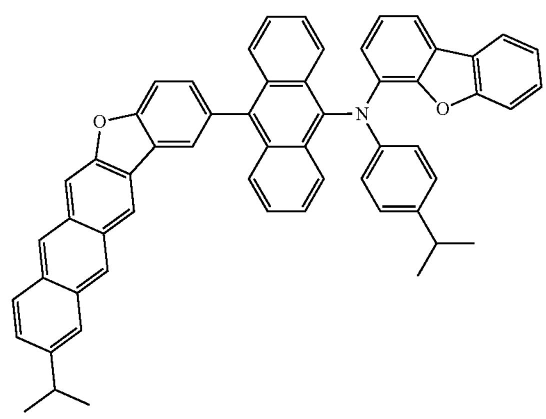

-continued

EX202

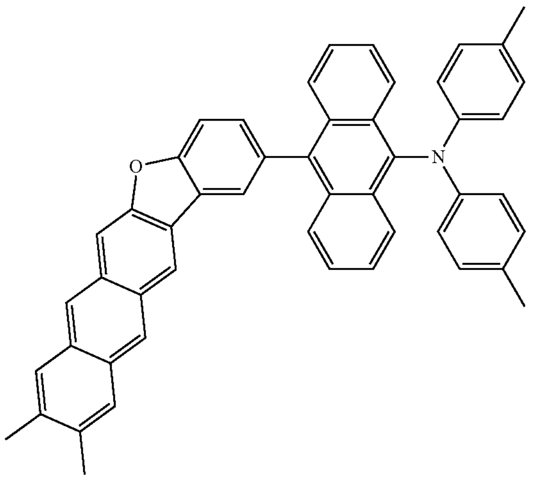

EX203

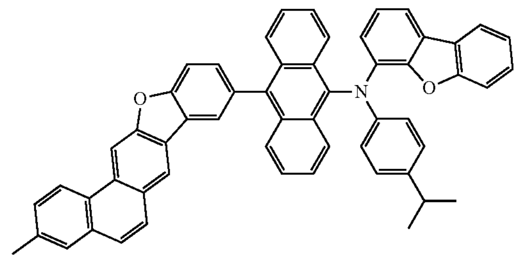

and

EX204

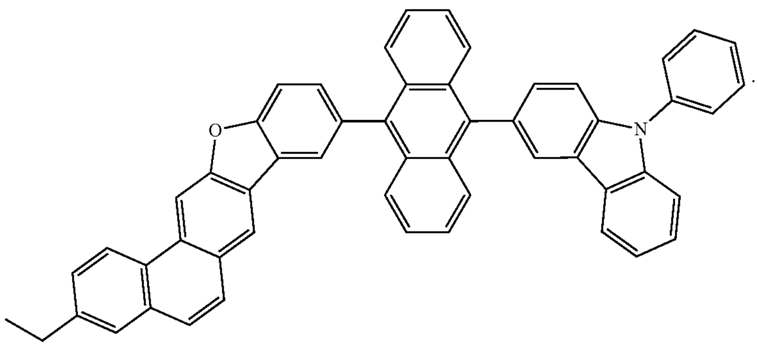

In another embodiment of the present invention, an organic electroluminescence device is disclosed. The organic electroluminescence device comprises a pair of electrodes composed of a cathode and an anode, and a light emitting layer and one or more organic thin film layers between the pair of electrodes. At least one of the light emitting layer and the organic thin film layer comprises the organic compound of formula (1).

In some embodiments, the light emitting layer comprising the organic compound of formula (1) is a host material. The host material may be a phosphorescent host material or a fluorescent host material. In certain embodiments, the light emitting layer comprising the organic compound of formula (1) is used as a fluorescent dopant material.

In some embodiments, the organic thin film layer may comprise an organic compound of formula (1) as a material of electron transporting layer (ETM) or a material of hole blocking layer (HBM).

In a further embodiment of the present invention, the organic electroluminescence device is a lighting panel. In other embodiment of the present invention, the organic electroluminescence device is a backlight panel.

Detailed preparation of the organic compounds of the present invention will be clarified by exemplary embodiments below, but the present invention is not limited thereto. EXAMPLES 1 to 15 show the preparation of the organic compounds of the present invention, and EXAMPLES 16 show the fabrication and test reports of the organic EL devices.

Example 1

Synthesis of EX1

Synthesis of Intermediate A

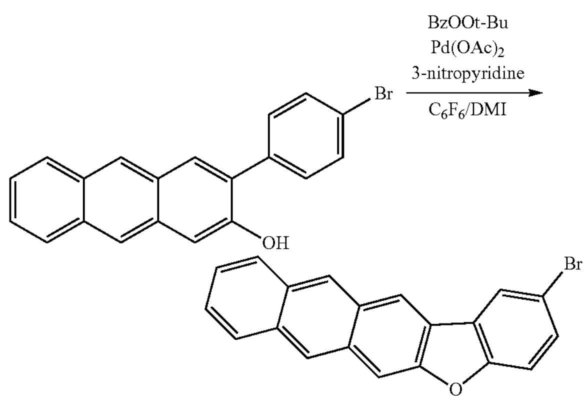

Intermediate A

A mixture of 10 g (28.6 mole) of 3-(4-bromophenyl) anthracen-2-ol, 0.66 g (2.93 mmole) of $Pd(OAc)_2$, 0.37 g (2.93 mmole) of 3-Nitropyridine, 11.4 g (58.6 mmole) of Tert-butyl peroxybenzoate, 100 ml of DMI, and 50 ml of $C_6F_6$ was placed under nitrogen, and then heated at 80° C. while stirring for 16 h. After the reaction finished, the mixture was allowed to cool to room temperature. The solution was extracted with dichloromethane and water. The organic layer was dried with anhydrous magnesium sulfate and then the solvent was evaporated under reduced pressure. The residue was purified by column chromatography on silica to give product (4.3 g, 43%) as a white solid.

Synthesis of Intermediate B

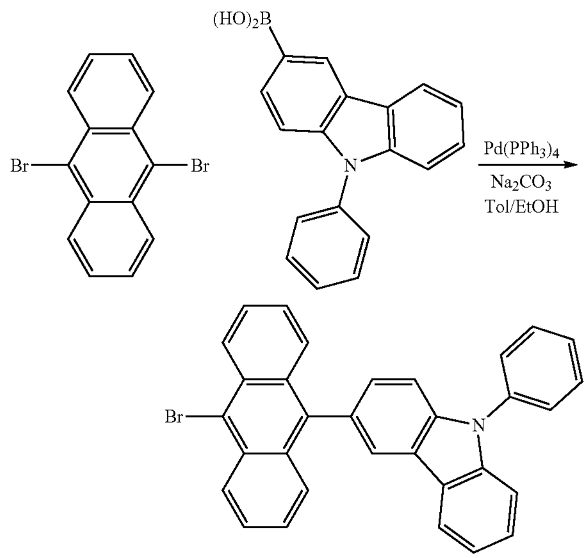

Intermediate B

A mixture of 15.0 g (44.6 mmole) of 9,10-Dibromoanthracene, 15.4 g (53.5 mmole) of 9-Phenylcarbazole-3-boronic acid, 1.0 g (0.89 mmole) of $Pd(PPh_3)_4$, 0.63 g (1.8 mmole) of 2-Dicyclophosphine-2',6'-dimethoxybiphenyl, 7.1 g (66.9 mmole) of $Na_2CO_3$, 225 ml of Toluene and 75 ml of Ethanol, and 34 ml of $H_2O$ was placed under nitrogen, and then heated at 80° C. while stirring for 16 h. After the reaction finished, the mixture was allowed to cool to room temperature. The solution was extracted with 100 ml of ethyl acetate (3 times) and then 300 ml of water. The organic layer was dried with anhydrous magnesium sulfate, and then the solvent was evaporated under reduced pressure. The residue was purified by column chromatography on silica to give product (15.8 g, 71%) as a white solid.

Synthesis of Intermediate C

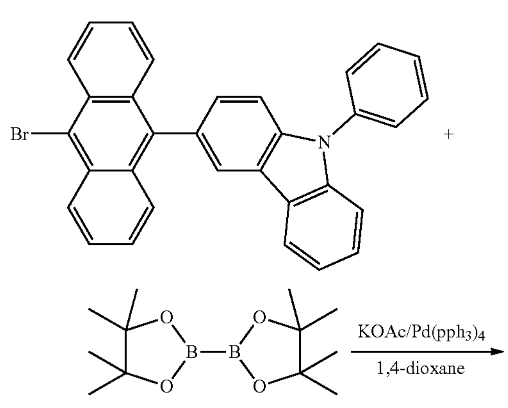

-continued

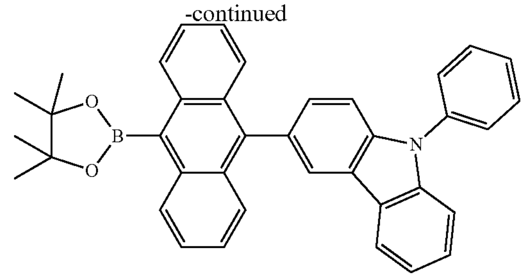

Intermediate C

A mixture of 15.8 g (31.7 mmole) of Intermediate B, 9.7 g (38.0 mmol) of bis(pinacolato)diboron, 0.7 g (0.63 mmol) of $Pd(PPh_3)_4$, 9.3 g (95.1 mmol) of potassium acetate, and 450 ml of 1,4-dioxane was degassed and placed under nitrogen, and then heated at 90° C. for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (13.0 g, 75%) as a off-white solid.

Synthesis of EX1

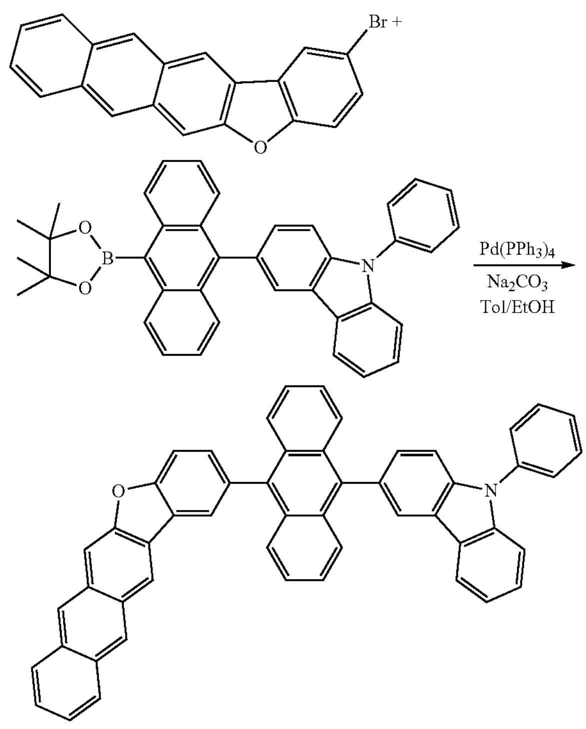

A mixture of 5.0 g (14.4 mmole) of Intermediate A, 9.4 g (17.3 mmole) of Intermediate C, 0.33 g (0.3 mmole) of $Pd(PPh_3)_4$, 0.2 g (0.58 mmole) of 2-Dicyclophosphine-2',6'-dimethoxybiphenyl, 2.3 g (21.6 mmole) of $Na_2CO_3$, 75 ml of Toluene and 25 ml of Ethanol, and 11 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.8 g, 59%) of yellow product, which was recrystallized from EtOH. MS(m/z, $EI^+$):686.8

Example 2

Synthesis of EX5

Synthesis of Intermediate D

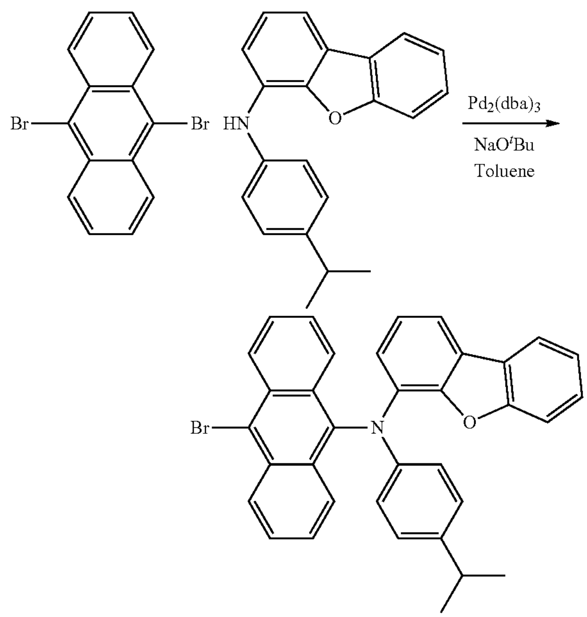

Intermediate D

A mixture of 15.0 g (44.6 mmole) of 9,10-Dibromoanthracene, 16.1 g (53.5 mmole) of N-(4-isopropylphenyl) dibenzofuran-4-amine, 2.0 g (2.2 mmole) of $Pd_2(dba)_3$, 8.5 g (89.2 mmole) of Sodium tert-butoxide, and 300 ml of Toluene was placed under nitrogen, and then heated at 110° C. while stirring for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (14.6 g, 59%) as a brown solid.

Synthesis of Intermediate E

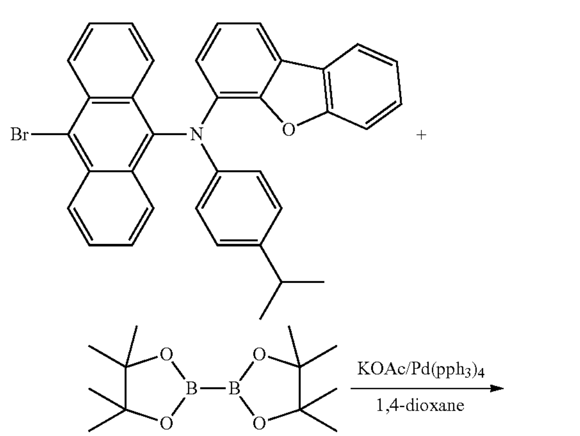

-continued

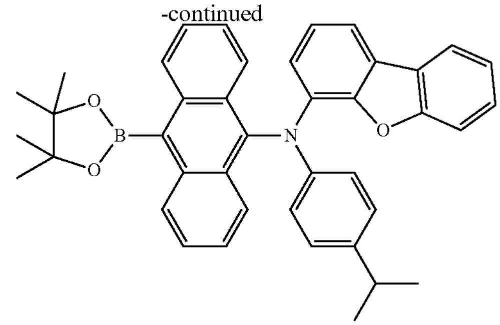

Intermediate E

A mixture of 14.6 g (26.3 mmole) of Intermediate D, 8.0 g (31.6 mmol) of bis(pinacolato)diboron, 0.6 g (0.5 mmol) of $Pd(PPh_3)_4$, 7.7 g (78.9 mmol) of potassium acetate, and 440 ml of 1,4-dioxane was degassed and placed under nitrogen, and then heated at 90° C. for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (10.8 g, 68%) as a yellow solid.

Synthesis of EX5

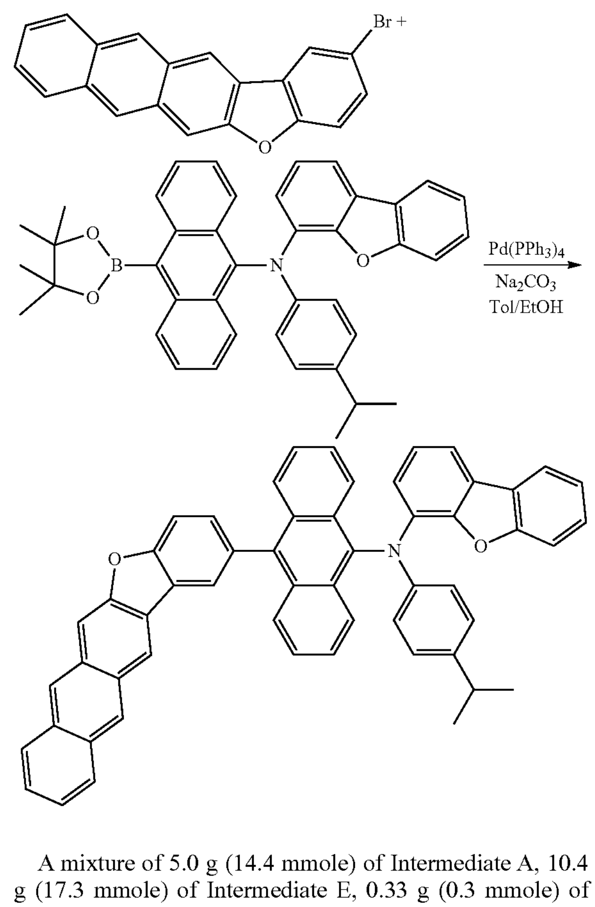

A mixture of 5.0 g (14.4 mmole) of Intermediate A, 10.4 g (17.3 mmole) of Intermediate E, 0.33 g (0.3 mmole) of $Pd(PPh_3)_4$, 0.2 g (0.58 mmole) of 2-Dicyclophosphine-2', 6'-dimethoxybiphenyl, 2.3 g (21.6 mmole) of $Na_2CO_3$, 75 ml of Toluene and 25 ml of Ethanol, and 11 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.6 g, 53%) of yellow product, which was recrystallized from EtOH. MS(m/z, $EI^+$):744.9

Example 3

Synthesis of EX6

Synthesis of Intermediate F

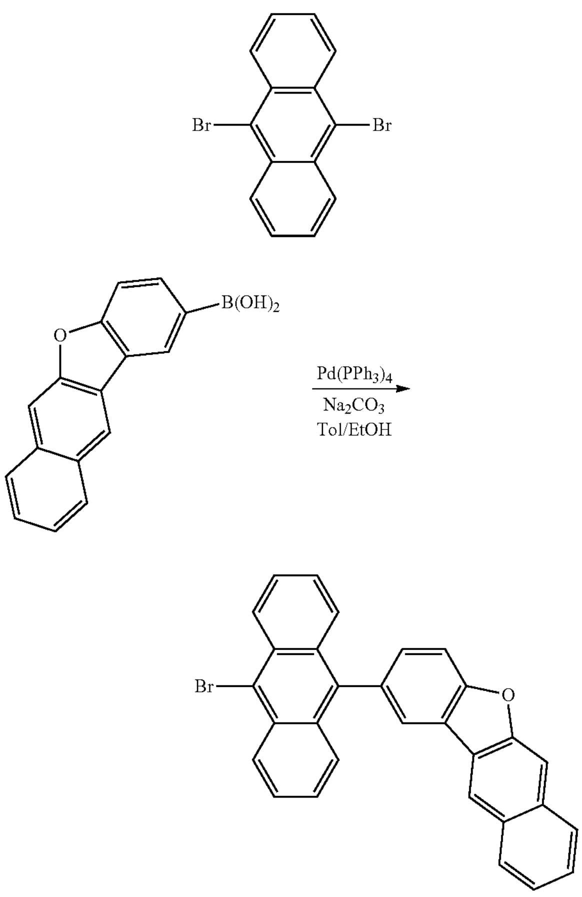

Intermediate F

A mixture of 5.4 g (16.0 mmole) of 9,10-Dibromoanthracene, 5.0 g (19.1 mmole) of Naphtho[2,3-b]benzofuran-2-ylboronic acid, 0.4 g (0.3 mmole) of $Pd(PPh_3)_4$, 0.2 g (0.6 mmole) of 2-Dicyclophosphine-2',6'-dimethoxy-biphenyl, 2.5 g (24.0 mmole) of $Na_2CO_3$, 120 ml of Toluene and 40 ml of Ethanol, and 12 ml of $H_2O$ was placed under nitrogen, and then heated at 80° C. while stirring for 16 h. After the reaction finished, the mixture was allowed to cool to room temperature. The solution was extracted with 100 ml of ethyl acetate (3 times) and then 300 ml of water. The organic layer was dried with anhydrous magnesium sulfate, and then the solvent was evaporated under reduced pressure. The residue was purified by column chromatography on silica to give product (5.1 g, 67%) as a white solid.

Synthesis of Intermediate G

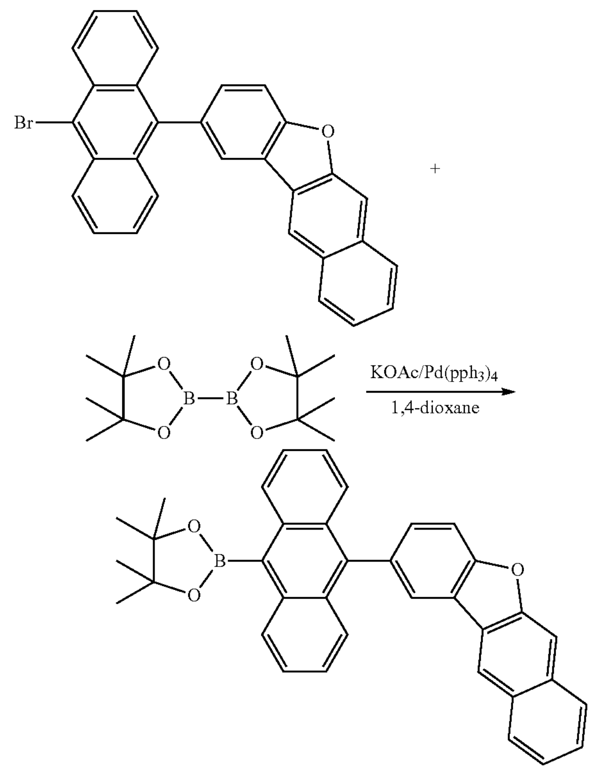

Intermediate G

A mixture of 5.1 g (10.7 mmole) of Intermediate F, 3.3 g (12.9 mmol) of bis(pinacolato)diboron, 0.25 g (0.2 mmol) of $Pd(PPh_3)_4$, 3.1 g (32.1 mmol) of potassium acetate, and 150 ml of 1,4-dioxane was degassed and placed under nitrogen, and then heated at 90° C. for 16 h. After the reaction finished, the mixture was allowed to cool to room temperature. The solution was extracted with 100 ml of ethyl acetate (3 times) and then 200 ml of water. The organic layer was dried with anhydrous magnesium sulfate, and then the solvent was evaporated under reduced pressure. The residue was purified by column chromatography on silica to give product (3.5 g, 63%) as a off-white solid.

Synthesis of EX6

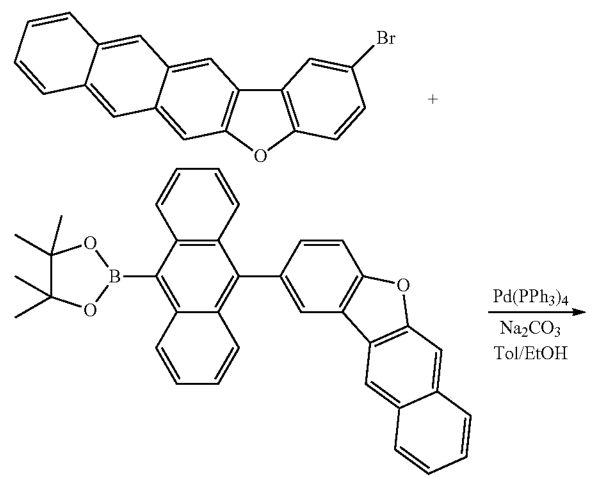

-continued

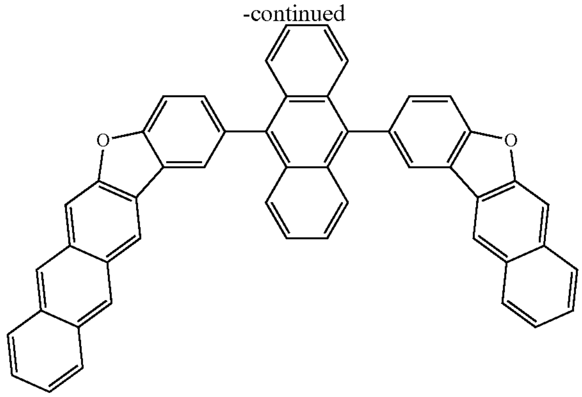

A mixture of 5.0 g (14.4 mmole) of Intermediate A, 9.0 g (17.3 mmole) of Intermediate G, 0.33 g (0.3 mmole) of $Pd(PPh_3)_4$, 0.2 g (0.58 mmole) of 2-Dicyclophosphine-2',6'-dimethoxybiphenyl, 2.3 g (21.6 mmole) of $Na_2CO_3$, 75 ml of Toluene and 25 ml of Ethanol, and 11 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.4 g, 57%) of white product, which was recrystallized from EtOH. MS(m/z, $EI^+$):661.7

Example 4

Synthesis of EX12

Synthesis of Intermediate H

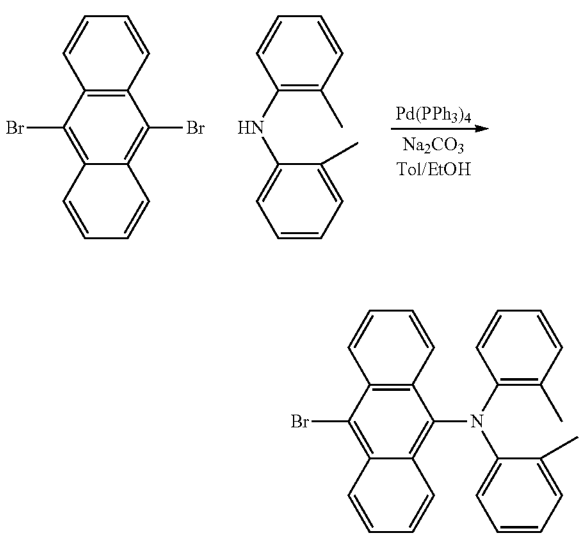

Intermediate H

A mixture of 15.0 g (44.6 mmole) of 9,10-Dibromoanthracene, 10.6 g (53.5 mmole) of 2-Methyl-N-(2-methylphenyl)aniline, 2.0 g (2.2 mmole) of $Pd_2(dba)_3$, 8.5 g (89.2 mmole) of Sodium tert-butoxide, and 300 ml of Toluene was placed under nitrogen, and then heated at 110° C. while stirring for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (12.5 g, 62%) as a brown oil.

Synthesis of Intermediate I

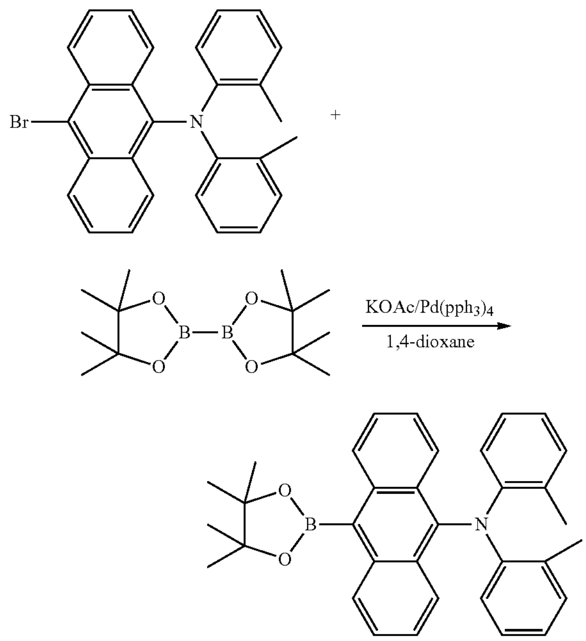

Intermediate I

A mixture of 12.5 g (27.7 mmole) of Intermediate H, 8.4 g (33.2 mmol) of bis(pinacolato)diboron, 0.6 g (0.5 mmol) of $Pd(PPh_3)_4$, 8.1 g (83.1 mmol) of potassium acetate, and 370 ml of 1,4-dioxane was degassed and placed under nitrogen, and then heated at 90° C. for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (8.4 g, 61%) as a yellow solid.

Synthesis of EX12

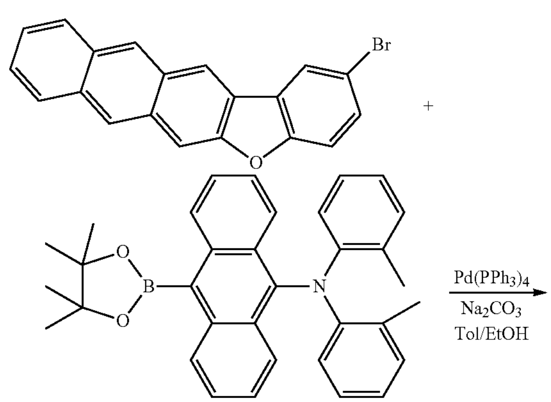

-continued

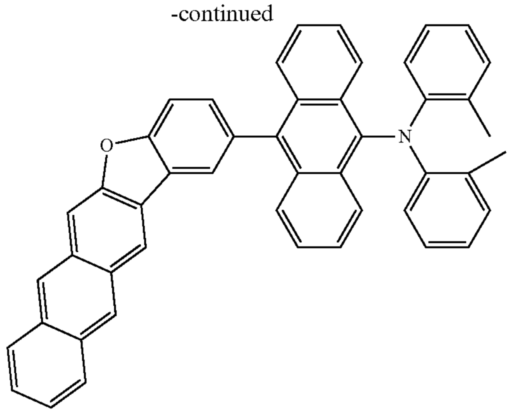

A mixture of 5.0 g (14.4 mmole) of Intermediate A, 8.6 g (17.3 mmole) of Intermediate I, 0.33 g (0.3 mmole) of $Pd(PPh_3)_4$, 0.2 g (0.58 mmole) of 2-Dicyclophosphine-2',6'-dimethoxybiphenyl, 2.3 g (21.6 mmole) of $Na_2CO_3$, 75 ml of Toluene and 25 ml of Ethanol, and 11 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.0 g, 54%) of white product, which was recrystallized from EtOH. MS(m/z, $EI^+$):640.8

Example 5

Synthesis of EX54

Synthesis of Intermediate J

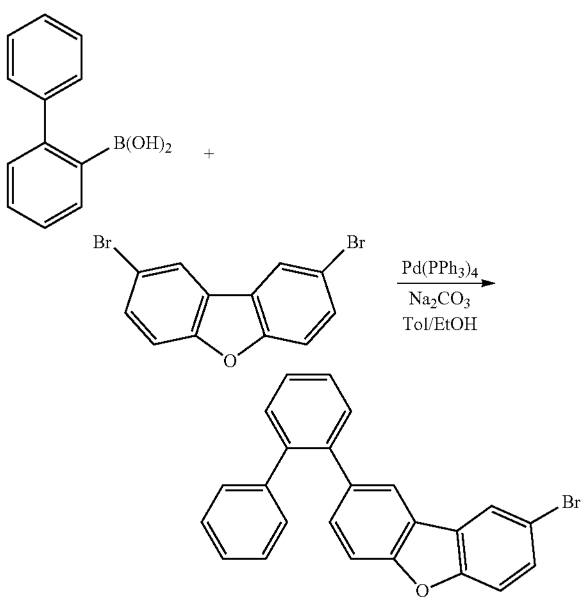

Intermediate J

A mixture of 32.6 g (100 mmol) of 2,8-dibromodibenzo[b,d]furan, 21.8 g (110 mmol) of biphenyl-2-ylboronic acid, 2.31 g (2 mmol) of $Pd(PPh_3)_4$, 75 ml of 2M $Na_2CO_3$, 150 ml of EtOH and 300 ml toluene was degassed and placed under nitrogen, and then heated at 100° C. for 12 h. After finishing the reaction, the mixture was allowed to cool to room temperature. The organic layer was extracted with ethyl acetate and water, dried with anhydrous magnesium sulfate, the solvent was removed and the residue was purified by column chromatography on silica to give product (25.1 g, 63%) as a white solid.

Synthesis of Intermediate K

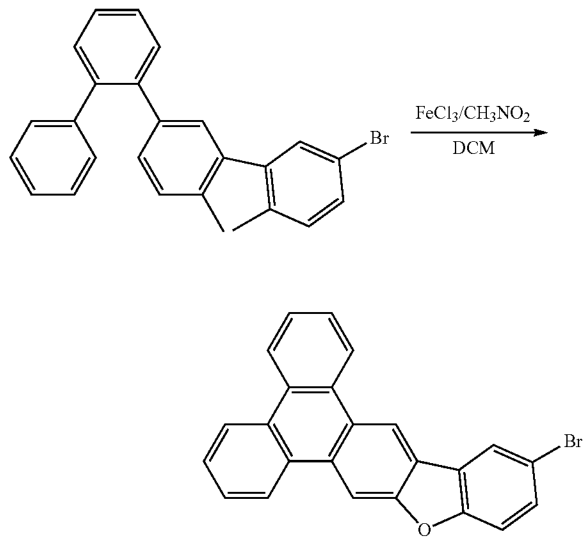

Intermediate K

In a 3000 ml three-necked flask that had been degassed and filled with nitrogen, 25.1 g (63 mmol) of Intermediate J was dissolved in anhydrous dichloromethane (1500 ml), 102.2 g (630 mmol) iron(III) chloride was then added, and the mixture was stirred one hour. Methanol 500 ml were added to the mixture and the organic layer was separated and the solvent removed in vacuo. The residue was purified by column chromatography on silica to give product (5.7 g, 23%) as a yellow solid.

Synthesis of EX54

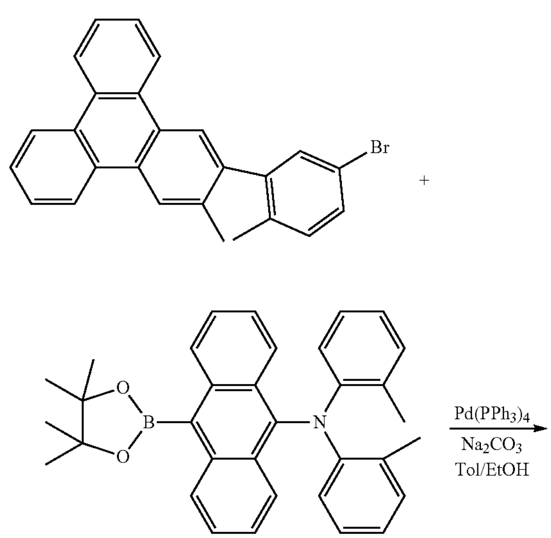

-continued

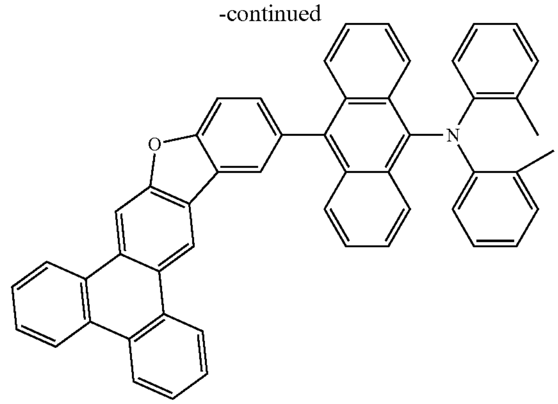

A mixture of 5.0 g (12.6 mmole) of Intermediate K, 7.5 g (15.1 mmole) of Intermediate I, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (4.2 g, 49%) of white product, which was recrystallized from EtOH. MS(m/z, $EI^+$):690.8

Example 6

Synthesis of EX56

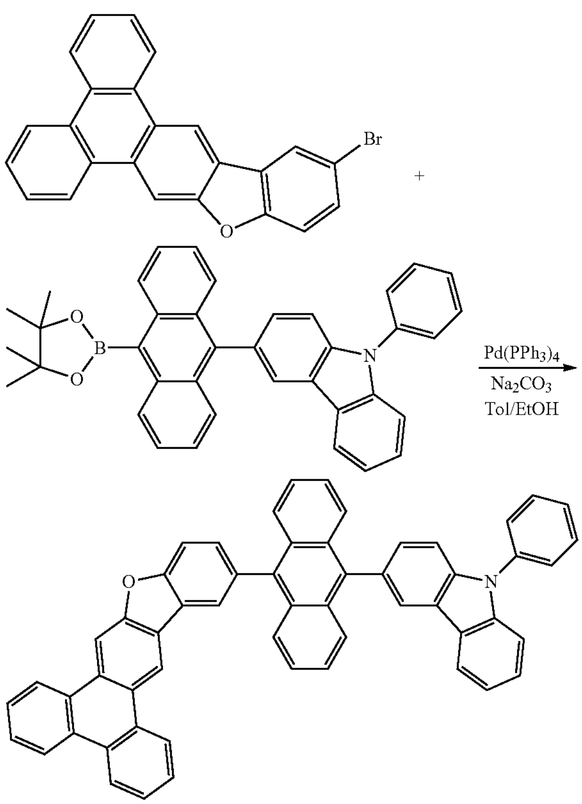

A mixture of 5.0 g (12.6 mmole) of Intermediate K, 8.2 g (15.1 mmole) of Intermediate G, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (4.8 g, 52%) of white product, which was recrystallized from EtOH. MS(m/z, $EI^+$):736.8

Example 7

Synthesis of EX57

Synthesis of Intermediate L

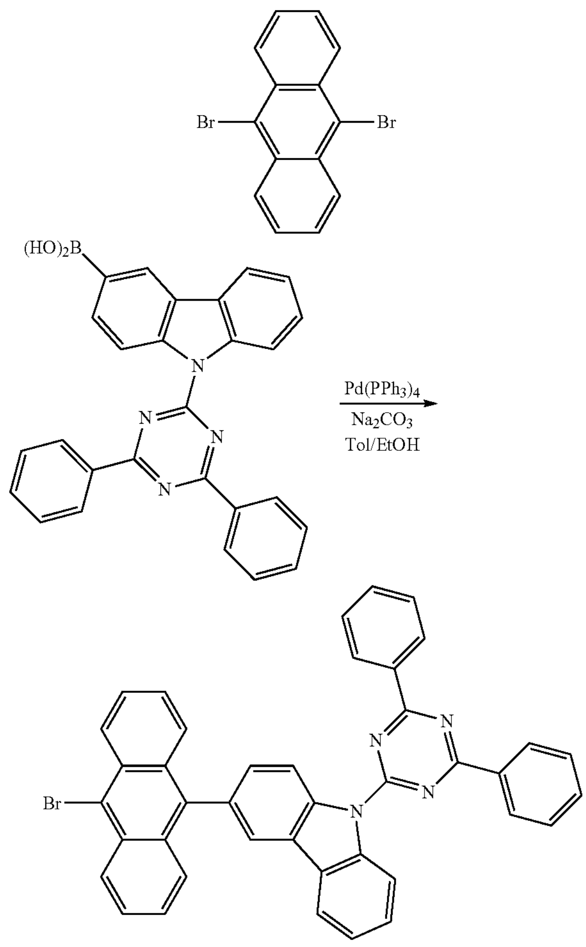

Intermediate L

A mixture of 7.5 g (22.3 mmole) of 9,10-Dibromoanthracene, 11.8 g (26.8 mmole) of (9-(4,6-diphenyl-1,3,5-triazin-2-yl)-9H-carbazol-3-yl)boronic acid, 0.5 g (0.44 mmole) of $Pd(PPh_3)_4$, 0.3 g (0.9 mmole) of 2-Dicyclophosphine-2',6'-dimethoxybiphenyl, 3.6 g (33.5 mmole) of $Na_2CO_3$,110 ml of Toluene and 35 ml of Ethanol, and 17 ml of $H_2O$ was placed under nitrogen, and then heated at 80° C. while stirring for 16 h. After the reaction finished, the mixture was allowed to cool to room temperature. The solution was extracted with 100 ml of ethyl acetate (3 times) and then 150 ml of water. The organic layer was dried with anhydrous magnesium sulfate, and then the solvent was evaporated under reduced pressure. The residue was purified by column chromatography on silica to give product (6.8 g, 47%) as a off-white solid.

Synthesis of Intermediate M

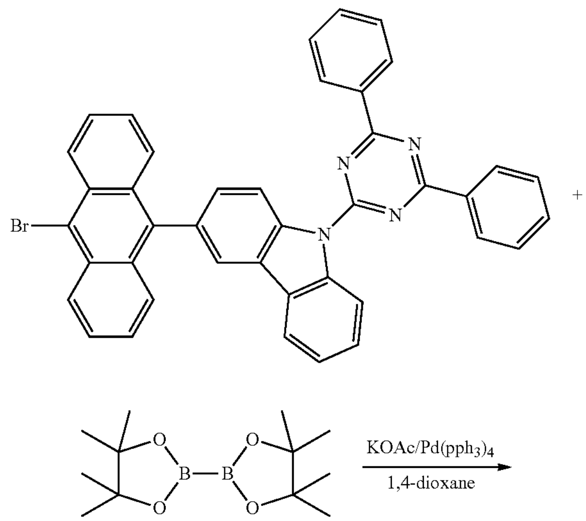

-continued

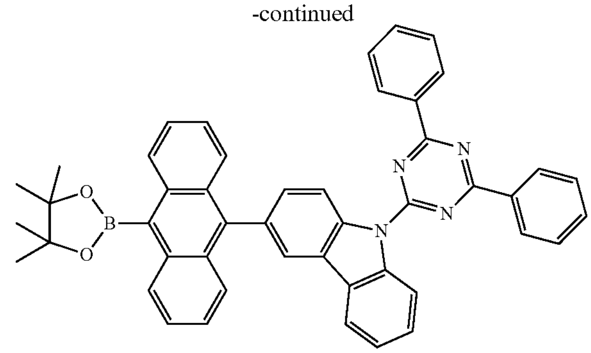

Intermediate M

A mixture of 6.8 g (10.5 mmole) of Intermediate L, 3.2 g (12.6 mmol) of bis(pinacolato)diboron, 0.25 g (0.21 mmol) of $Pd(PPh_3)_4$, 3.1 g (31.5 mmol) of potassium acetate, and 200 ml of 1,4-dioxane was degassed and placed under nitrogen, and then heated at 90° C. for 16 h. After the reaction finished, the mixture was allowed to cool to room temperature. The solution was extracted with 100 ml of ethyl acetate (3 times) and then 200 ml of water. The organic layer was dried with anhydrous magnesium sulfate, and then the solvent was evaporated under reduced pressure. The residue was purified by column chromatography on silica to give product (5.0 g, 68%) as a off-white solid.

Synthesis of EX57

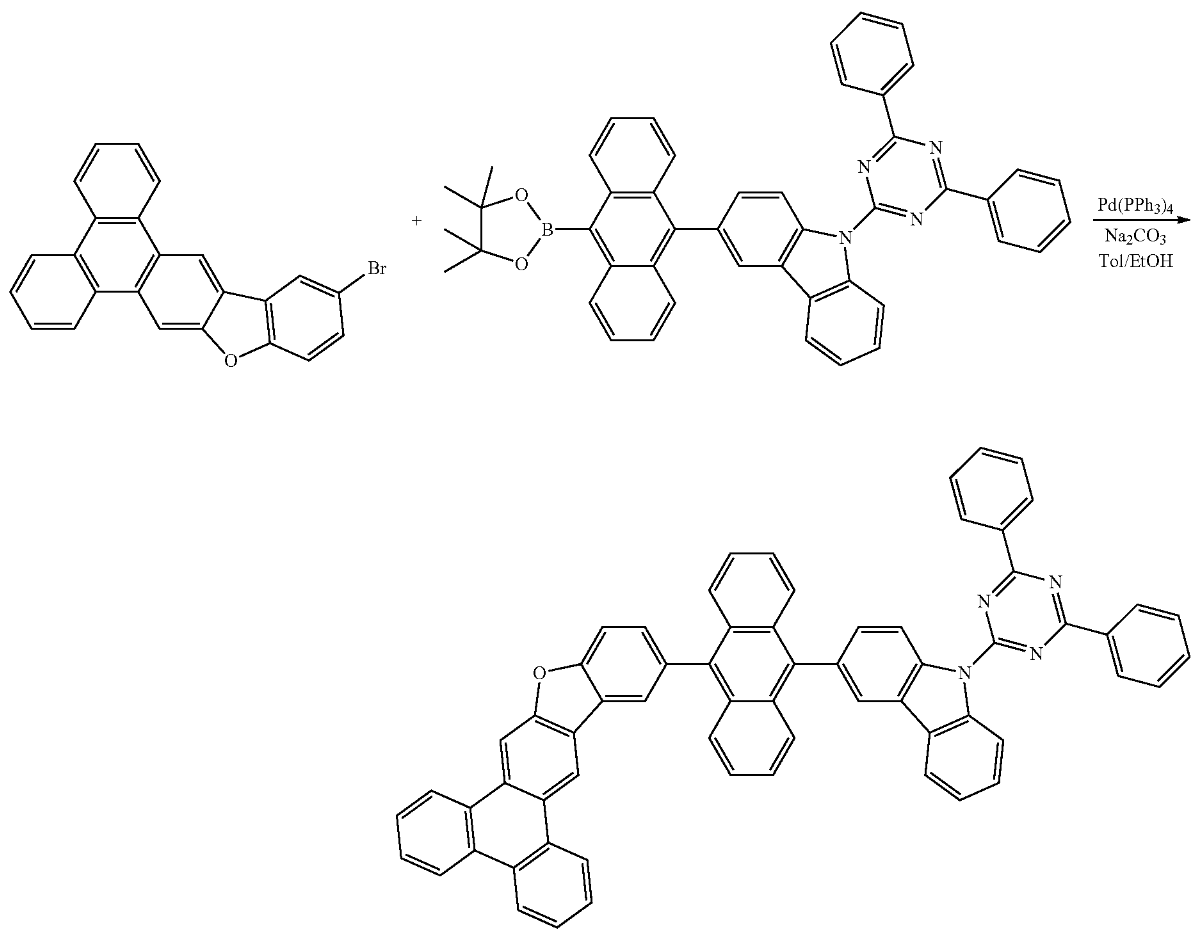 [SMILES: Brc1ccc2oc3cc4c5ccccc5c5ccccc5c4cc3c2c1 ; CC1(C)OB(c2c3ccccc3c(-c3ccc4c(c3)c3ccccc3n4-c3nc(-c4ccccc4)nc(-c4ccccc4)n3)c3ccccc23)OC1(C)C ; c1ccc(-c2nc(-c3ccccc3)nc(-n3c4ccccc4c4cc(-c5c6ccccc6c(-c6ccc7oc8cc9c%10ccccc%10c%10ccccc%10c9cc8c7c6)c6ccccc56)ccc43)n2)cc1 ; "Pd(PPh3)4"]

A mixture of 5.0 g (12.6 mmole) of Intermediate K, 10.6 g (15.1 mmole) of Intermediate M, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (6.6 g, 59%) of off-white product, which was recrystallized from EtOH. MS(m/z, $EI^+$):892.0

Example 8

Synthesis of EX58

Synthesis of EX58

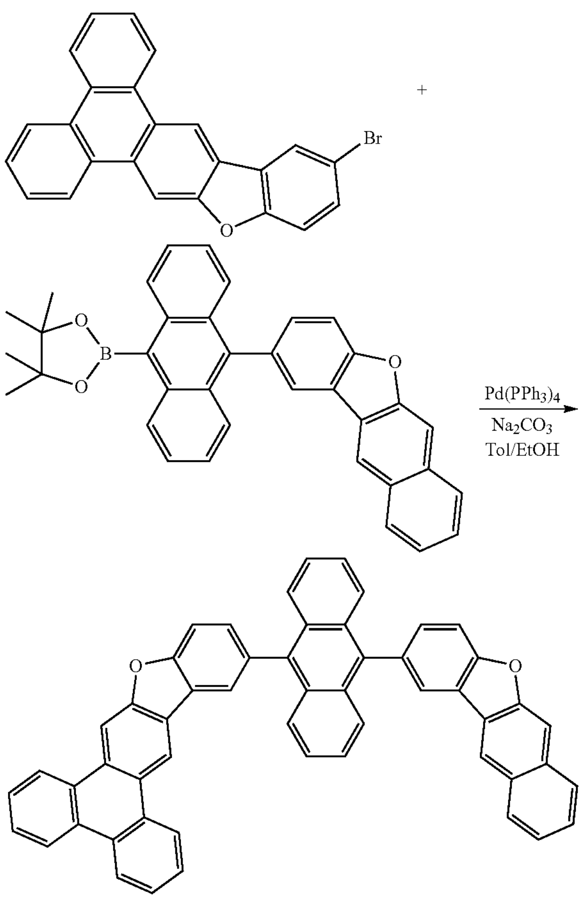

A mixture of 5.7 g (14.4 mmole) of Intermediate K, 9.0 g (17.3 mmole) of Intermediate G, 0.33 g (0.3 mmole) of $Pd(PPh_3)_4$, 0.2 g (0.58 mmole) of 2-Dicyclophosphine-2',6'-dimethoxybiphenyl, 2.3 g (21.6 mmole) of $Na_2CO_3$, 85 ml of Toluene and 30 ml of Ethanol, and 11 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.5 g, 54%) of white product, which was recrystallized from EtOH. MS(m/z, $EI^+$):711.8

Example 9

Synthesis of EX59

Synthesis of Intermediate N

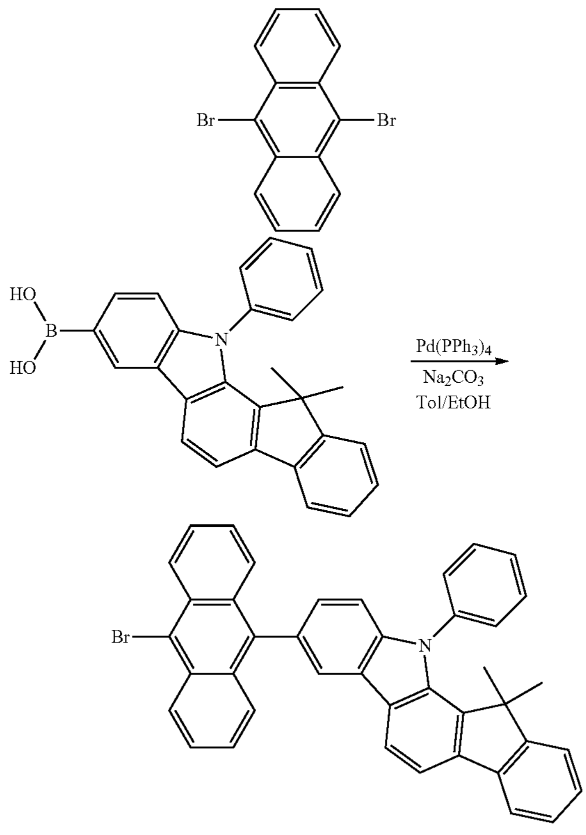

Intermediate N

A mixture of 15.0 g (44.6 mmole) of 9,10-Dibromoanthracene, 21.6 g (53.5 mmole) of (12,12-dimethyl-11-phenyl-11,12-dihydroindeno[2,1-a]carba-zol-8-yl)boronic acid, 2.0 g (2.2 mmole) of $Pd_2(dba)_3$, 8.5 g (89.2 mmole) of Sodium tert-butoxide, and 300 ml of Toluene was placed under nitrogen, and then heated at 110° C. while stirring for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (12.9 g, 47%) as a yellow solid.

Synthesis of Intermediate O

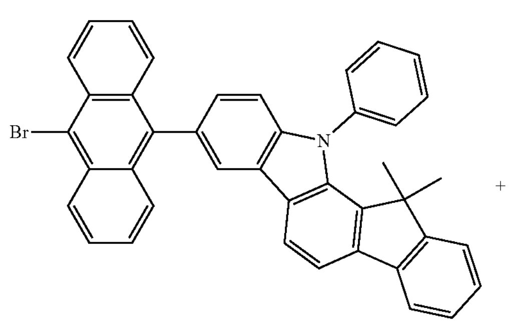

-continued

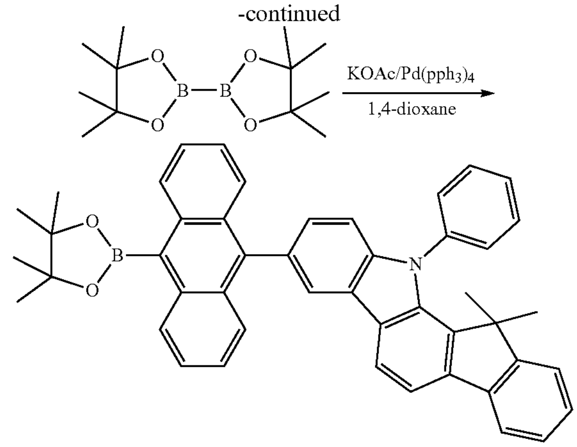

Intermediate O

A mixture of 12.9 g (20.9 mmole) of Intermediate N, 6.4 g (25.2 mmol) of bis(pinacolato)diboron, 0.5 g (0.4 mmol) of $Pd(PPh_3)_4$, 6.2 g (62.7 mmol) of potassium acetate, and 390 ml of 1,4-dioxane was degassed and placed under nitrogen, and then heated at 90° C. for 16 h. After the reaction finished, the mixture was allowed to cool to room temperature. The solution was extracted with 150 ml of ethyl acetate (3 times) and then 300 ml of water. The organic layer was dried with anhydrous magnesium sulfate, and then the solvent was evaporated under reduced pressure. The residue was purified by column chromatography on silica to give product (9.0 g, 65%) as a yellow solid.

Synthesis of EX59

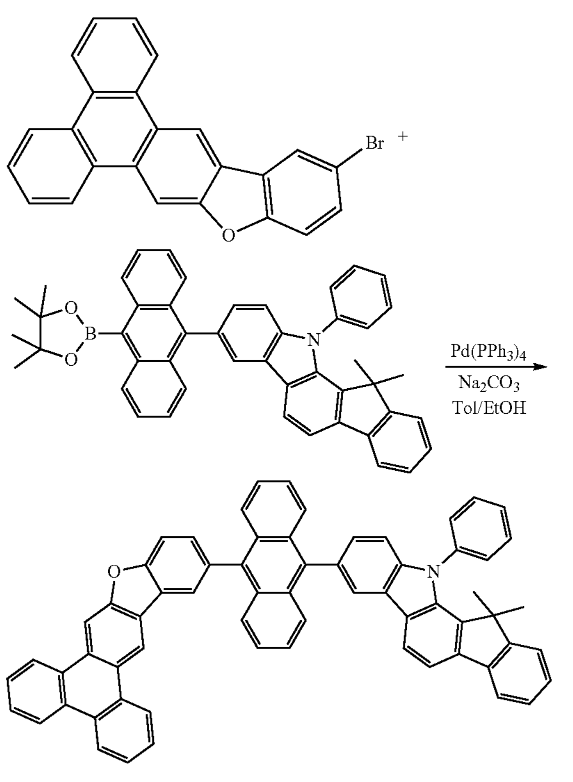

A mixture of 5.0 g (12.6 mmole) of Intermediate K, 10.0 g (15.1 mmole) of Intermediate O, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.0 g, 47%) of white product, which was recrystallized from EtOH. MS(m/z, $EI^+$):853.0

Example 10

Synthesis of EX63

Synthesis of Intermediate P

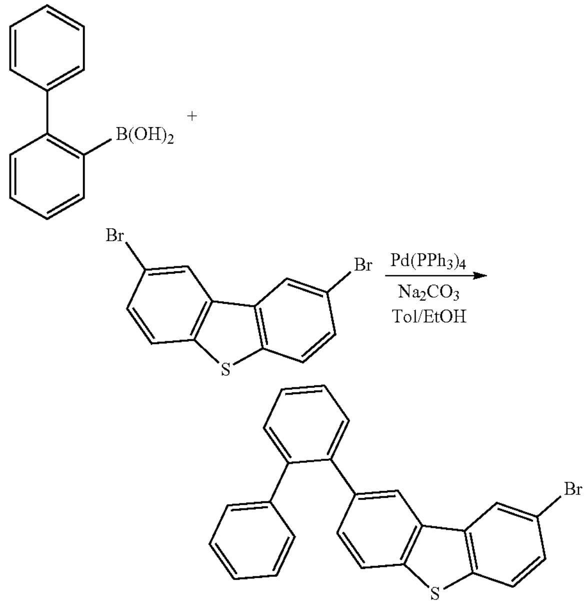

Intermediate P

A mixture of 34.2 g (100 mmol) of 2,8-Dibromodibenzo[b,d]thiophene, 21.8 g (110 mmol) of biphenyl-2-ylboronic acid, 2.31 g (2 mmol) of $Pd(PPh_3)_4$, 75 ml of 2M $Na_2CO_3$, 150 ml of EtOH and 300 ml toluene was degassed and placed under nitrogen, and then heated at 100° C. for 12 h. After finishing the reaction, the mixture was allowed to cool to room temperature. The organic layer was extracted with ethyl acetate and water, dried with anhydrous magnesium sulfate, the solvent was removed and the residue was purified by column chromatography on silica to give product (25.3 g, 61%) as a white solid.

Synthesis of Intermediate Q

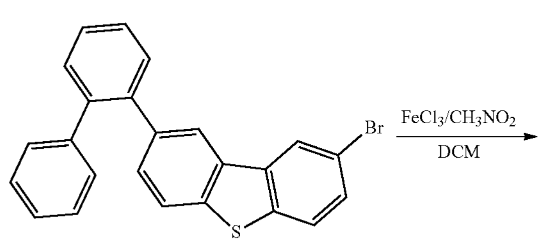

-continued

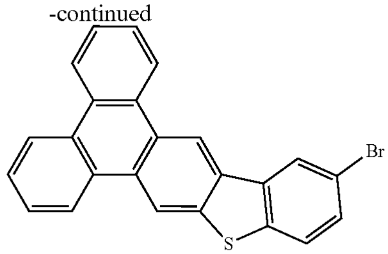

Intermediate Q

In a 3000 ml three-necked flask that had been degassed and filled with nitrogen, 25.3 g (61 mmol) of Intermediate P was dissolved in anhydrous dichloromethane (1500 ml), 98.9 g (610 mmol) iron(III) chloride was then added, and the mixture was stirred one hour. Methanol 500 ml were added to the mixture and the organic layer was separated and the solvent removed in vacuo. The residue was purified by column chromatography on silica to give product (6.8 g, 27%) as a yellow solid.

Synthesis of EX63

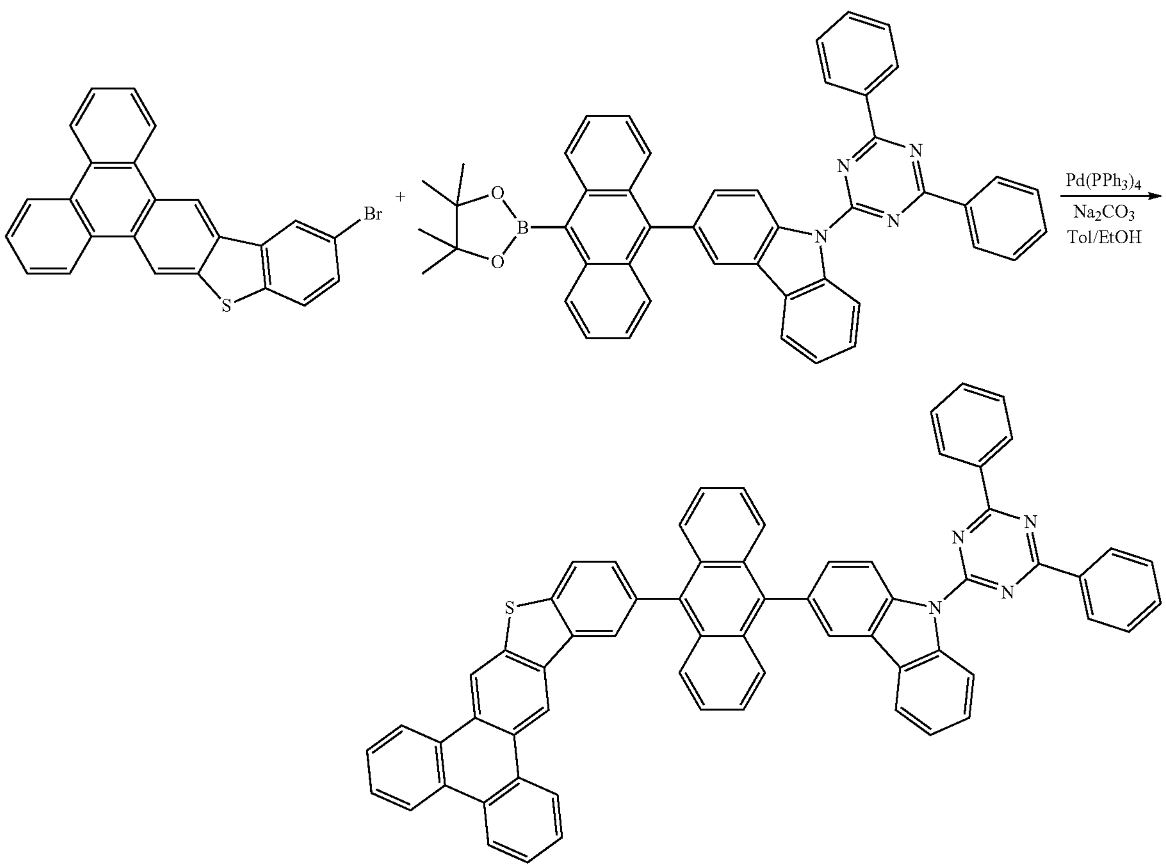

A mixture of 5.0 g (12.1 mmole) of Intermediate Q, 10.2 g (14.5 mmole) of Intermediate M, 0.28 g (0.24 mmole) of $Pd(PPh_3)_4$, 0.18 g (0.5 mmole) of 2-Dicyclophosphine-2',6'-dimethoxybiphenyl, 1.9 g (18.2 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.8 g, 53%) of yellow product, which was recrystallized from EtOH. MS(m/z, $EI^+$):908.0

Example 11

Synthesis of EX79

Synthesis of Intermediate R

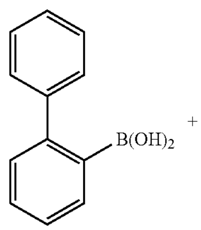

-continued

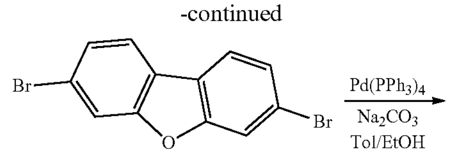

-continued

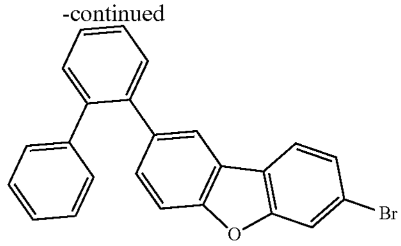

Intermediate R

A mixture of 32.6 g (100 mmol) of 3,7-dibromodibenzo[b,d]furan, 21.8 g (110 mmol) of biphenyl-2-ylboronic acid, 2.31 g (2 mmol) of $Pd(PPh_3)_4$, 75 ml of 2M $Na_2CO_3$, 150 ml of EtOH and 300 ml toluene was degassed and placed under nitrogen, and then heated at 100° C. for 12 h. After finishing the reaction, the mixture was allowed to cool to room temperature. The organic layer was extracted with ethyl acetate and water, dried with anhydrous magnesium sulfate, the solvent was removed and the residue was purified by column chromatography on silica to give product (24.3 g, 61%) as a white solid.

Synthesis of Intermediate S

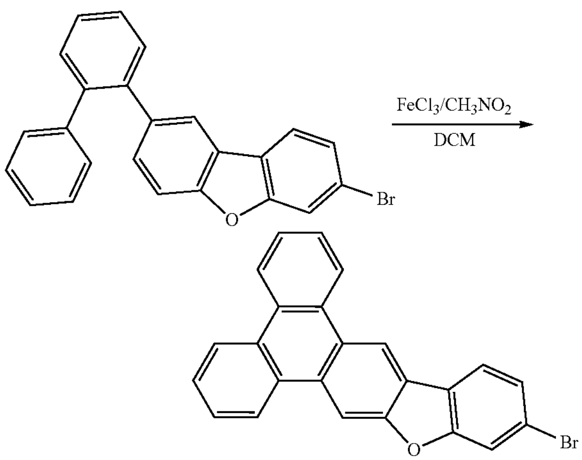

Intermediate S

In a 3000 ml three-necked flask that had been degassed and filled with nitrogen, 24.3 g (61 mmol) of Intermediate R was dissolved in anhydrous dichloromethane (1500 ml), 98.9 g (610 mmol) iron(III) chloride was then added, and the mixture was stirred one hour. Methanol 500 ml were added to the mixture and the organic layer was separated and the solvent removed in vacuo. The residue was purified by column chromatography on silica to give product (7.0 g, 29%) as a yellow solid.

Synthesis of EX79

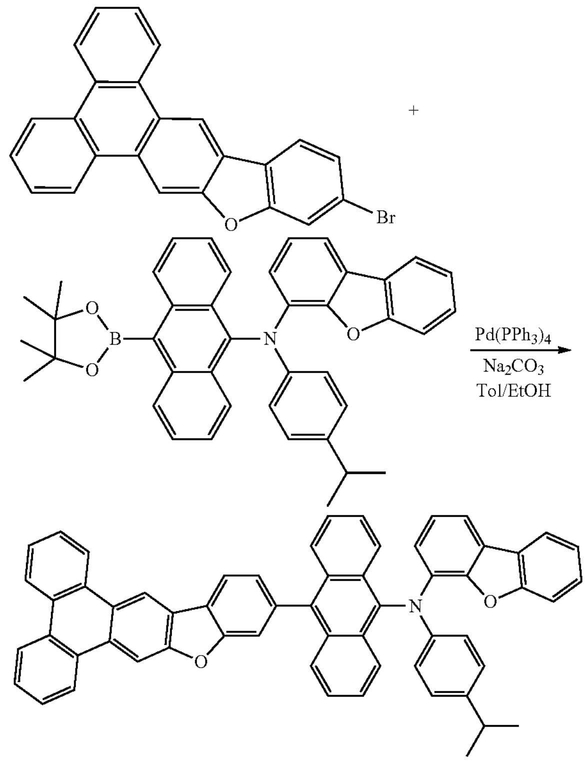

A mixture of 5.0 g (12.6 mmole) of Intermediate S, 9.1 g (15.1 mmole) of Intermediate E, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (4.9 g, 49%) of off-white product, which was recrystallized from EtOH. MS(m/z, $EI^+$):794.9

Example 12

Synthesis of EX83
Synthesis of EX83

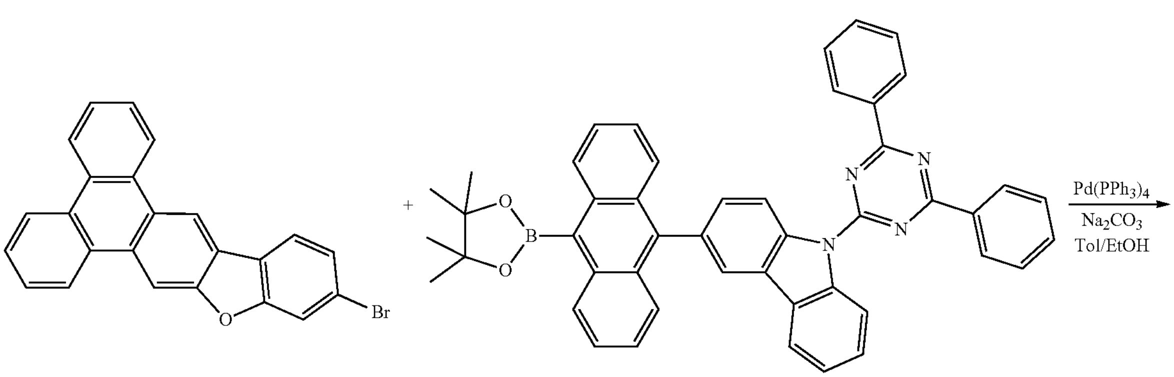

-continued

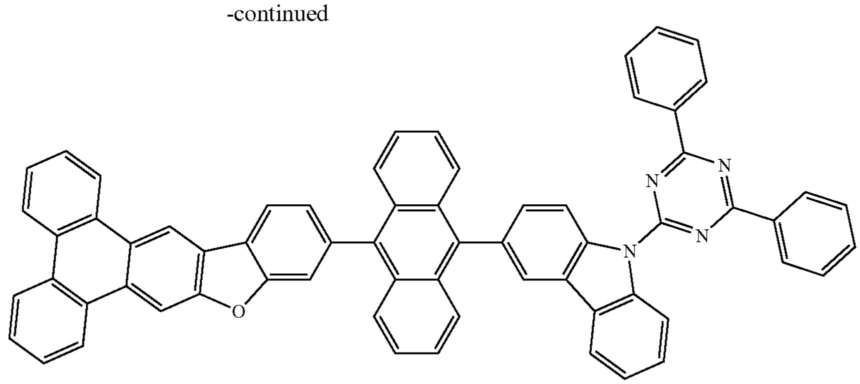

A mixture of 5.0 g (12.6 mmole) of Intermediate S, 10.6 g (15.1 mmole) of Intermediate M, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (6.1 g, 54%) of off-white product, which was recrystallized from EtOH. MS(m/z, $EI^+$):892.0

Example 13

Synthesis of EX122

Synthesis of Intermediate T

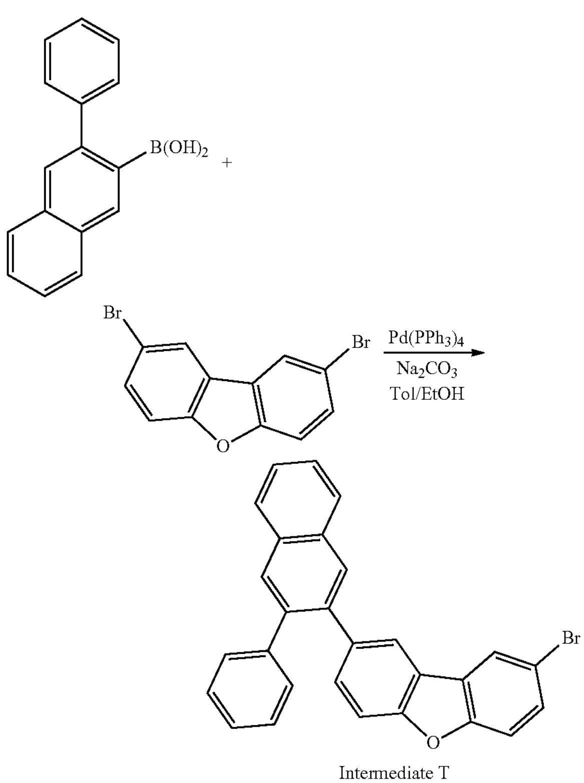

Intermediate T

A mixture of 32.6 g (100 mmol) of 2,8-dibromodibenzo[b,d]furan, 27.3 g (110 mmol) of (3-phenylnaphthalen-2-yl) boronic acid, 2.31 g (2 mmol) of $Pd(PPh_3)_4$, 75 ml of 2M $Na_2CO_3$, 150 ml of EtOH and 300 ml toluene was degassed and placed under nitrogen, and then heated at 100° C. for 12 h. After finishing the reaction, the mixture was allowed to cool to room temperature. The organic layer was extracted with ethyl acetate and water, dried with anhydrous magnesium sulfate, the solvent was removed and the residue was purified by column chromatography on silica to give product (23.8 g, 53%) as a off-white solid.

Synthesis of Intermediate U

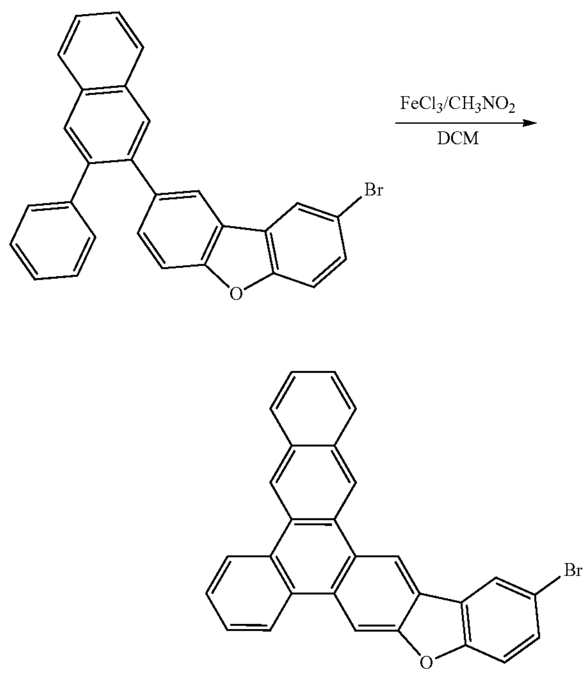

Intermediate U

In a 3000 ml three-necked flask that had been degassed and filled with nitrogen, 23.8 g (53 mmol) of Intermediate T was dissolved in anhydrous dichloromethane (1500 ml), 86.0 g (530 mmol) iron(III) chloride was then added, and the mixture was stirred one hour. Methanol 500 ml were added to the mixture and the organic layer was separated and the solvent removed in vacuo. The residue was purified by column chromatography on silica to give product (5.0 g, 21%) as a yellow solid.

Synthesis of EX122

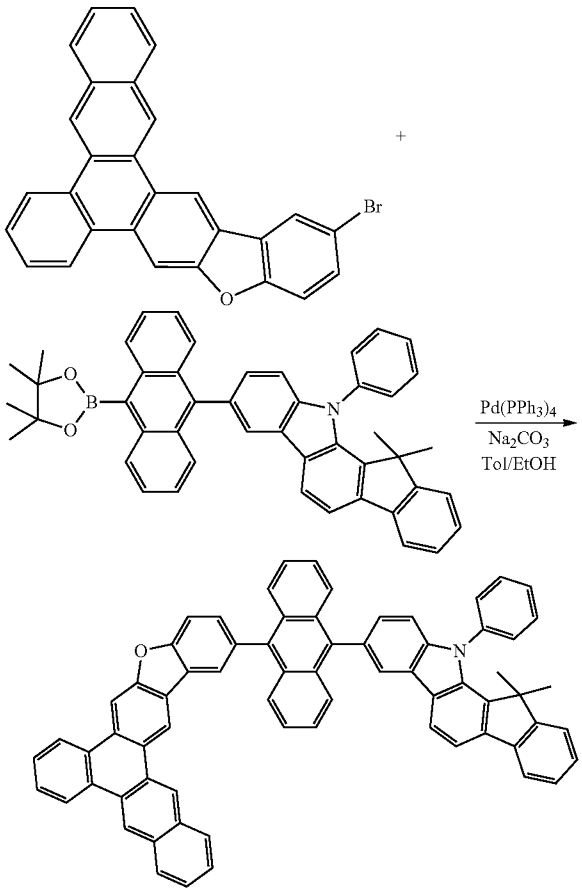

A mixture of 5.6 g (12.6 mmole) of Intermediate U, 10.0 g (15.1 mmole) of Intermediate O, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.6 g, 49%) of off-white product, which was recrystallized from EtOH. MS(m/z, EI+):903.1

Example 14

Synthesis of EX162

Synthesis of Intermediate V

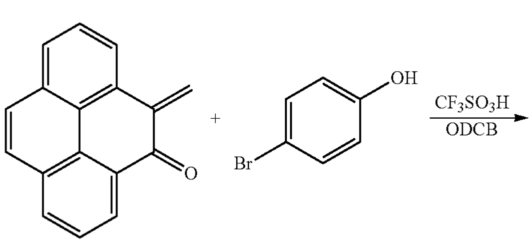

-continued

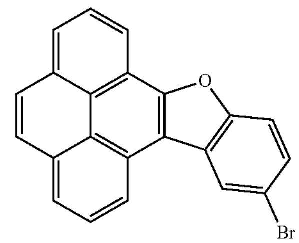

Intermediate V

A mixture of 12 g (51.7 mmol) of Pyrene-4,5-diketone, 7.7 g (51.7 mmol) of Trifluoromethanesulfonic acid, 8.9 g (51.7 mmol) of 4-Bromophenol, 200 ml of 1,2-Dichlorobenzene was degassed and placed under nitrogen, and then heated at 190° C. for 24 h. After finishing the reaction, the solvent was removed and the residue was purified by column chromatography on silica to give product (3.3 g, 17%) as a light-green solid.

Synthesis of EX162

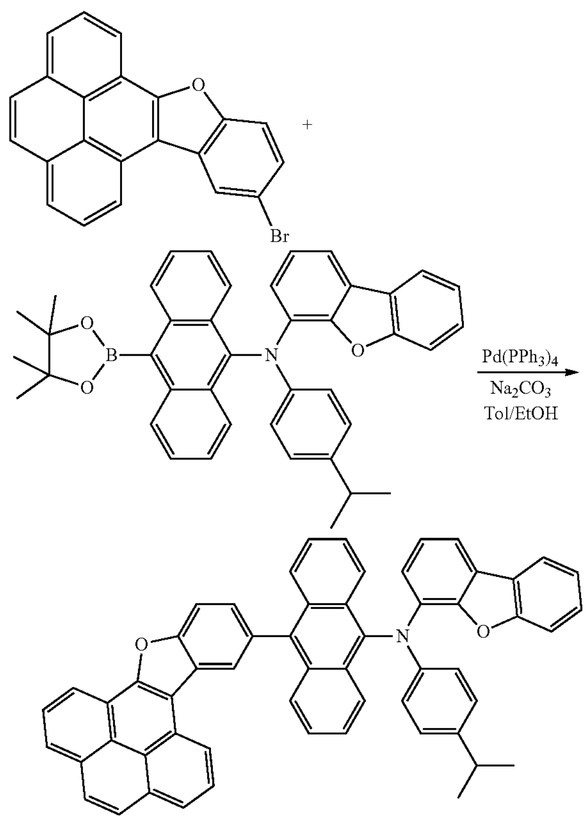

A mixture of 4.7 g (12.6 mmole) of Intermediate V, 9.1 g (15.1 mmole) of Intermediate E, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.6 g, 58%) of yellow product, which was recrystallized from EtOH. MS(m/z, EI$^+$):768.9

Example 15

Synthesis of EX164
Synthesis of EX164

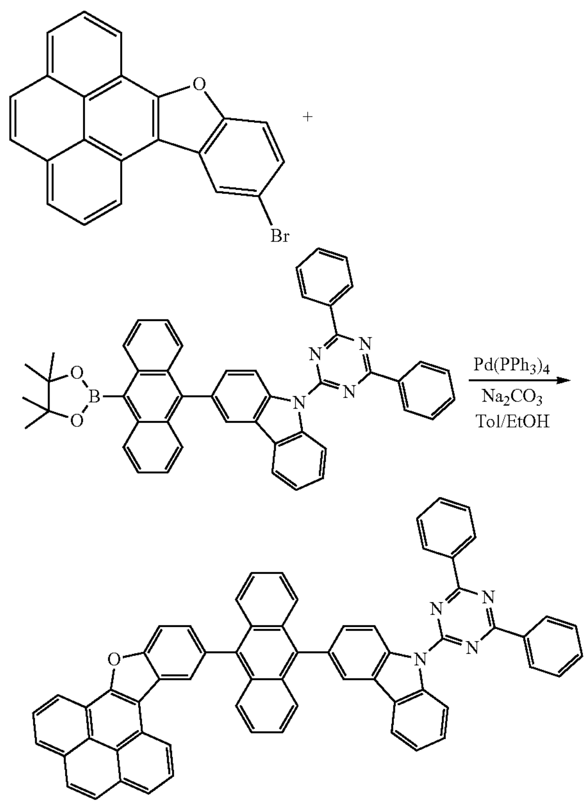

A mixture of 4.7 g (12.6 mmole) of Intermediate V, 10.6 g (15.1 mmole) of Intermediate M, 0.3 g (0.25 mmole) of $Pd(PPh_3)_4$, 0.18 g (0.5 mmole) of 2-Dicyclophosphine-2',6'-dimethoxybiphenyl, 2.0 g (18.9 mmole) of $Na_2CO_3$, 75 ml of Toluene and 25 ml of Ethanol, and 10 ml of $H_2O$ was placed under nitrogen, and then heated at 80° C. while stirring for 16 h. After the reaction finished, the mixture was allowed to cool to room temperature. Then 300 ml of MeOH was added while stirring and the precipitated product was filtered off with suction to give (5.4 g, 50%) of yellow product, which was recrystallized from EtOH. MS(m/z, EI$^+$):866.0

General Method of Producing Organic EL Device

ITO-coated glasses with 9-12 ohm/square in resistance and 120-160 nm in thickness are provided (hereinafter ITO substrate) and cleaned in a number of cleaning steps in an ultrasonic bath (e.g. detergent, deionized water). Before vapor deposition of the organic layers, cleaned ITO substrates are further treated by UV and ozone. All pre-treatment processes for ITO substrate are under clean room (class 100).

The organic layers are applied onto the ITO substrate in order by vapor deposition in a high-vacuum unit ($10^{-7}$ Torr), such as: resistively heated quartz boats. The thickness of the respective layer and the vapor deposition rate (0.1~0.3 nm/sec) are precisely monitored or set with the aid of a quartz-crystal monitor. It is also possible, as described above, for individual layers to consist of more than one compound, i.e. in general a host material doped with a dopant material. This is successfully achieved by co-vaporization from two or more sources, which means the organic compounds of the present invention are thermally stable.

Dipyrazino[2,3-f:2,3-]quinoxaline-2,3,6,7,10,11-hexacarbonitrile(HA T-CN) is used as hole injection layer in this organic EL device, N,N-Bis(naphthalene-1-yl)-N,N-bis(phenyl)-benzidine(NPB) is most widely used as the hole transporting layer; 10,10-dimethyl-13-(3-(pyren-1-yl)phenyl)-10H-indeno[2,1-b]triphenylene(H1) and 10,10-dimethyl-12-(10-(4-(naphthalene-1-yl)-phenyl)anthracen-9-yl)-10H-indeno[2,1-b]triphenylene(H2) are used as emitting hosts in organic EL device. D1 is used as blue guest, D2 is used as green guest for comparison; HB3 (see the following chemical structure) are used as hole blocking material (HBM) and 2-(naphthalen-1-yl)-9-(4-(1-(4-(10-(naphthalene-2-yl)anthracen-9-yl)phenyl)-1H-benzo[d]imidazol-2-yl)phenyl)-1,10-phenanthroline(ET2) is used as electron transporting material to co-deposit with 8-hydroxyquinolato-lithium(LiQ) in organic EL device. The prior art of OLED materials for producing standard organic EL device control and comparable material in this invention shown its chemical structure as follows:

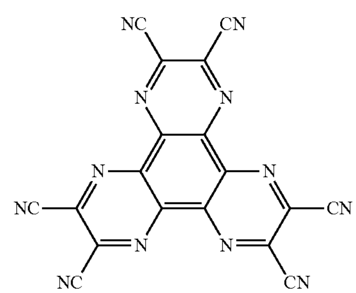

HAT-CN

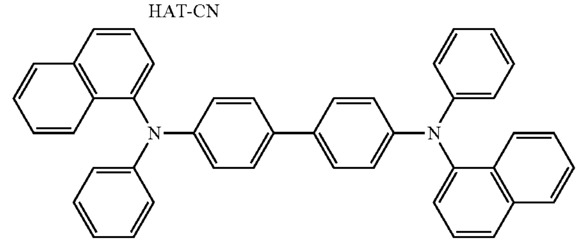

NPB

D1

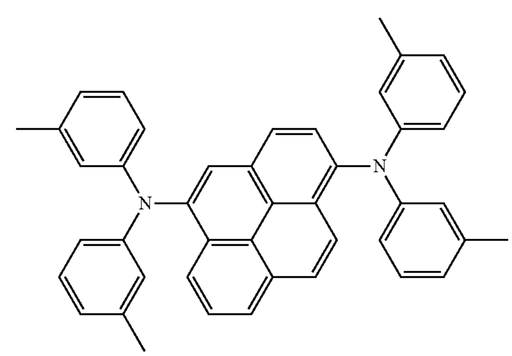

-continued
D2
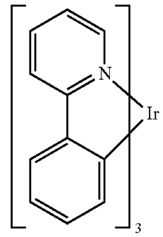
H1
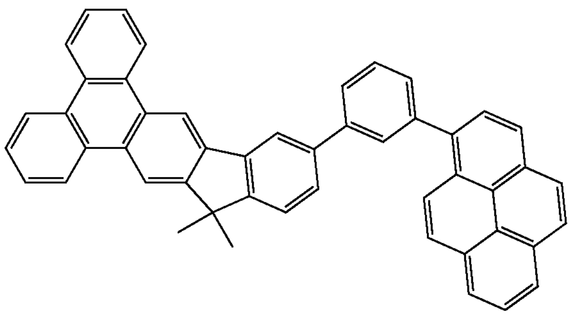
H2
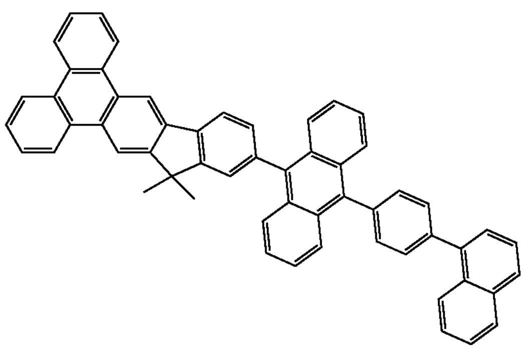
HB3
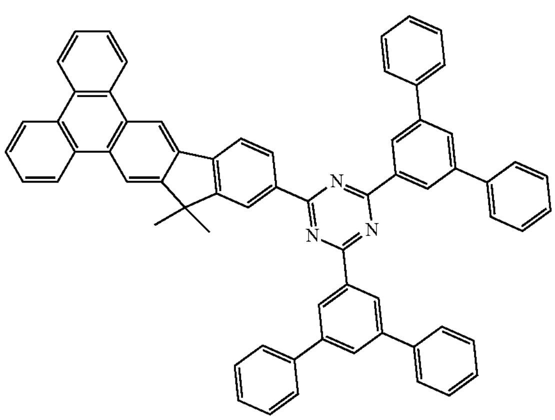
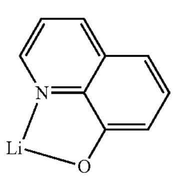
LiQ
-continued
ET2
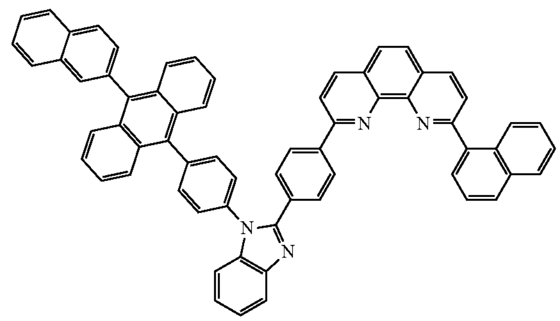
EX1
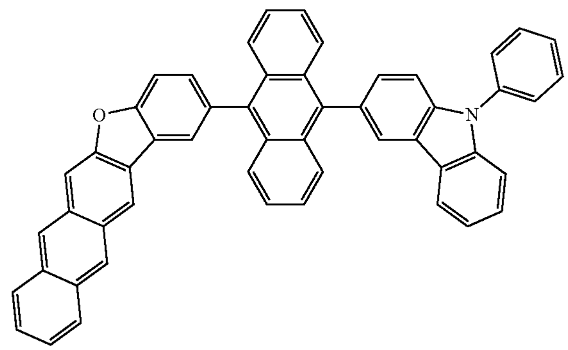
EX5
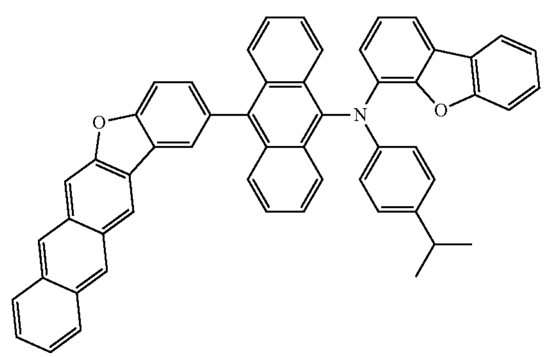
EX12
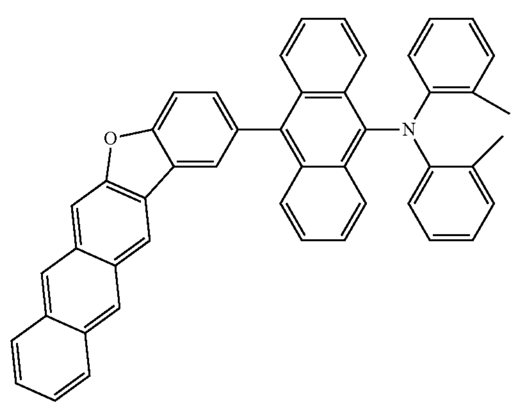

-continued
EX54
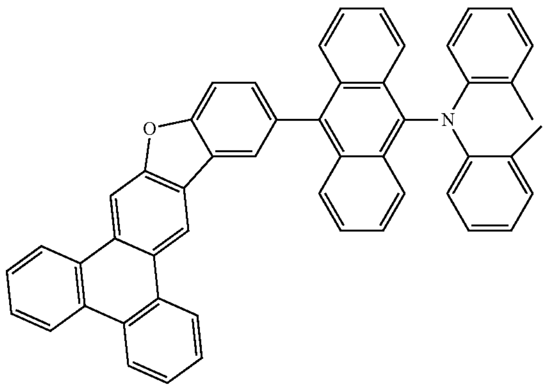
EX56
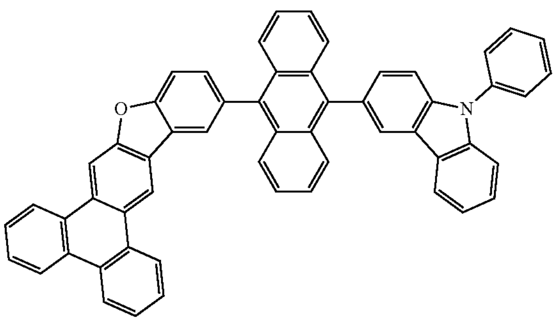
EX79
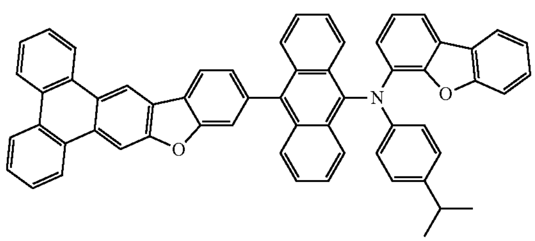
EX121
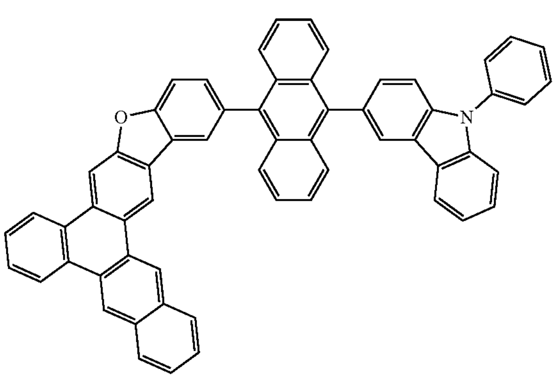
-continued
EX162
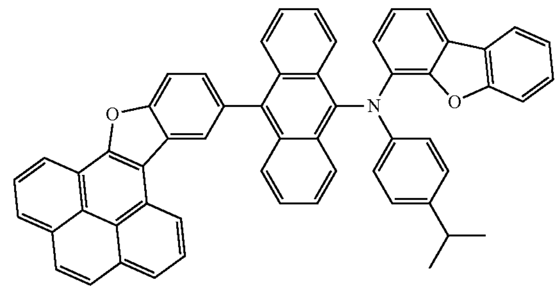
EX3
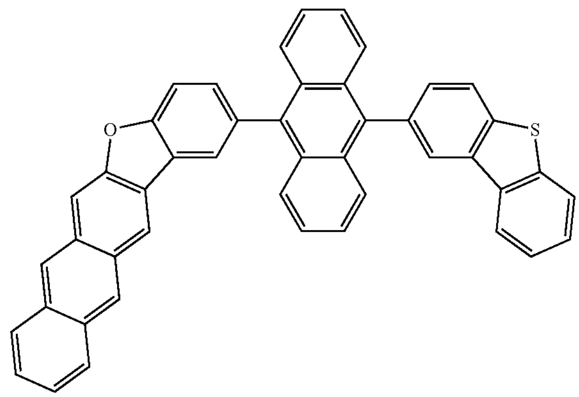
EX8
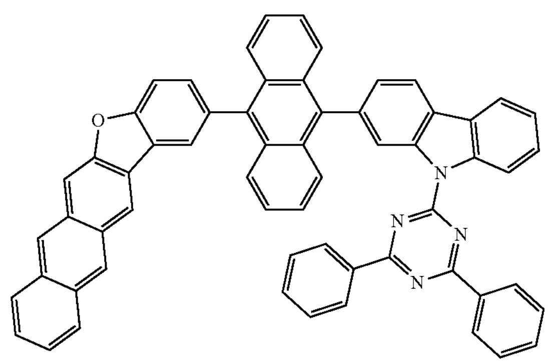
EX34
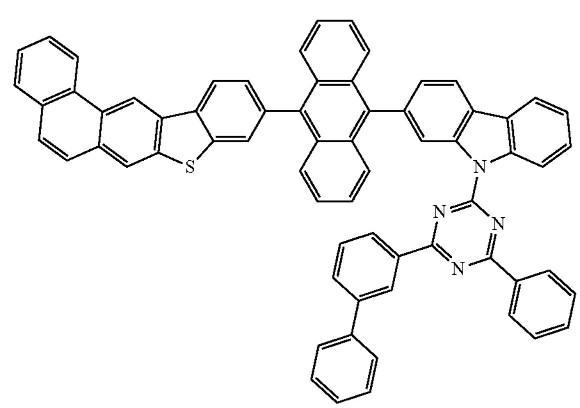

-continued
EX57
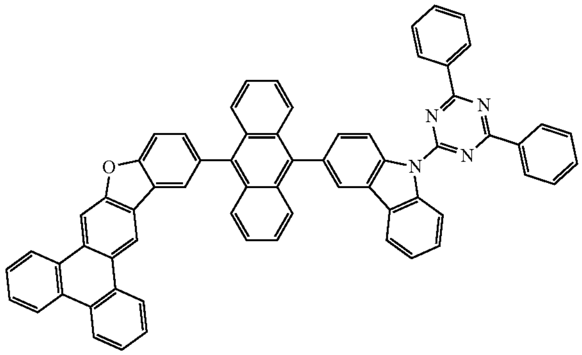
EX58
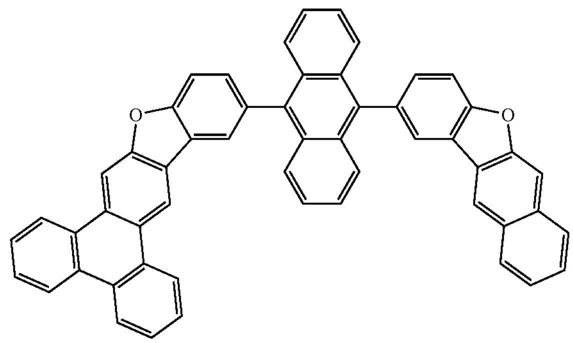
EX59
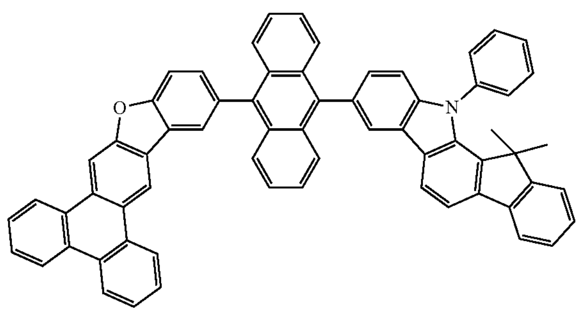
EX63
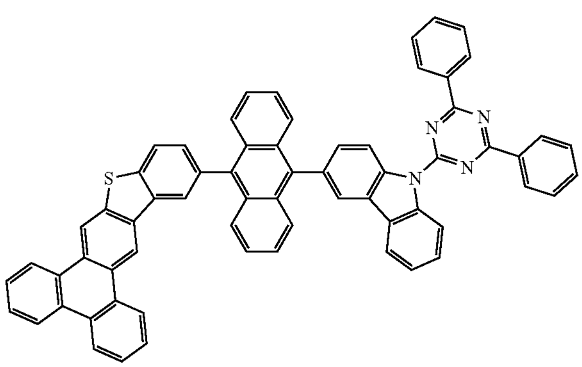
-continued
EX83
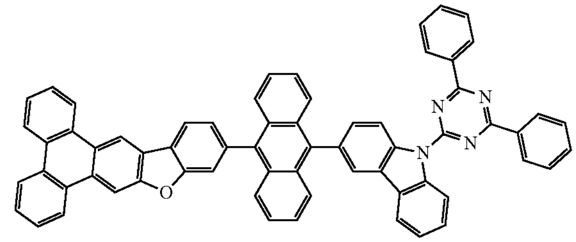
EX85
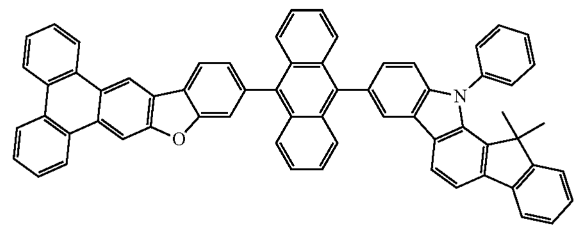
EX87
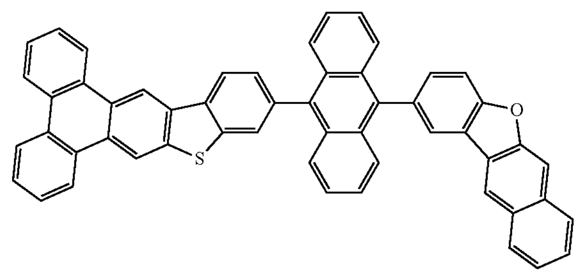
EX101
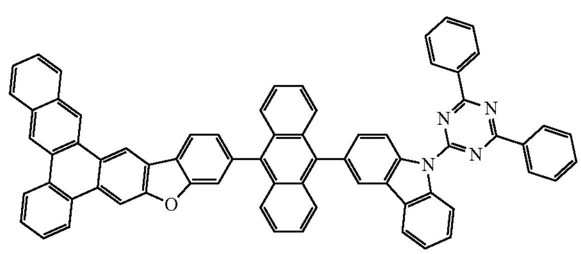
EX122
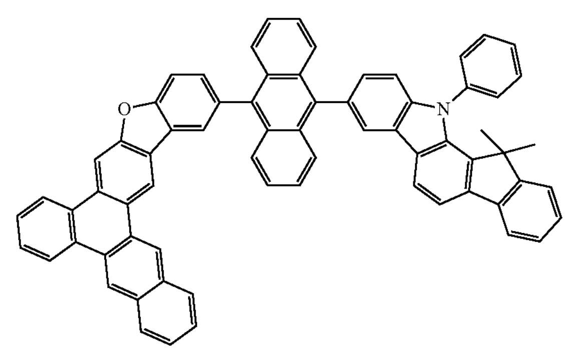

-continued

EX140

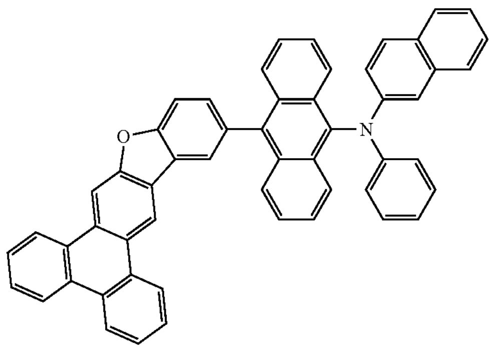

and

EX164

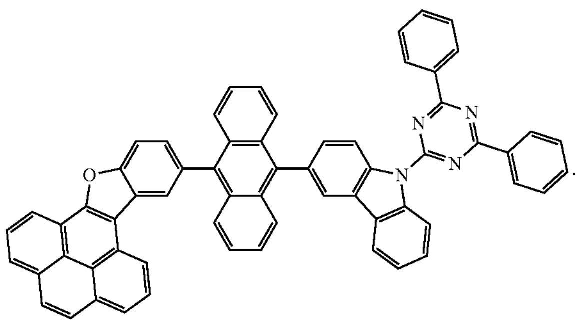

.

A typical organic EL device consists of low work function metals, such as Al, Mg, Ca, Li and K, as the cathode, and the low work function metals can help electrons injecting the electron transporting layer from cathode. In addition, for reducing the electron injection barrier and improving the organic EL device performance, a thin-film electron injecting layer is introduced between the cathode and the electron transporting layer. The materials of electron injecting layer are metal halide or metal oxide with low work function, such as: LiF, LiQ, MgO, or $Li_2O$. On the other hand, after the organic EL device fabrication, EL spectra and CIE coordination are measured by using a PR650 spectra scan spectrometer. Furthermore, the current/voltage, luminescence/voltage and yield/voltage characteristics are taken with a Keithley 2400 programmable voltage-current source. The above-mentioned apparatuses are operated at room temperature (about 25° C.) and under atmospheric pressure.

Example 16

Using a procedure analogous to the above mentioned general method, organic EL devices emitting fluorescence and having the device structure as shown in the FIGURE. From the bottom layer 10 to the top layer 80, the following components were produced: ITO/HAT-CN(20 nm)/NPB (110 nm)/Emitting host material doped with 5% Emitting guest material (30 nm)/HB3 (10 nm)/ET2 doped with 50% LiQ (35 nm)/LiQ (1 nm)/Al(160 nm). In the device illustrated in the FIGURE, the hole injection layer 20 (HAT-CN) is deposited onto the transparent electrode 10 (ITO). The hole transport layer 30 (NPB) is deposited onto the hole injection layer 20. The emitting layer 40 is deposited onto the hole transport layer 30. The emitting layer 40 may comprise an emitting host material and an emitting guest (dopant) material, as shown in, for example, Table 1. The emitting host material may be doped with about 5% emitting guest material. The emitting layer 40 may have a thickness of about 30 nm.

The hole blocking layer 50 (HB3) is deposited onto the emitting layer 40. The electron transport layer 60 (ET2 doped with 50% LiQ) is deposited onto the hole blocking layer (HBL) 50. The electron injection layer 70 (LiQ) is deposited onto the electron transport layer (ETL) 60. The metal electrode 80 (Al) is deposited onto the electron injection layer 70. The I—V-B (at 1000 nits) test reports of these organic EL devices are summarized in Table 1 below. The half-life time is defined that the initial luminance of 1000 cd/m$^2$ has dropped to half.

TABLE 1

| Emitting Host Material | Emitting Dopant Material | Driving Voltage (V) | Current Efficiency (cd/A) | Device Color | Half-life time (hours) |
|---|---|---|---|---|---|
| H1 | EX1 | 4.2 | 5.8 | blue | 230 |
| H1 | EX5 | 4.0 | 6.5 | blue | 250 |
| H1 | EX12 | 3.7 | 6.8 | blue | 260 |
| H1 | EX54 | 3.6 | 7.3 | blue | 290 |
| H1 | EX56 | 4.0 | 6.3 | blue | 240 |
| H1 | EX79 | 3.7 | 7.1 | blue | 270 |
| H1 | EX121 | 5.6 | 46.3 | green | 510 |
| H1 | EX162 | 3.8 | 6.7 | blue | 270 |
| H1 | D1 | 4.2 | 5.2 | blue | 170 |
| H2 | D1 | 4.0 | 5.4 | blue | 200 |
| H2 | D2 | 5.9 | 44.1 | green | 400 |
| H2 | D2 | 5.6 | 45.3 | green | 420 |
| H2 | EX1 | 3.9 | 5.7 | blue | 220 |
| H2 | EX5 | 3.8 | 6.4 | blue | 240 |
| H2 | EX12 | 3.7 | 6.9 | blue | 270 |
| H2 | EX54 | 3.4 | 7.4 | blue | 300 |
| H1 | EX56 | 3.8 | 6.1 | blue | 230 |
| H2 | EX79 | 3.5 | 7.2 | blue | 280 |
| H2 | EX121 | 5.3 | 48.6 | green | 530 |
| H2 | EX162 | 3.7 | 6.6 | blue | 260 |
| EX3 | D1 | 3.9 | 5.9 | blue | 230 |
| EX8 | D1 | 3.9 | 5.8 | blue | 220 |
| EX34 | D1 | 4.1 | 5.3 | blue | 190 |
| EX57 | D1 | 3.2 | 7.6 | blue | 360 |
| EX58 | D1 | 3.6 | 6.8 | blue | 280 |
| EX59 | D1 | 3.5 | 7.0 | blue | 310 |
| EX63 | D1 | 3.4 | 7.2 | blue | 320 |
| EX83 | D1 | 3.4 | 7.3 | blue | 330 |
| EX85 | D1 | 3.8 | 6.2 | blue | 250 |
| EX87 | D1 | 3.8 | 6.1 | blue | 240 |
| EX101 | D1 | 3.7 | 6.4 | blue | 250 |
| EX122 | D1 | 4.0 | 5.6 | blue | 200 |
| EX140 | D1 | 3.3 | 7.4 | blue | 340 |
| EX164 | D1 | 3.6 | 6.6 | blue | 270 |

In Table 1, the organic compound of formula (1) used as a fluorescent blue host or dopant material may exhibit better performance than the prior art materials. In particular, an organic EL device of the present invention comprises an organic compound of formula (1) as a dopant material or a host material to collocate with a host material H1 or H2 or a dopant material D1, thereby lowering a driving voltage, improving luminance, or increasing a current efficiency or a half-life time under the same voltage of the organic EL device.

Example 17

Using a procedure analogous to the above-mentioned method, as shown in the FIGURE, an organic EL device having the following device structure, from the bottom layer 10 to the top layer 80, is produced: ITO/HAT-CN(20 nm)/NPB (110 nm)/H2+5% D1 (30 nm)/HB3 (10 nm)/ET2 doped with 50% LiQ, EX8, EX34, or EX164 (EBM for EBL 60; 35 nm)/LiQ(1 nm)/Al(160 nm). The I—V-B (at 1000 nits) test reports of these organic EL devices are summarized in Table 2 below. The half-life time is defined that the initial luminance of 1000 $cd/m^2$ has dropped to half.

TABLE 2

| ETM | Driving Voltage (V) | Current Efficiency (cd/A) | Device Color | Half-life time (hours) |
|---|---|---|---|---|
| ET2 | 4.0 | 5.5 | blue | 210 |
| EX8 | 3.8 | 6.0 | blue | 260 |
| EX34 | 4.0 | 5.5 | blue | 210 |
| EX164 | 3.8 | 5.8 | blue | 230 |

From the summary of the test report the above organic EL devices, it can be seen that the organic compound of formula (1) used as the electron transporting material (ETM) exhibits better performance than the prior art material ET2. In particular, the organic EL device of the present invention using the organic compound of formula (1) as the electron transporting material to collocate with the host material H2 and the dopant material D1 may have lower power consumption, higher current efficiency, or longer half-life time.

Example 18

Using a procedure analogous to the above-mentioned general method, as shown in the FIGURE, an organic EL device having the following device structure, from the bottom layer 10 to the top layer 80, is produced: ITO/HAT-CN(20 nm)/NPB (110 nm)/H2+5% D1 (30 nm)/HB3 or EX57, EX63, EX83, or EX101 (HBM for HBL 50; 10 nm)/ET2 doped with 50% LiQ(35 nm)/LiQ(1 nm)/Al(160 nm). The I—V-B (at 1000 nits) test reports of these organic EL devices are summarized in Table 3 below. The half-life time is defined that the initial luminance of 1000 $cd/m^2$ has dropped to half.

TABLE 3

| HBM | Driving Voltage (V) | Current Efficiency (cd/A) | Device Color | Half-life time (hours) |
|---|---|---|---|---|
| HB3 | 4.1 | 5.4 | blue | 200 |
| EX57 | 3.7 | 6.2 | blue | 280 |
| EX63 | 3.9 | 5.8 | blue | 240 |
| EX83 | 3.7 | 6.0 | blue | 260 |
| EX101 | 4.0 | 5.5 | blue | 220 |

From the summary of the test report the above organic EL devices, it can be seen that the organic compound of formula (1) used as a hole blocking material exhibits better performance than the prior art material HB3. In particular, the organic EL device of the present invention using the organic compound of formula (1) as the electron transporting material to collocate with the host material H2 and the dopant material D1 may have lower power consumption, higher current efficiency, or longer half-life time.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

The invention claimed is:

1. An organic compound represented by the following formula (1):

formula (1)

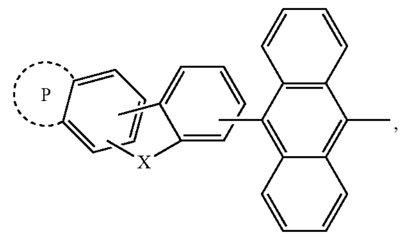

wherein A represents one of the formula (3), formula (4) and formula (6)

formula (3)

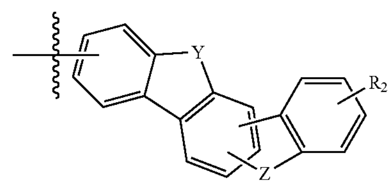

formula (4)

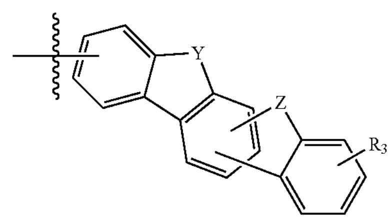

formula (6)

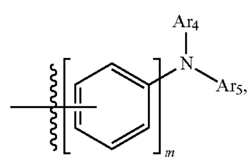

wherein X is a divalent bridge selected from the group consisting of O, S, $SiR_5R_6$; P represents a substituted or unsubstituted fused ring hydrocarbon unit having two, three or four rings; $Ar_1$ represent a substituted or unsubstituted fused ring hydrocarbon unit with one to two rings; m represents an integer of 0 or 1; Y is a divalent bridge selected from the group consisting of O, S, $SiR_7R_8$, $CR_9R_{10}$ and $NAr_2$; Z is a divalent bridge selected from the group consisting from O, S, $CR_{11}R_{12}$, $SiR_{13}R_{14}$ and $NAr_3$; $Ar_2$ and $Ar_3$ independently represent a substituted or unsubstituted aryl group having 6 to 30 carbon atoms; $Ar_4$ and $Ar_5$ independently represent a substituted or unsubstituted aryl group having 6 to 30 carbon atoms, or a substituted or unsubstituted hetroaryl group having 6 to 30 carbon atoms; and $R_2$, $R_3$, $R_5$ to $R_{14}$ are independently selected from the group consisting of a hydrogen atom, a halide, a substituted or unsubstituted alkyl group having 1 to 30 carbon atoms, a substituted or unsubstituted aryl group having 6 to 30 carbon atoms, and a substituted or unsubstituted aralkyl group having 7 to 30 carbon atoms.

2. The organic compound according to claim 1, wherein the substituted alkyl group, the substituted alkoxy group, the substituted aryl group, the substituted aralkyl group, or the substituted heteroaryl group is substituted by a halide, an alkyl group, an alkoxy group, or an aryl group.

3. An organic electroluminescence device comprising a pair of electrodes having a cathode and an anode, and between the pairs of electrodes comprising at least a light emitting layer and one or more layers of organic thin film layers, wherein the light emitting layer and/or the one or more thin film layers comprise the organic compound according to claim 1.

4. An organic compound selected from the group consist of:

EX2

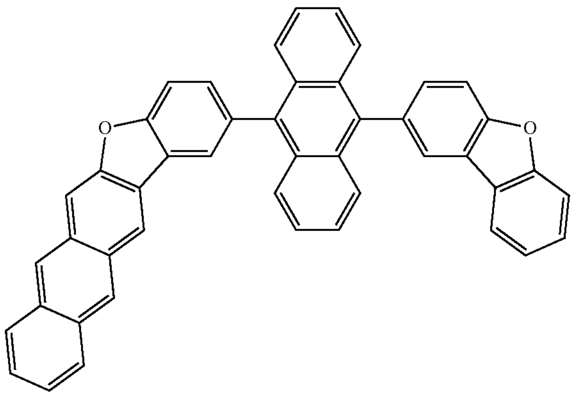

EX4

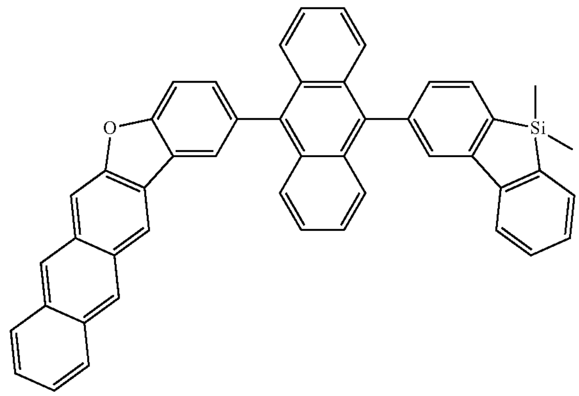

EX5

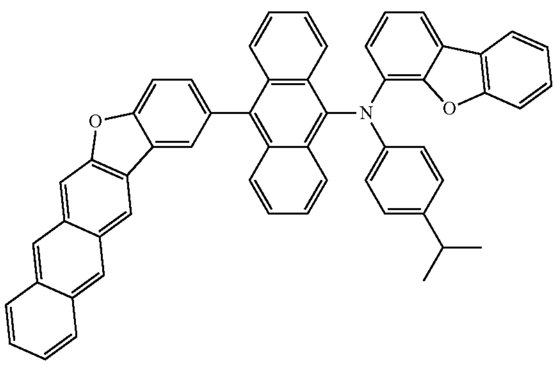

EX7

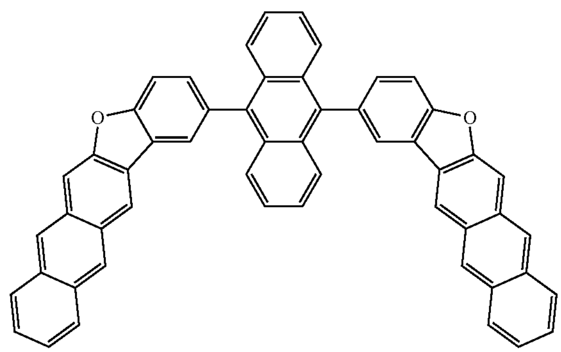

EX8

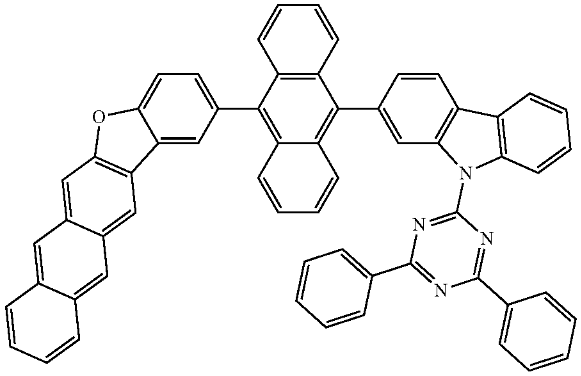

EX9

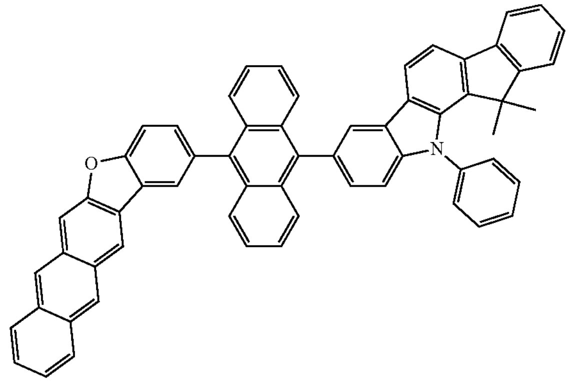

-continued
EX10
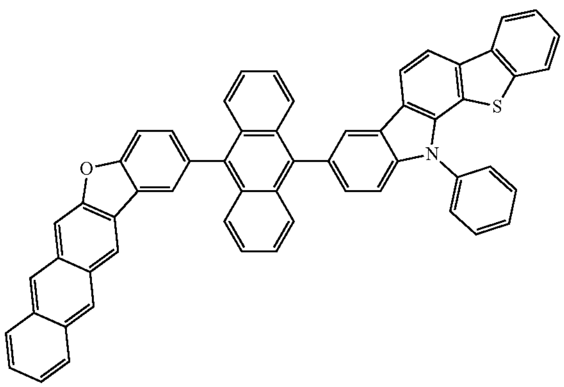
EX11
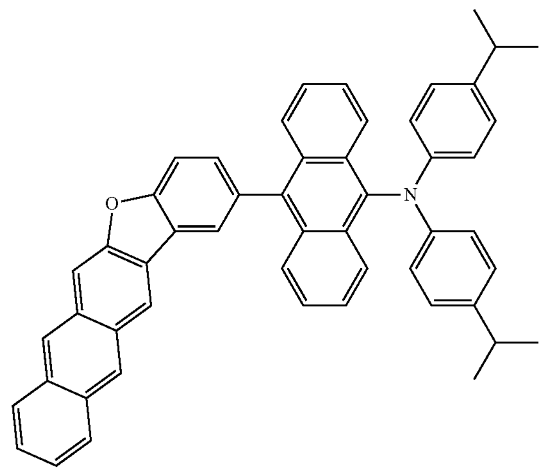
EX12
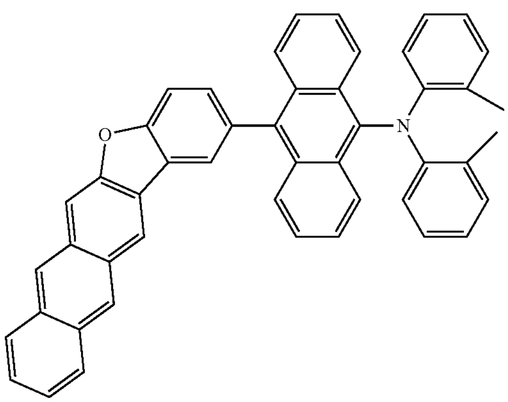
EX16
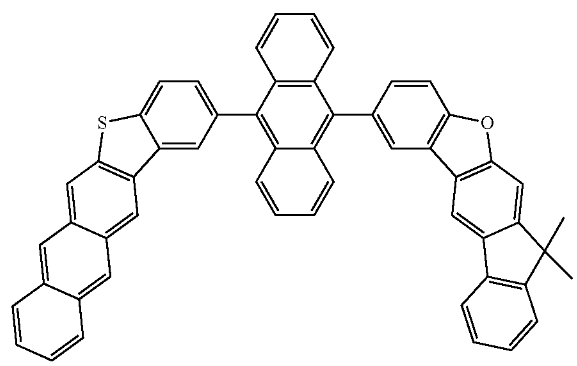
EX17
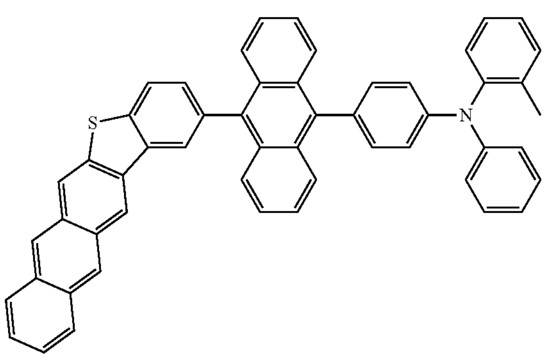
EX18
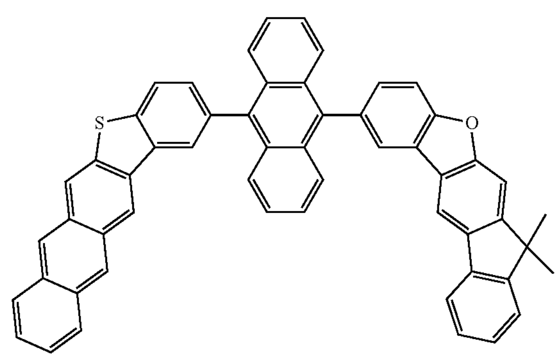

-continued
EX19
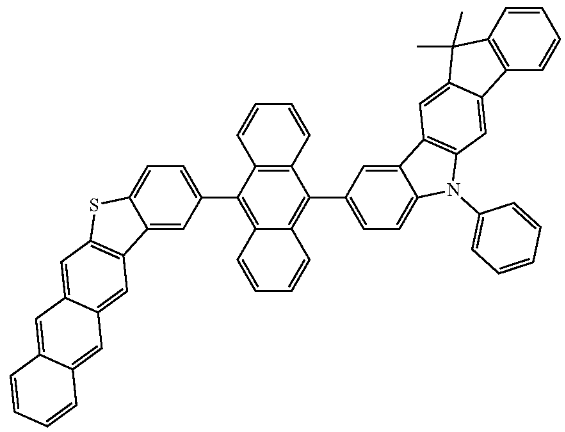
EX20
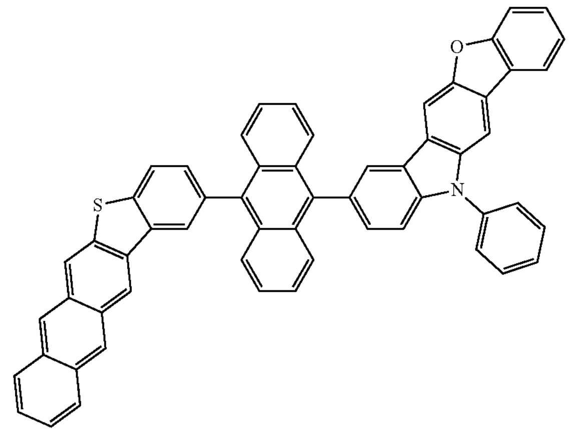
EX21
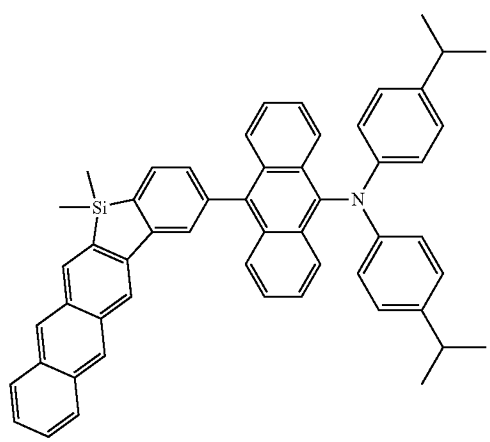
EX22
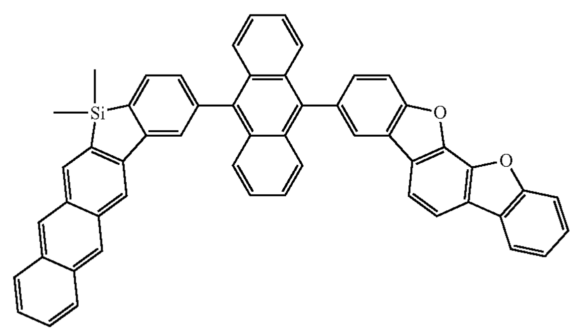
EX23
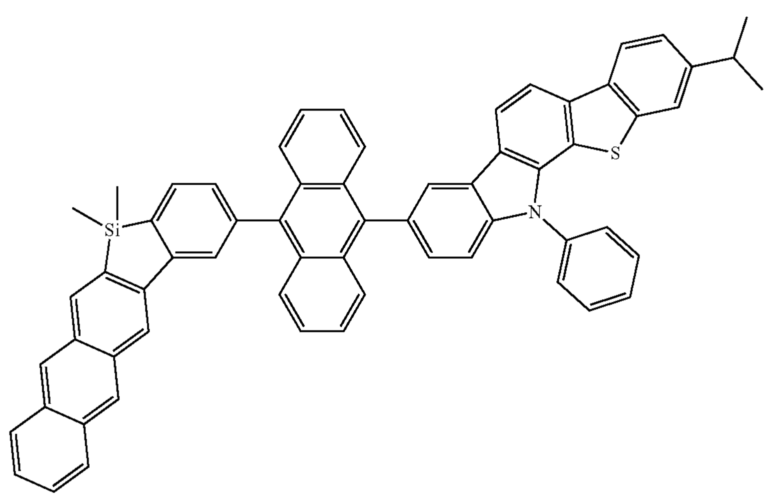

-continued
EX24
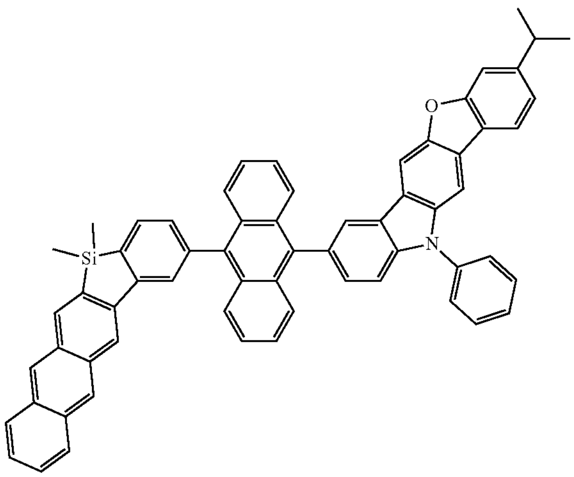
EX25
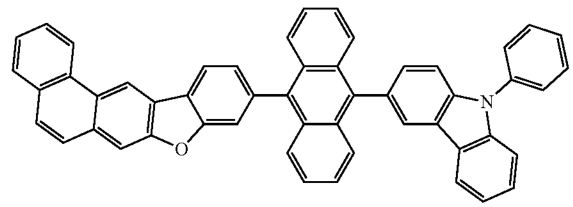
EX26
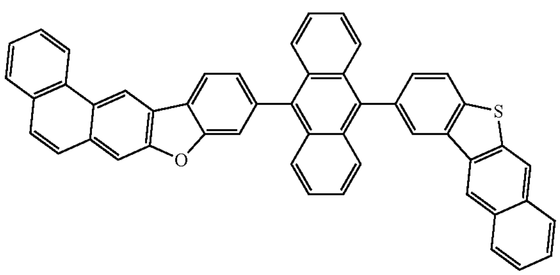
EX27
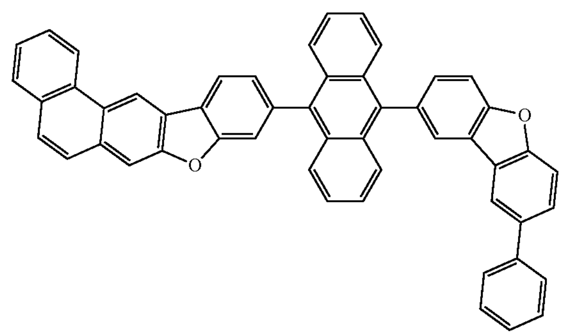
EX28
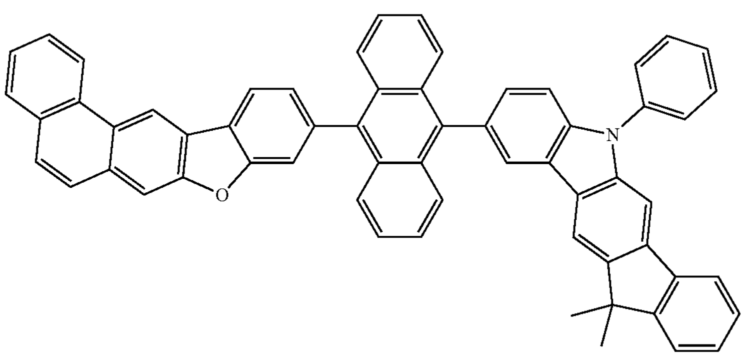
EX29
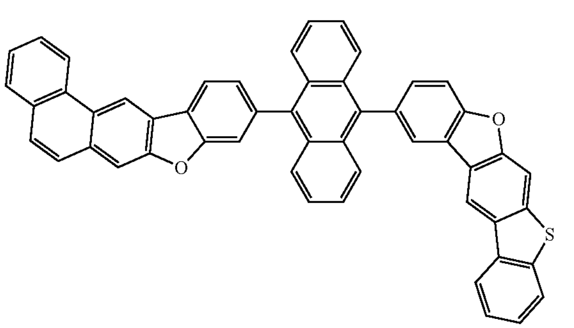
EX30
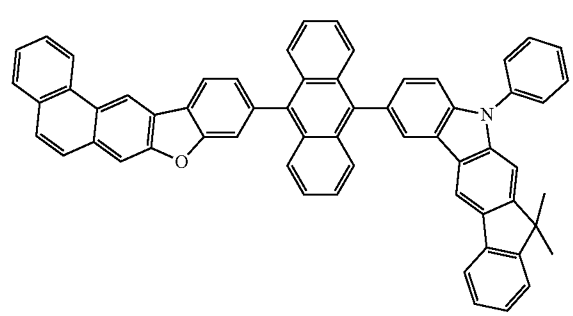

-continued
EX31
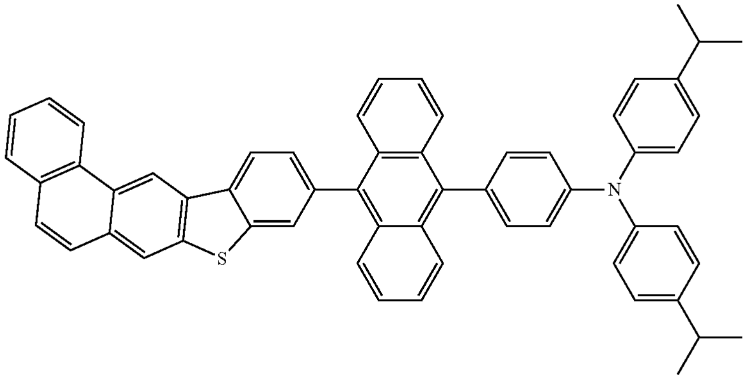
EX32
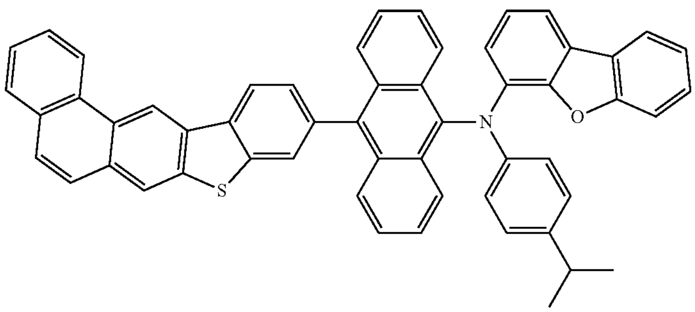
EX33
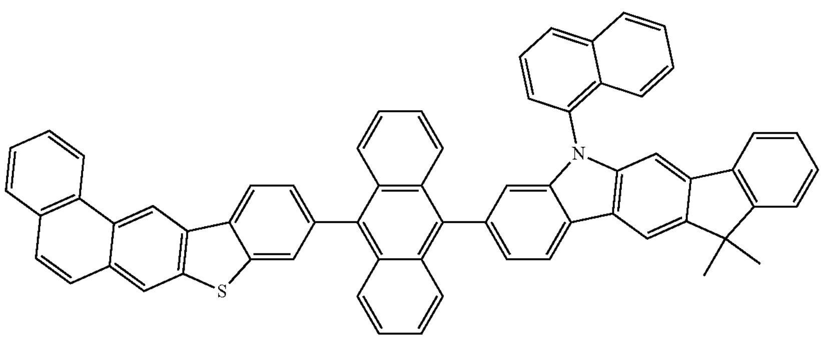
EX34
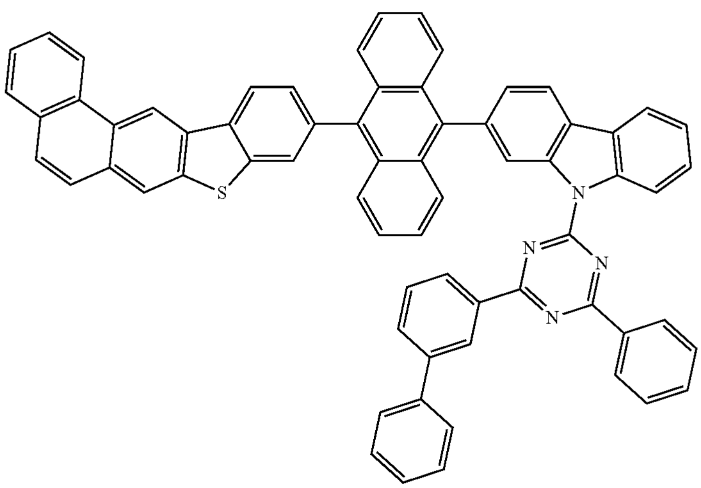

-continued
EX35
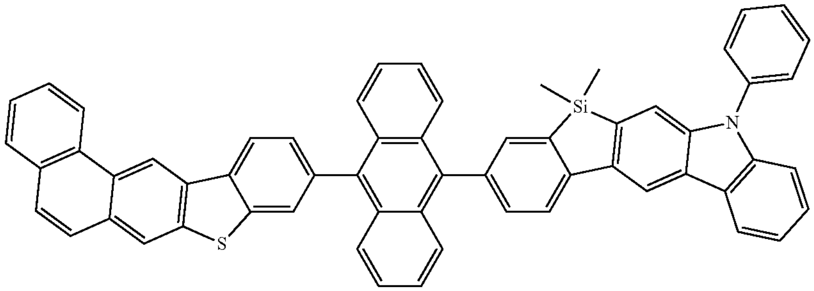
EX36
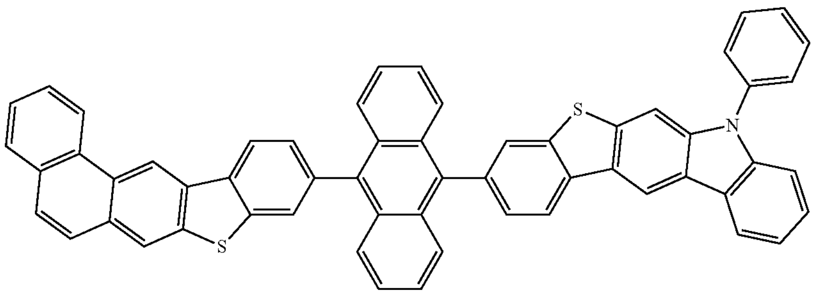
EX37
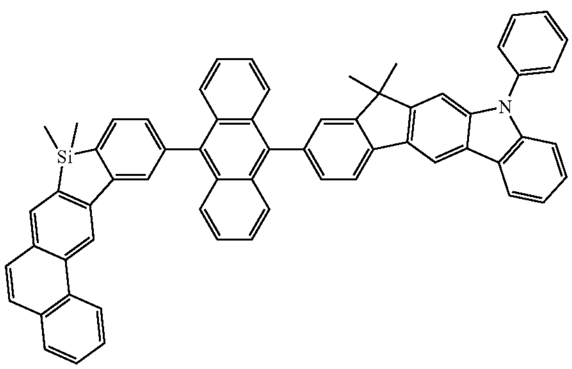
EX38
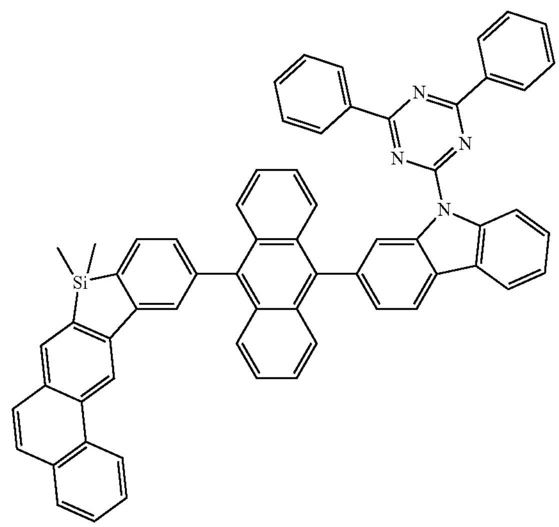
EX39
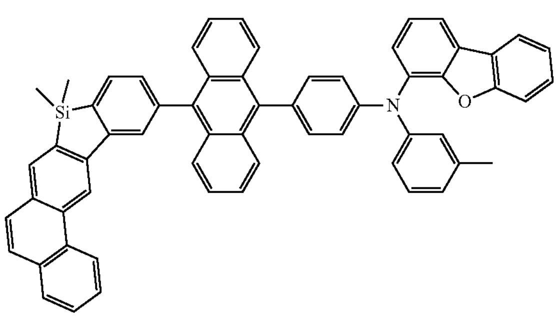
EX40
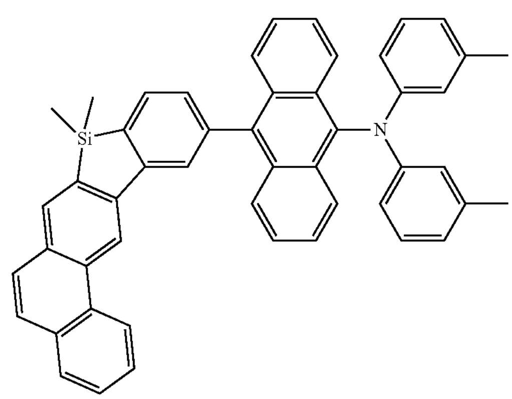

-continued
EX41
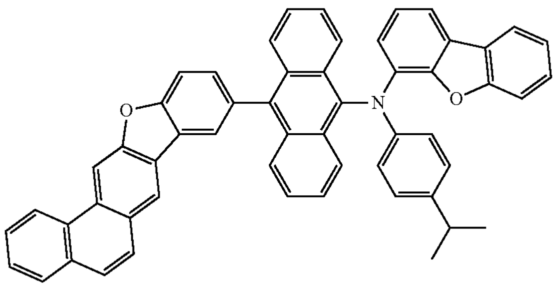
EX42
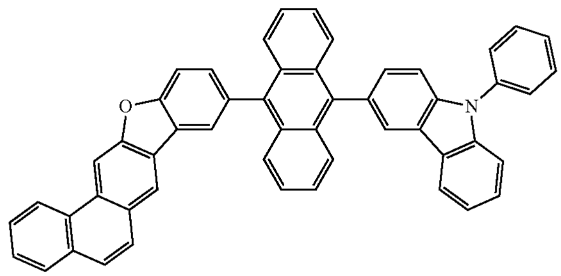
EX43
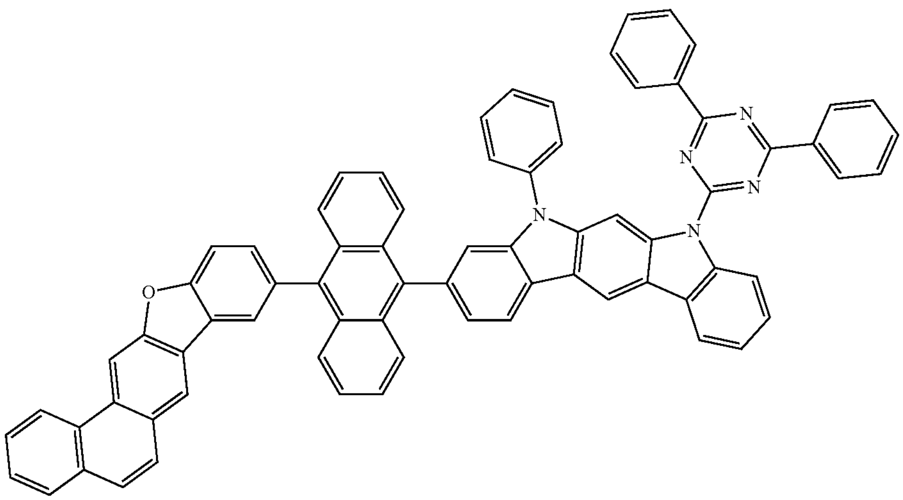
EX44
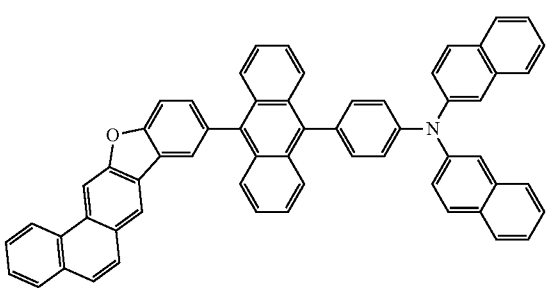
EX45
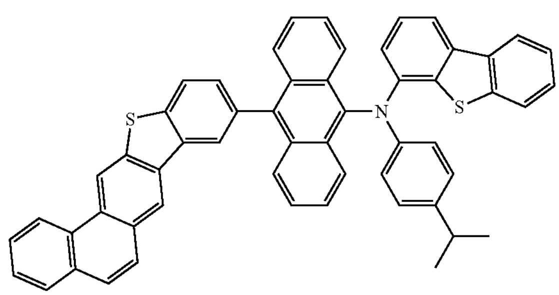
EX46
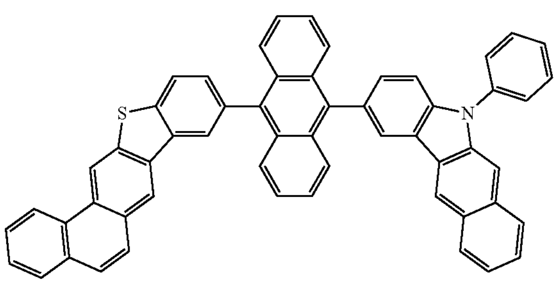
EX47
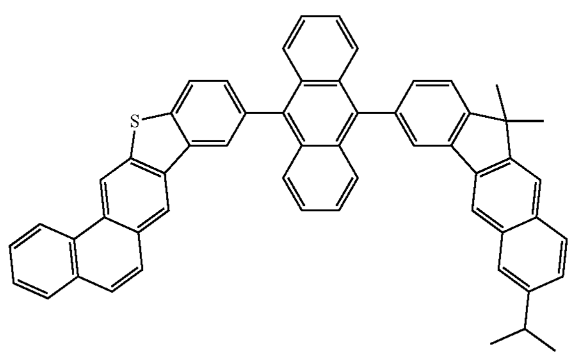

-continued
EX48
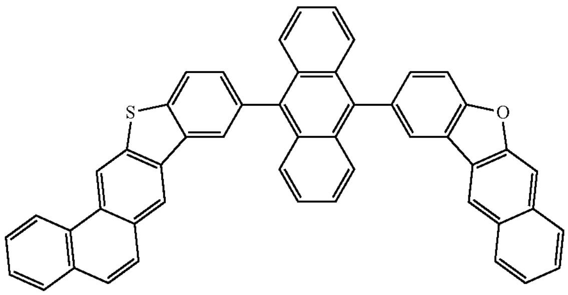
EX49
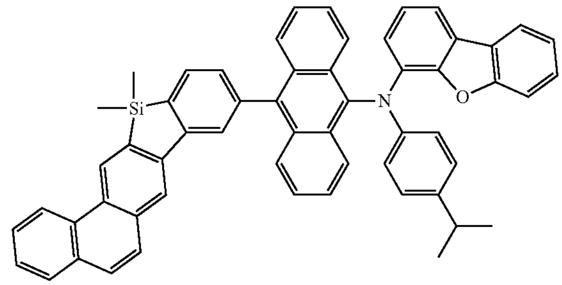
EX50
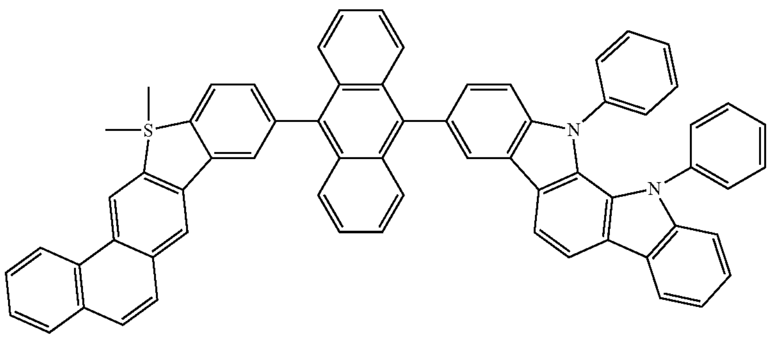
EX51
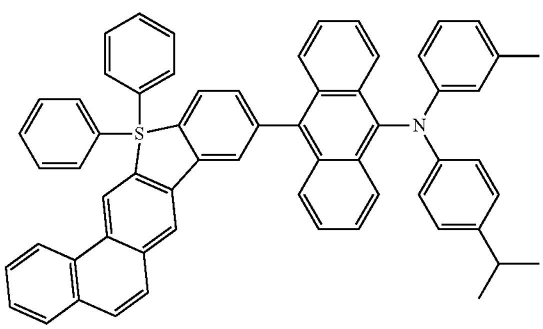
EX52
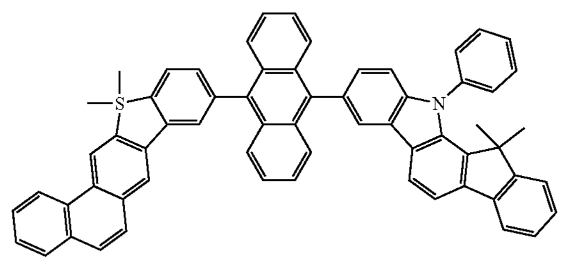
EX53
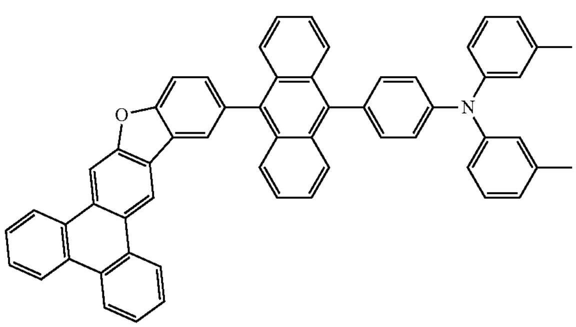
EX54
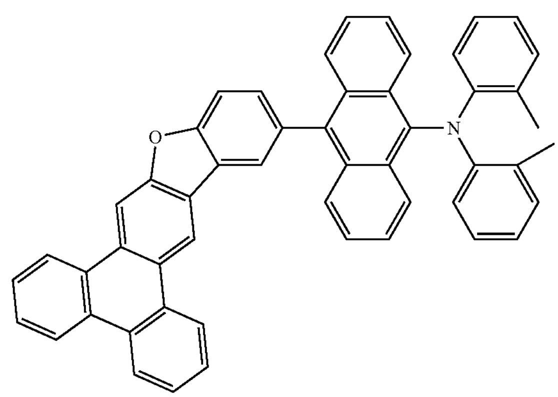

-continued
EX55
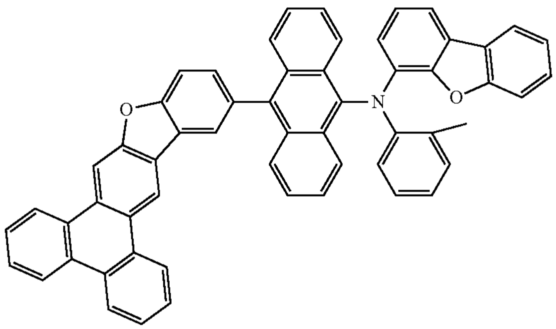
EX56
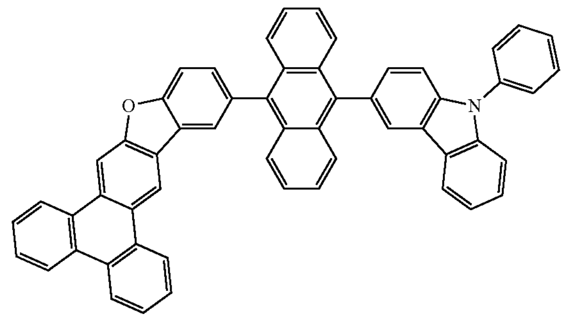
EX57
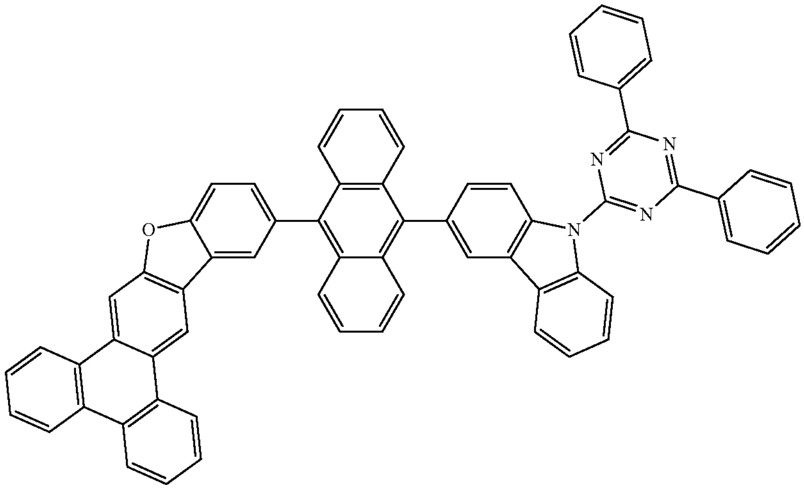
EX58
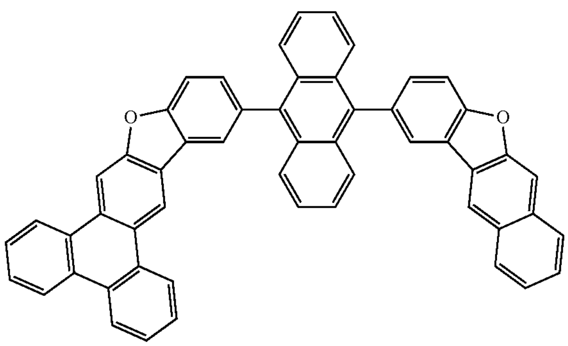
EX59
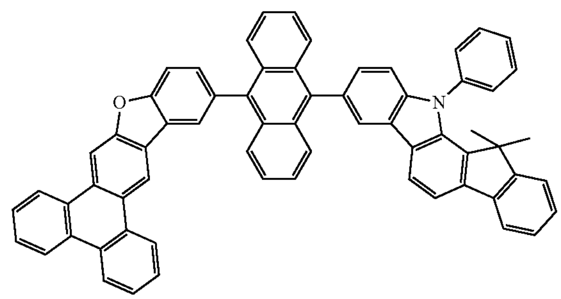
EX60
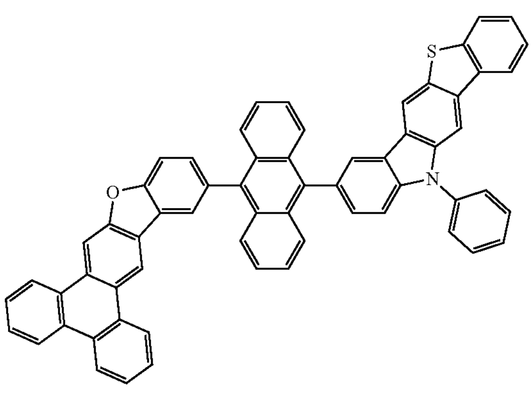
EX61
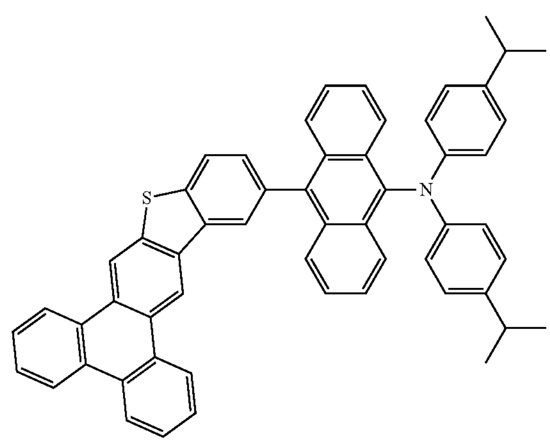

-continued
EX62
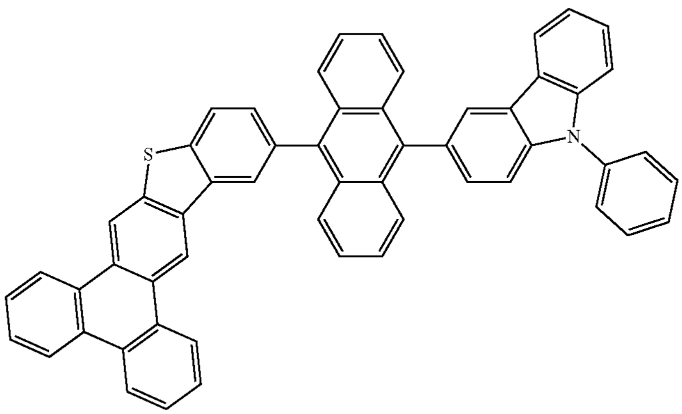
EX63
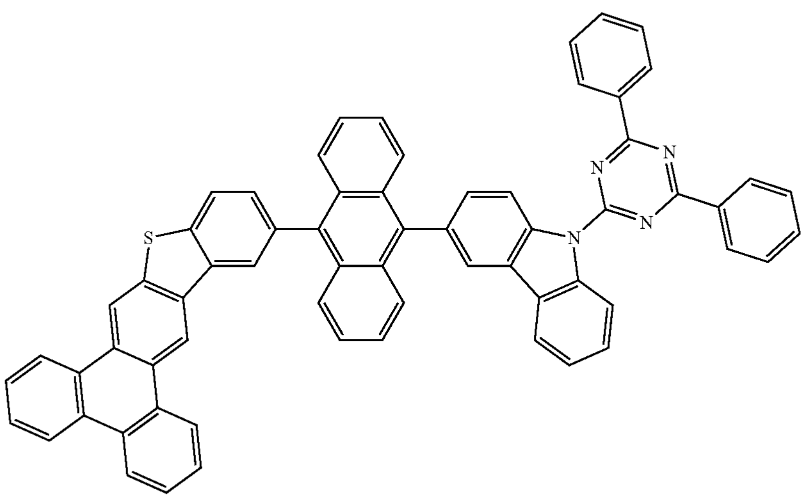
EX64
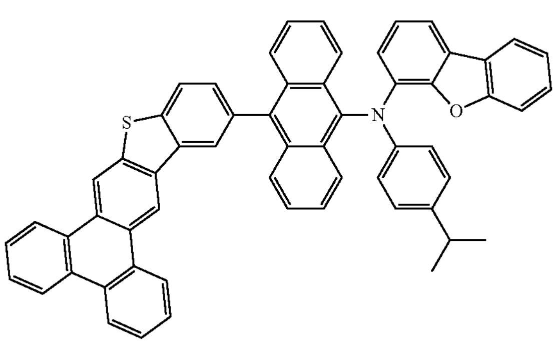
EX65
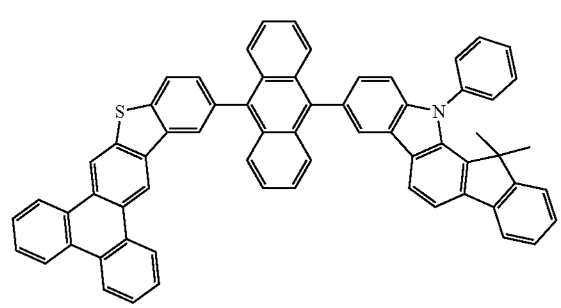

-continued
EX66
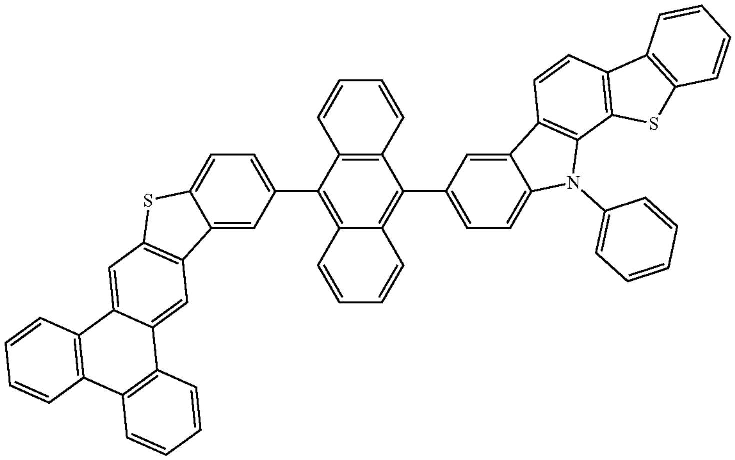
EX67
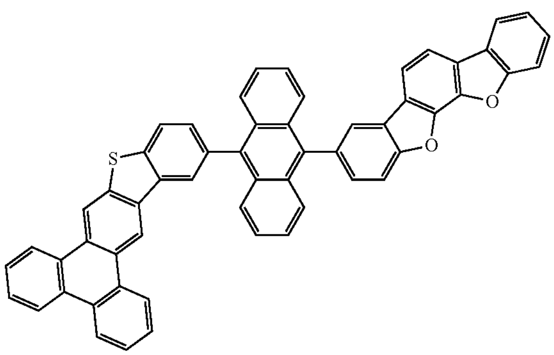
EX68
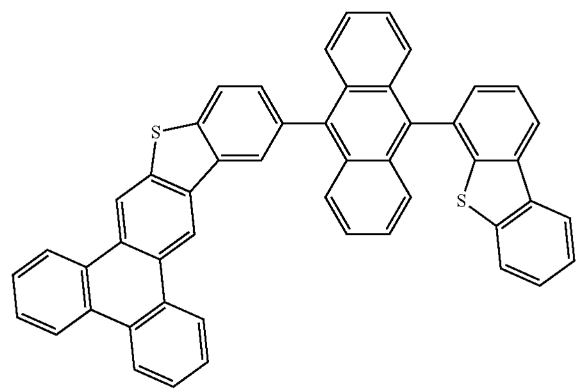
EX69
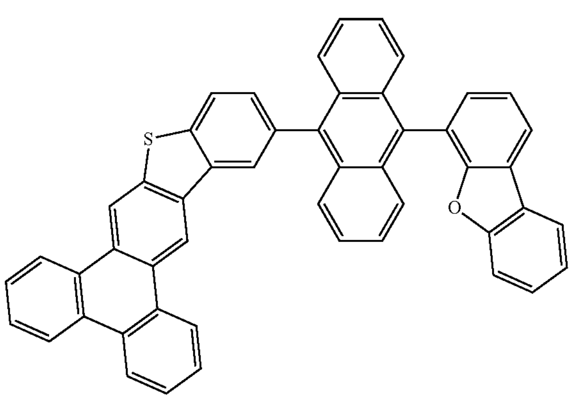
EX70
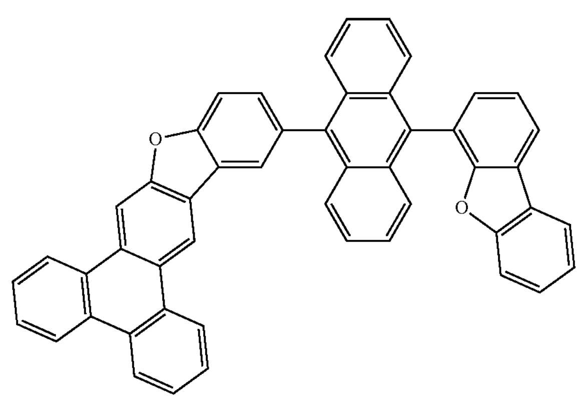

-continued
EX71
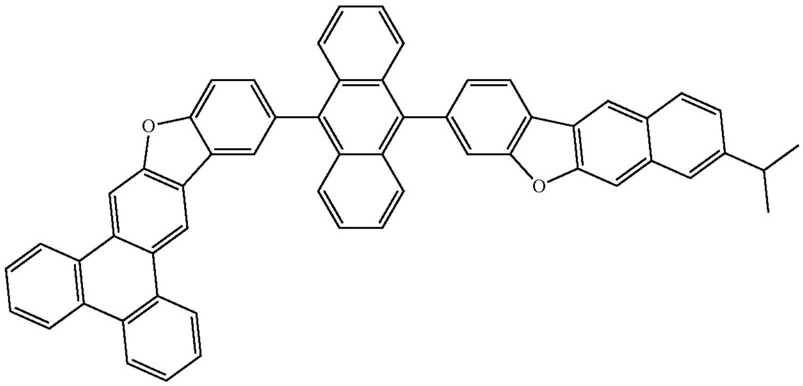
EX72
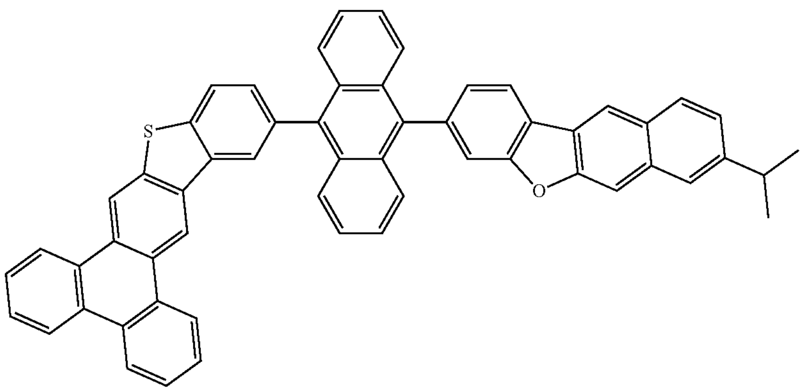
EX73
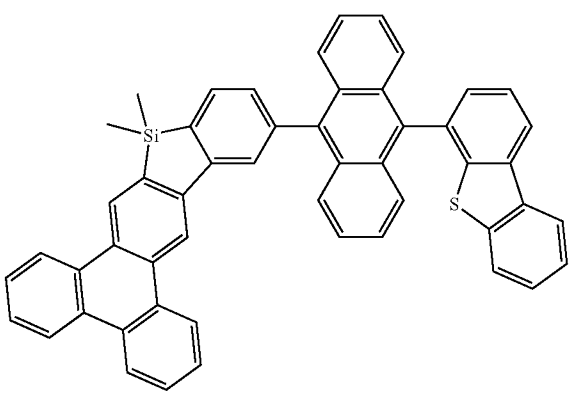
EX74
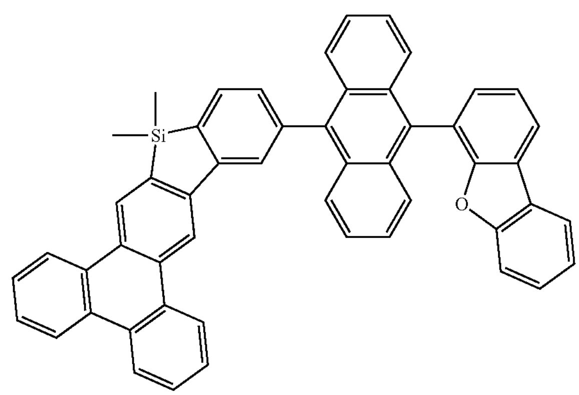
EX75
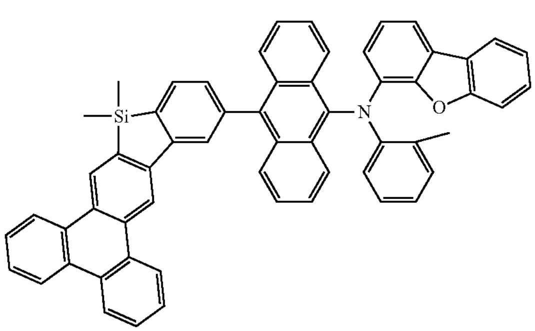
EX76
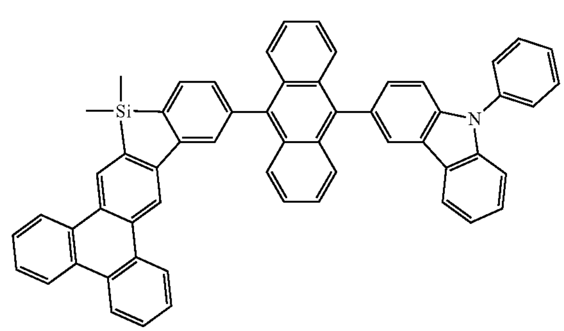

-continued
EX77
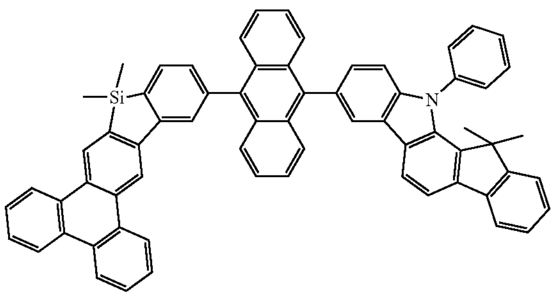
EX78
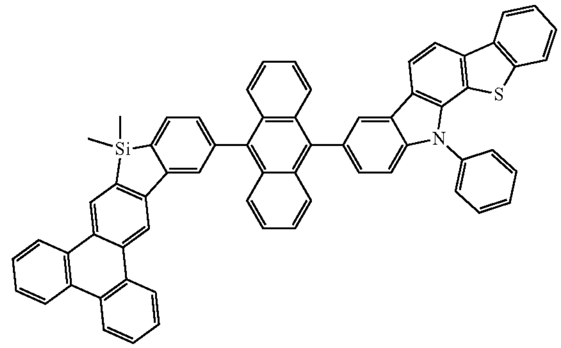
EX79
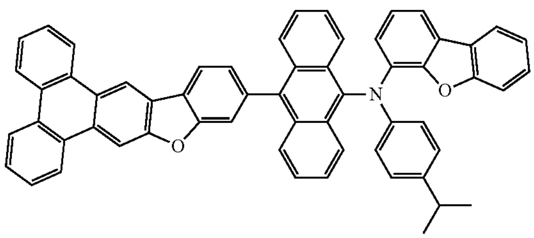
EX80
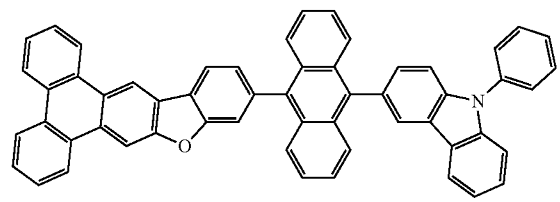
EX81
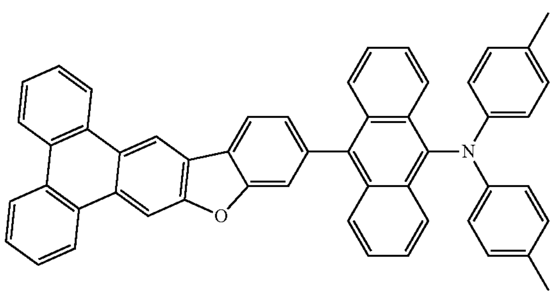
EX82
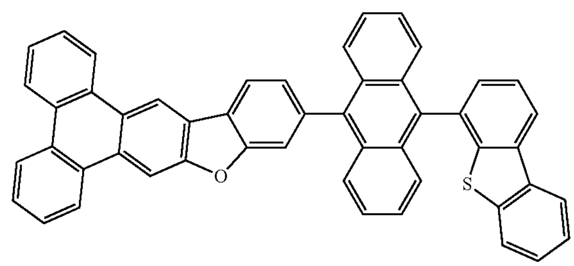
EX83
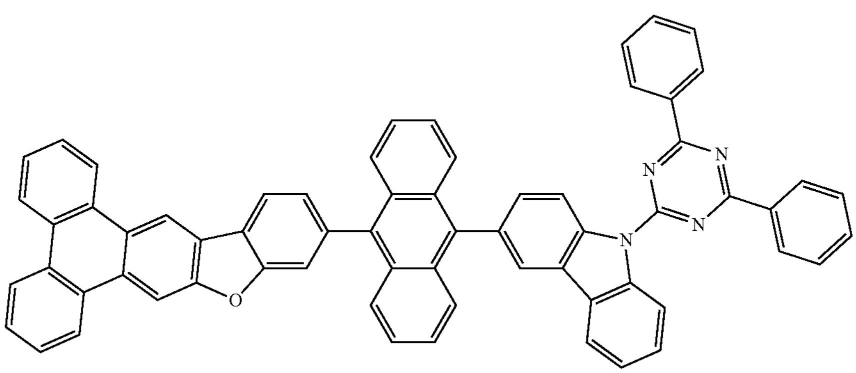
EX84
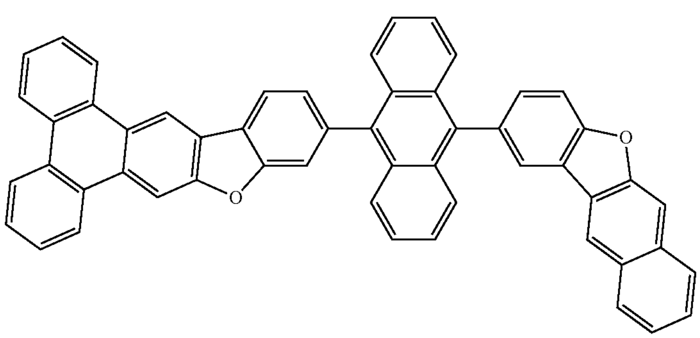

-continued
EX85
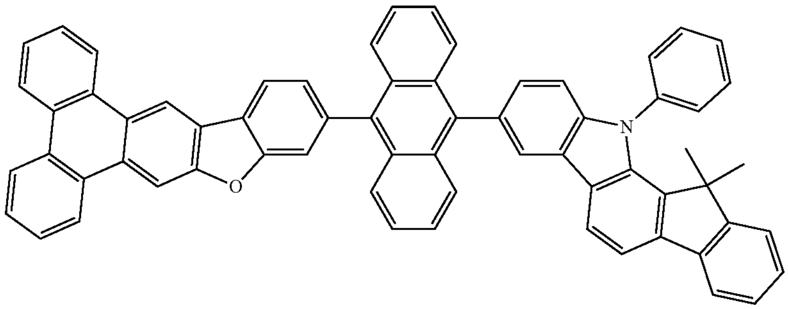
EX86
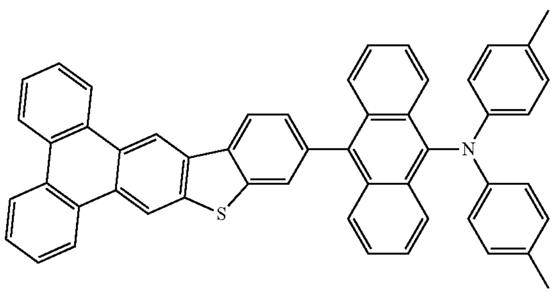
EX87
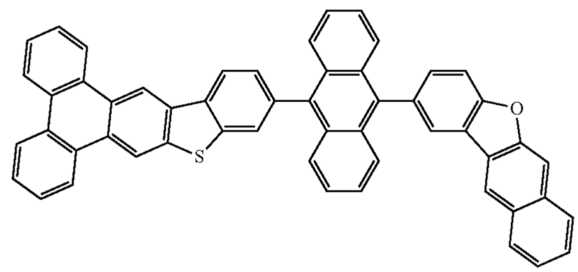
EX88
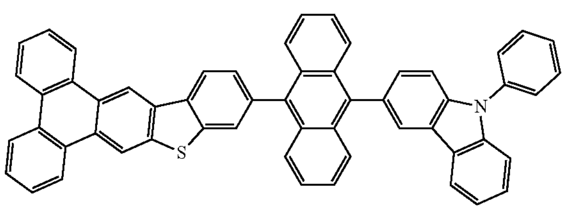
EX89
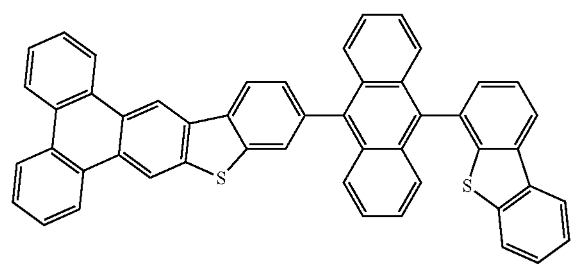
EX90
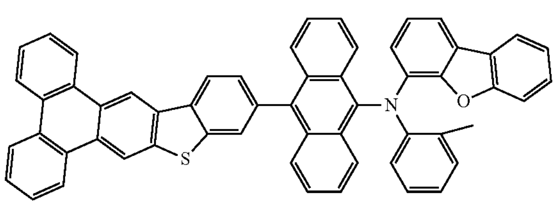
EX91
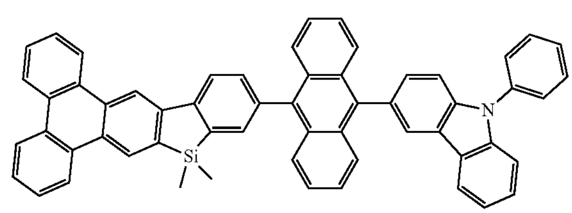
EX92
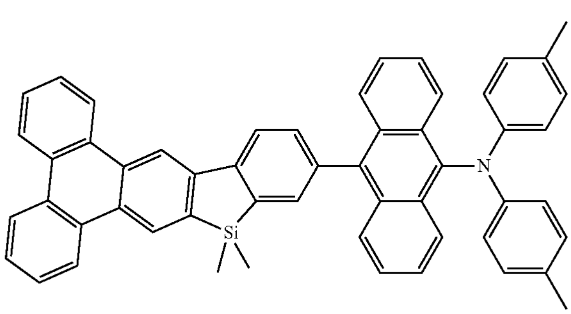
EX93
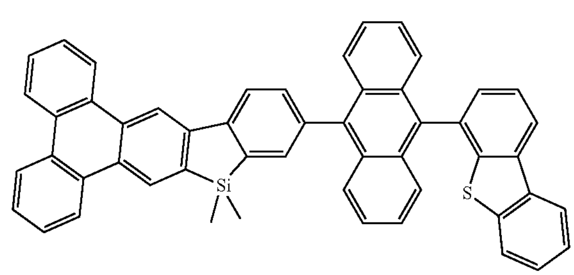

-continued
EX94
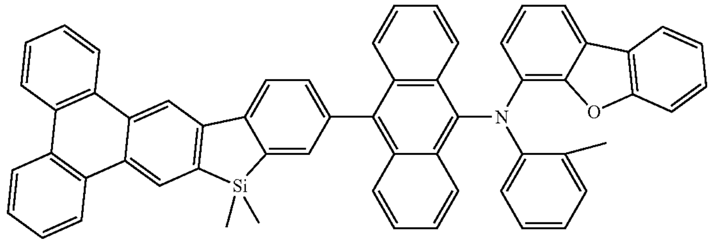
EX95
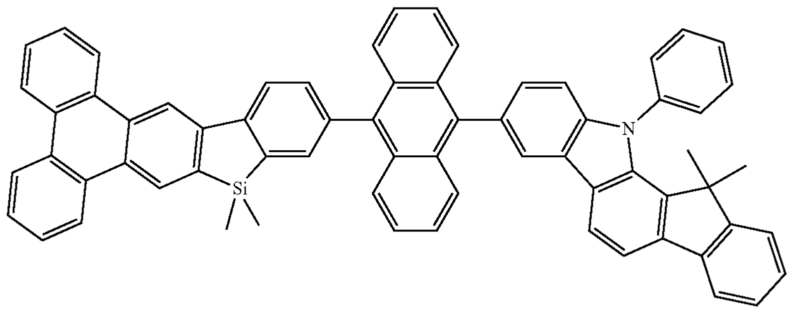
EX96
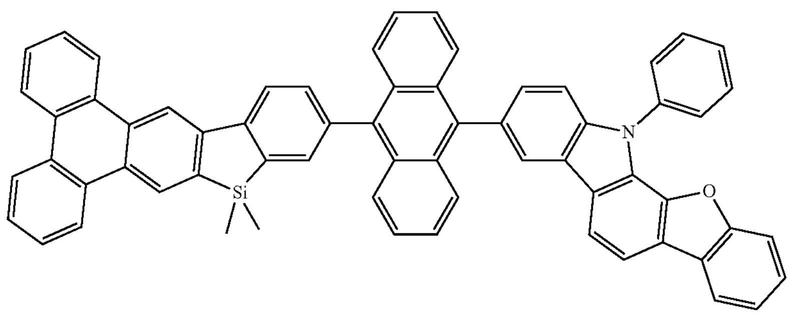
EX97
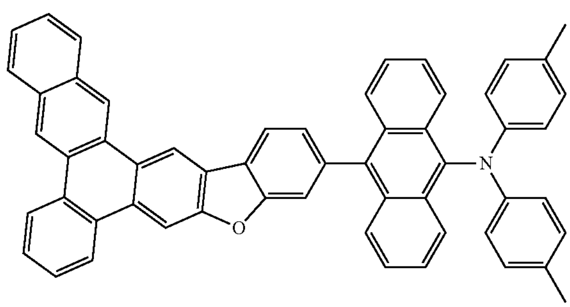
EX98
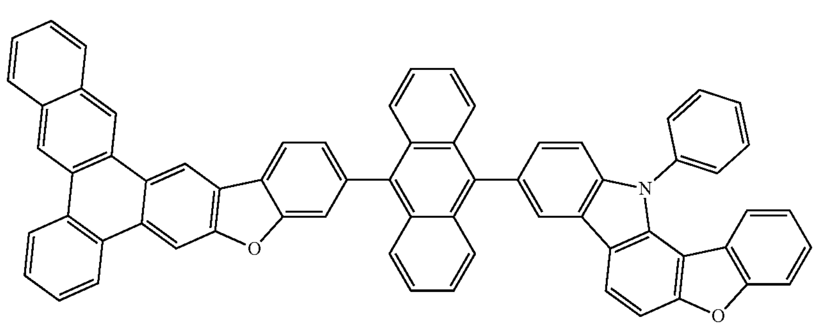

-continued
EX99
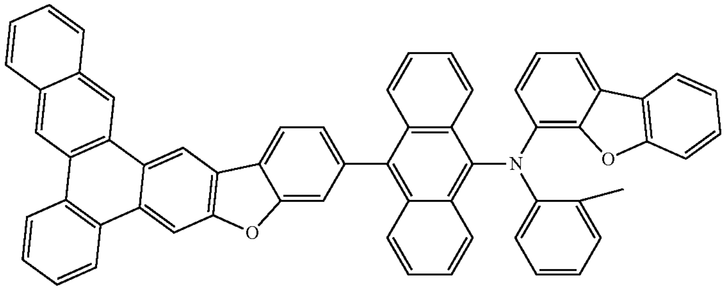
EX100
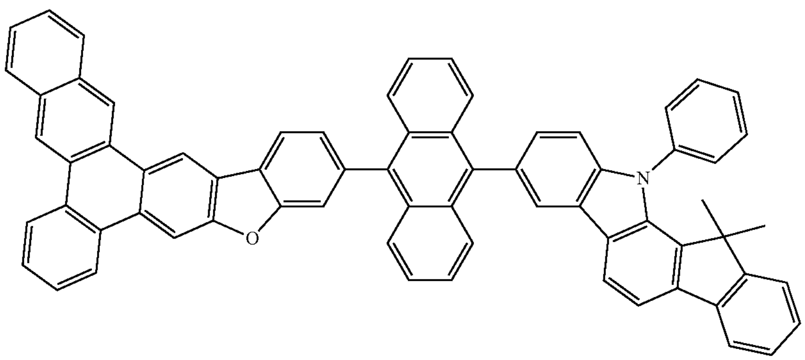
EX101
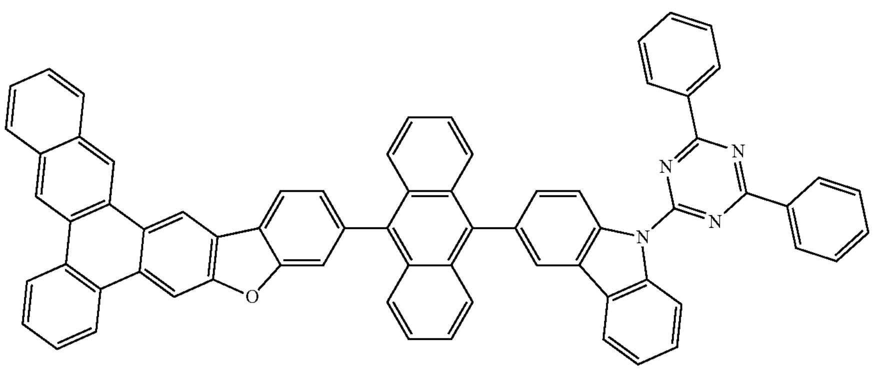
EX102
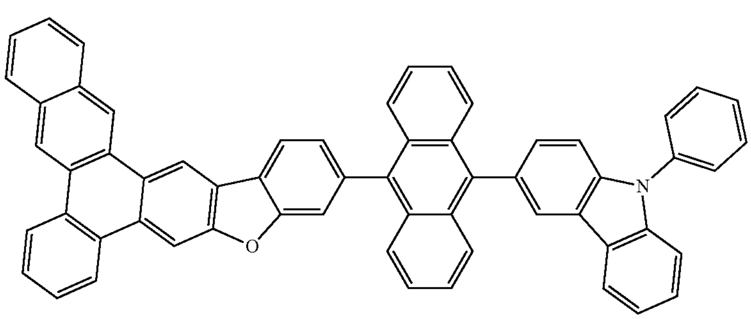

-continued
EX103
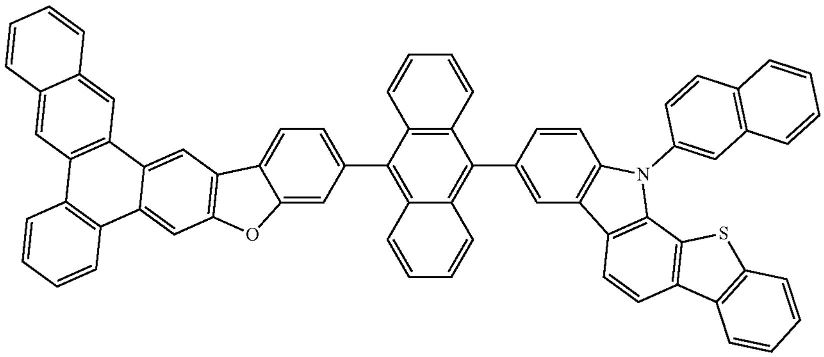
EX104
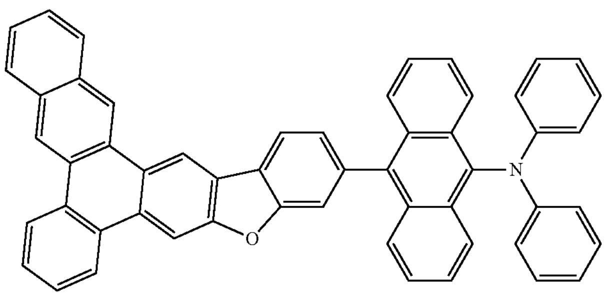
EX105
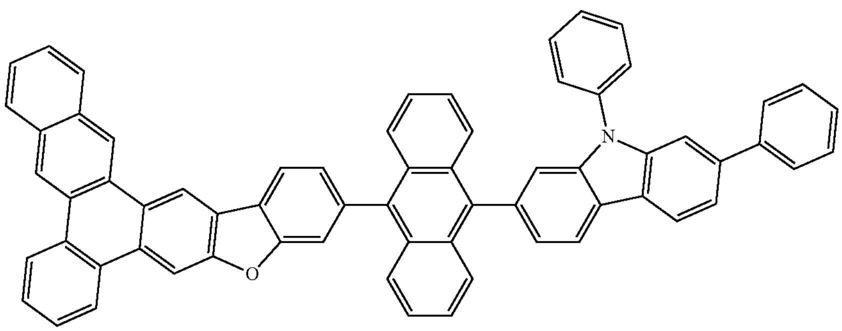
EX106
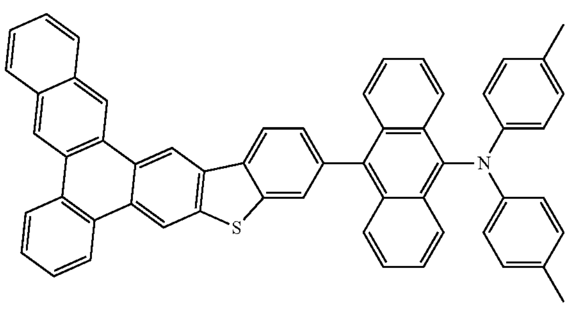
EX107
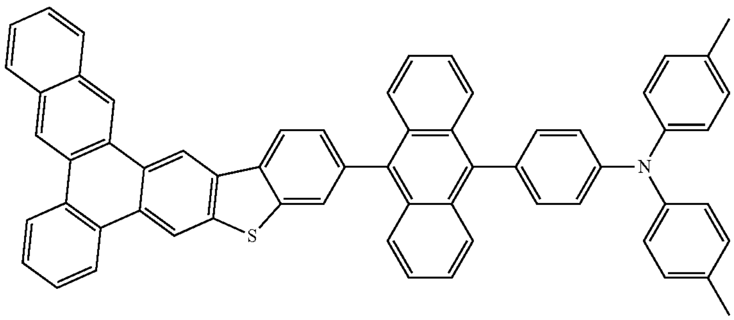

-continued
EX108
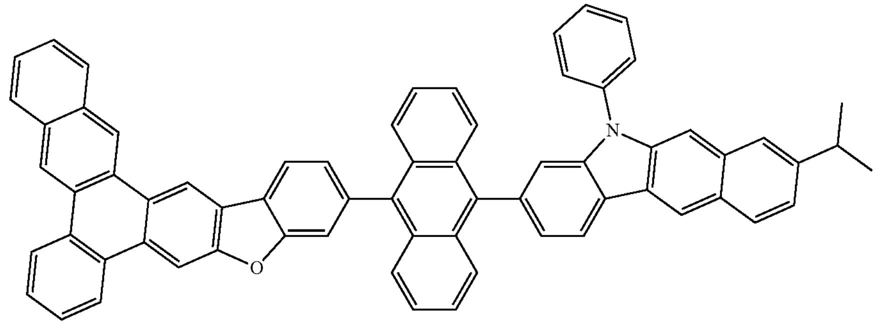
EX109
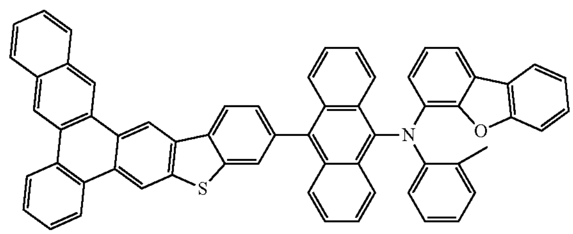
EX110
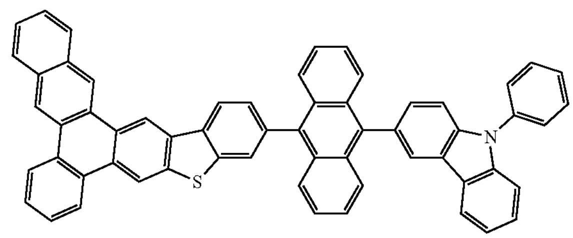
EX111
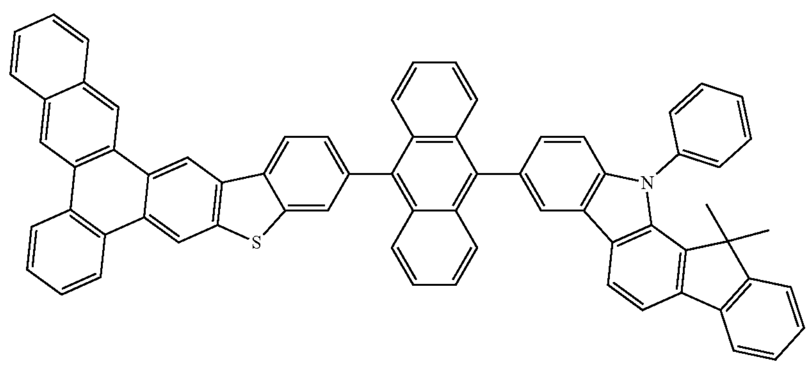
EX112
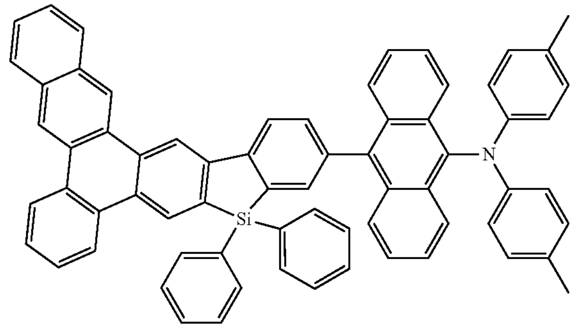
EX113
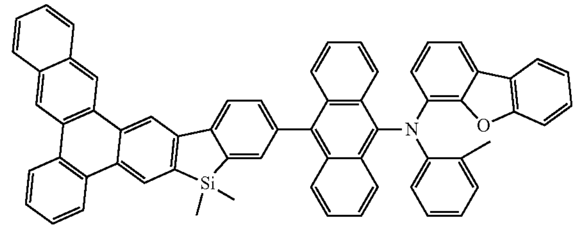

-continued
EX114
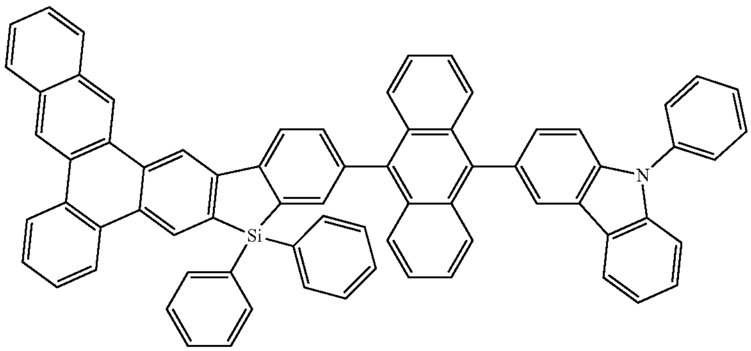
EX115
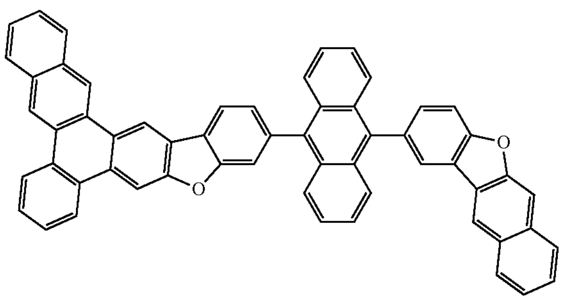
EX116
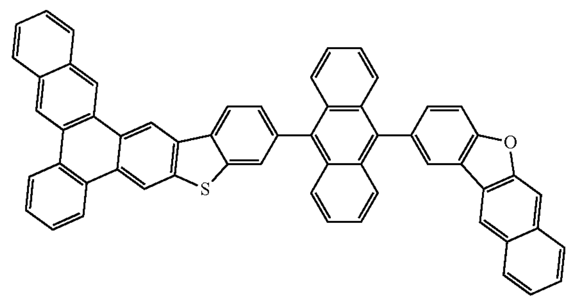
EX117
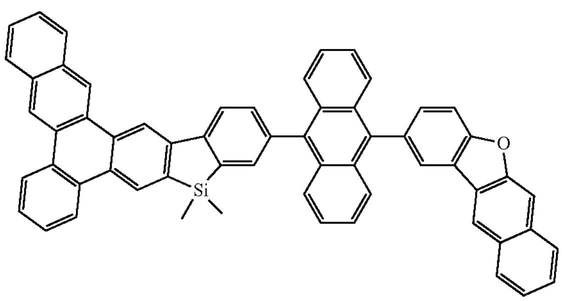
EX118
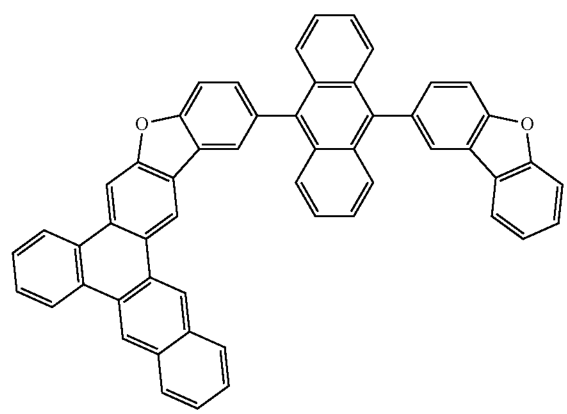
EX119
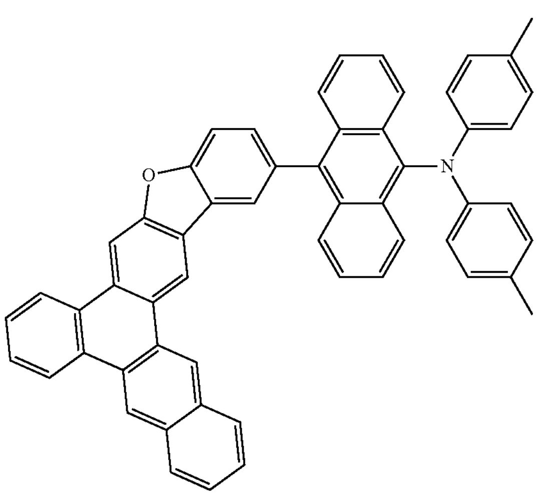
EX120
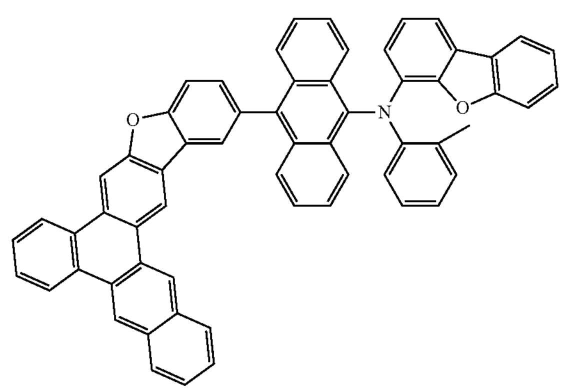

-continued
EX121
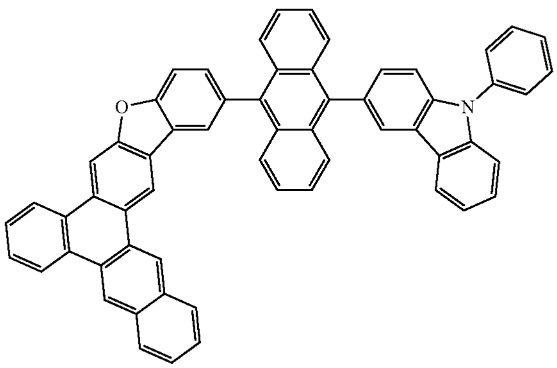
EX122
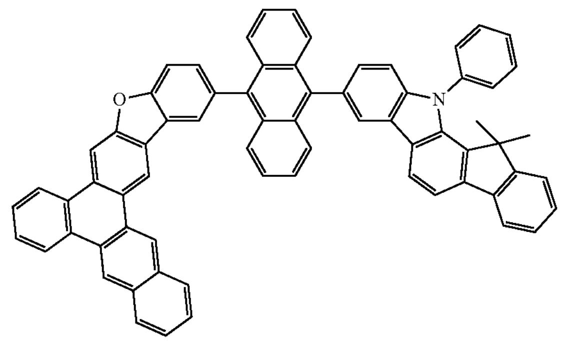
EX123
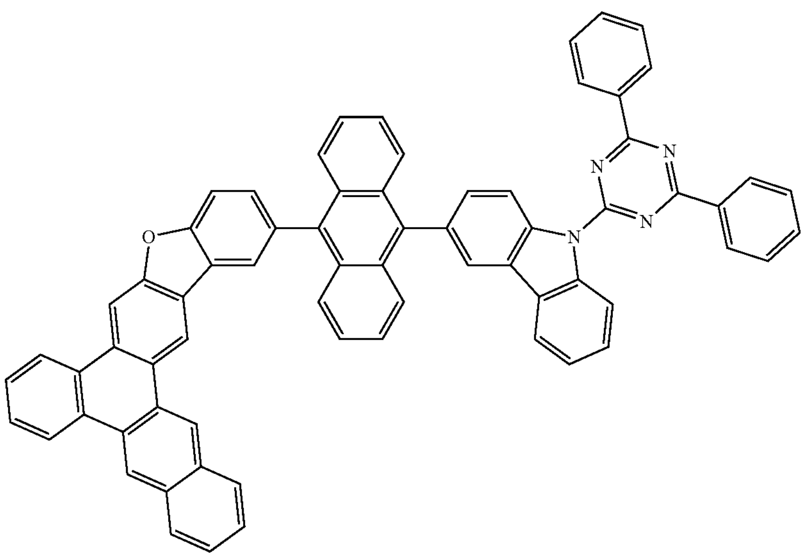
EX124
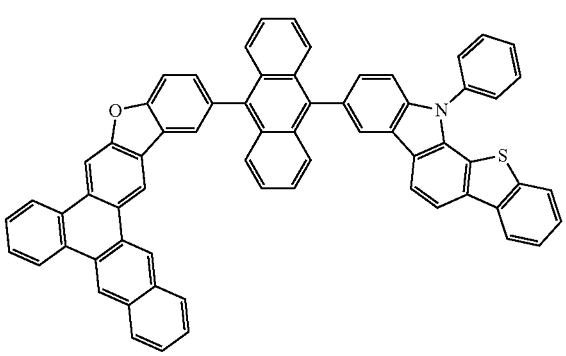
EX125
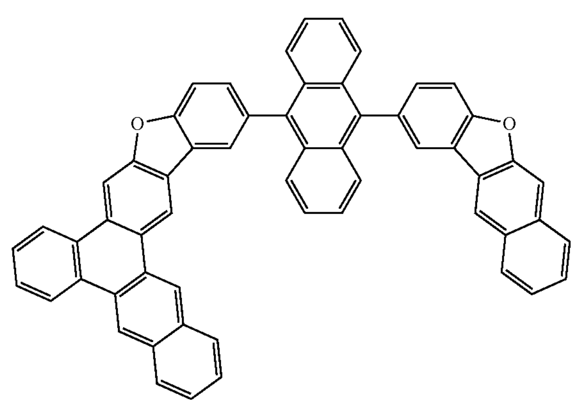

-continued
EX126
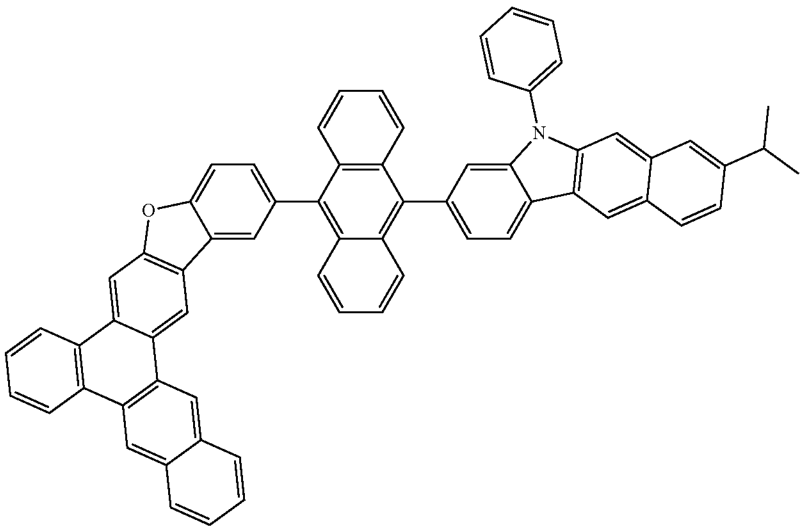
EX127
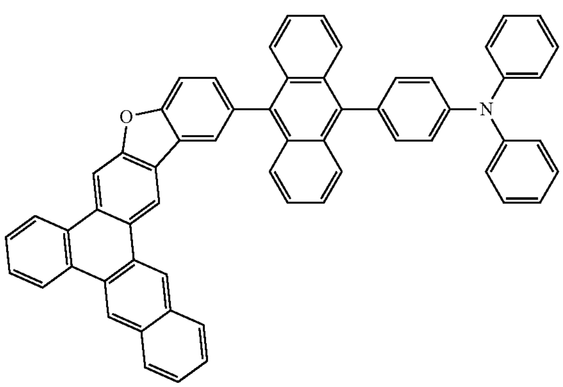
EX128
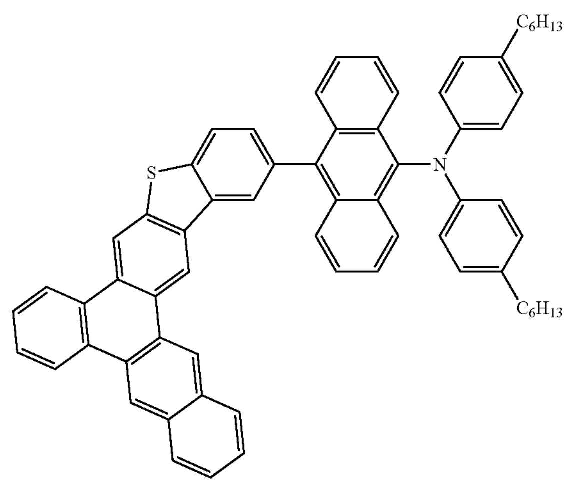
EX129
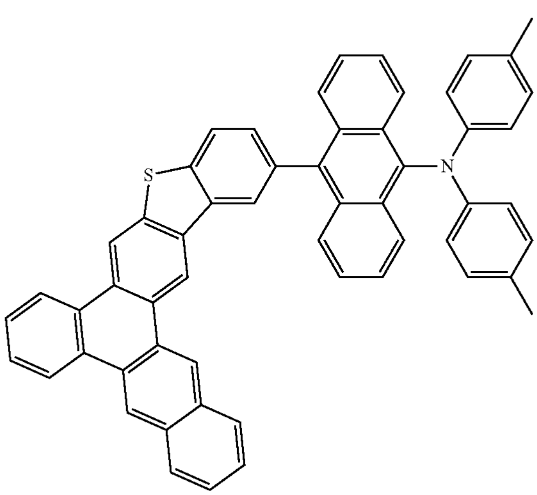
EX130
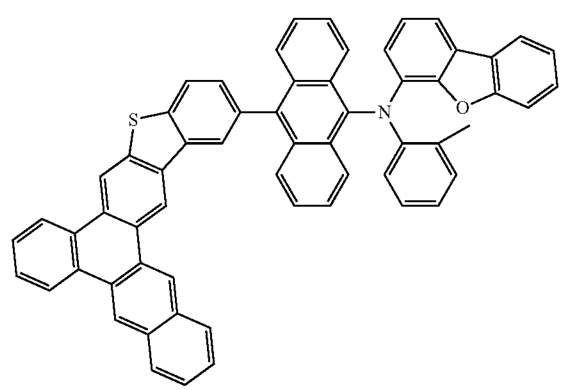

-continued
EX131
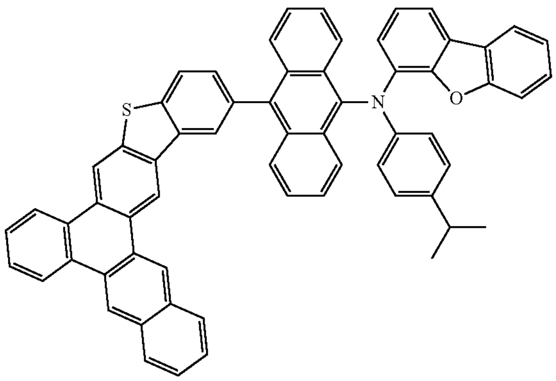
EX132
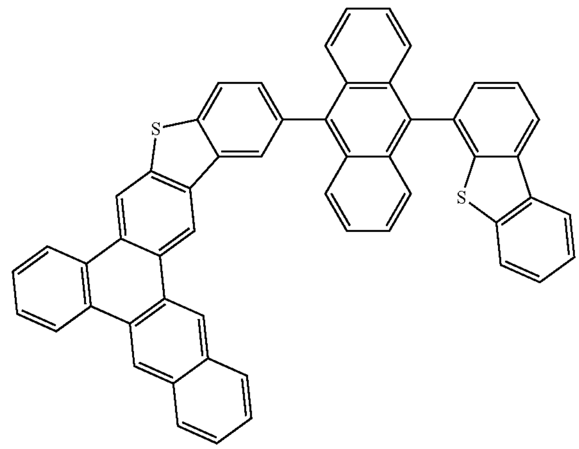
EX133
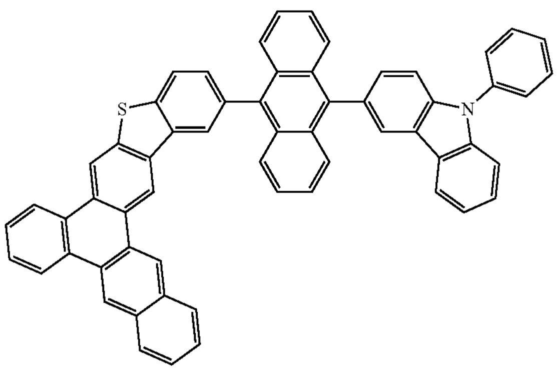
EX134
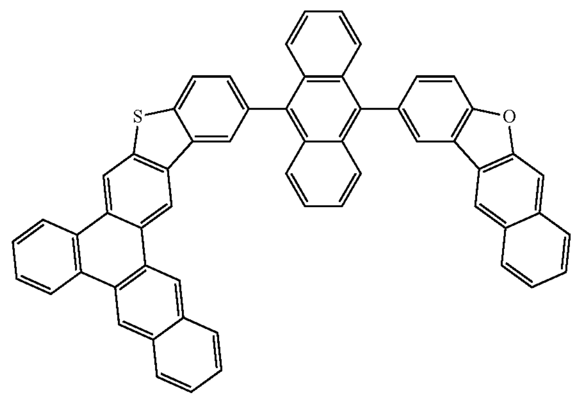
EX135
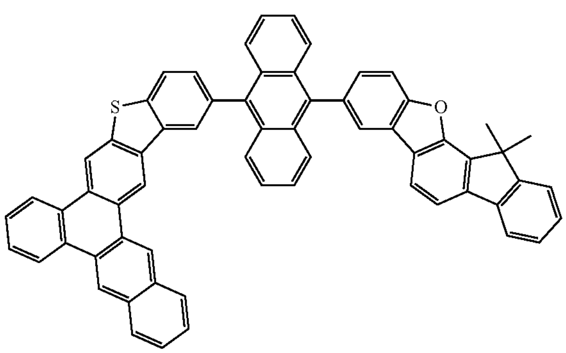
EX136
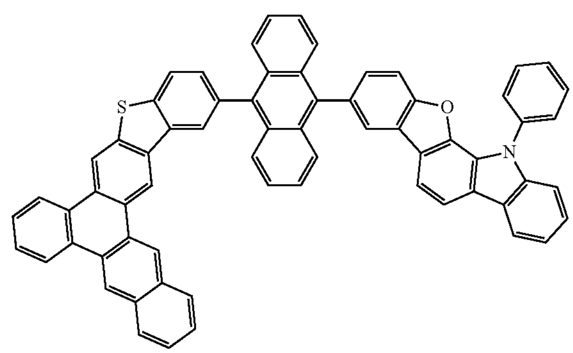
EX137
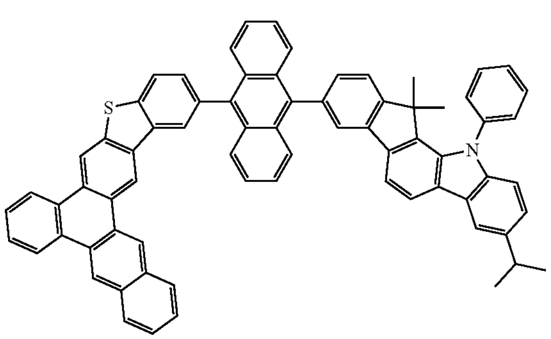
EX138
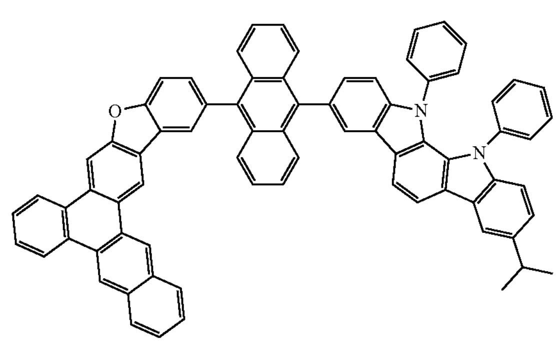

-continued
EX139
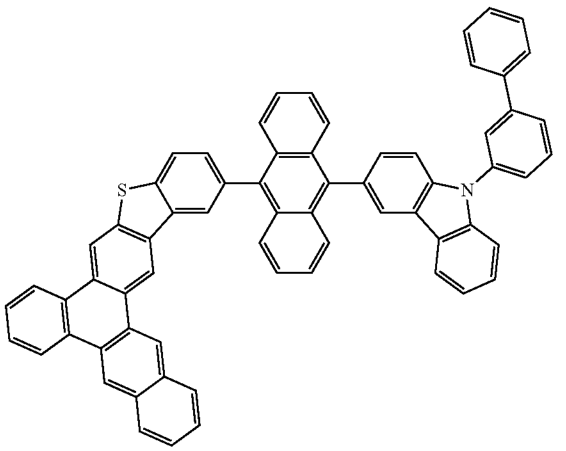
EX140
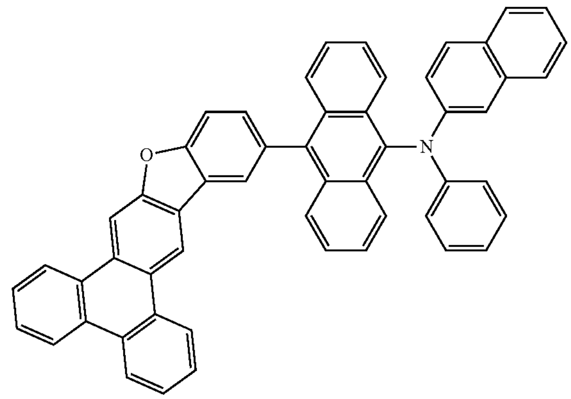
EX141
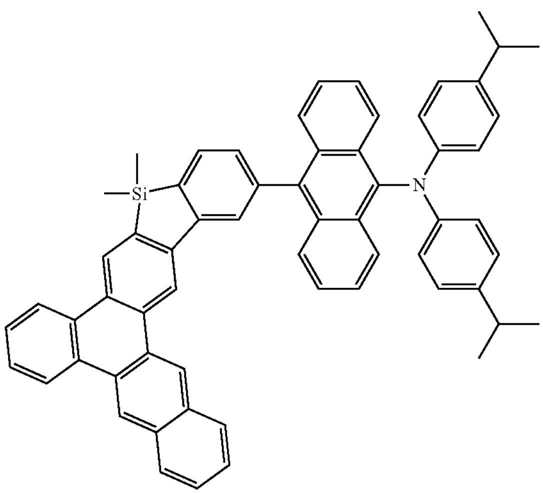
EX142
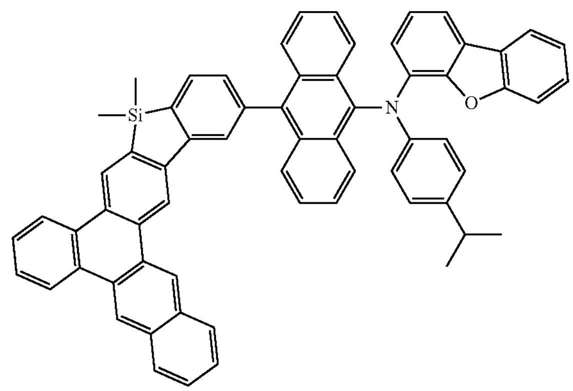
EX143
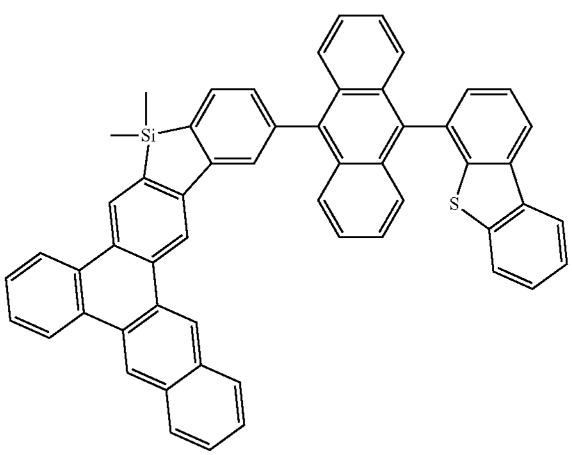
EX144
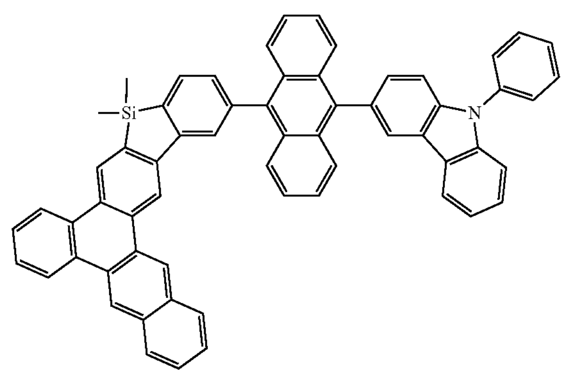

-continued
EX145
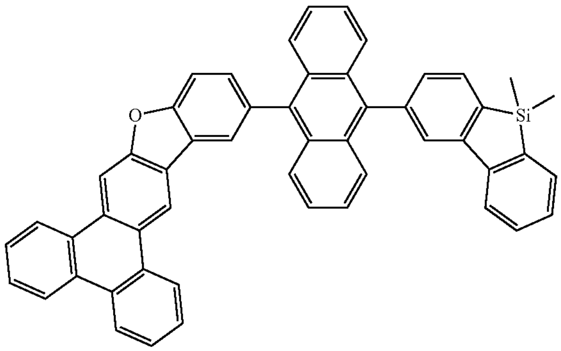
EX146
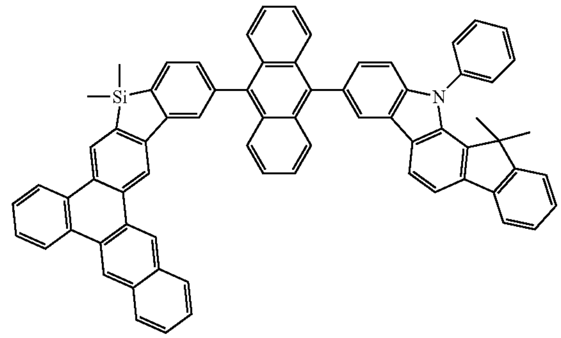
EX147
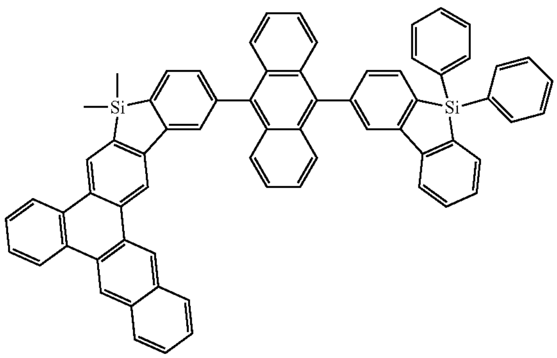
EX148
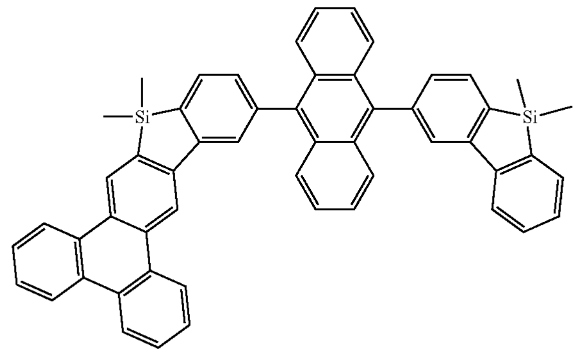
EX149
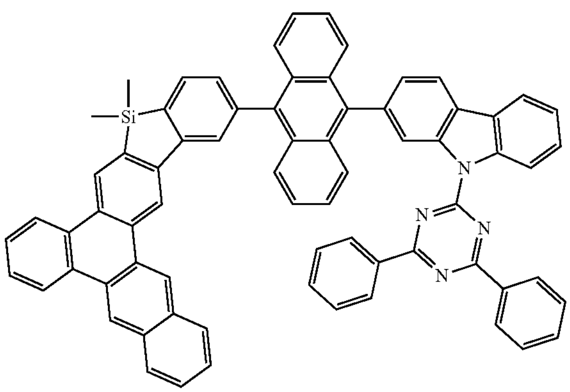
EX150
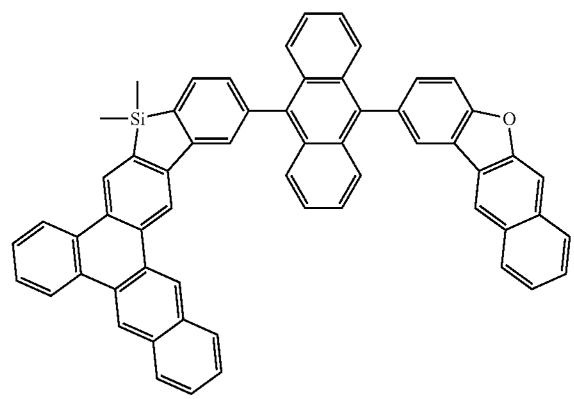
EX151
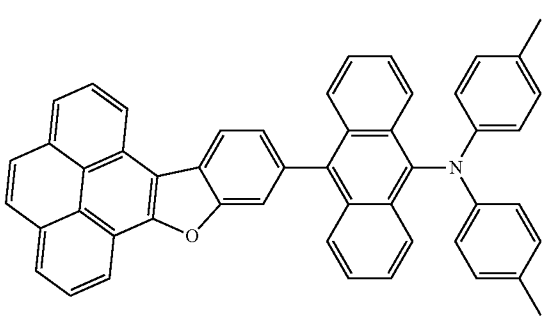
EX152
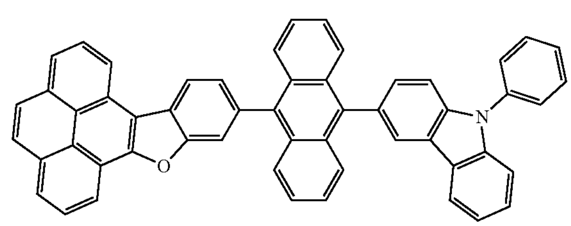

-continued
EX153
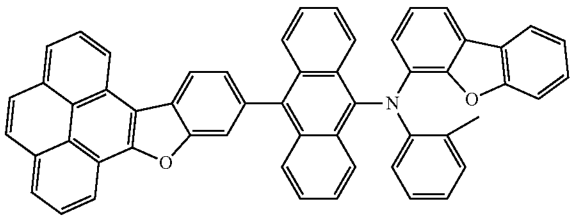
EX154
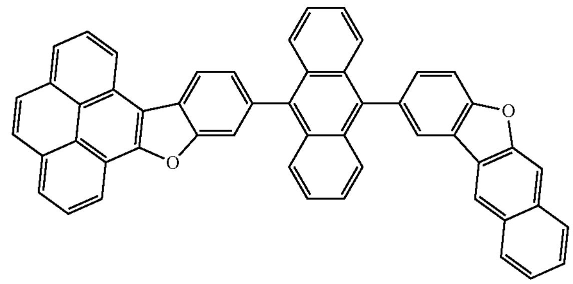
EX155
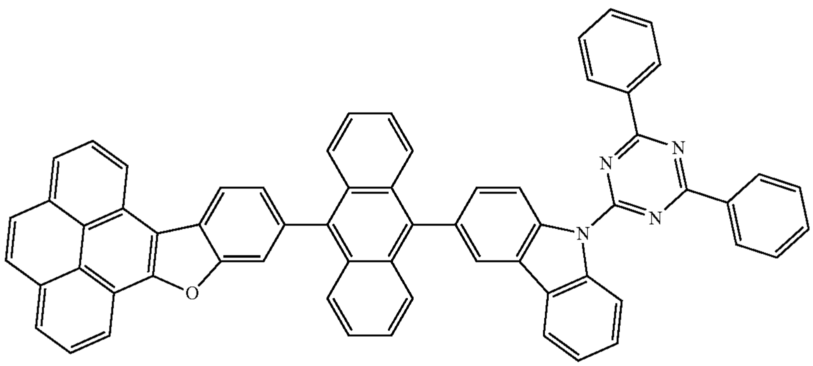
EX156
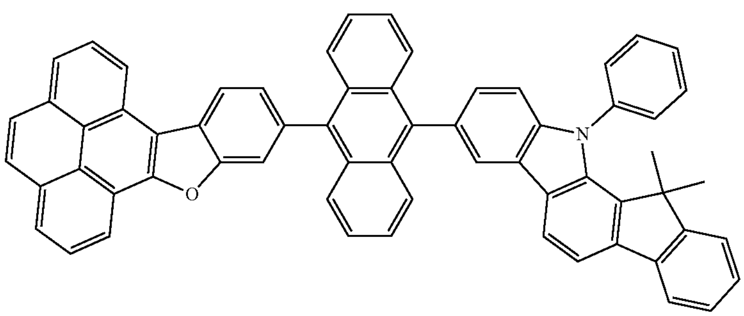
EX157
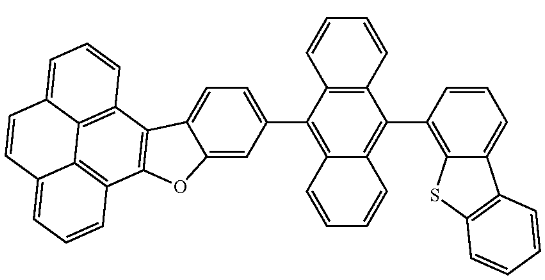
EX158
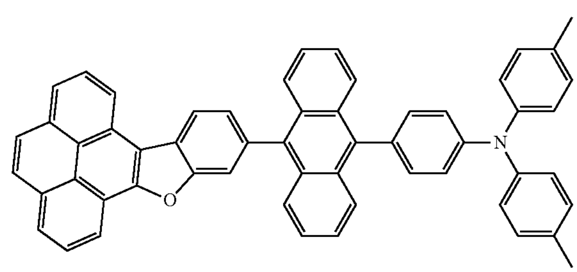

-continued
EX159
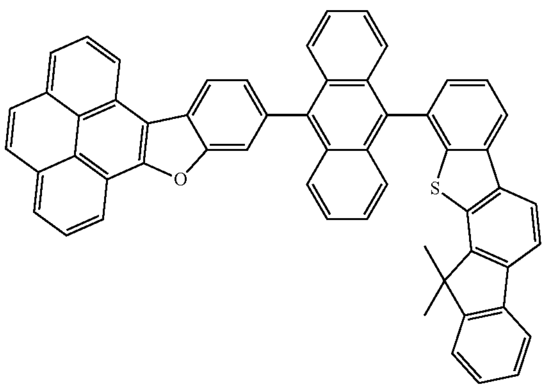
EX160
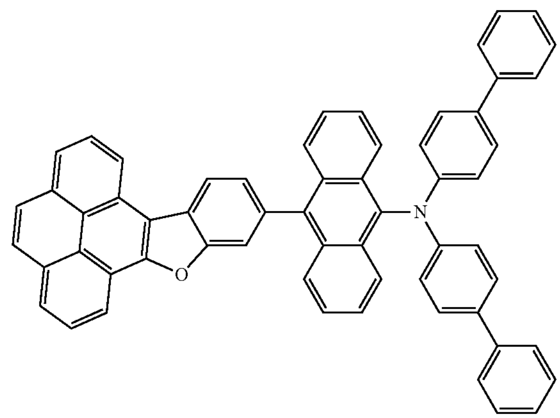
EX161
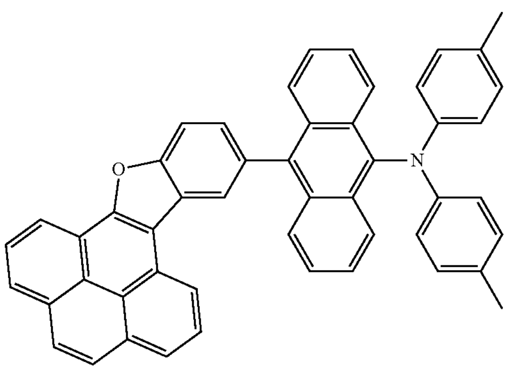
EX162
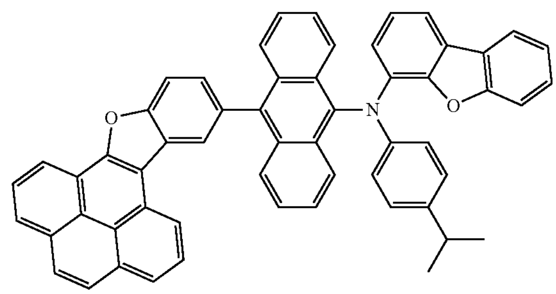
EX163
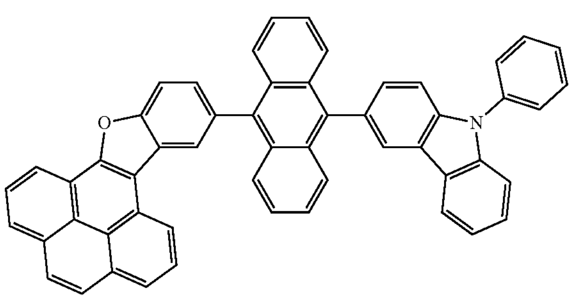
EX164
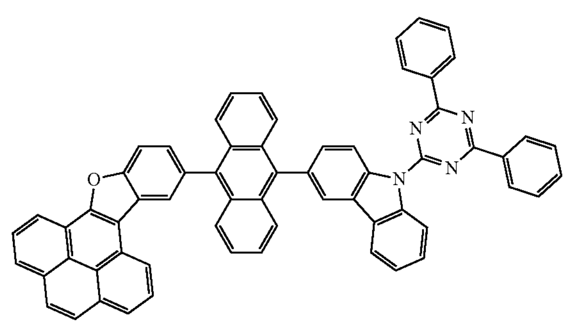
EX165
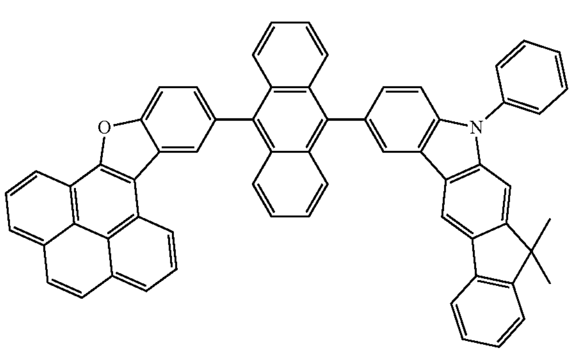
EX166
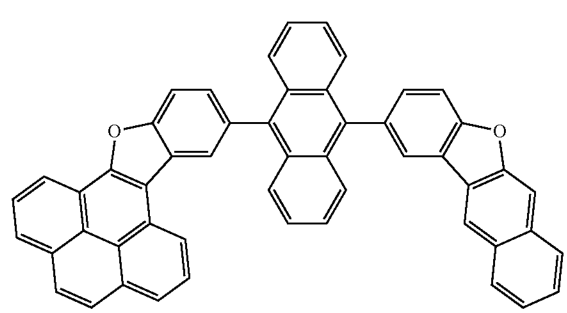

-continued
EX167
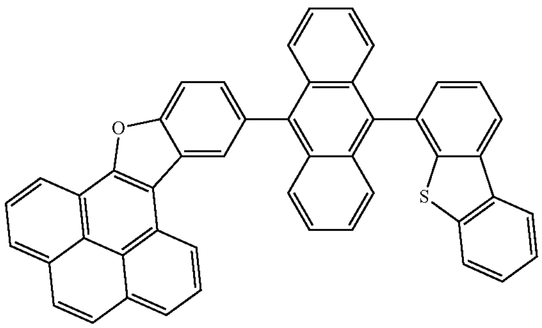
EX168
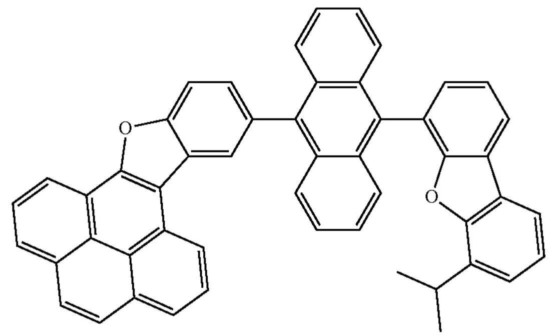
EX169
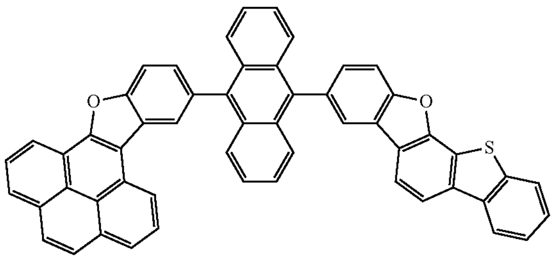
EX170
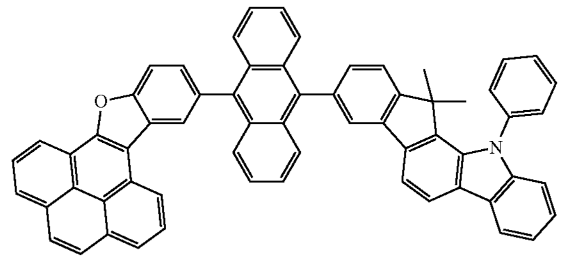
EX171
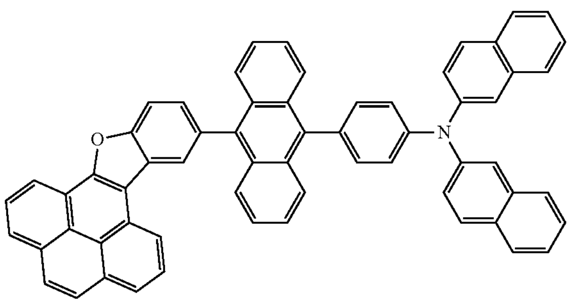
EX172
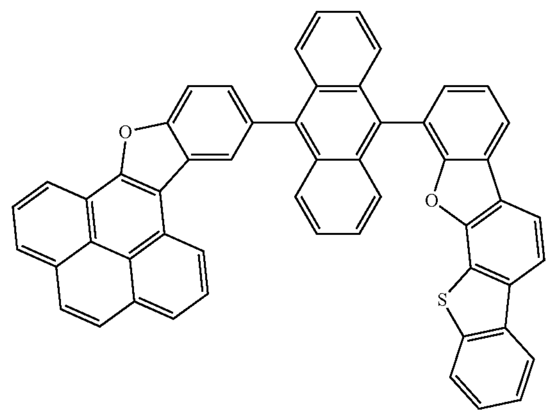
EX173
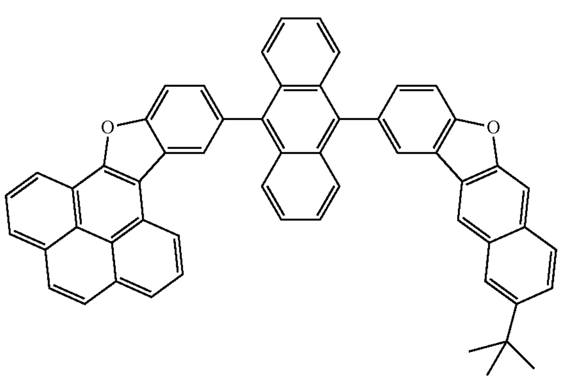
EX174
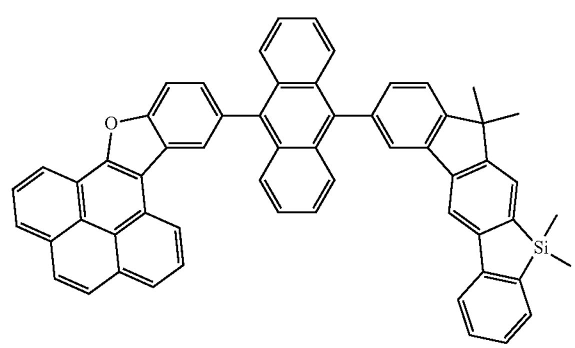

-continued
EX175
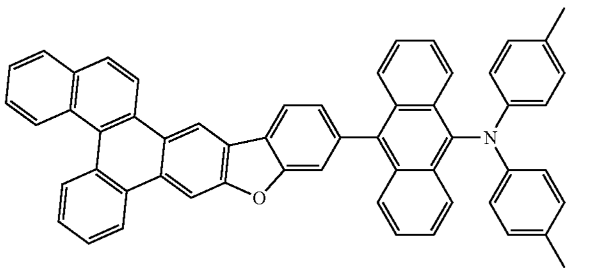
EX176
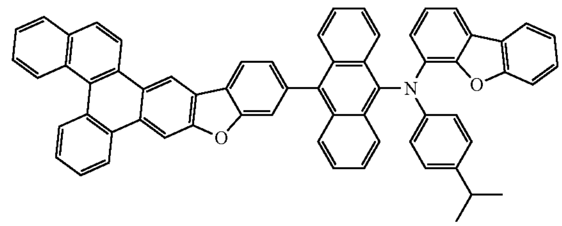
EX177
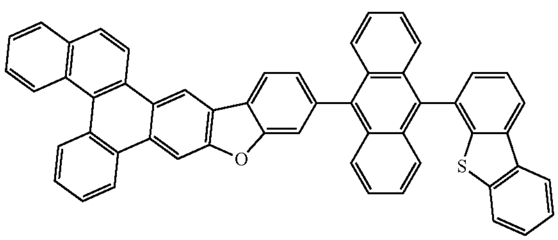
EX178
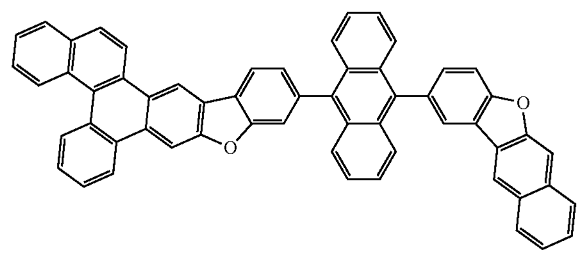
EX179
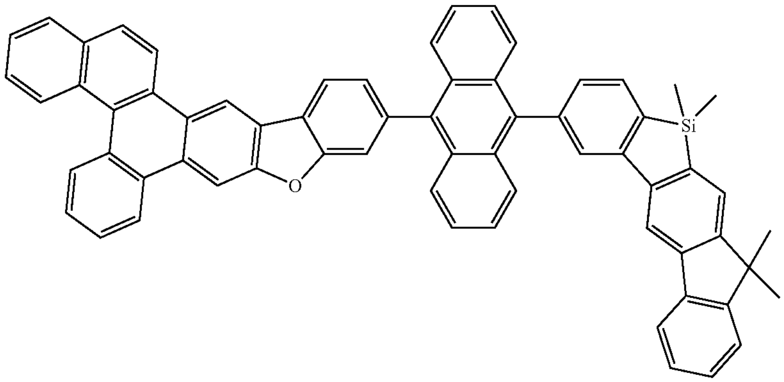
EX180
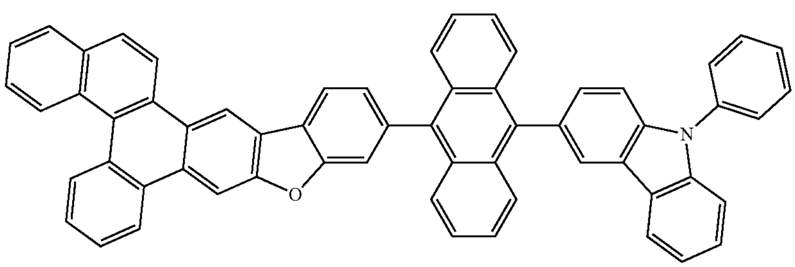
EX181
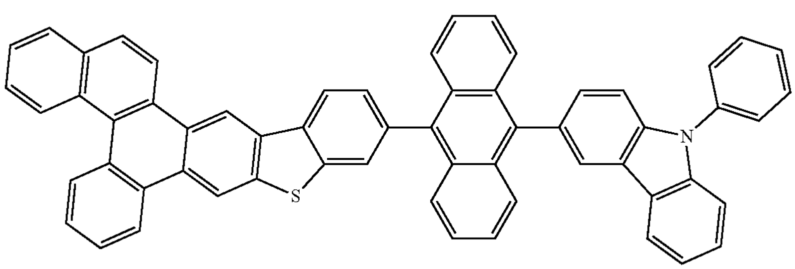

-continued
EX182
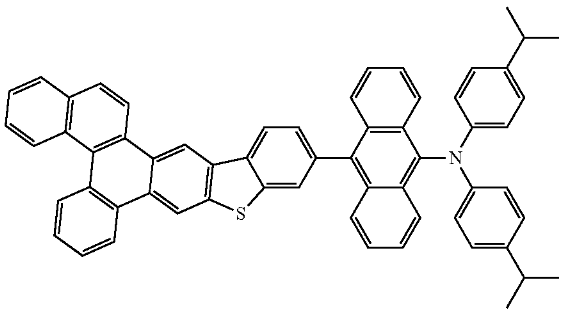
EX183
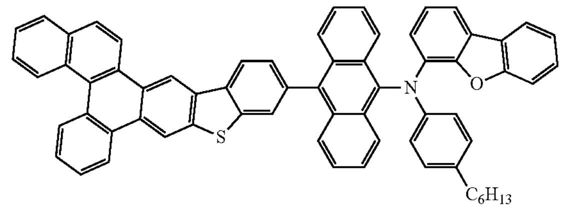
EX184
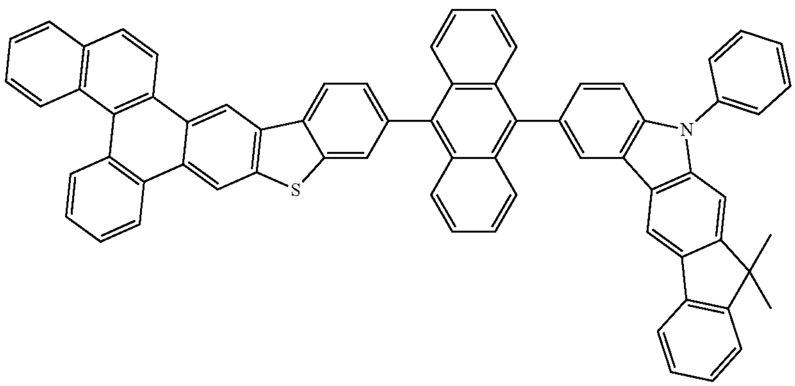
EX185
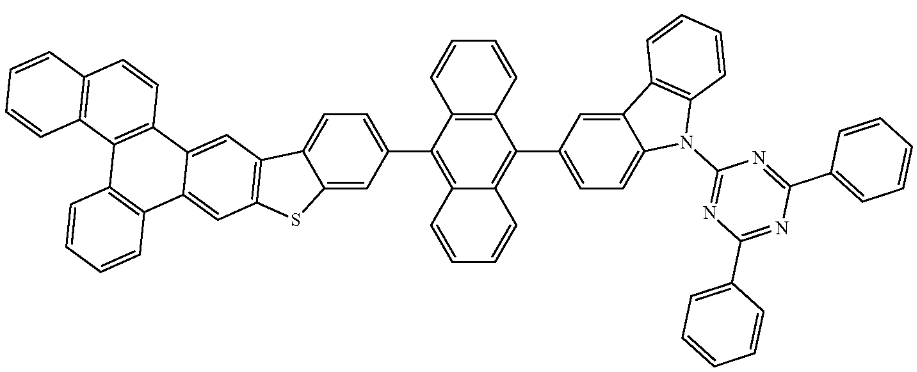
EX186
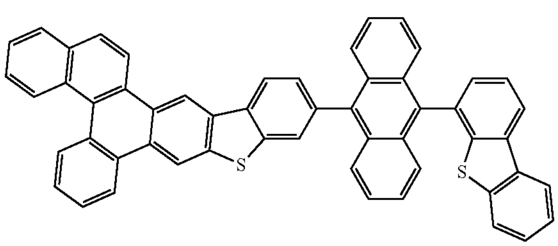
EX187
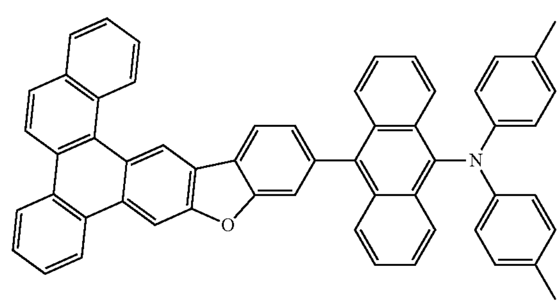

-continued
EX188
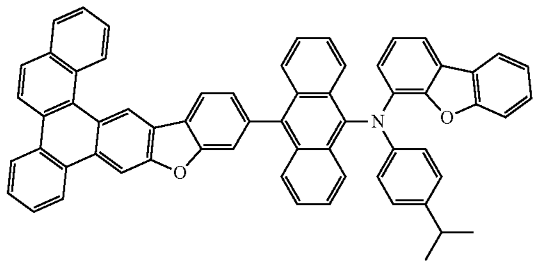
EX189
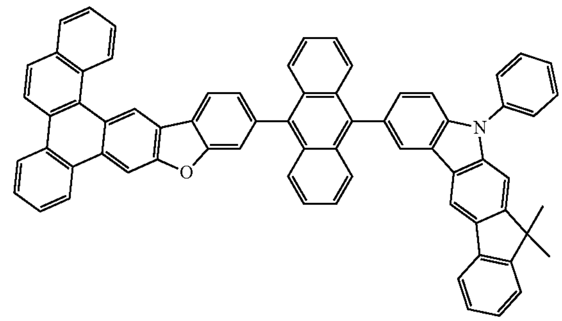
EX190
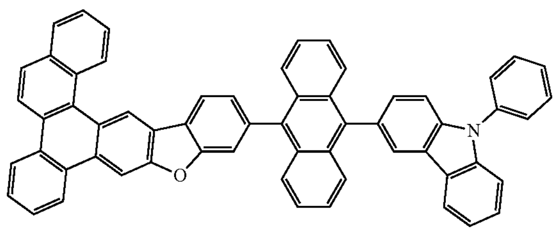
EX191
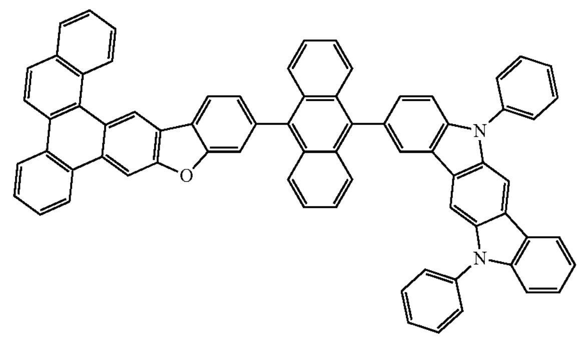
EX192
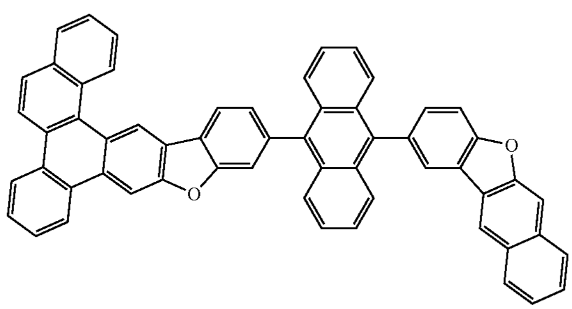
EX193
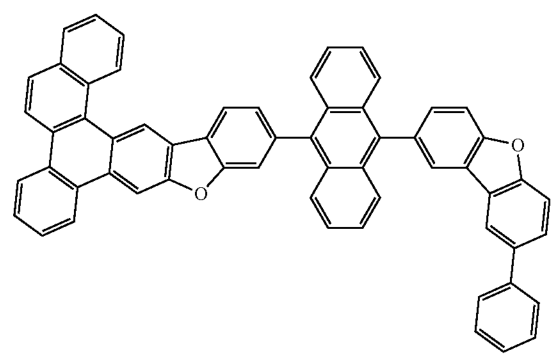
EX194
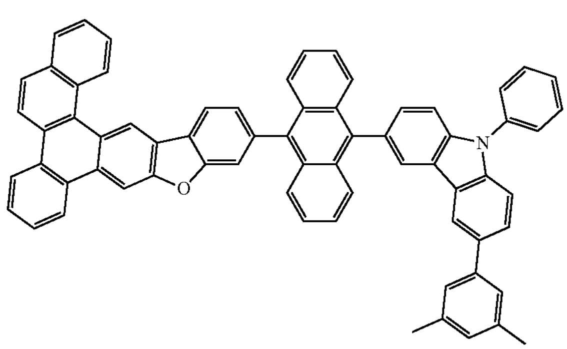
EX195
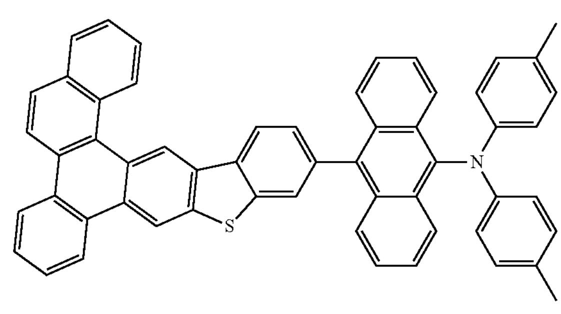

-continued
EX196
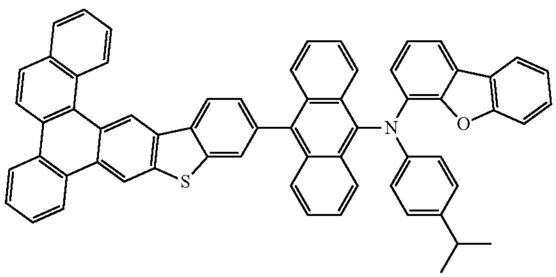
EX197
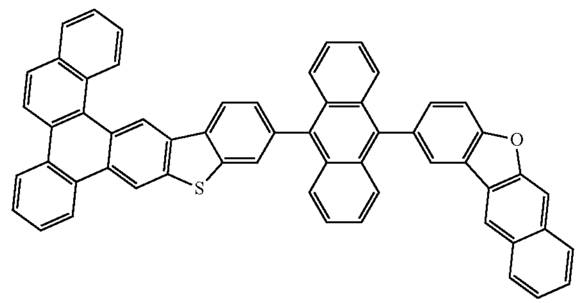
EX198
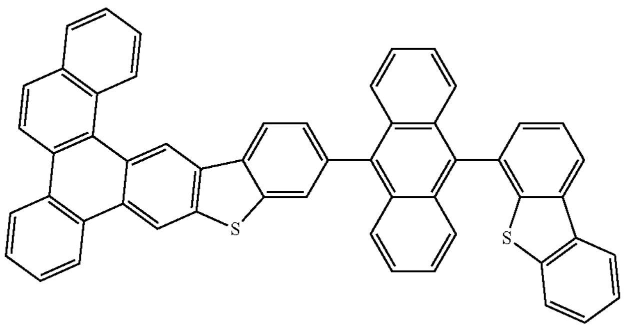
EX199
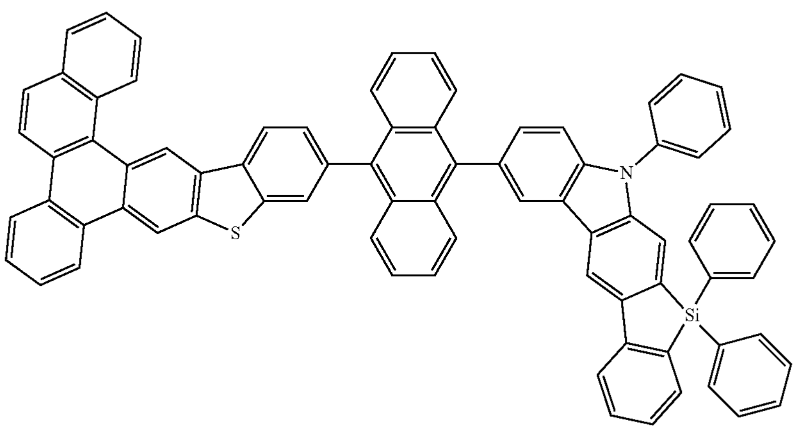
EX200
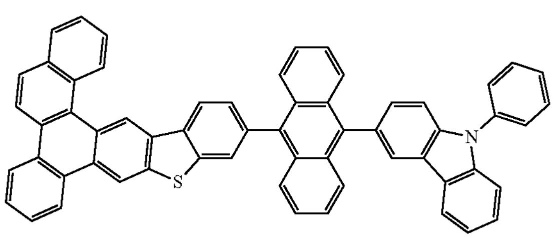
EX201
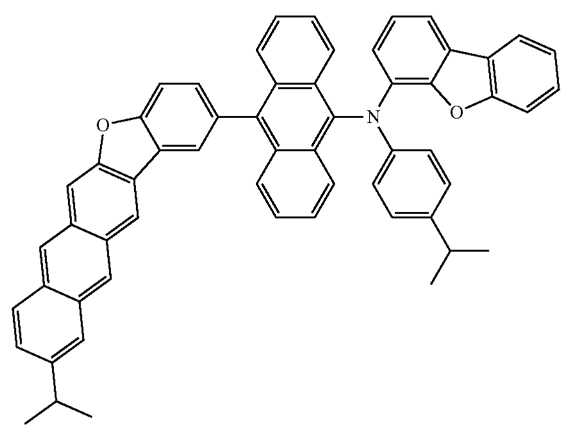

-continued

EX202

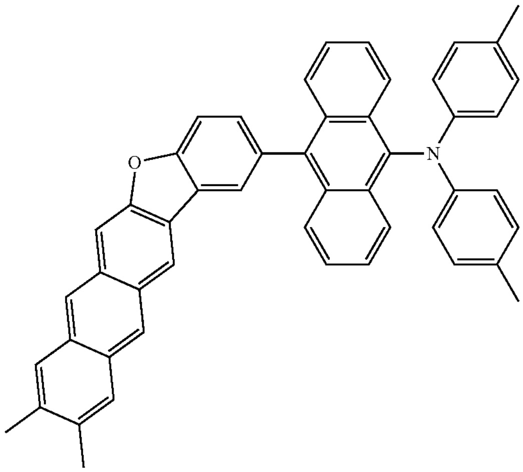

EX203

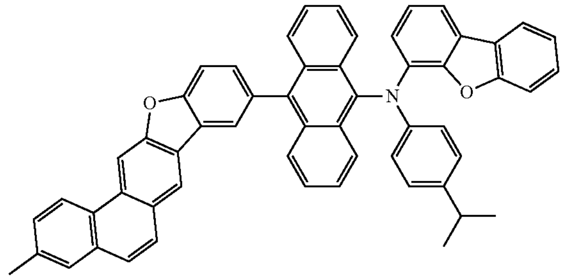

EX204

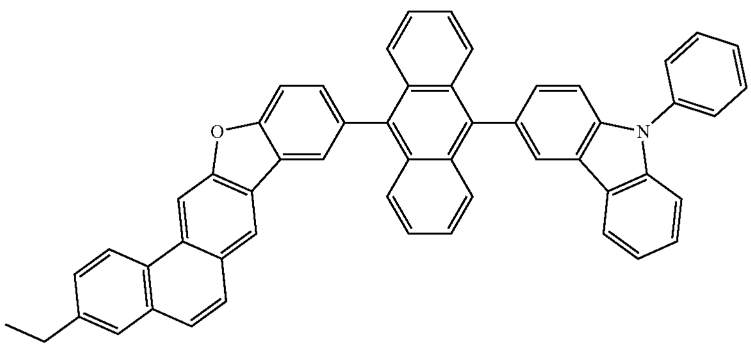

5. An organic electroluminescence device comprising a pair of electrodes having a cathode and an anode, and between the pairs of electrodes comprising at least a light emitting layer and one or more layers of organic thin film layers, wherein the light emitting layer and/or the one or more thin film layers comprise an organic compound as a guest material, wherein the organic compound is represented by the following formula (1):

formula (1)

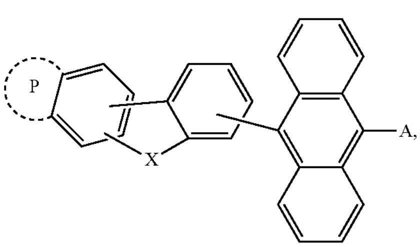

wherein A represents one of the formula (2) to formula (6)

formula (2)

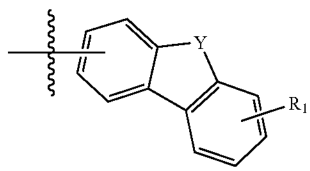

-continued formula (3)

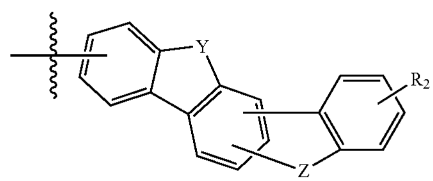

formula (4)

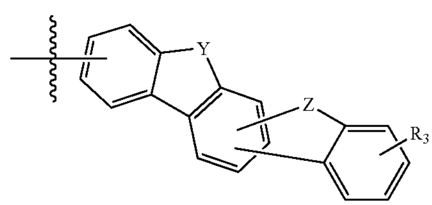

formula (5)

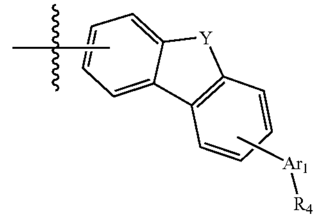

-continued formula (6)

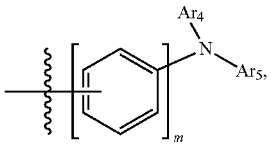

wherein X is a divalent bridge selected from the group consisting of O, S, $SiR_5R_6$; P represents a substituted or unsubstituted fused ring hydrocarbon unit having two, three or four rings; $Ar_1$ represent a substituted or unsubstituted fused ring hydrocarbon unit with one to two rings; m represents an integer of 0 or 1; Y is a divalent bridge selected from the group consisting of O, S, $SiR_7R_8$, $CR_9R_{10}$ and $NAr_2$; Z is a divalent bridge selected from the group consisting from O, S, $CR_{11}R_{12}$, $SiR_{13}R_{14}$ and $NAr_3$; $Ar_2$ and $Ar_3$ independently represent a substituted or unsubstituted aryl group having 6 to 30 carbon atoms; $Ar_4$ and $Ar_5$ independently represent a substituted or unsubstituted aryl group having 6 to 30 carbon atoms, or a substituted or unsubstituted heteroaryl group having 6 to 30 carbon atoms; and $R_1$ to $R_{14}$ are independently selected from the group consisting of a hydrogen atom, a halide, a substituted or unsubstituted alkyl group having 1 to 30 carbon atoms, a substituted or unsubstituted aryl group having 6 to 30 carbon atoms, and a substituted or unsubstituted aralkyl group having 7 to 30 carbon atoms.

6. The organic electroluminescence device according to claim 5, wherein the light emitting layer comprising the organic compound with a general formula (1) is a fluorescent host material.

7. The organic electroluminescence device according to claim 5, wherein the light emitting layer comprising the organic compound with a general formula (1) is a fluorescent emitter.

8. The organic electroluminescence device according to claim 5, wherein the light emitting layer comprising the organic compound with a general formula (1) is a phosphorescent host material.

9. The organic electroluminescence device according to claim 5, wherein the light emitting layer comprising the organic compound with a general formula (1) is an electron transport or hole blocking material.

10. The organic electroluminescence device according to claim 5, wherein the light emitting layer emits fluorescent blue or green light.

11. The organic electroluminescence device according to claim 5, wherein the device is an organic light emitting device.

12. The organic electroluminescent device according to claim 5, wherein the device is a lighting panel.

13. The organic electroluminescent device according to claim 5, wherein the device is a backlight panel.

14. The organic compound according to claim 5, wherein the organic compound is selected from the group consist of:

EX1

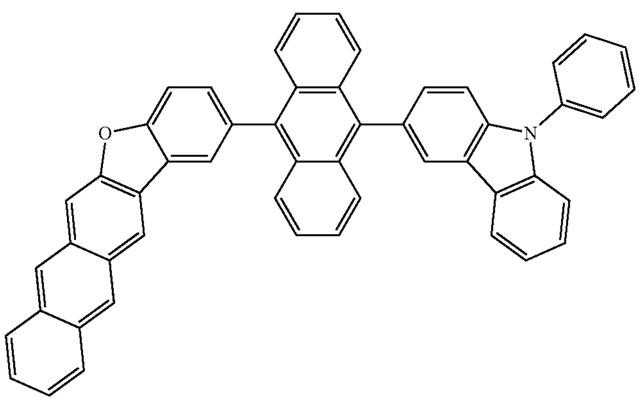

EX2

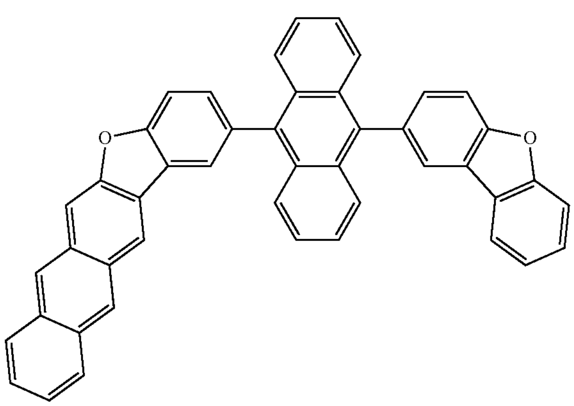

EX3

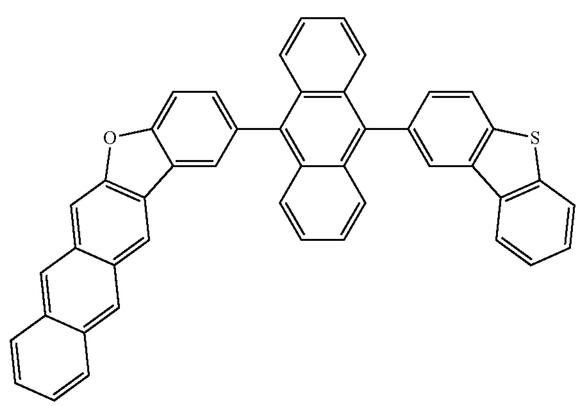

-continued
EX4
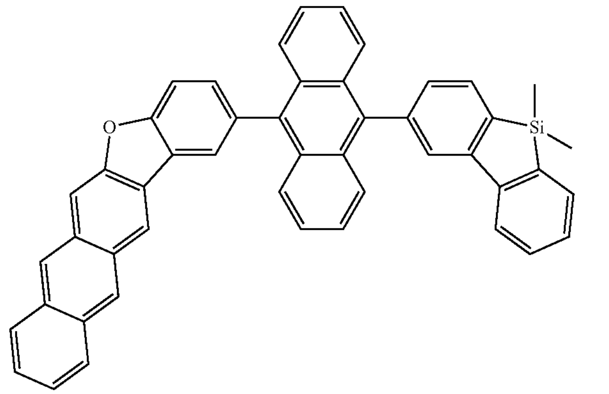
EX5
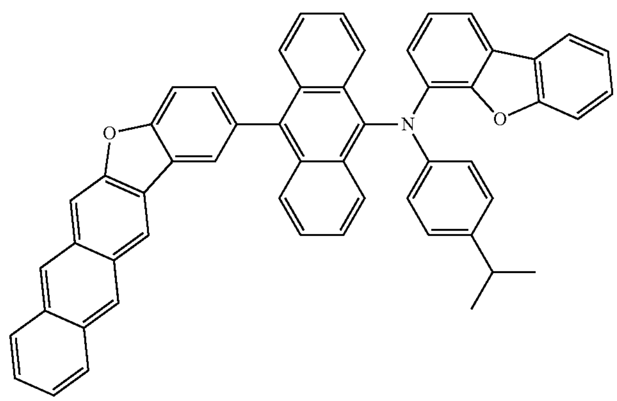
EX6
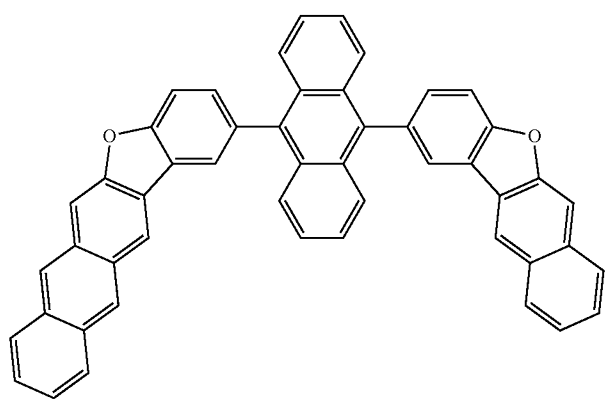
EX7
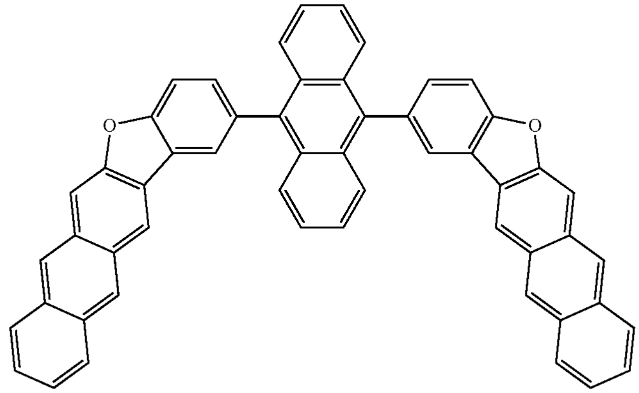

-continued
EX8
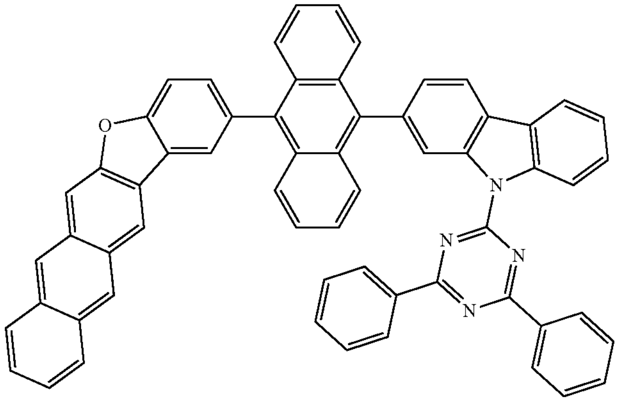
EX9
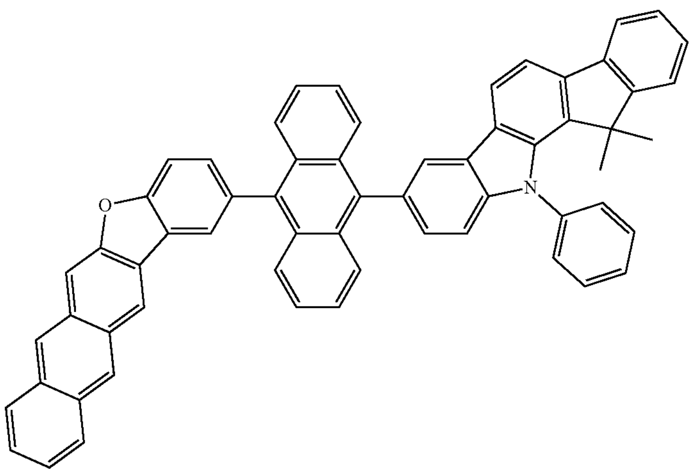
EX10
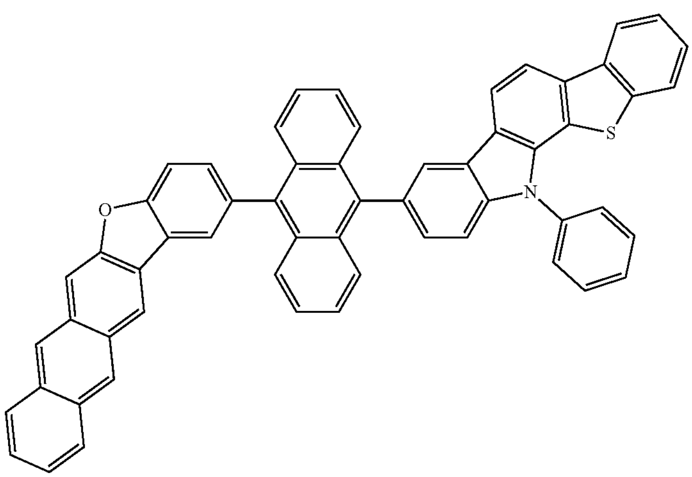

-continued
EX11
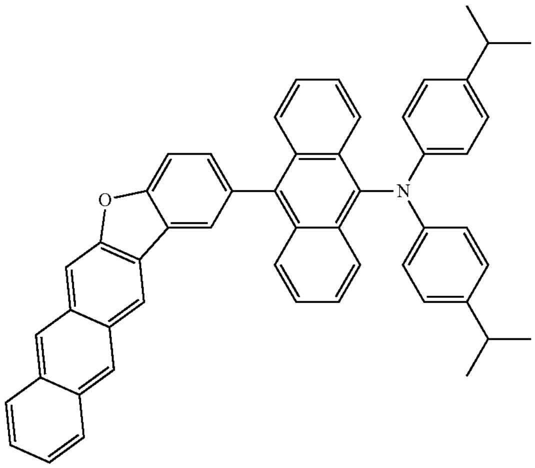
EX12
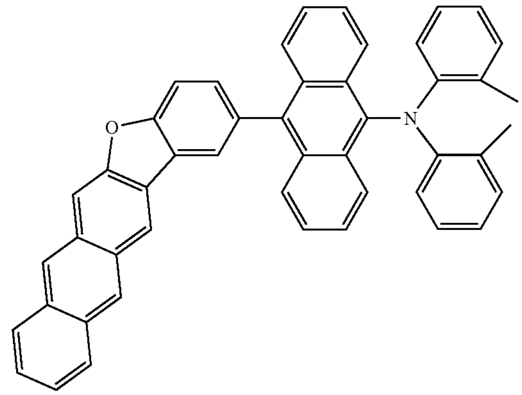
EX13
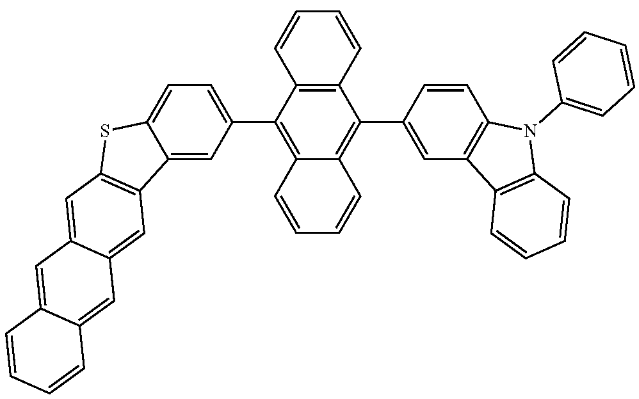
EX14
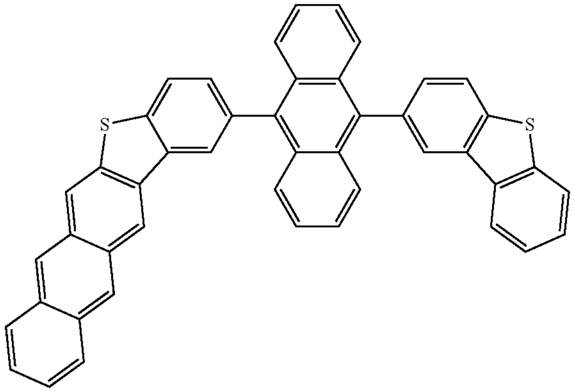

-continued
EX15
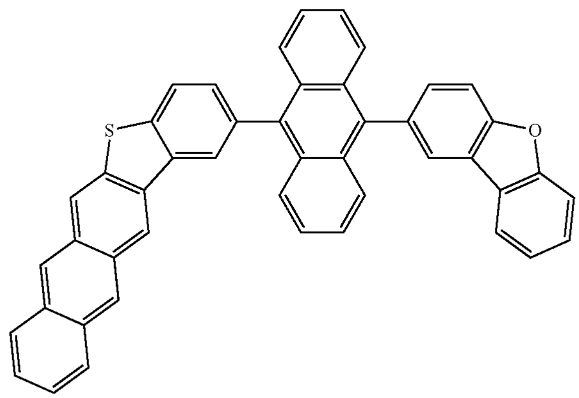
EX16
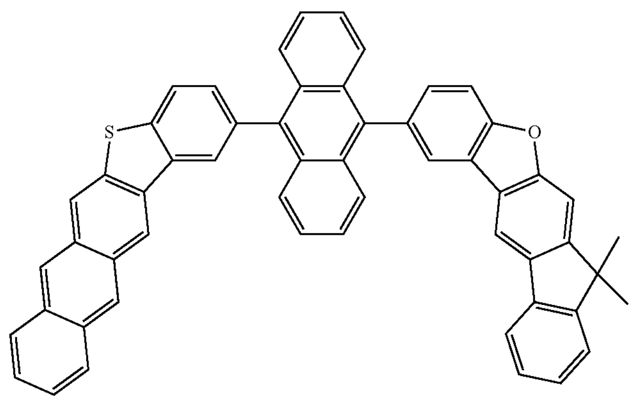
EX17
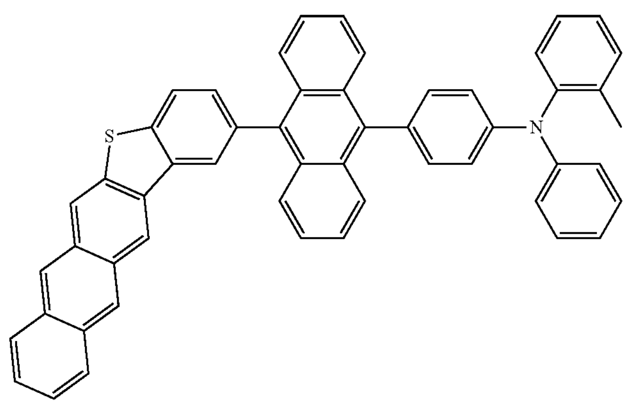
EX18
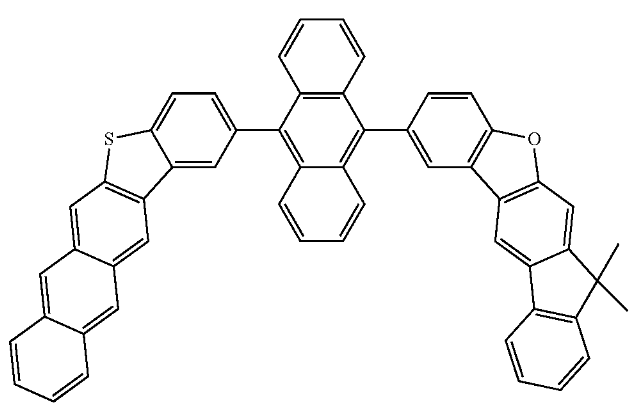

-continued
EX19
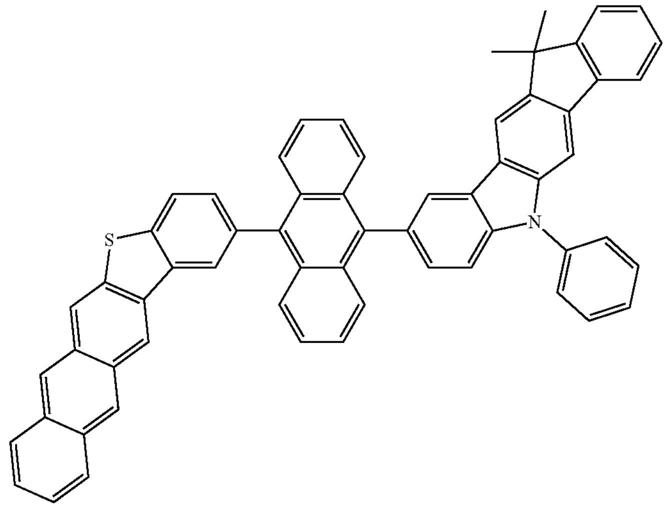
EX20
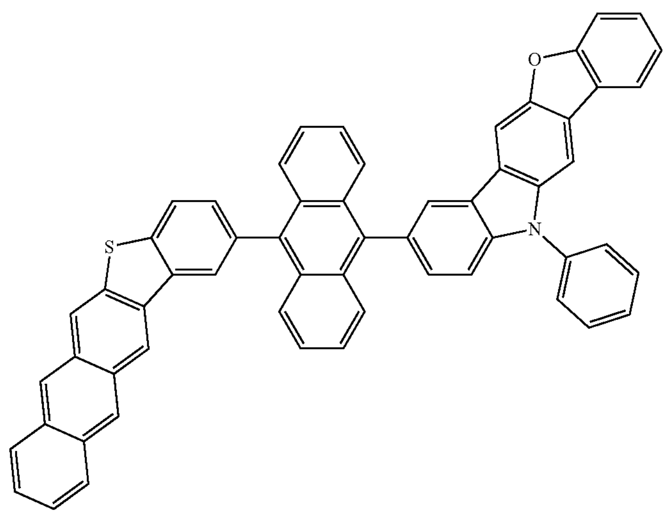
EX21
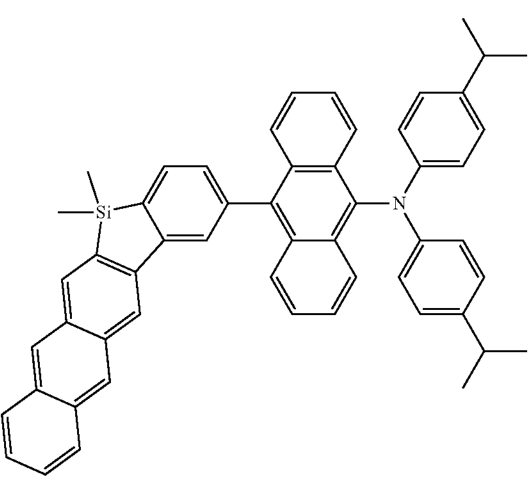

-continued
EX22
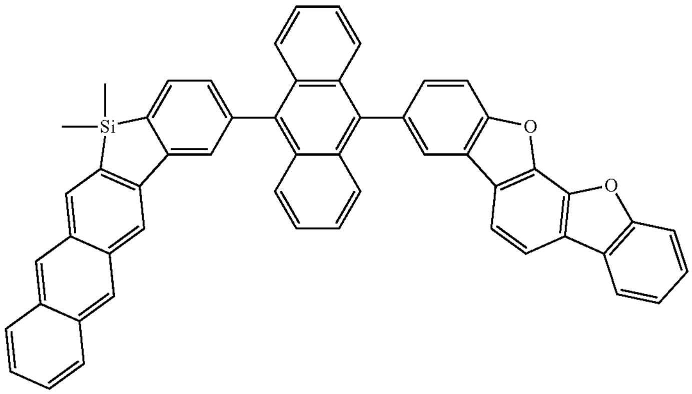
EX23
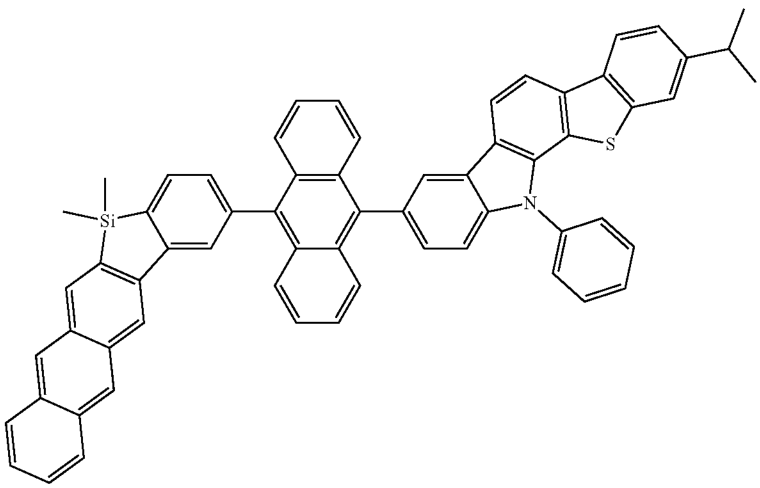
EX24
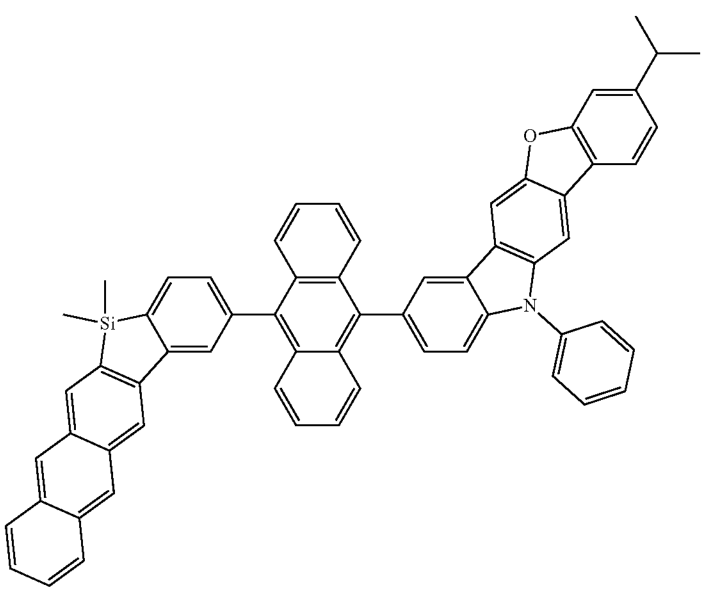

-continued
EX25
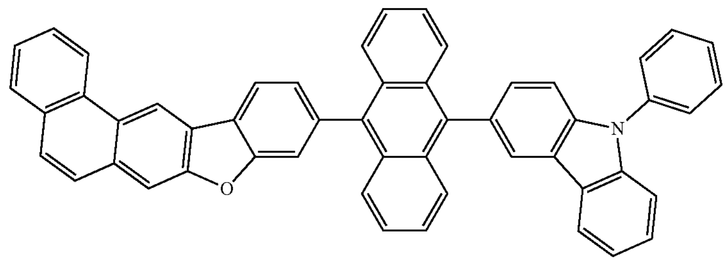
EX26
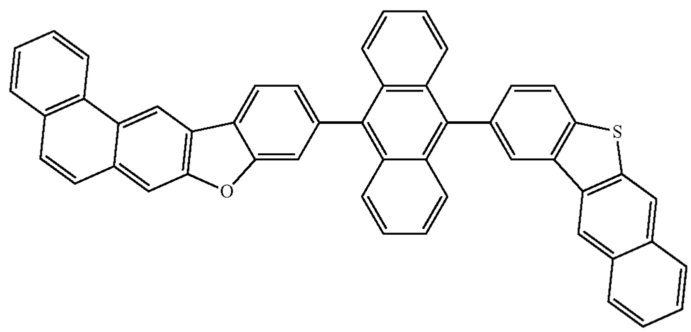
EX27
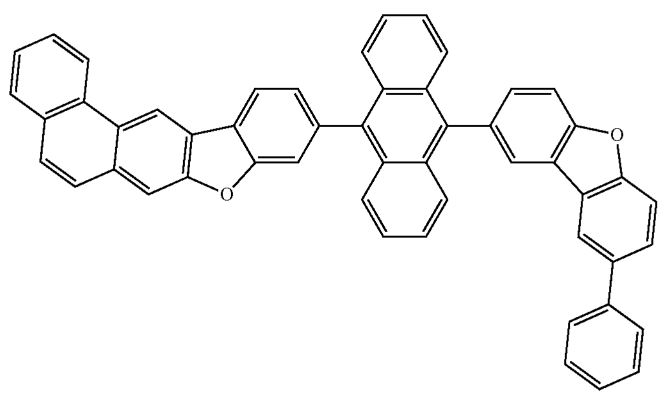
EX28
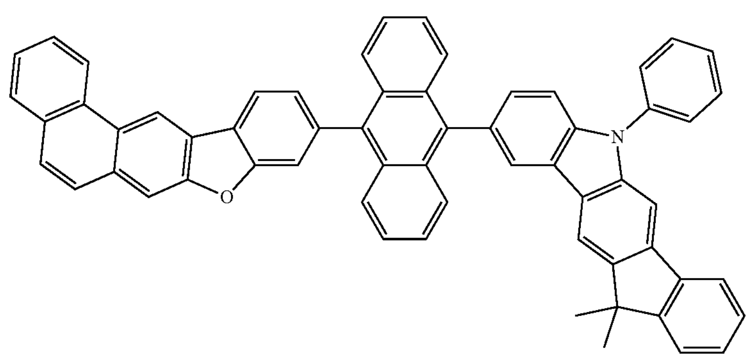

-continued
EX29
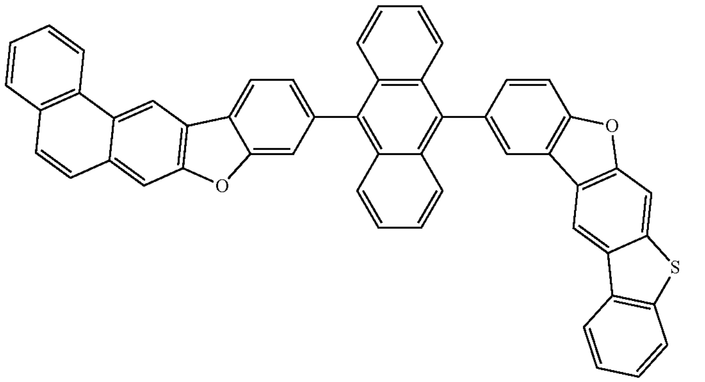
EX30
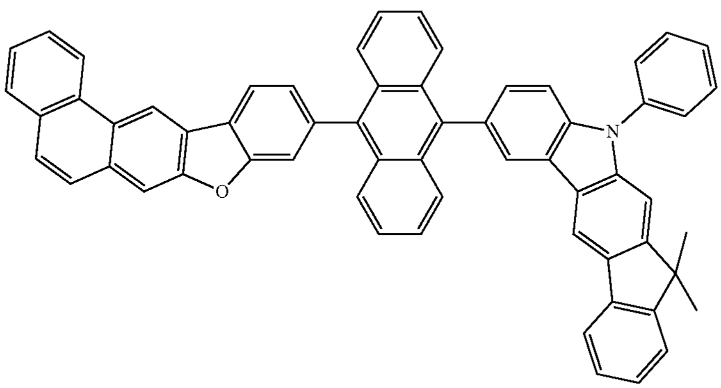
EX31
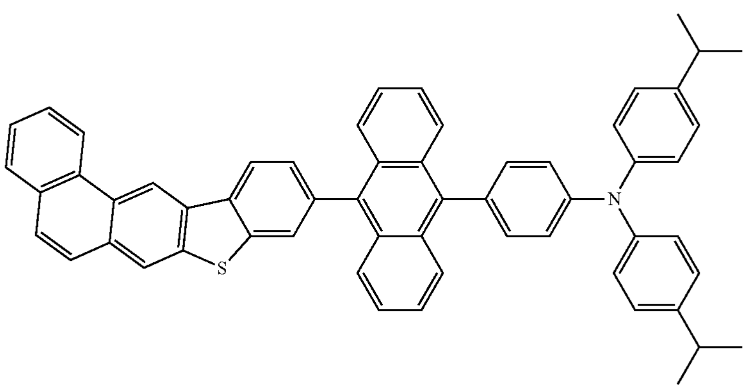
EX32
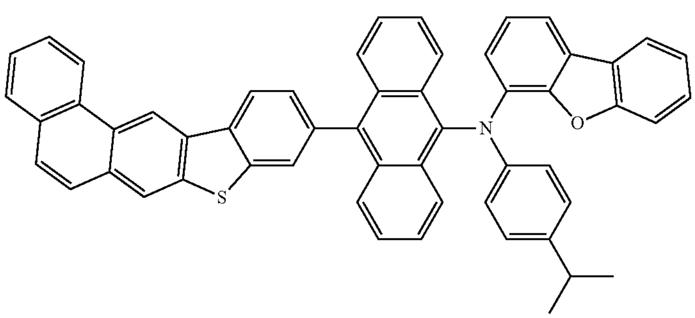

-continued
EX33
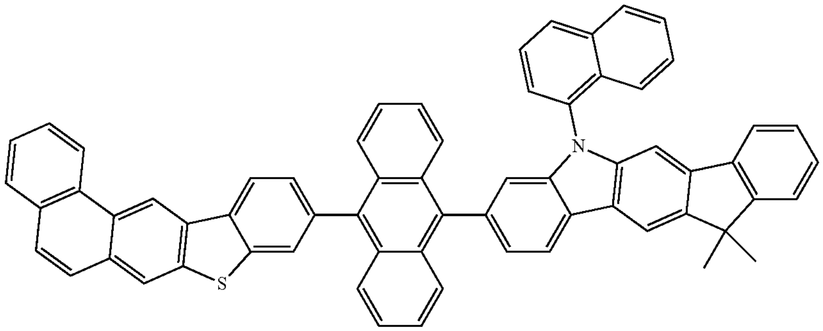
EX34
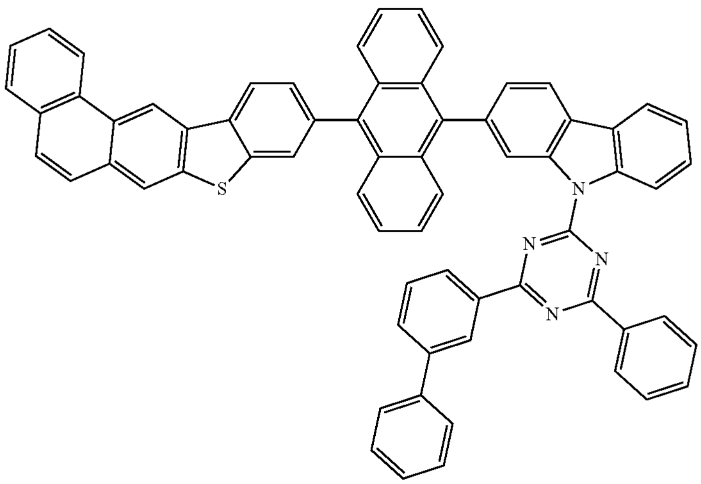
EX35
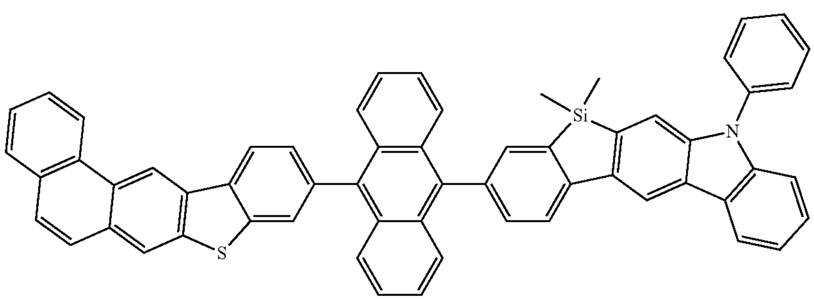
EX36
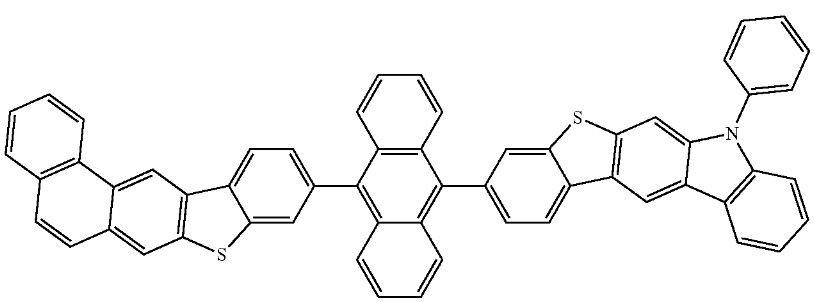

-continued
EX37
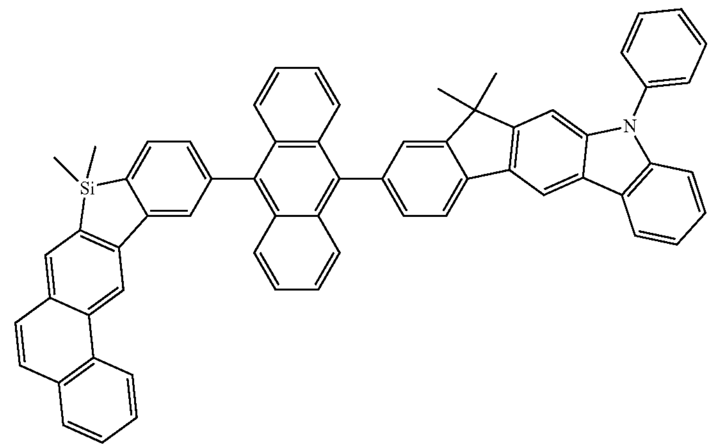
EX38
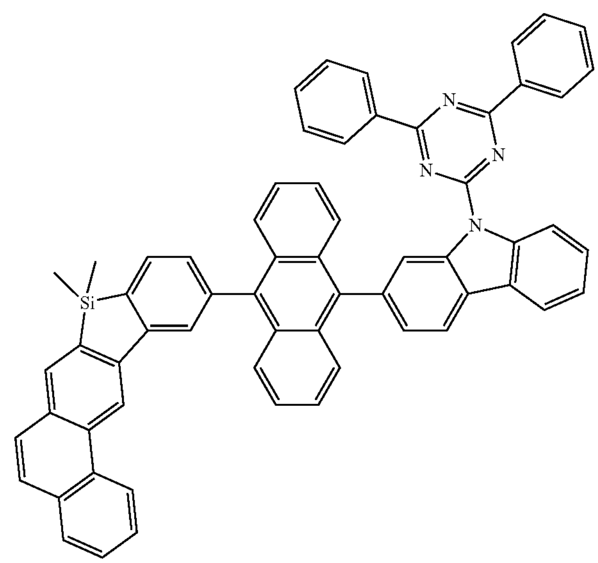
EX39
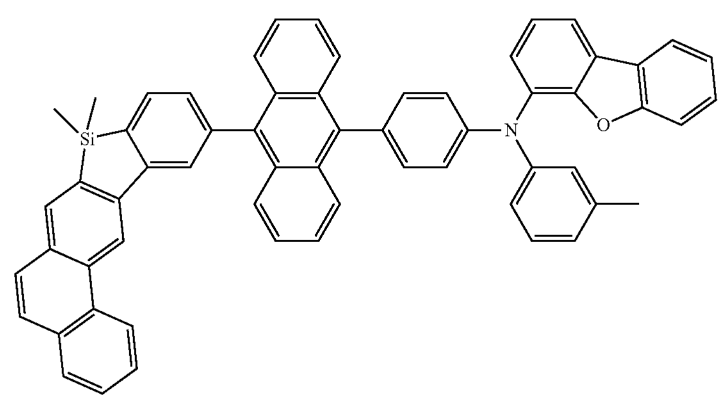

-continued
EX40
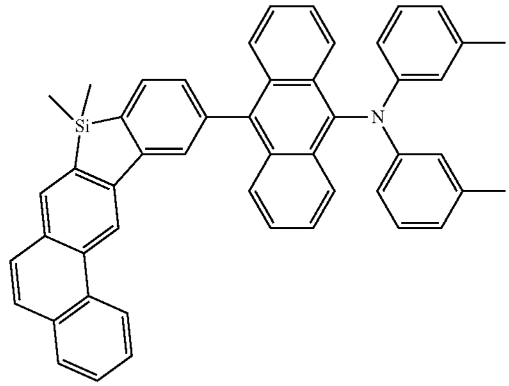
EX41
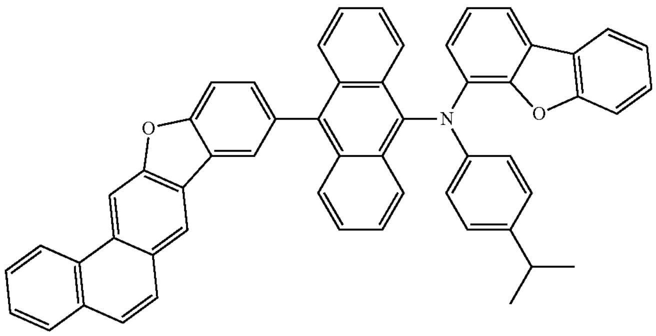
EX42
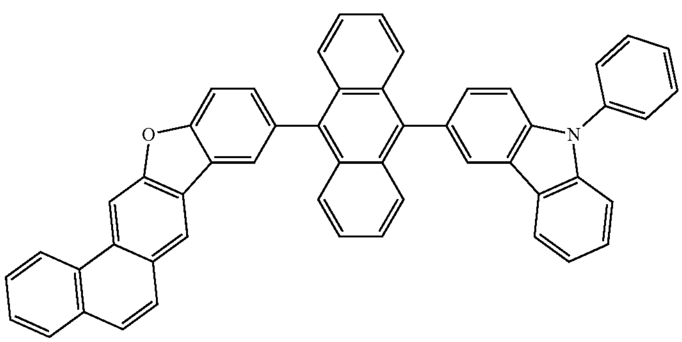
EX43
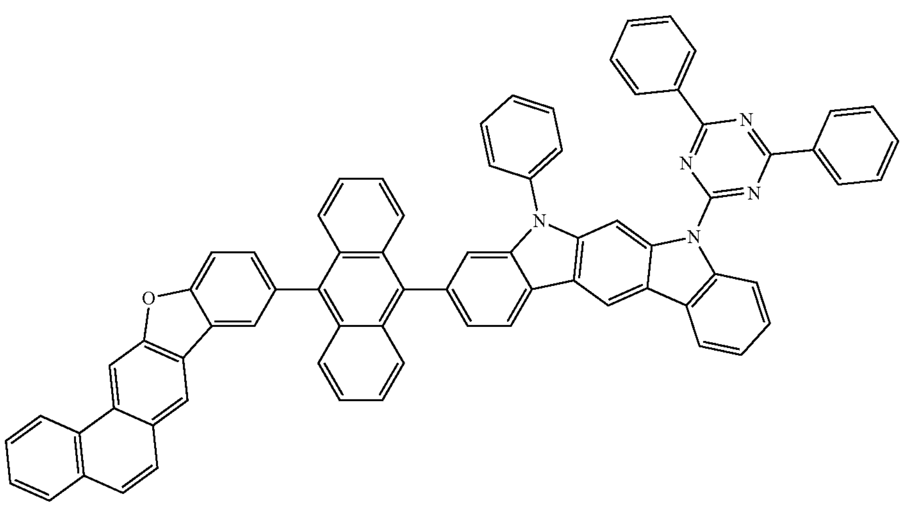

-continued
EX44
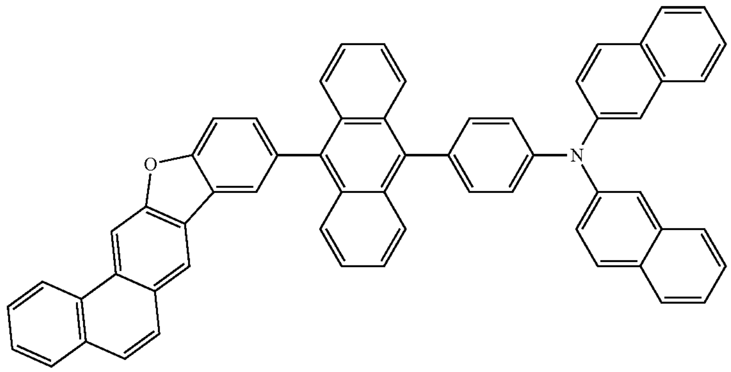
EX45
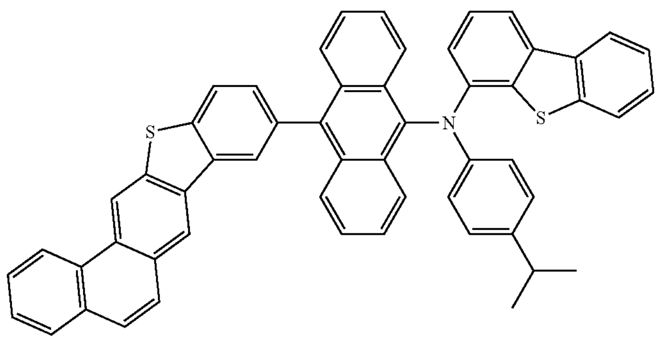
EX46
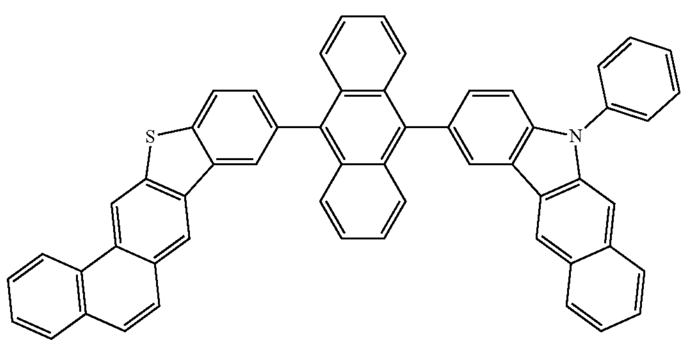
EX47
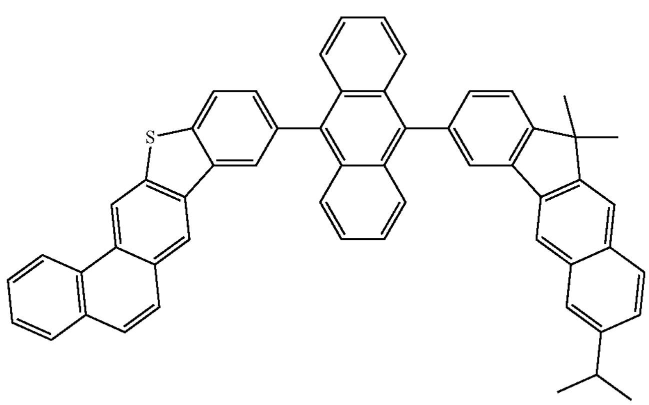

-continued
EX48
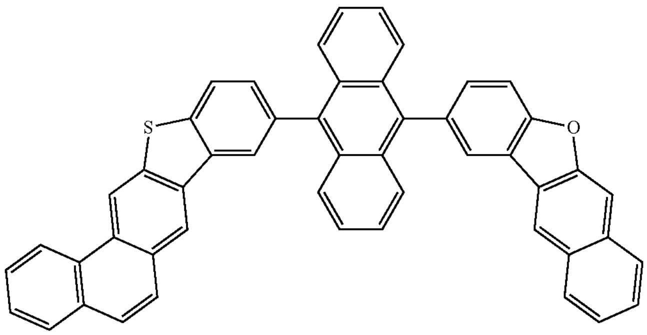
EX49
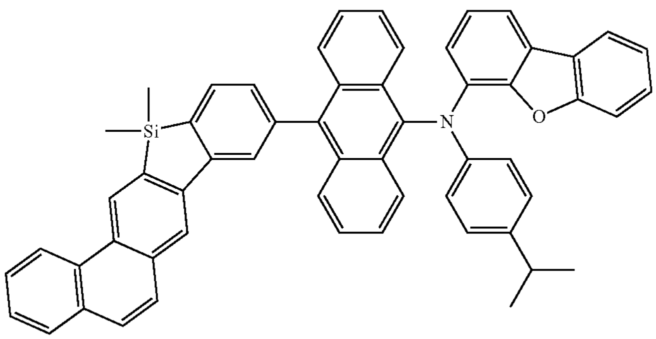
EX50
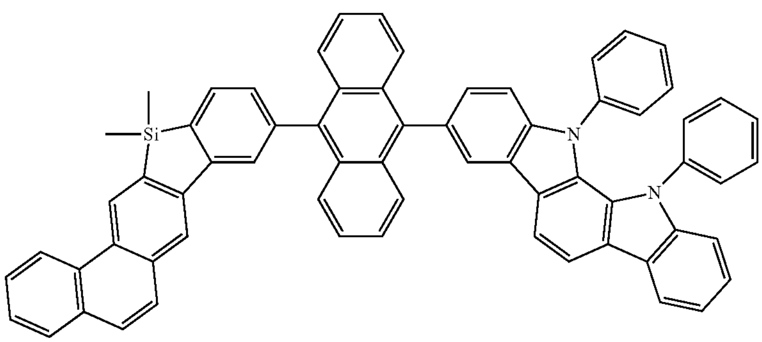
EX51
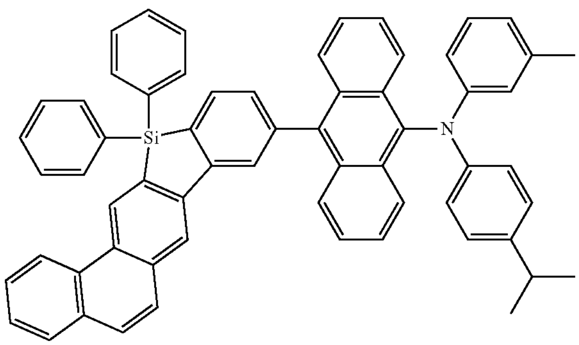

-continued
EX52
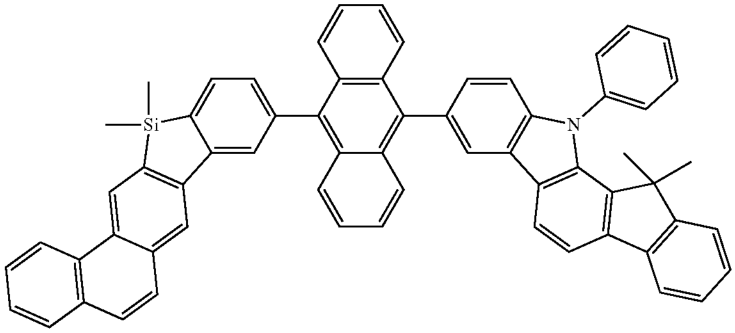
EX53
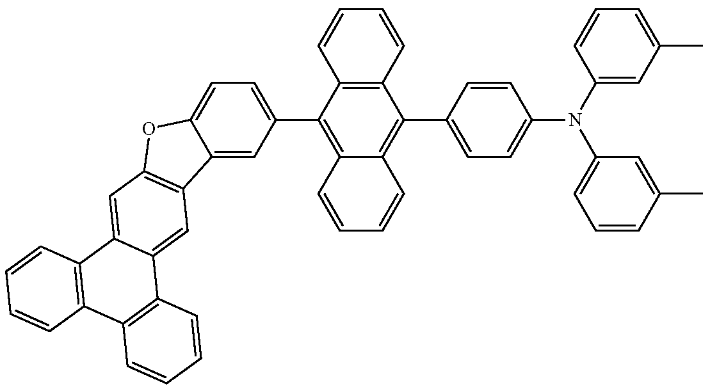
EX54
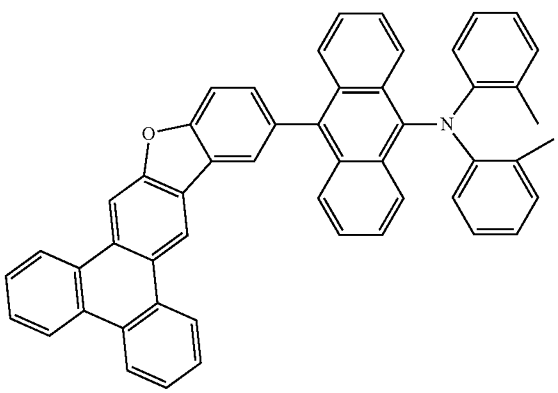
EX55
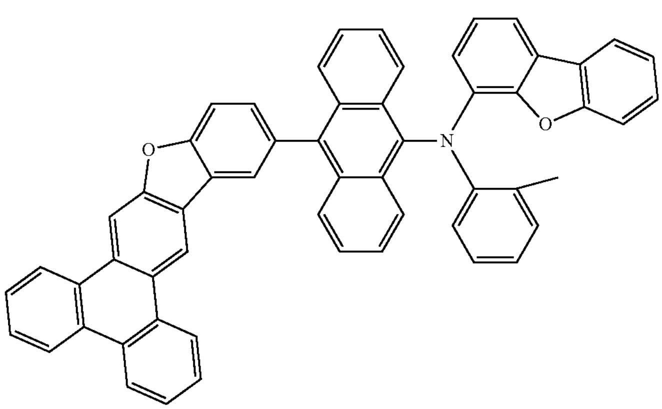

-continued
EX56
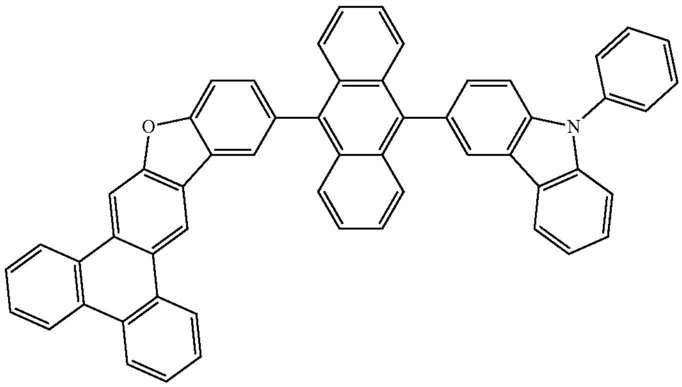
EX57
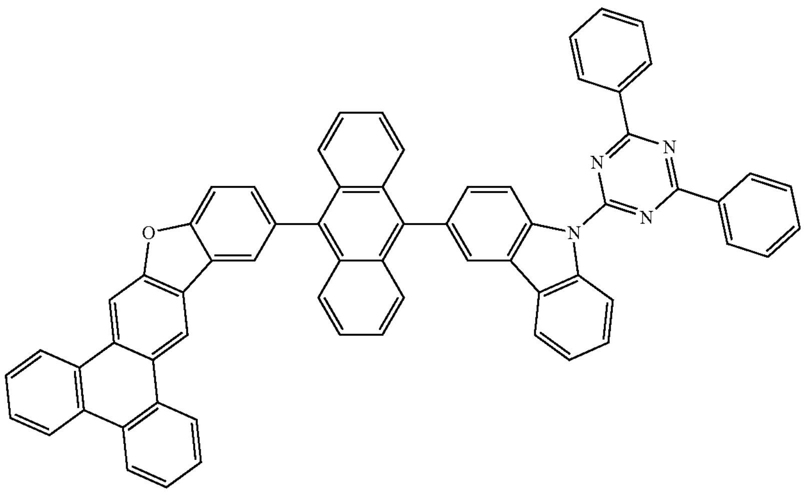
EX58
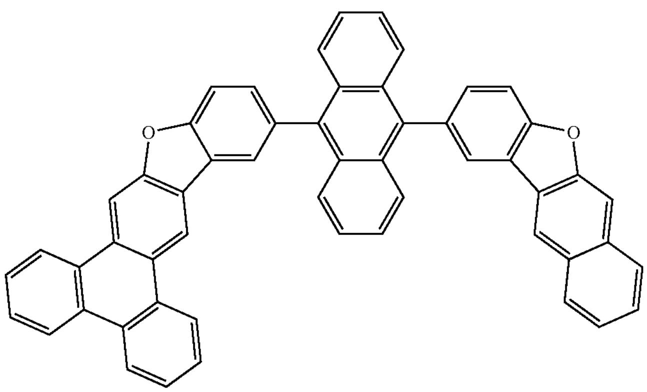
EX59
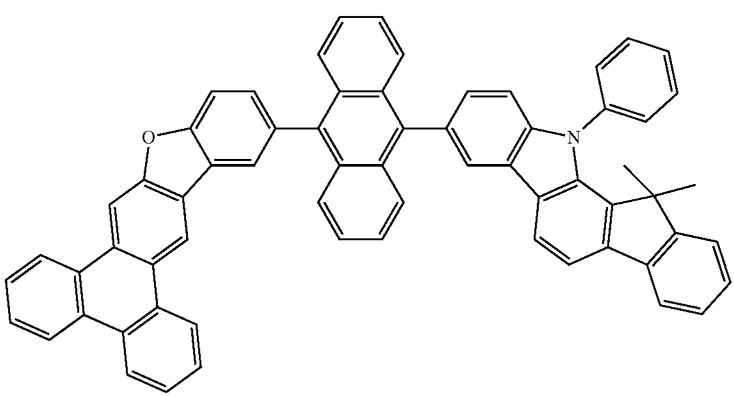

-continued
EX60
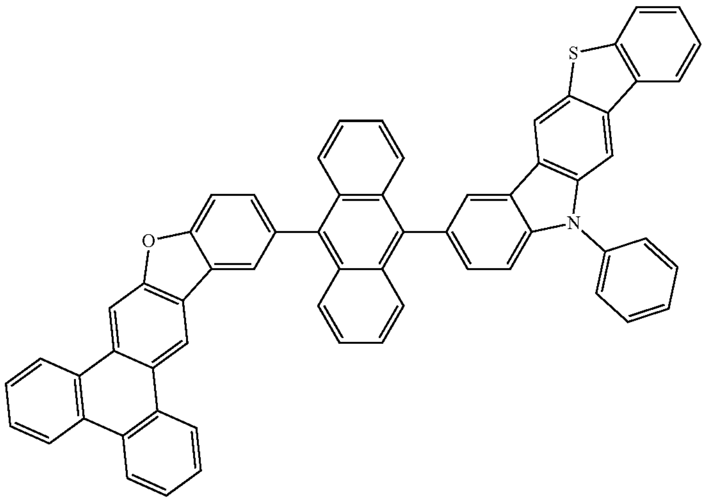
EX61
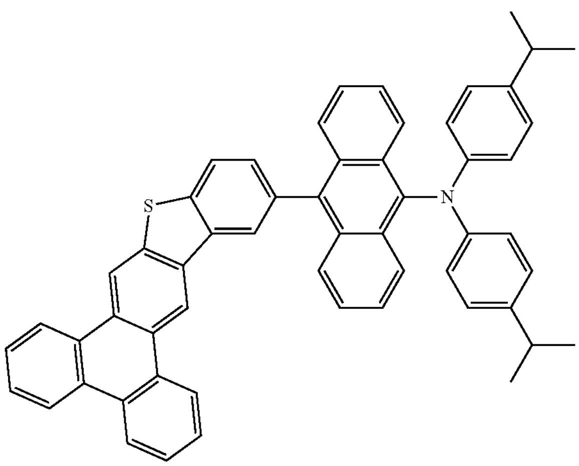
EX62
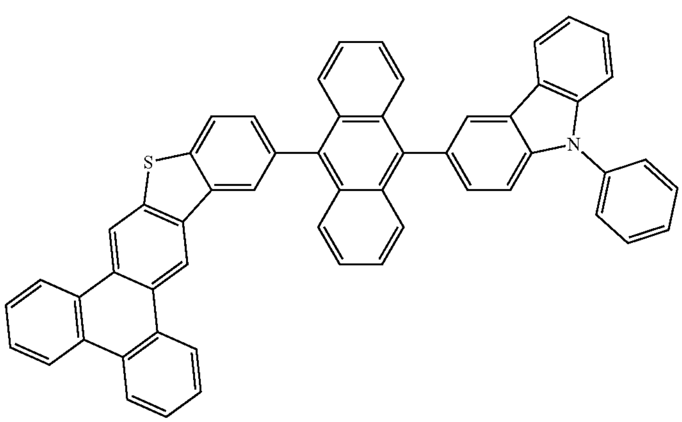

-continued
EX63
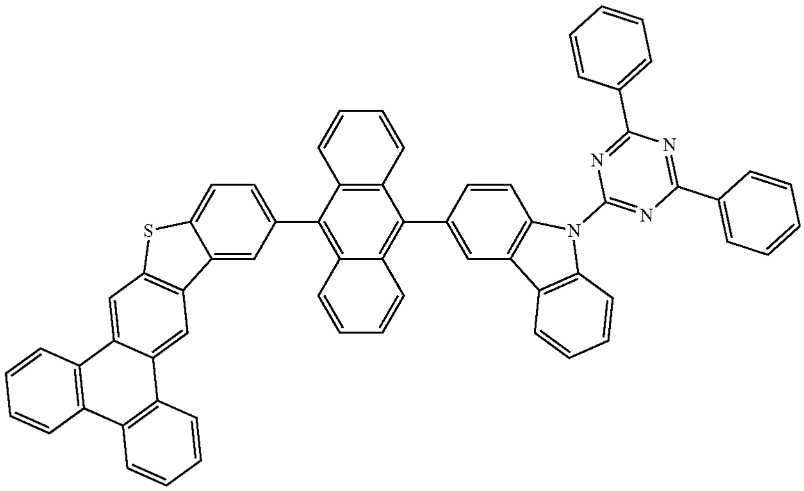
EX64
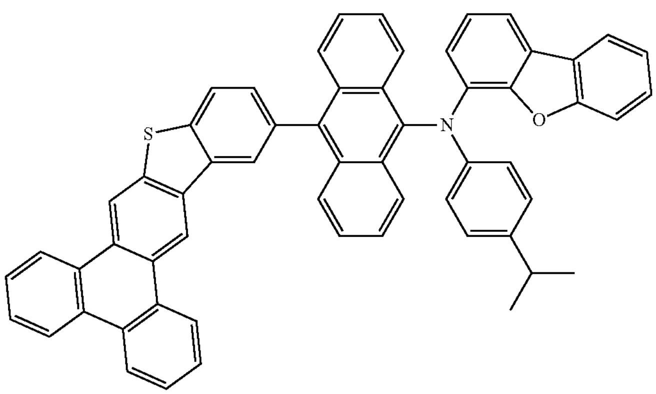
EX65
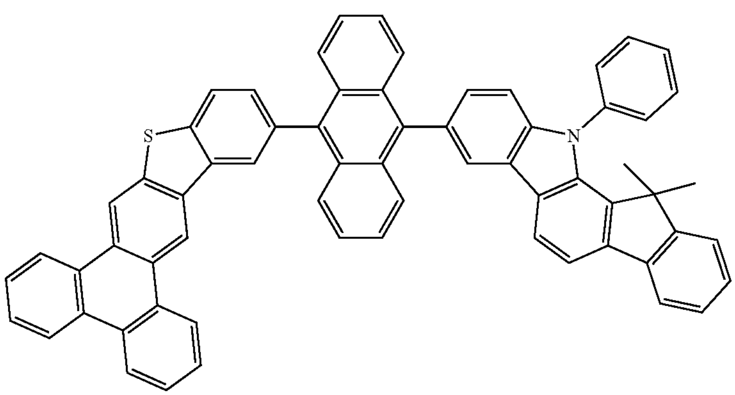

-continued
EX66
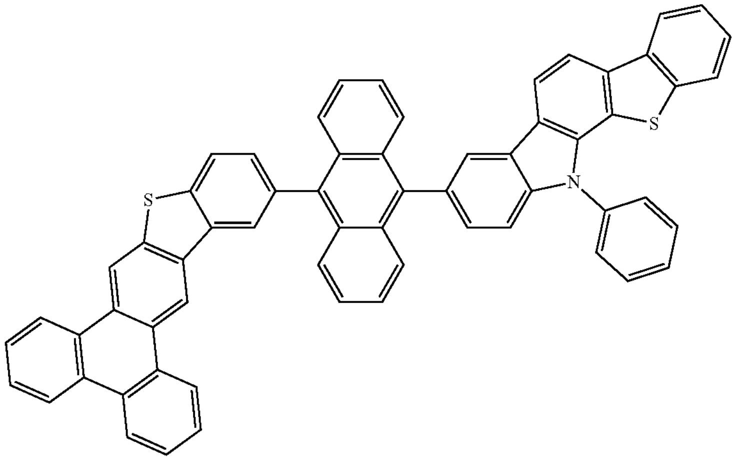
EX67
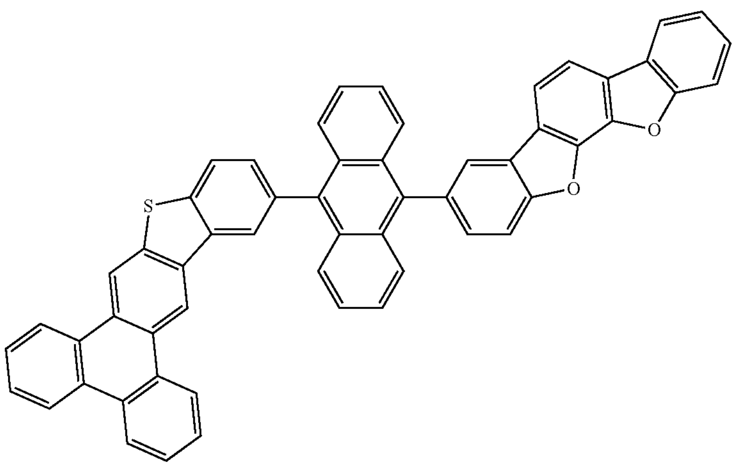
EX68
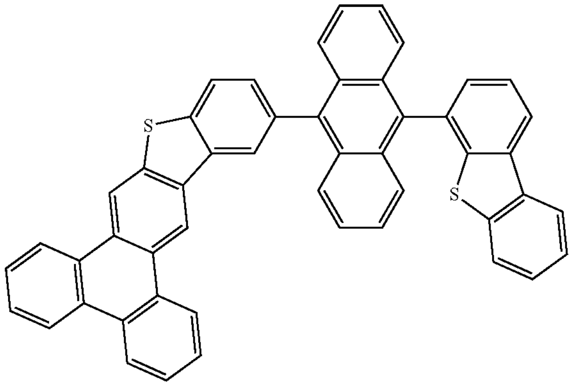
EX69
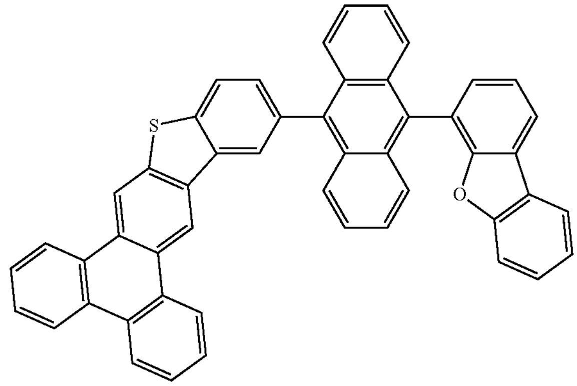

-continued
EX70
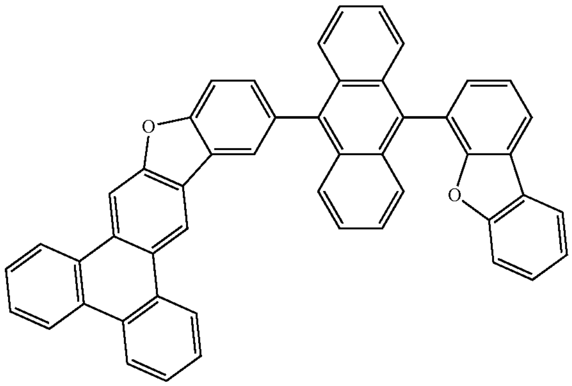
EX71
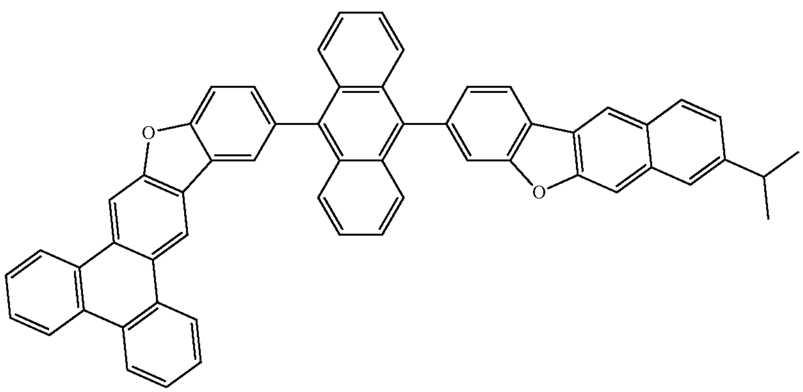
EX72
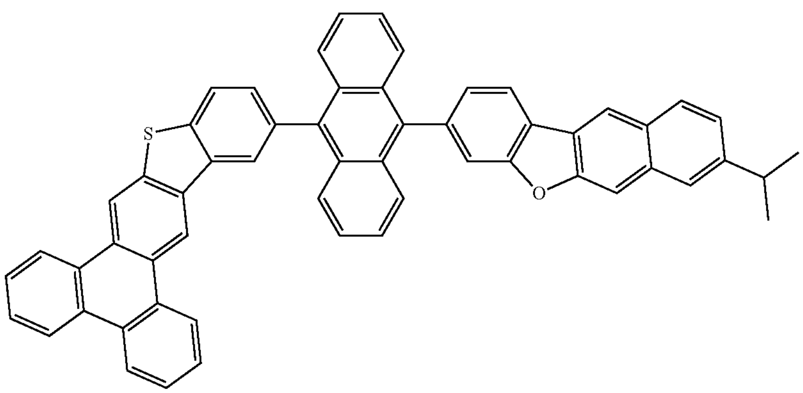
EX73
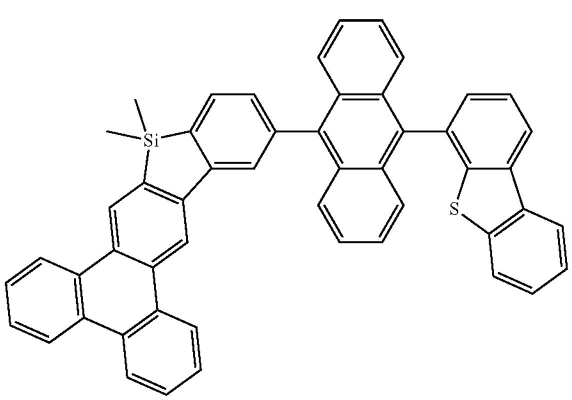
EX74
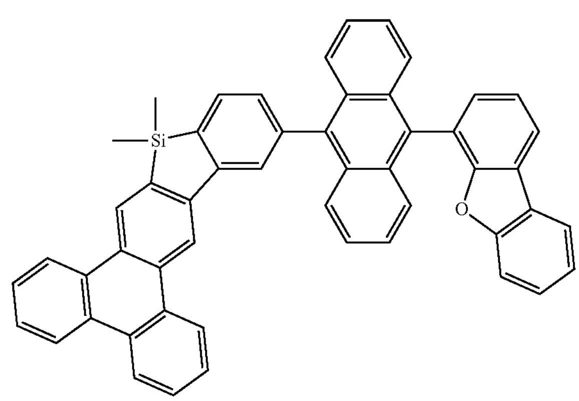

-continued
EX75
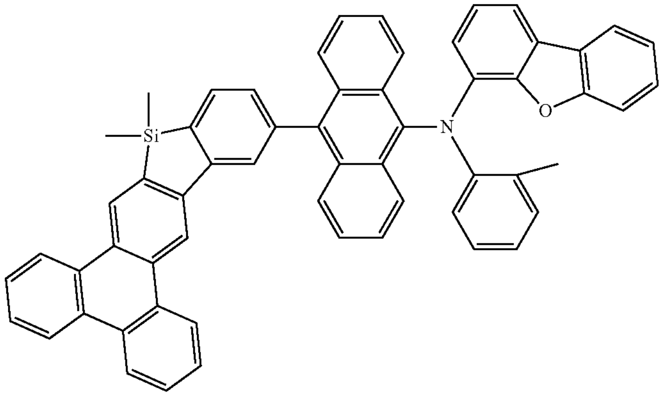
EX76
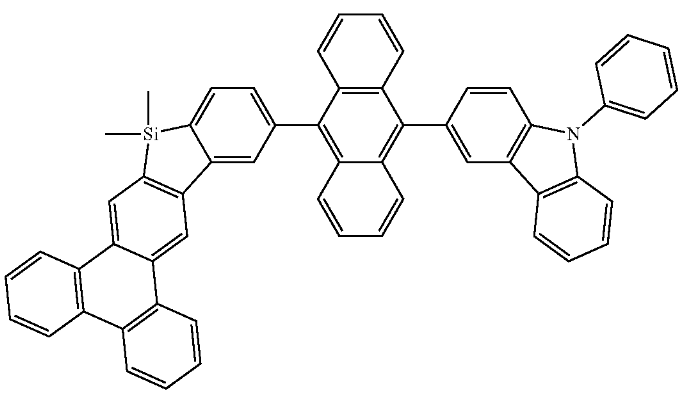
EX77
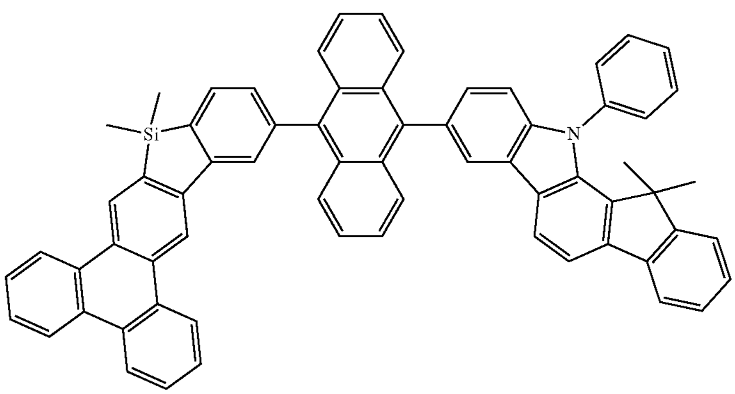
EX78
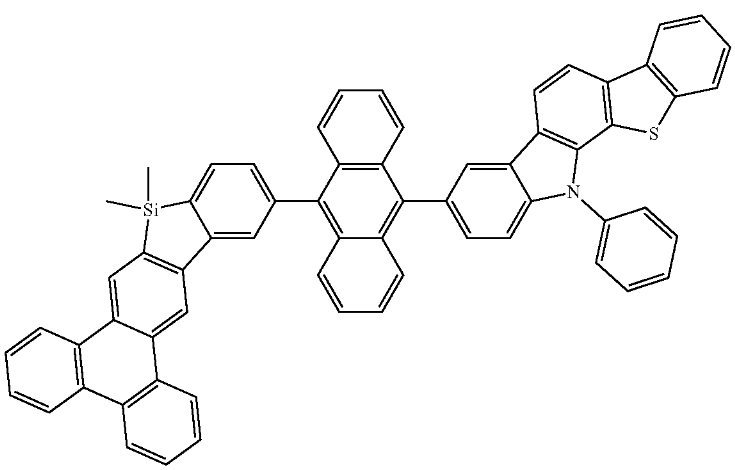

-continued
EX79
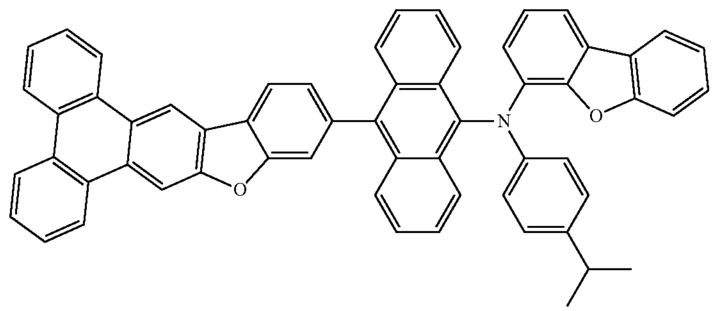
EX80
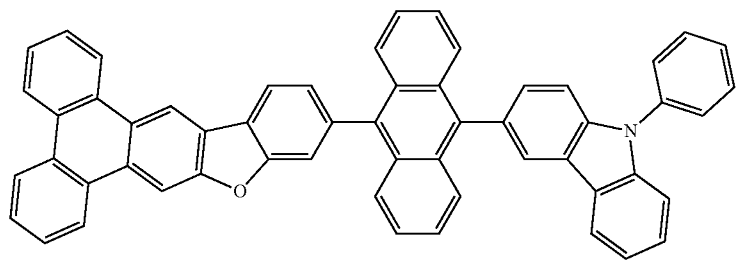
EX81
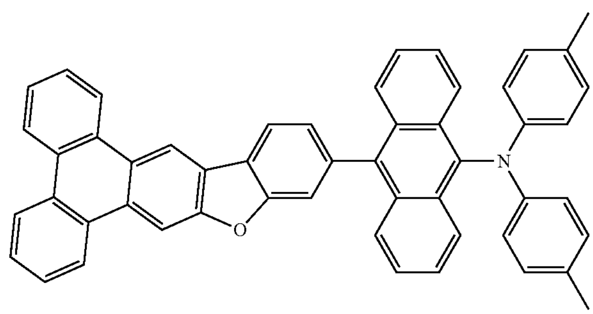
EX82
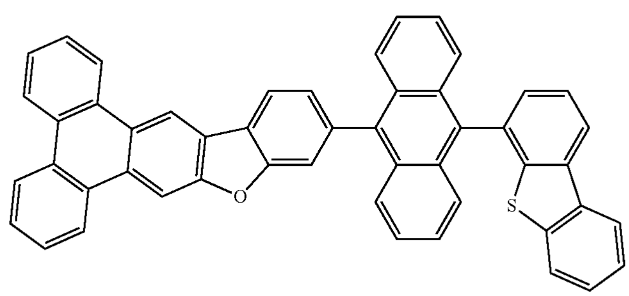
EX83
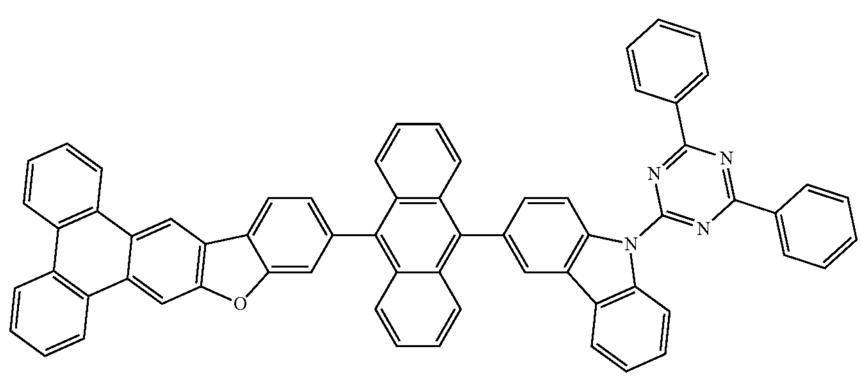

-continued
EX84
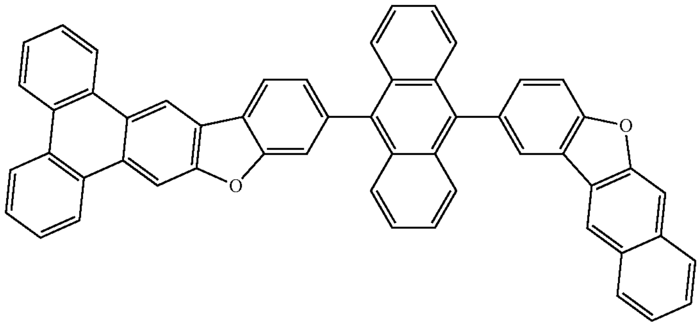
EX85
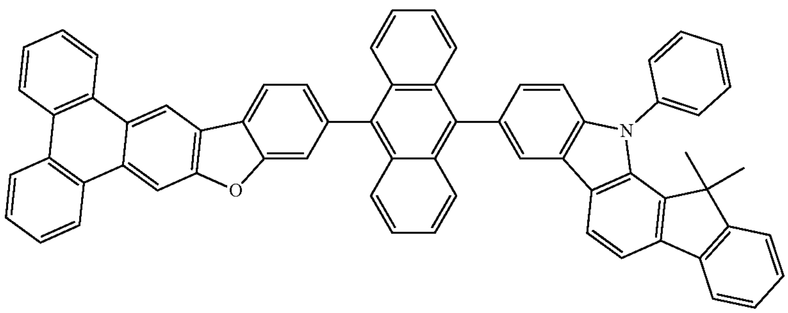
EX86
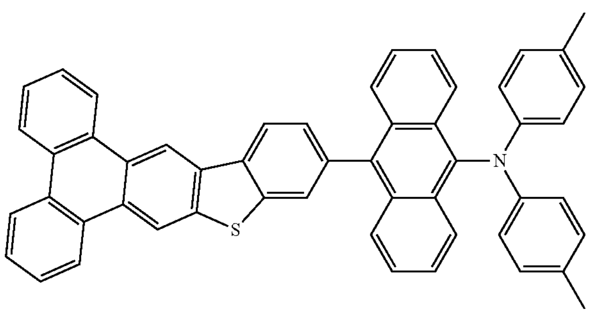
EX87
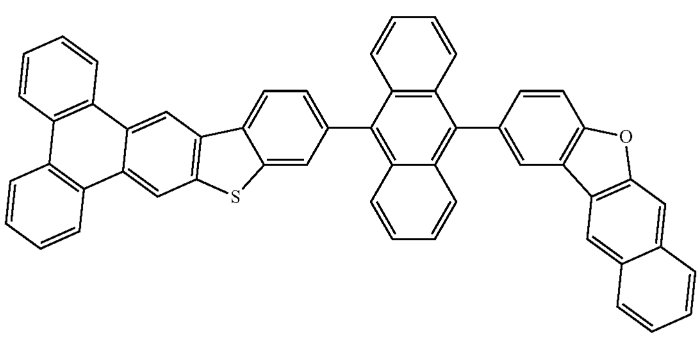
EX88
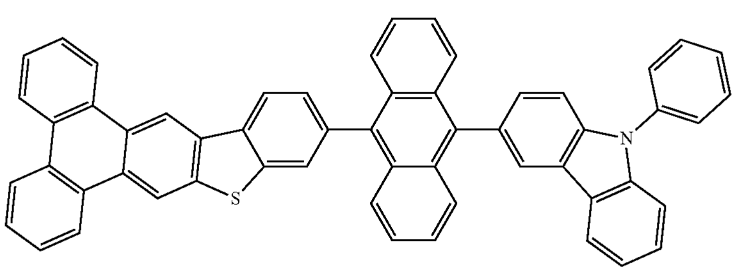

-continued
EX89
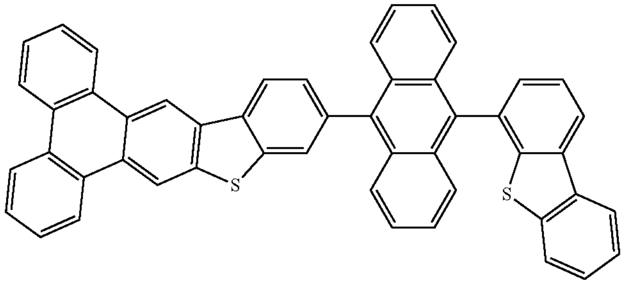
EX90
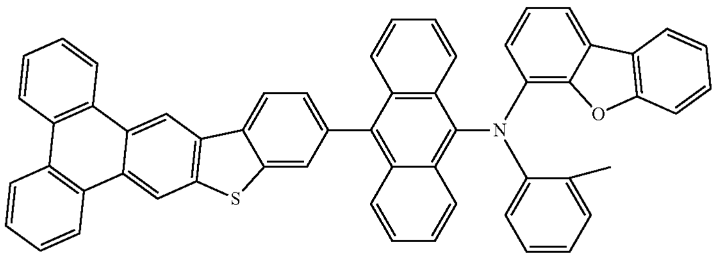
EX91
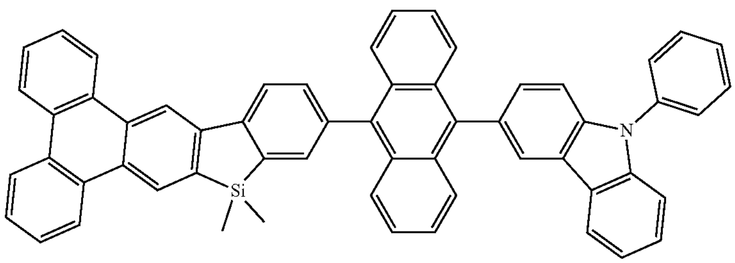
EX92
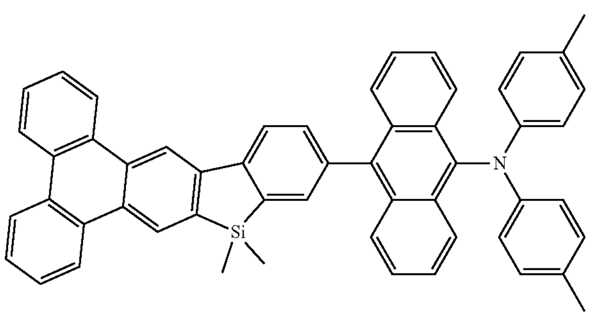
EX93
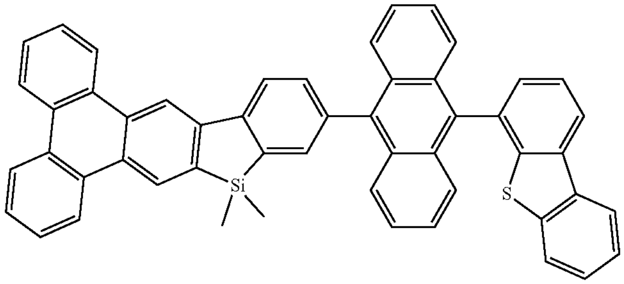

-continued
EX94
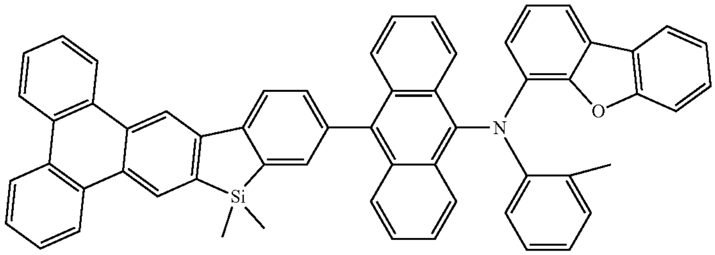
EX95
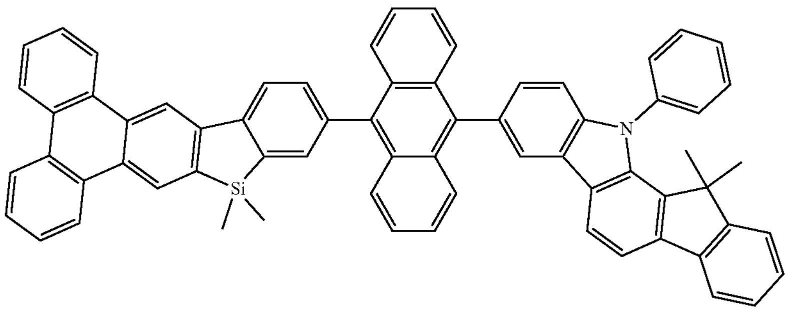
EX96
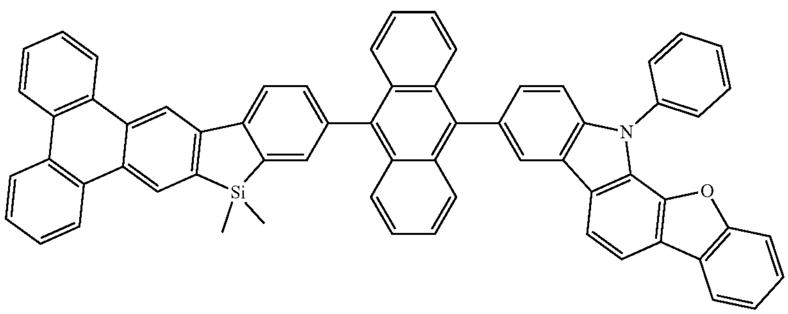
EX97
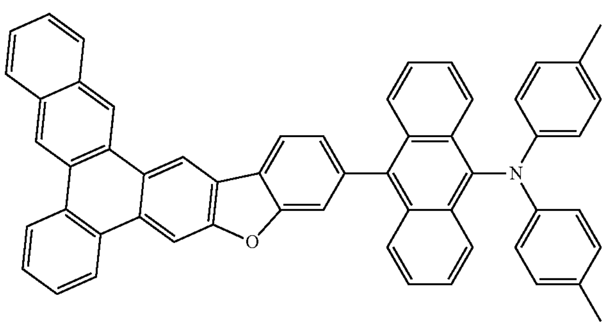
EX98
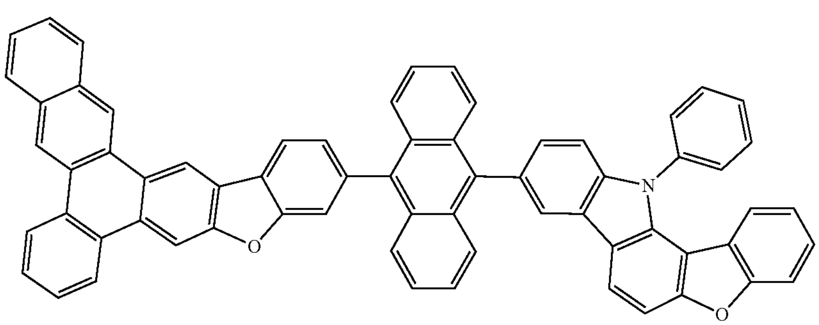

-continued
EX99
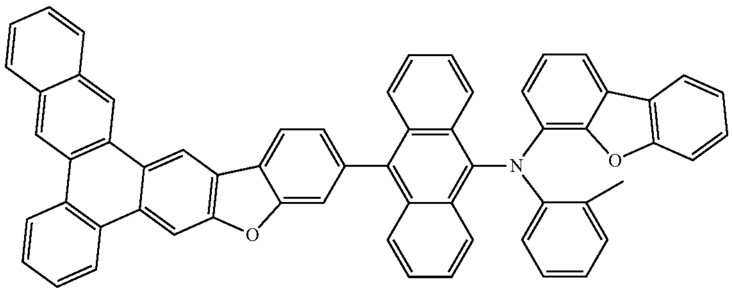
EX100
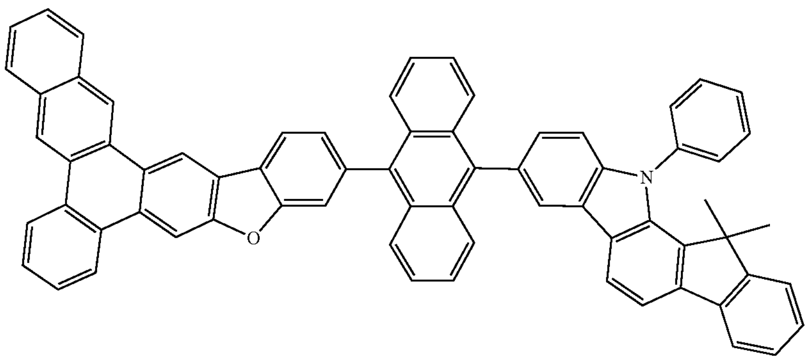
EX101
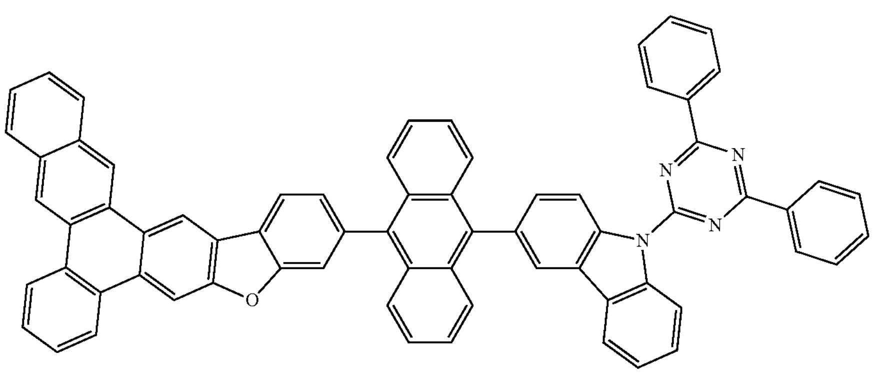
EX102
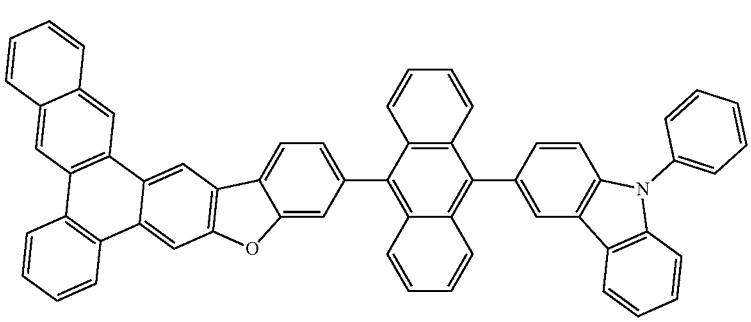

-continued
EX103
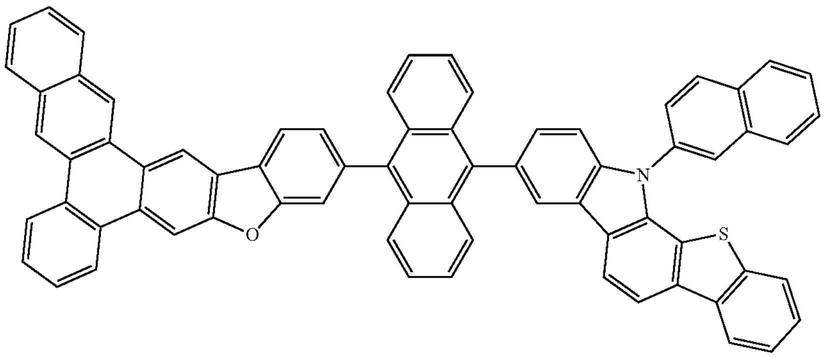
EX104
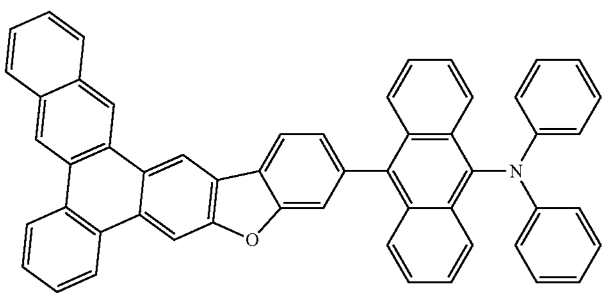
EX105
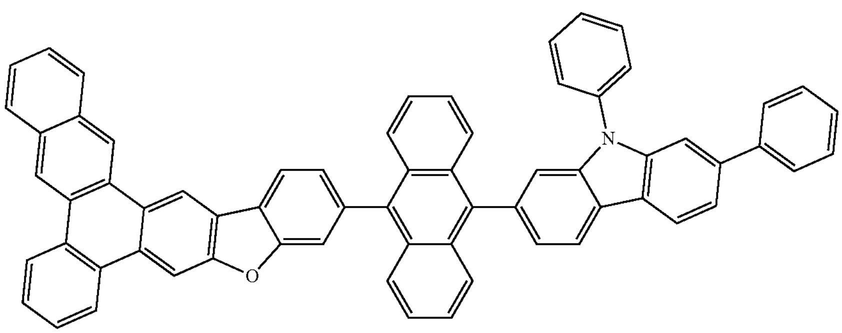
EX106
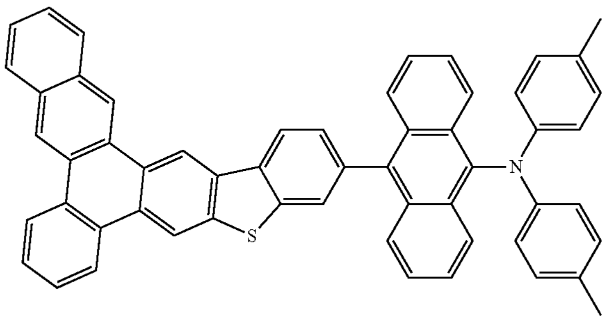

-continued
EX107
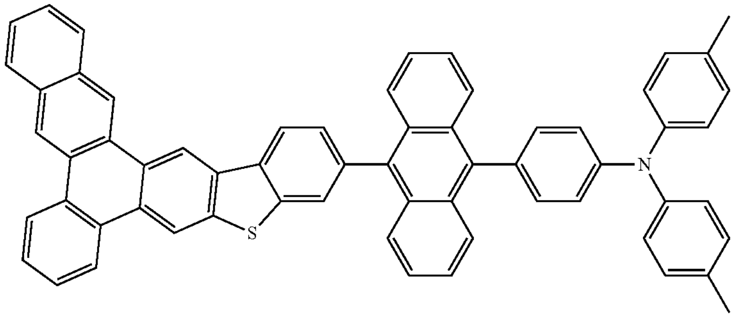
EX108
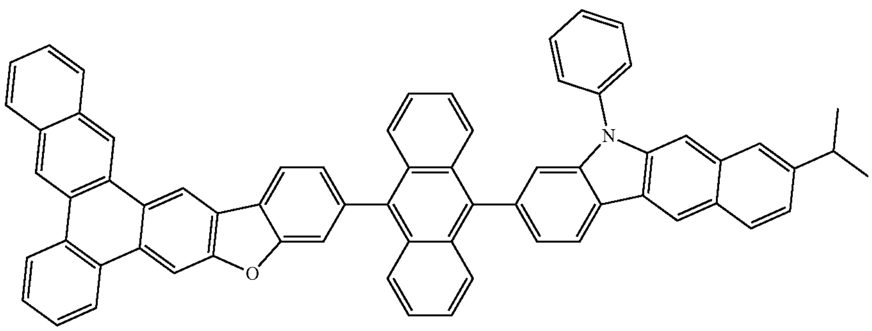
EX109
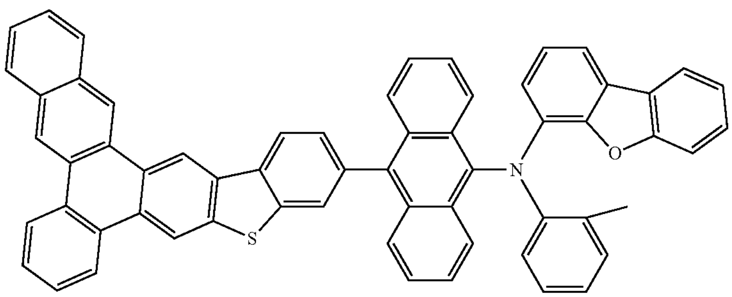
EX110
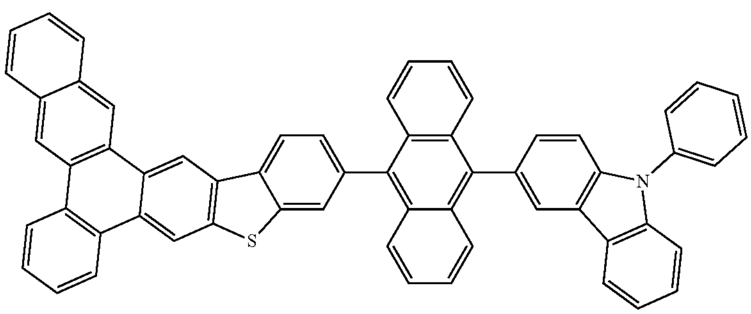
EX111
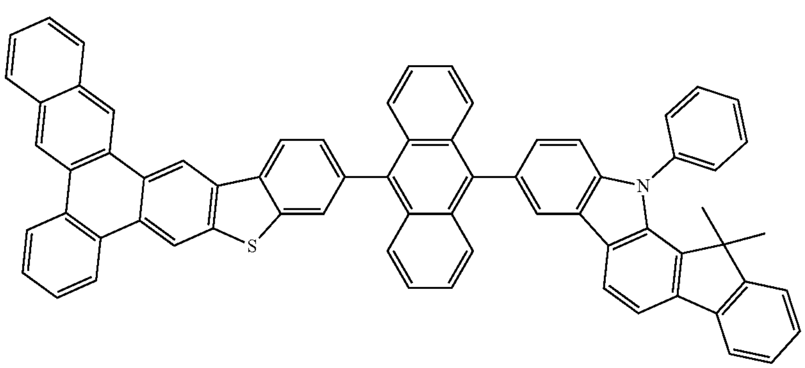

-continued
EX112
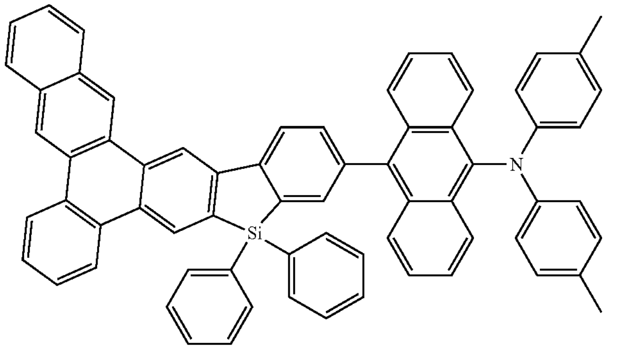
EX113
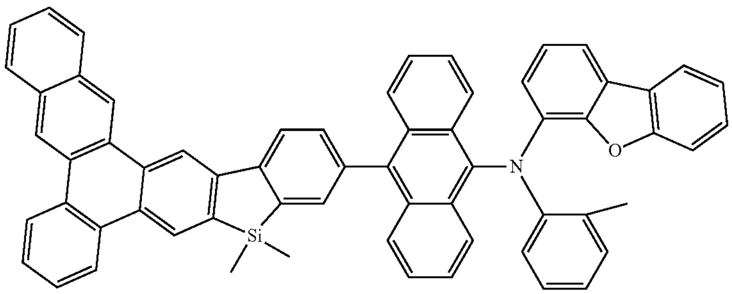
EX114
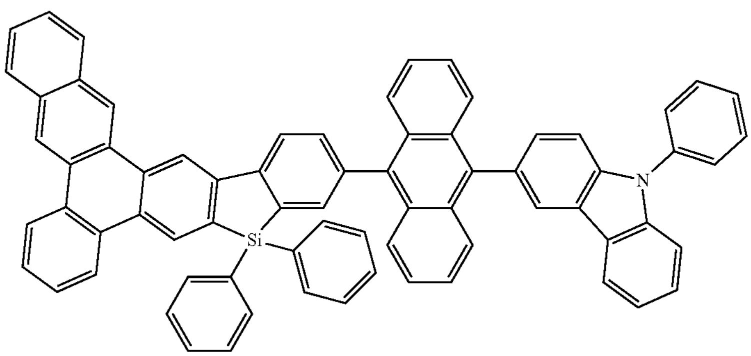
EX115
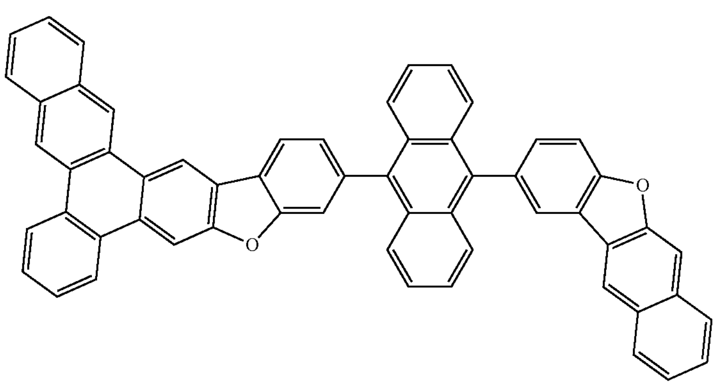

-continued
EX116
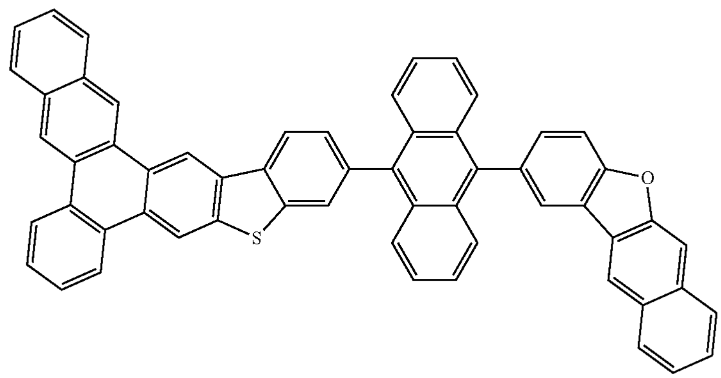
EX117
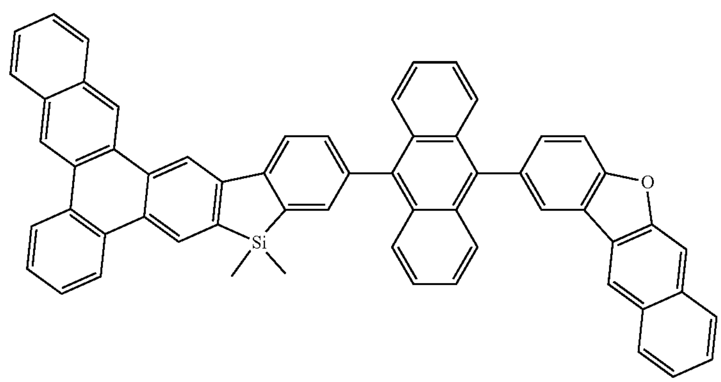
EX118
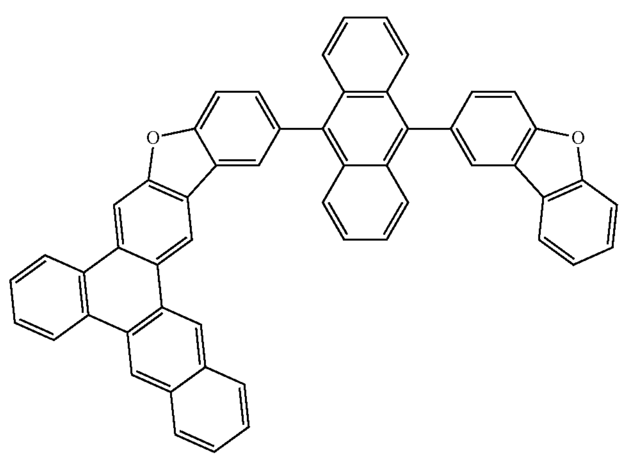

-continued
EX119
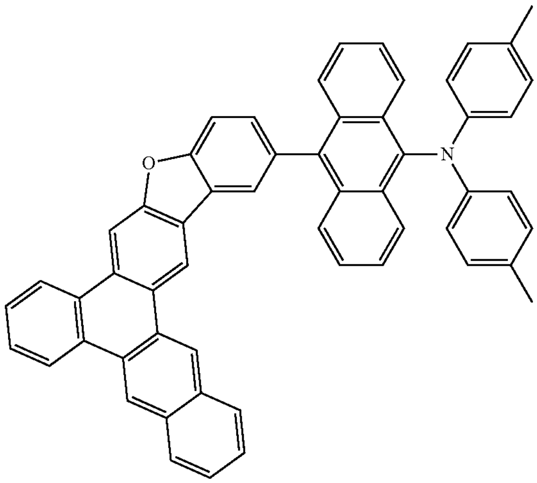
EX120
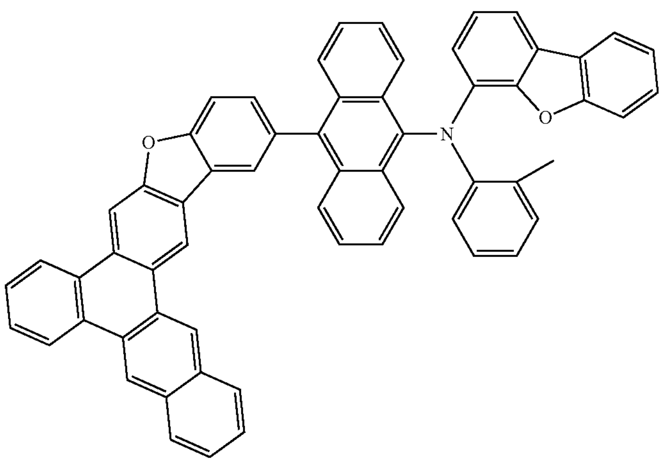
EX121
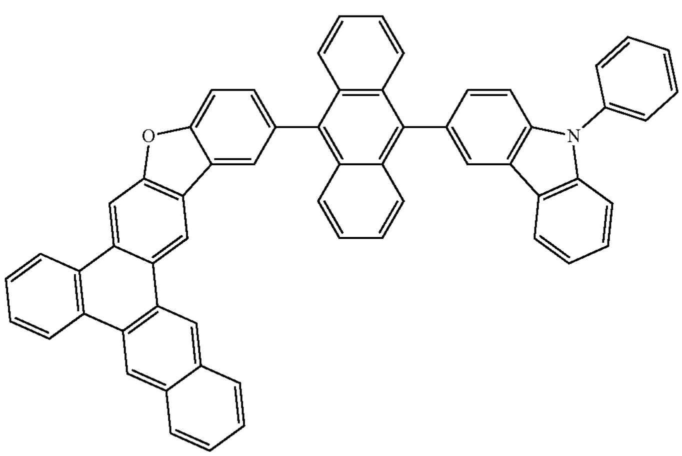

-continued
EX122
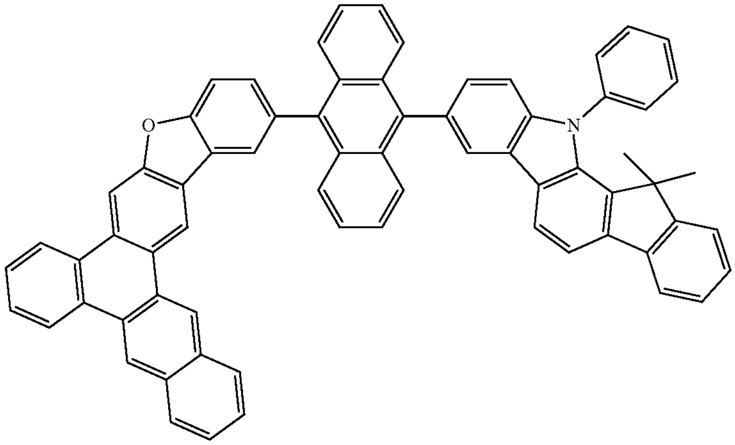
EX123
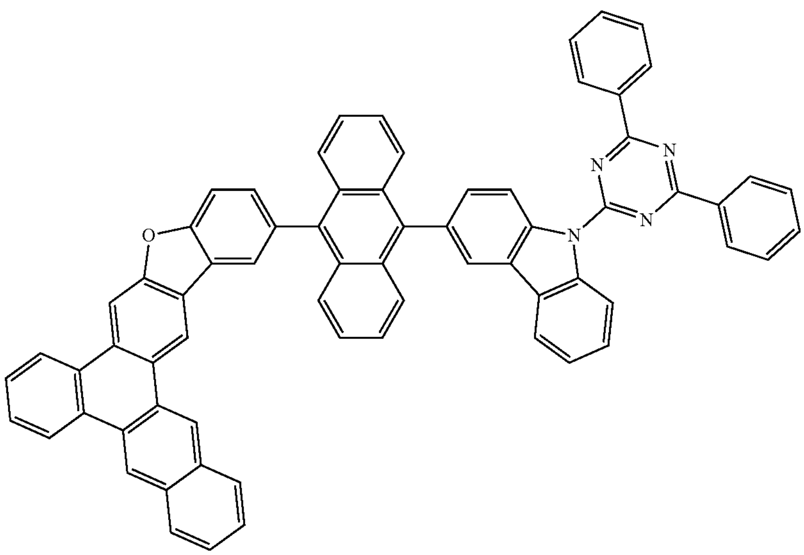
EX124
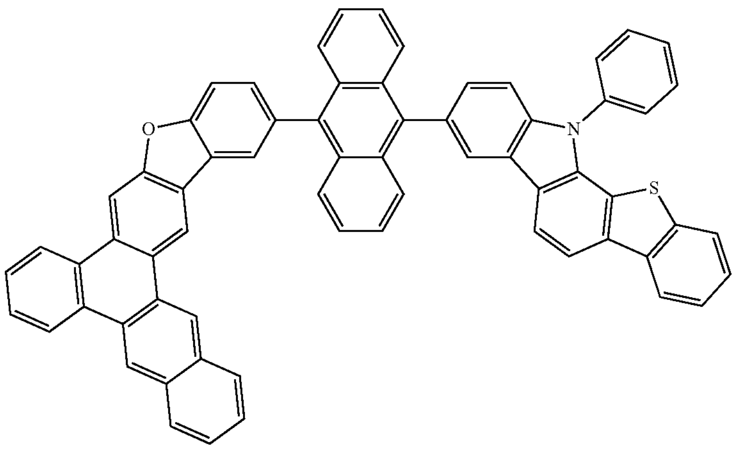

-continued
EX125
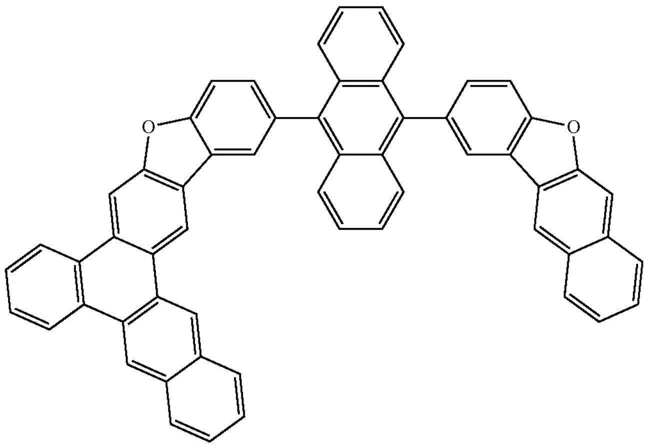
EX126
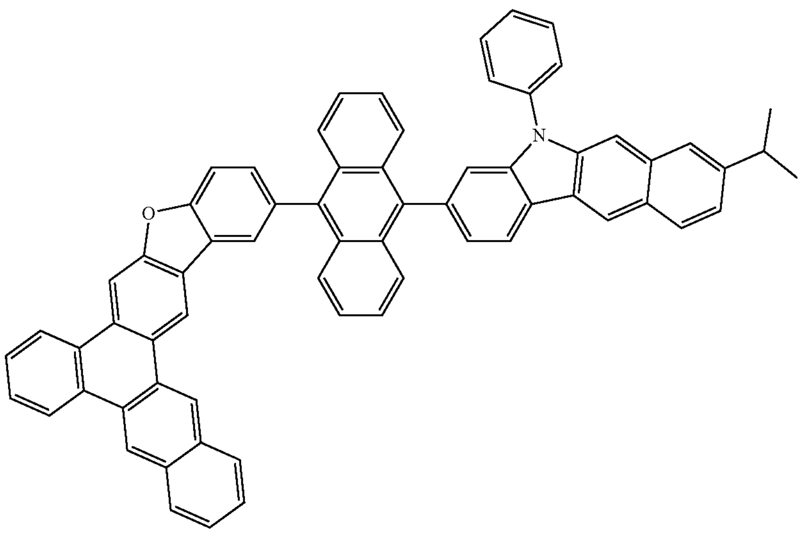
EX127
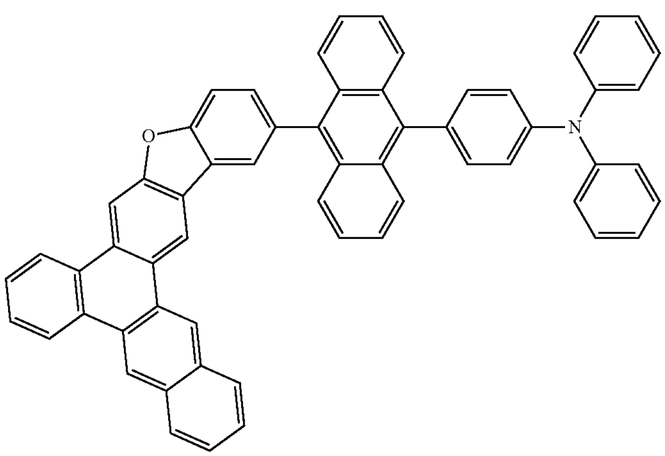

-continued
EX128
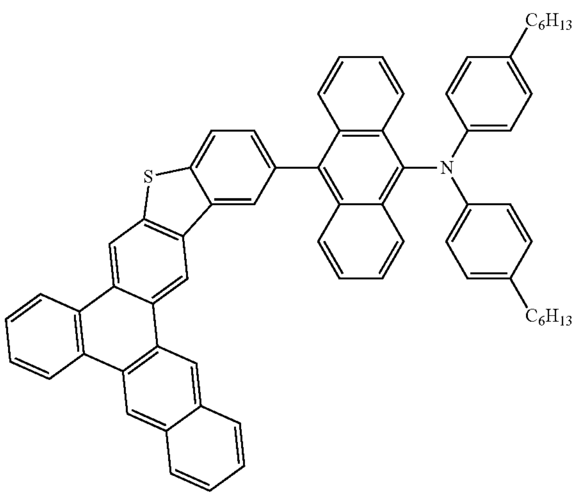
EX129
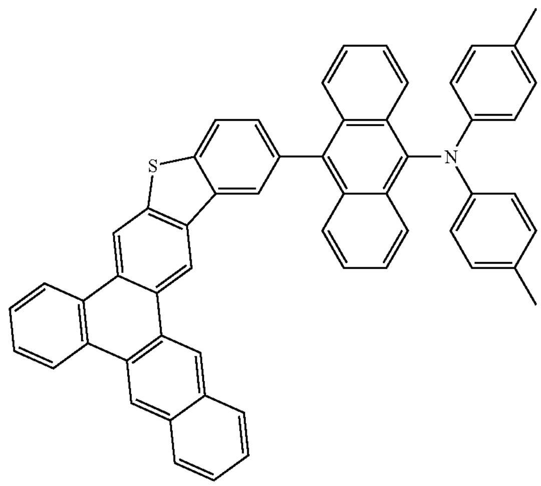
EX130
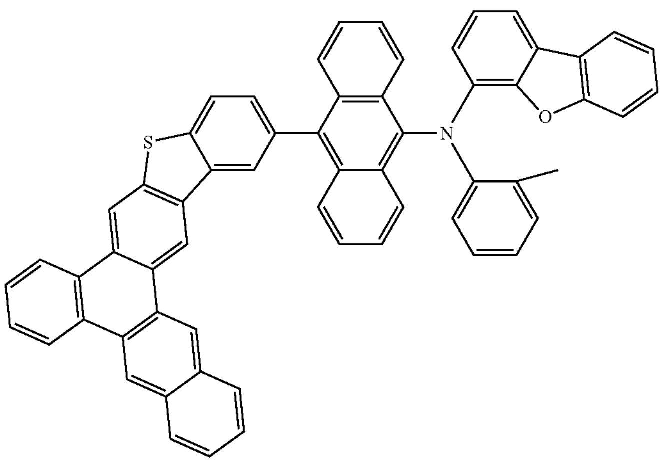
EX131
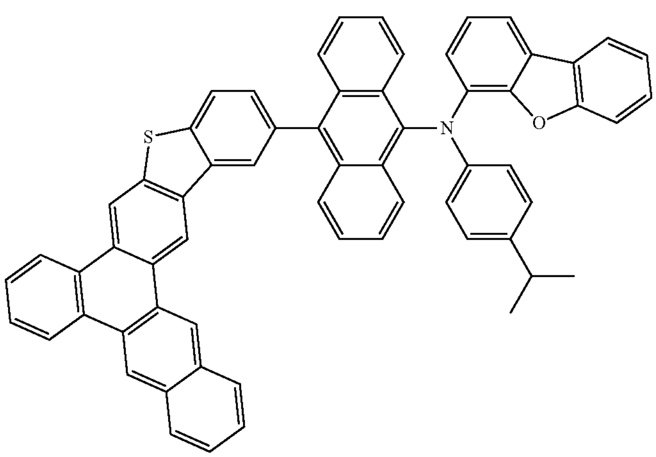

-continued
EX132
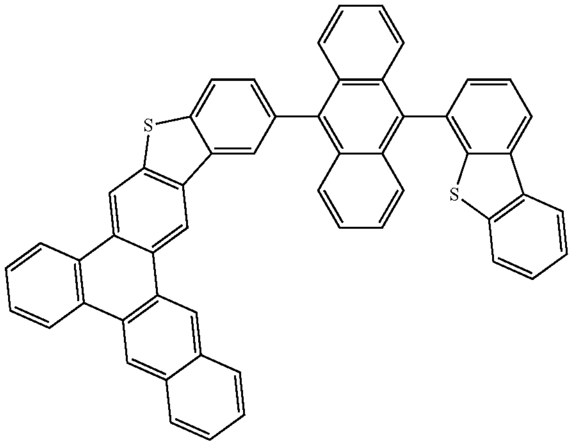
EX133
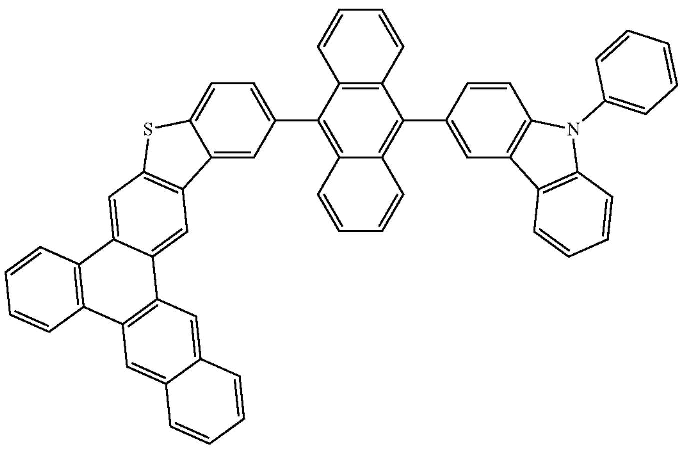
EX134
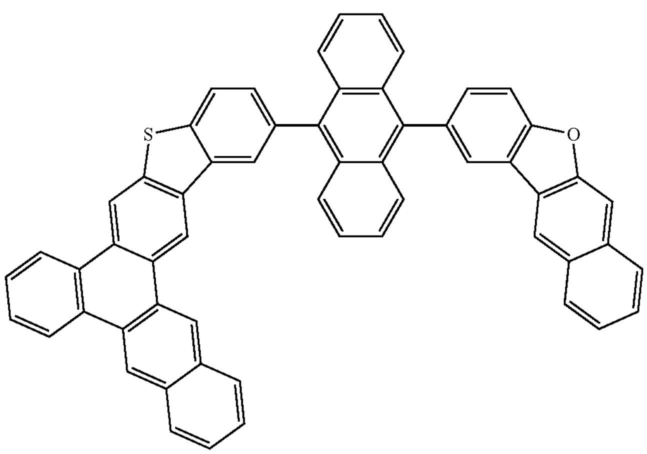

-continued
EX135
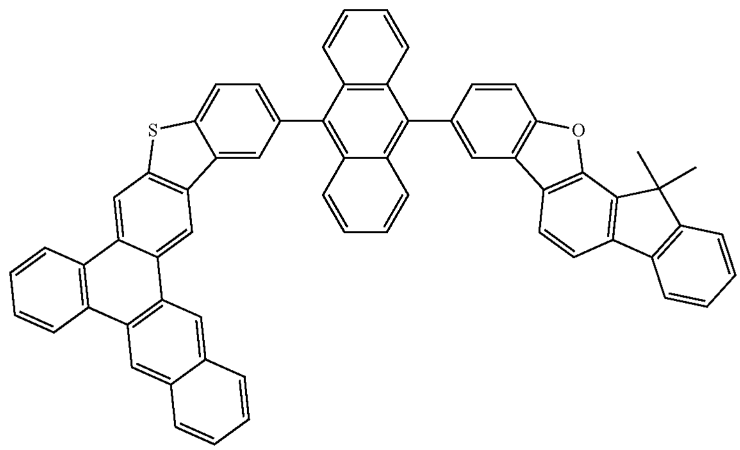
EX136
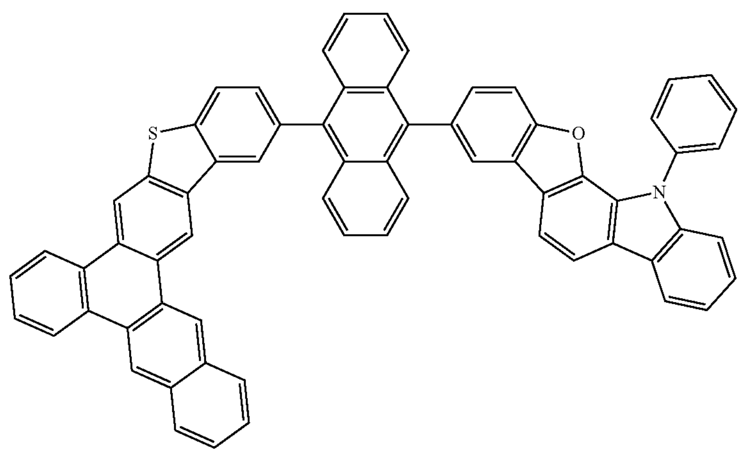
EX137
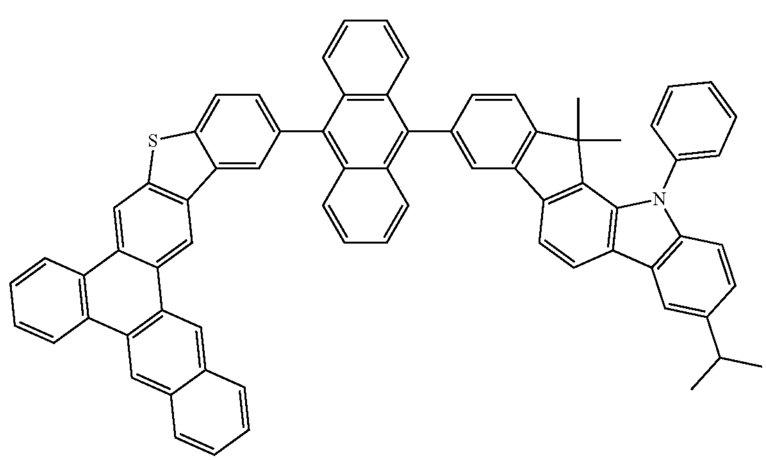

-continued
EX138
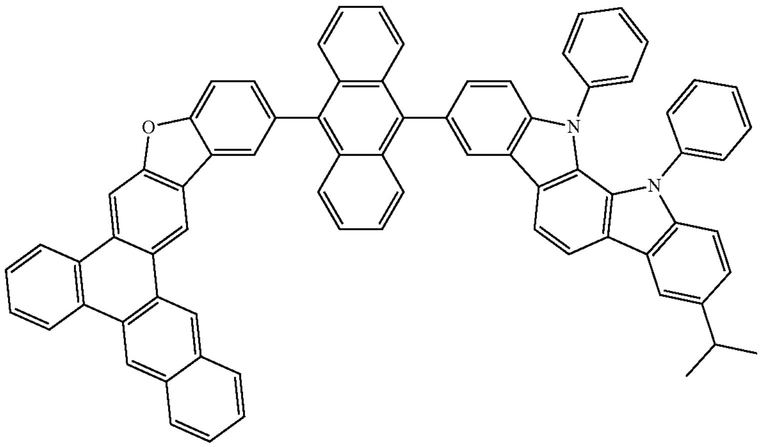
EX139
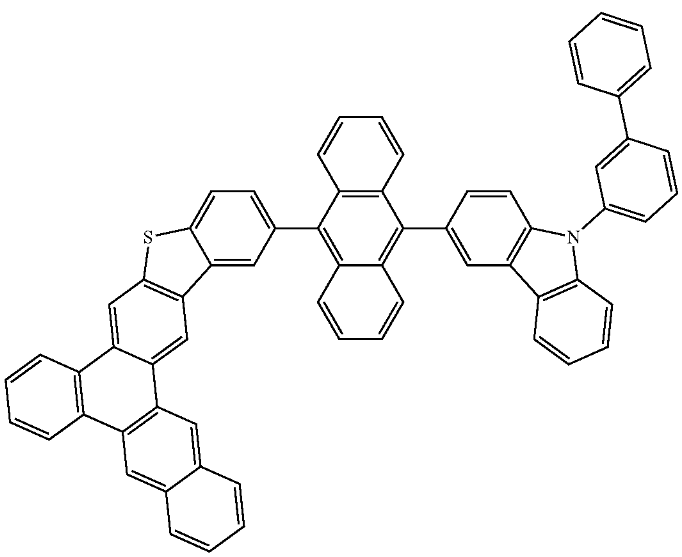
EX140
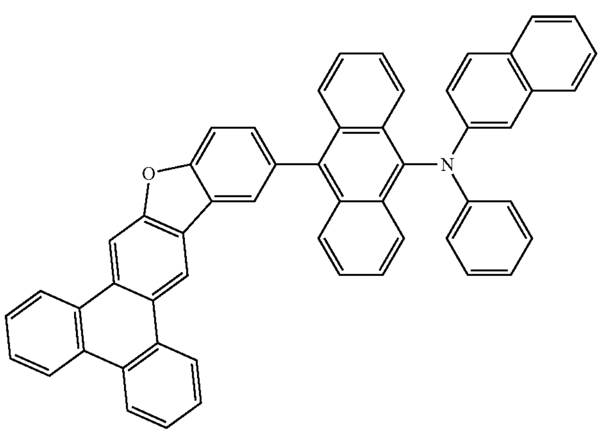

-continued
EX141
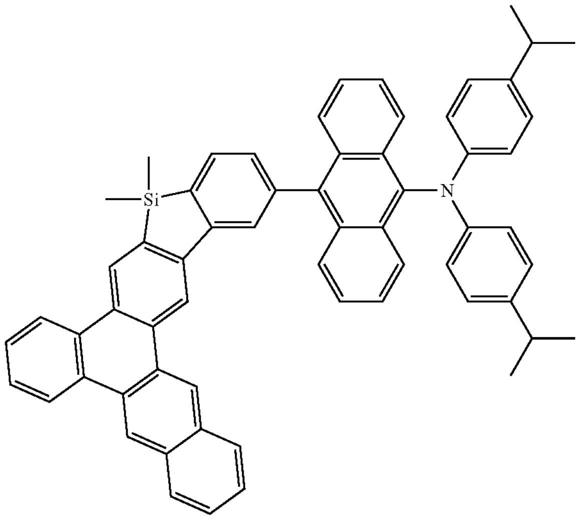
EX142
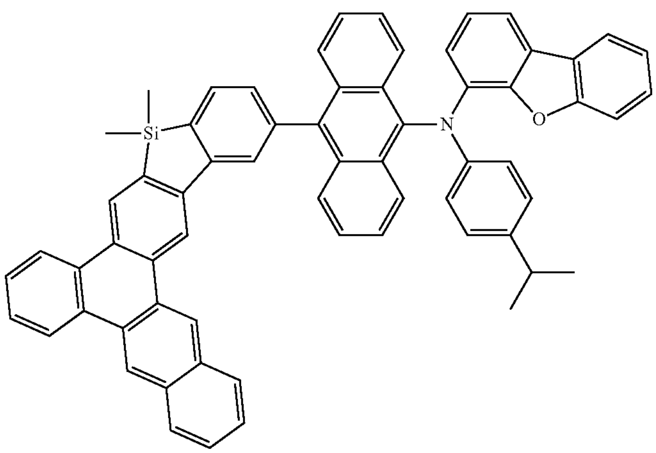
EX143
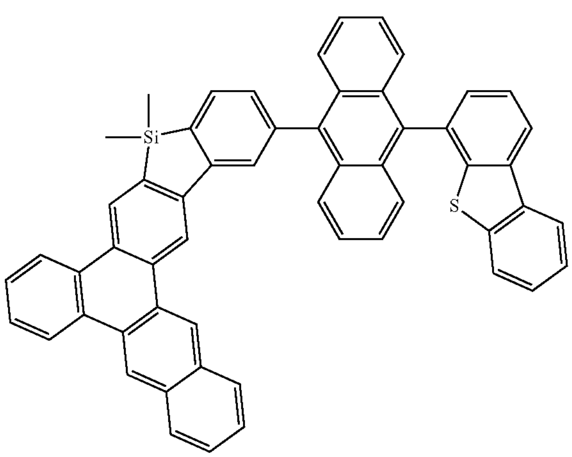

-continued
EX144
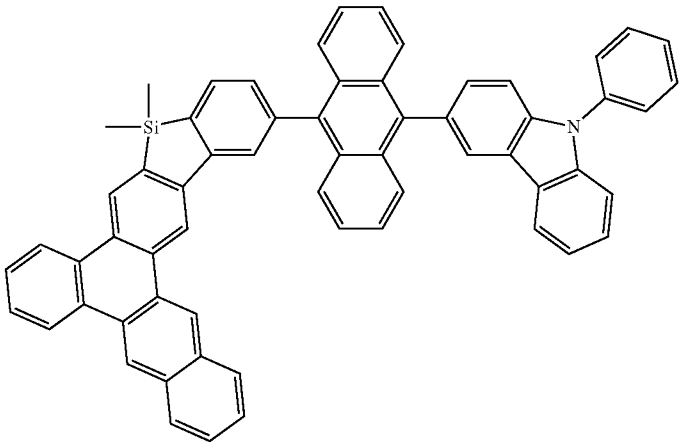
EX145
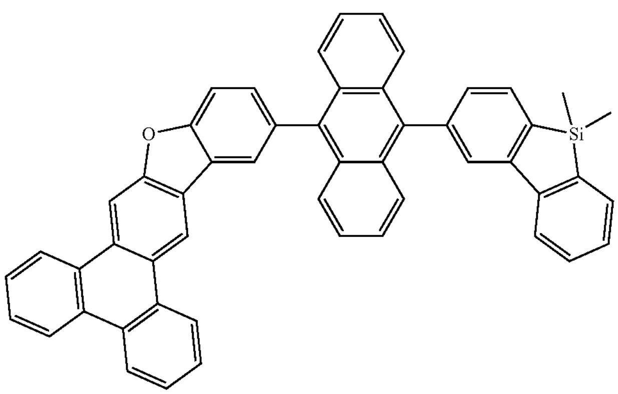
EX146
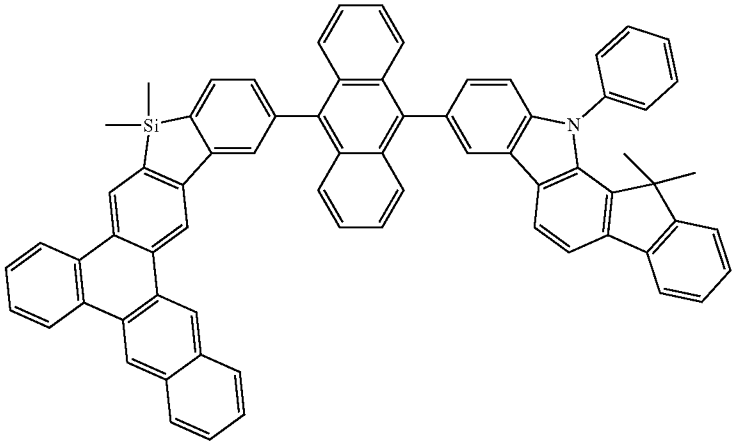

-continued
EX147
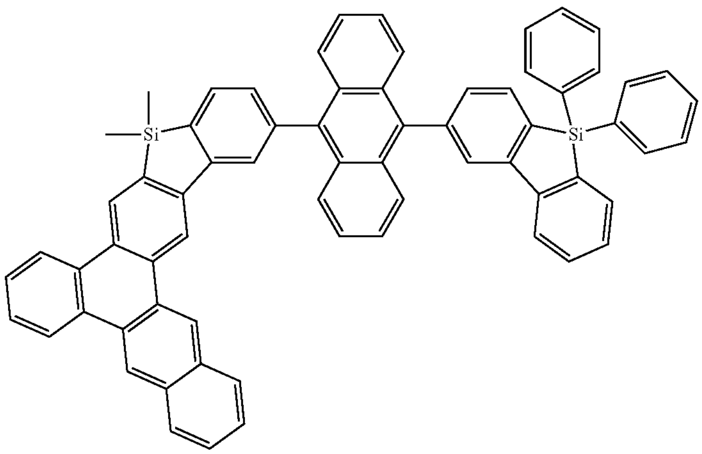
EX148
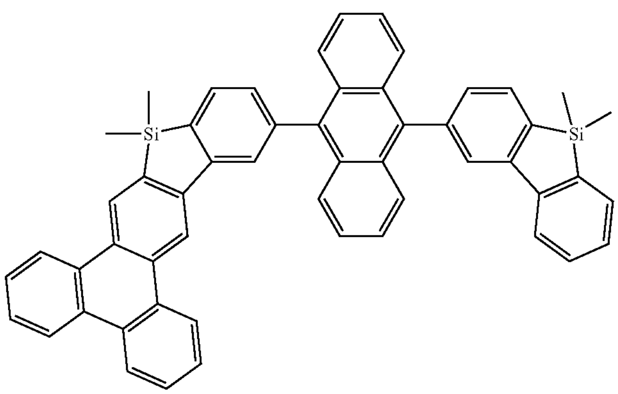
EX149
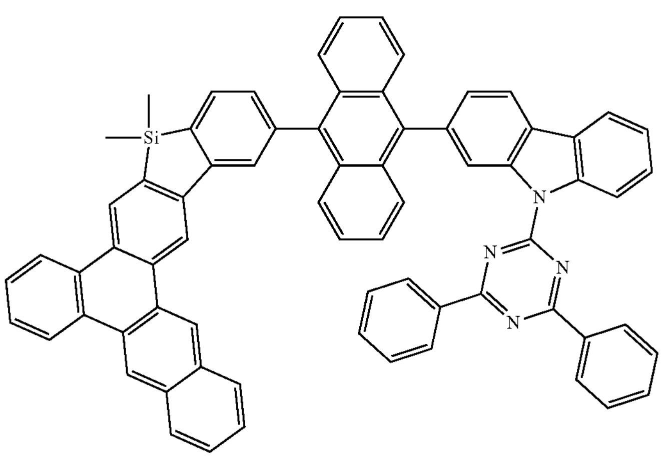

-continued
EX150
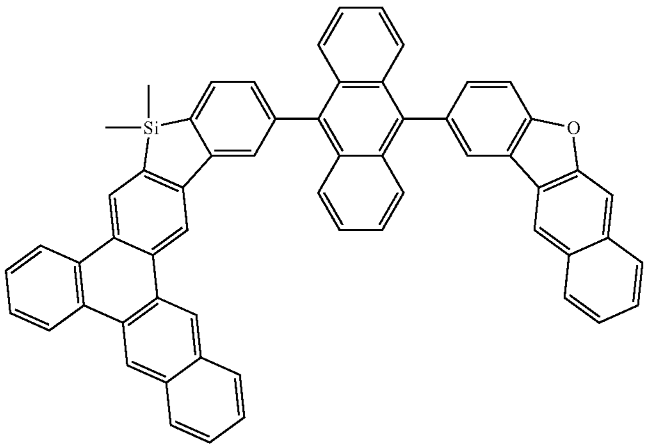
EX151
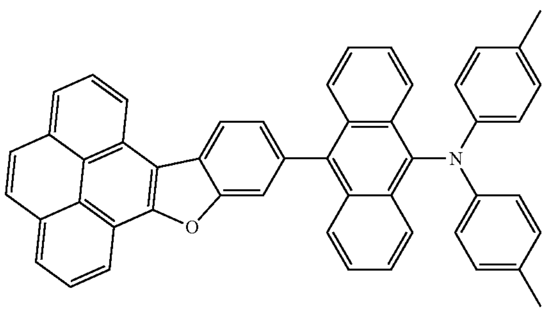
EX152
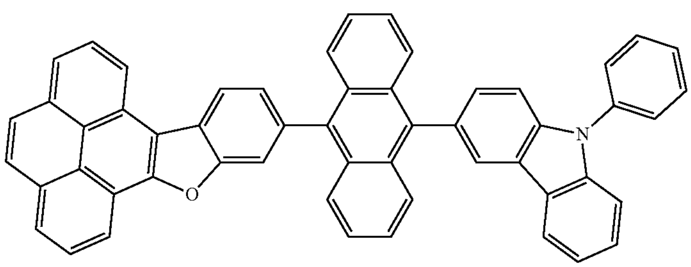
EX153
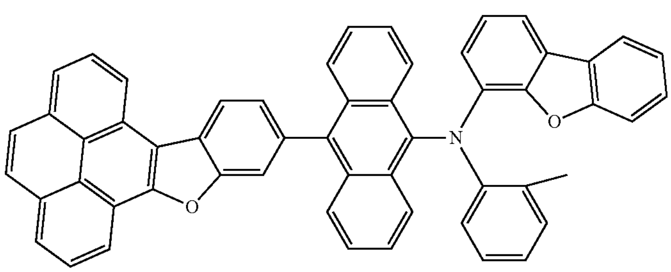
EX154
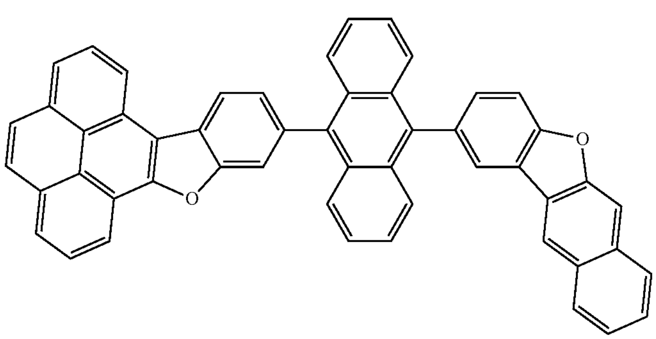

-continued
EX155
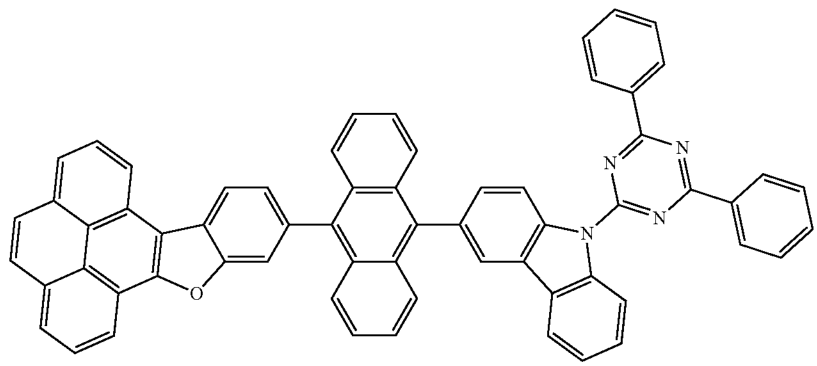
EX156
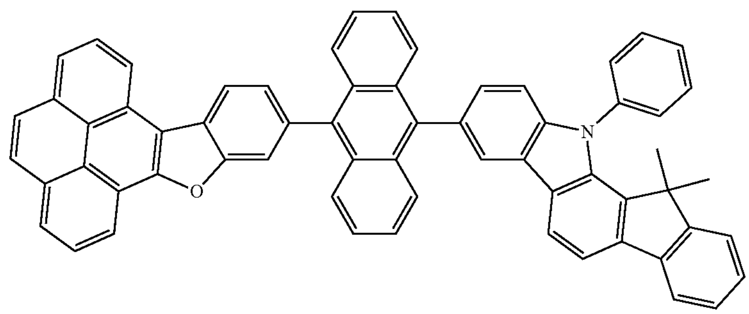
EX157
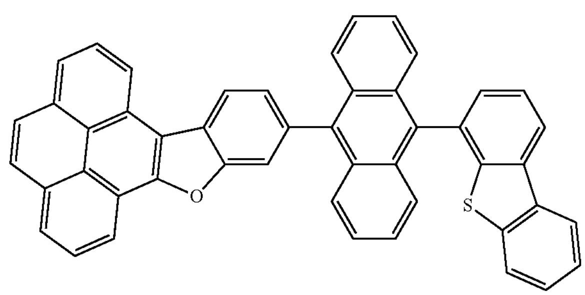
EX158
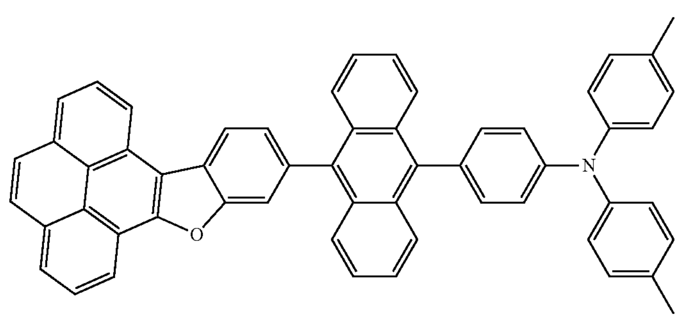

-continued
EX159
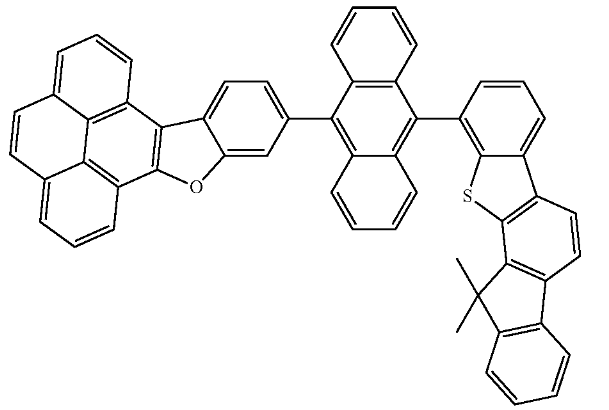
EX160
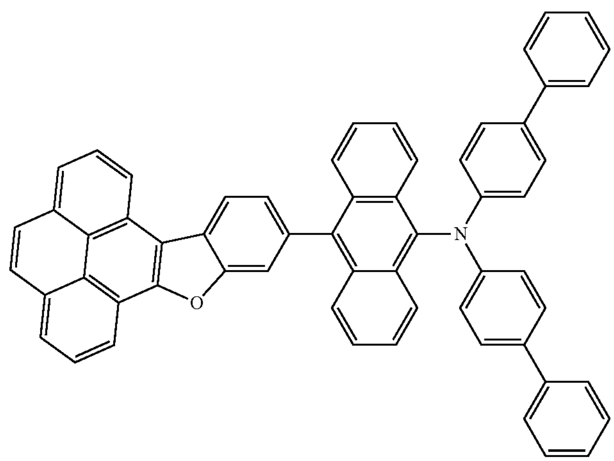
EX161
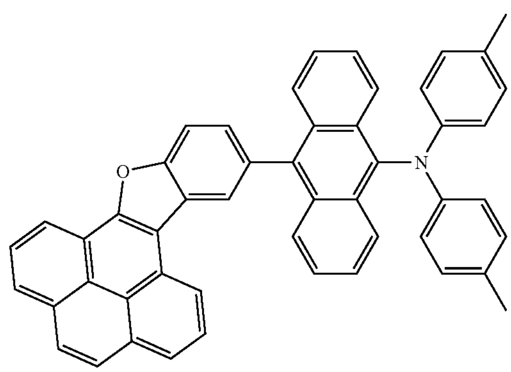
EX162
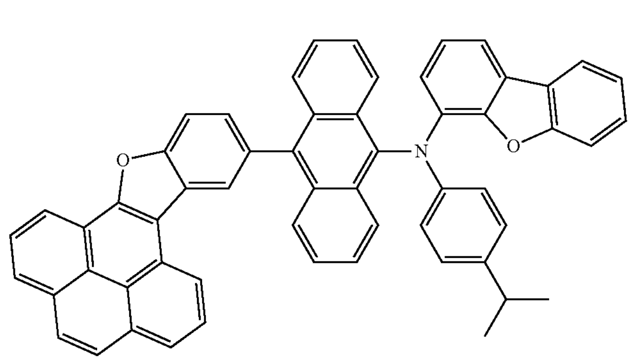

-continued
EX163
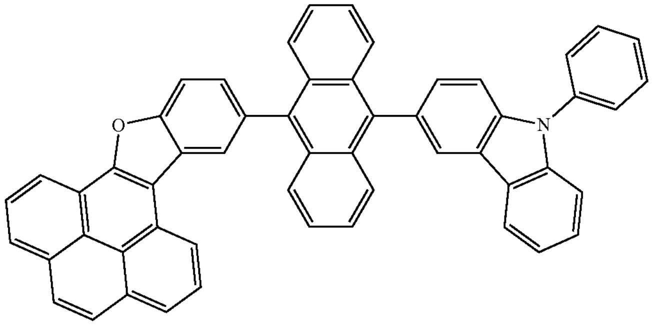
EX164
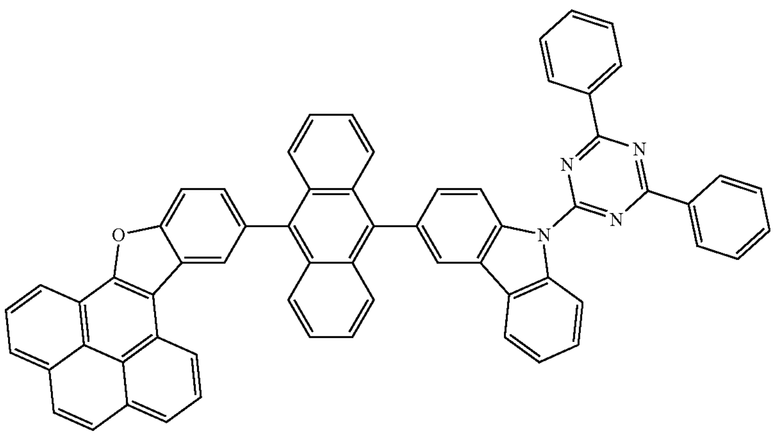
EX165
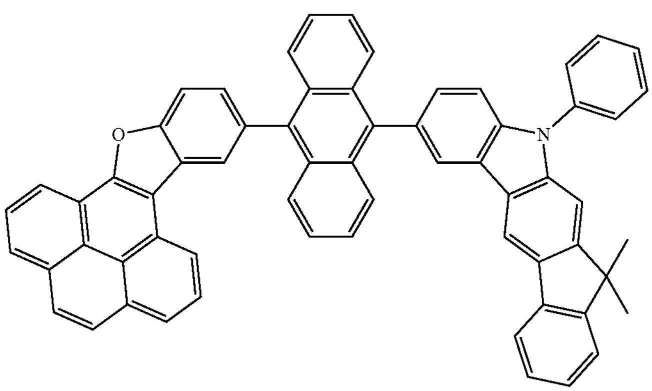
EX166
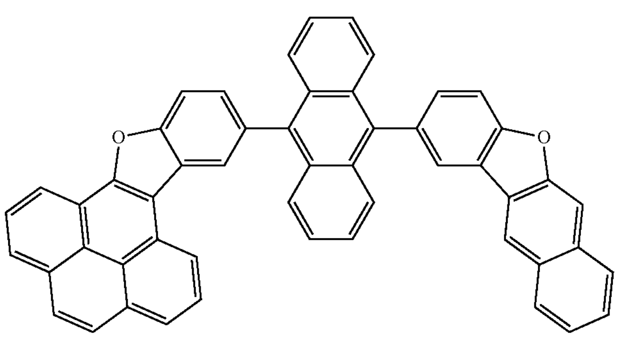

-continued
EX167
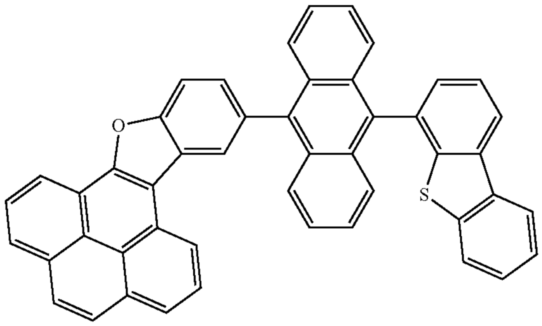
EX168
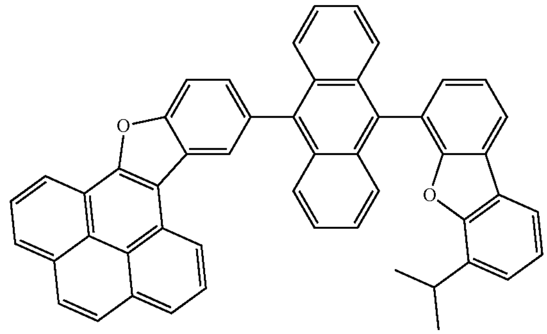
EX169
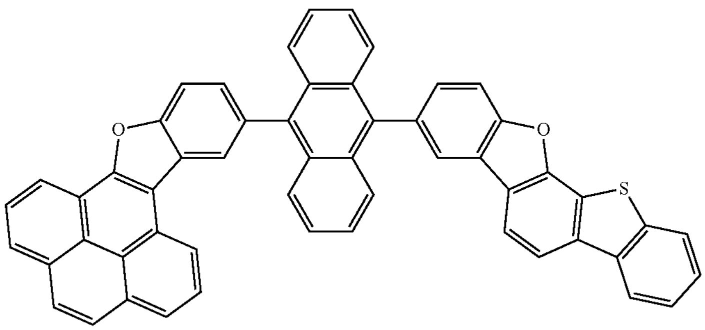
EX170
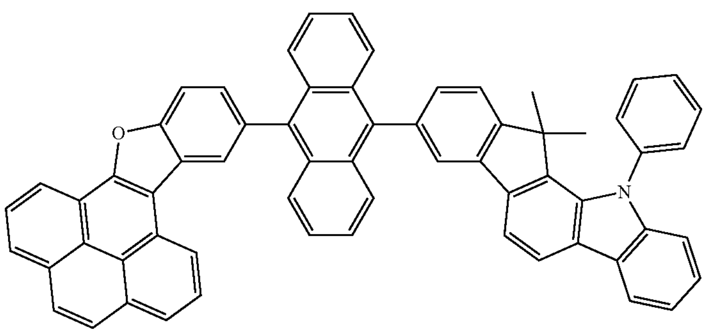
EX171
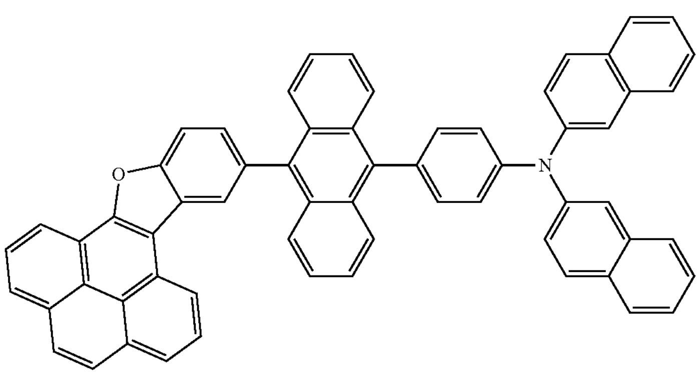

-continued
EX172
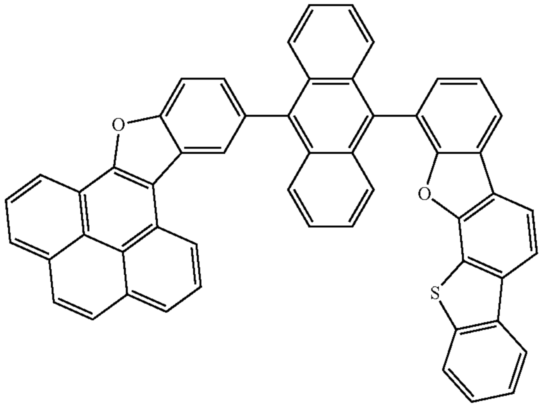
EX173
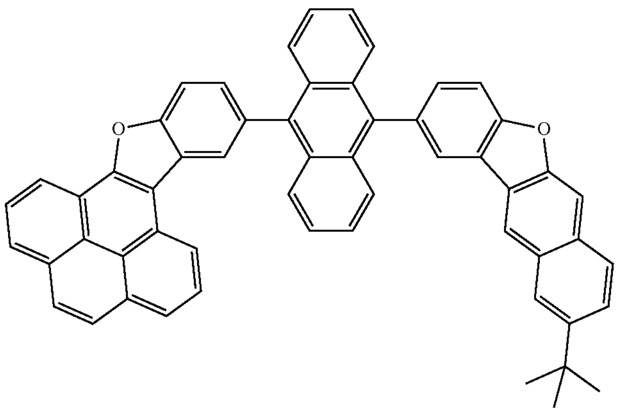
EX174
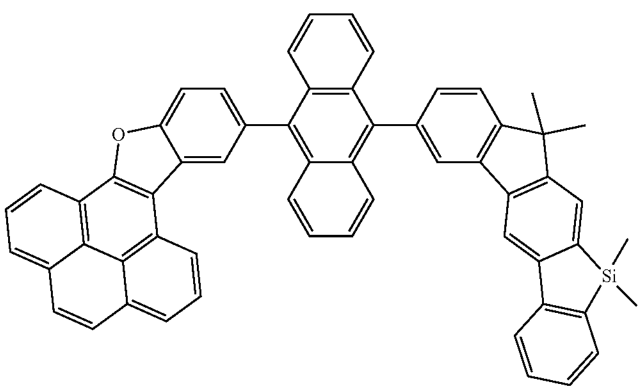
EX175
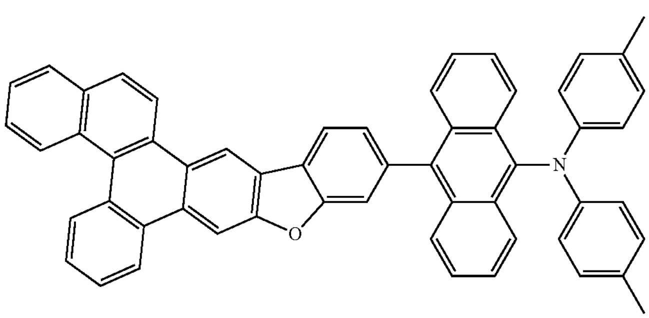

-continued
EX176
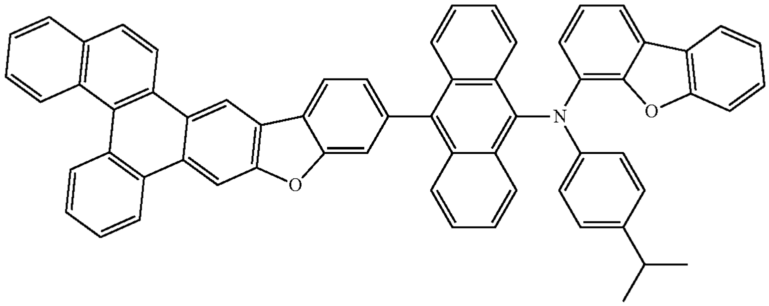
EX177
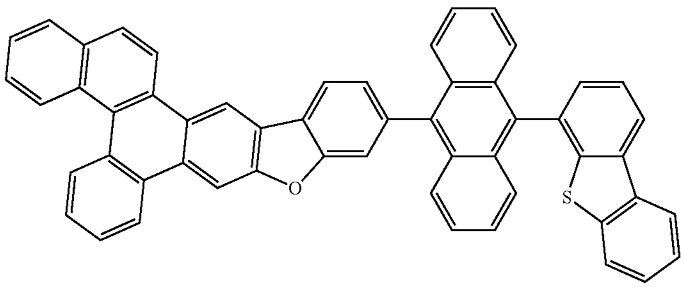
EX178
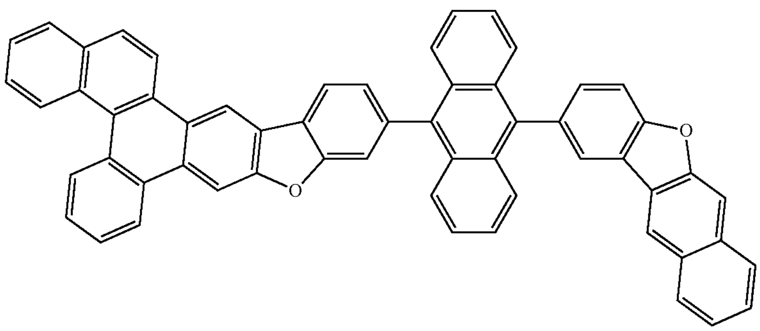
EX179
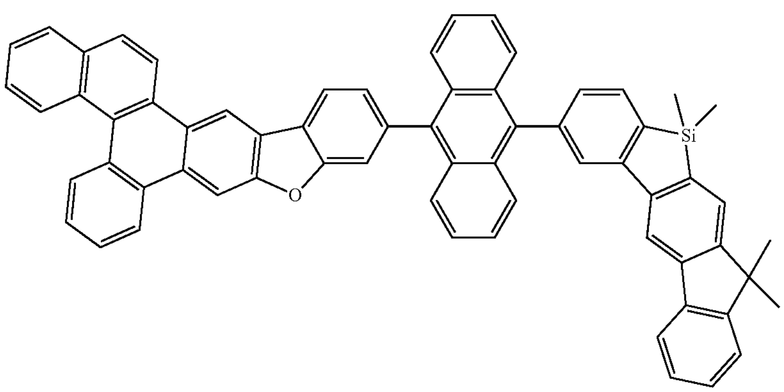
EX180
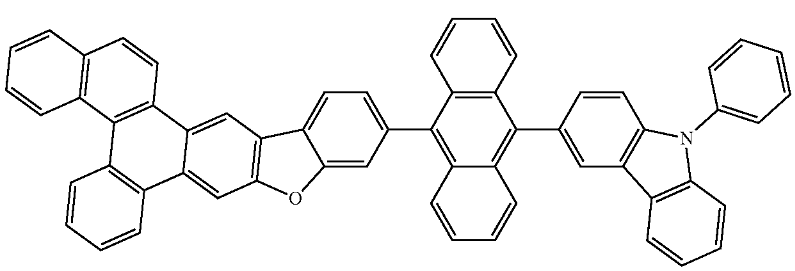

-continued
EX181
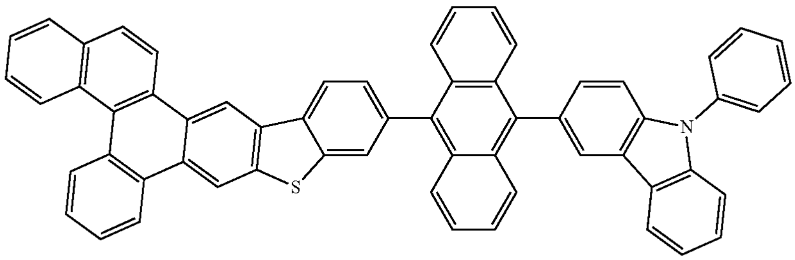
EX182
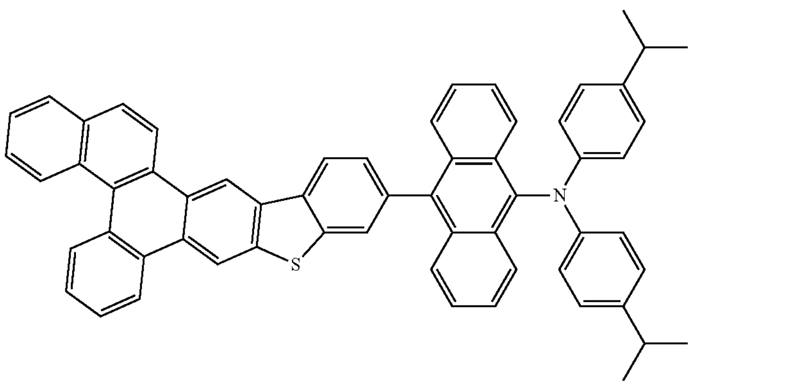
EX183
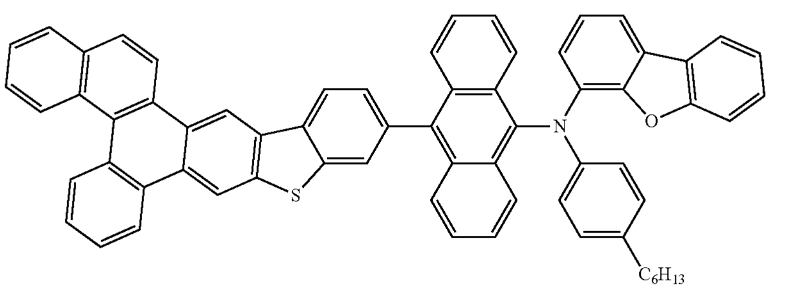
EX184
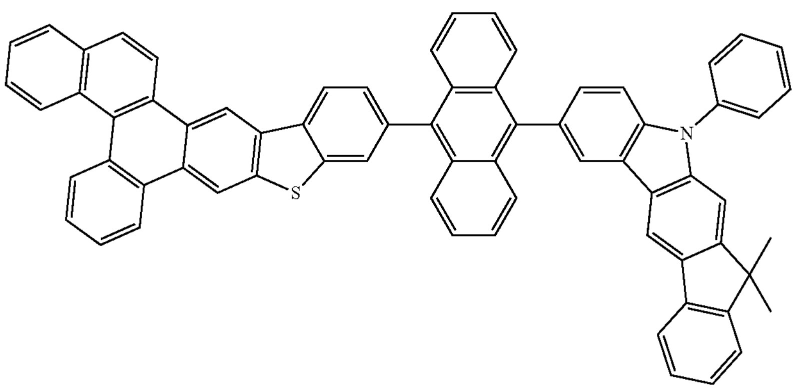

-continued
EX185
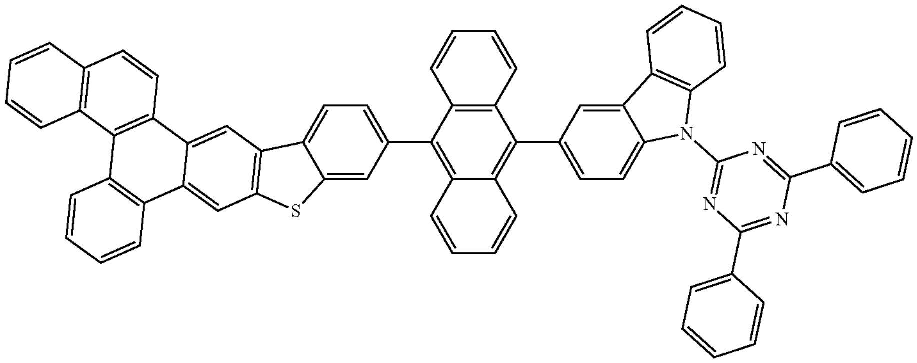
EX186
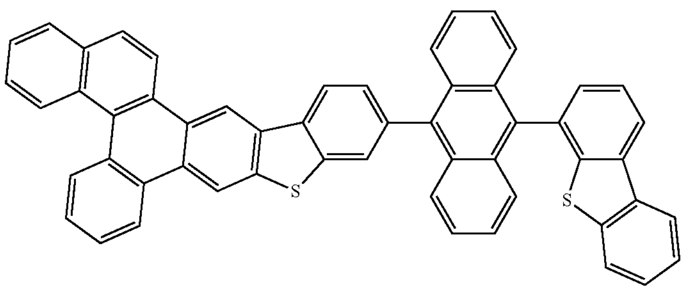
EX187
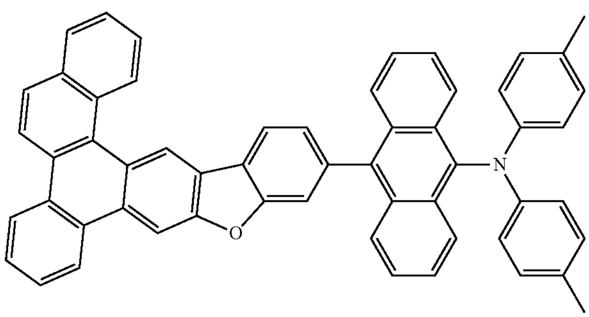
EX188
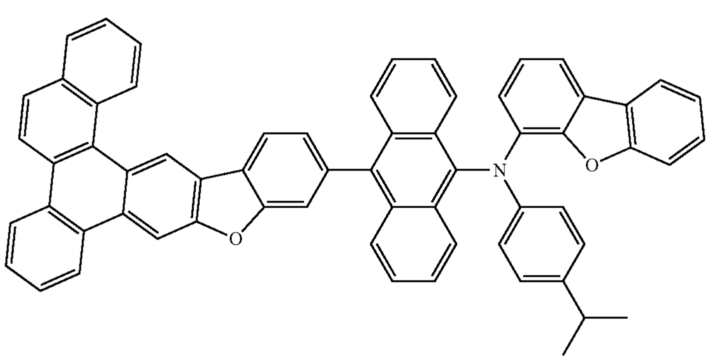

-continued
EX189
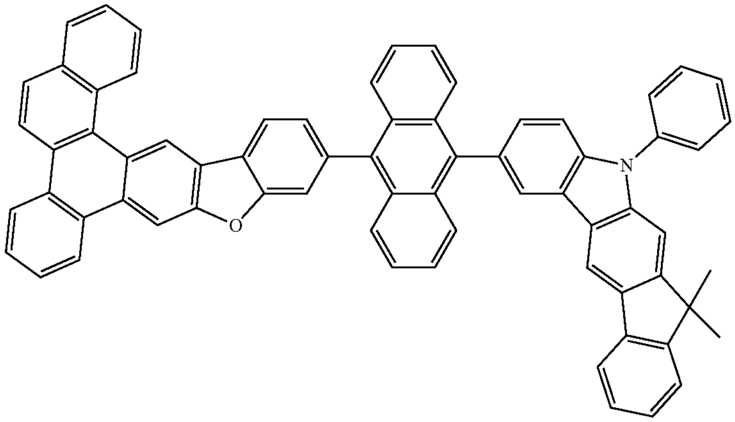
EX190
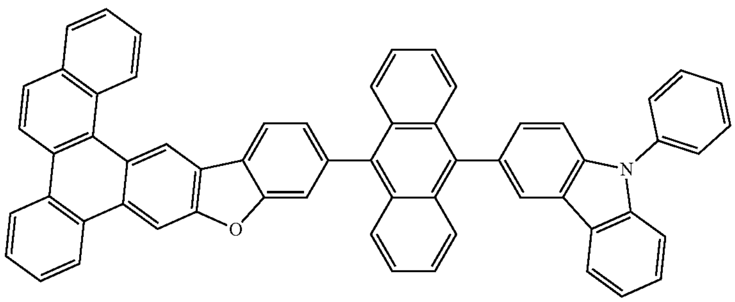
EX191
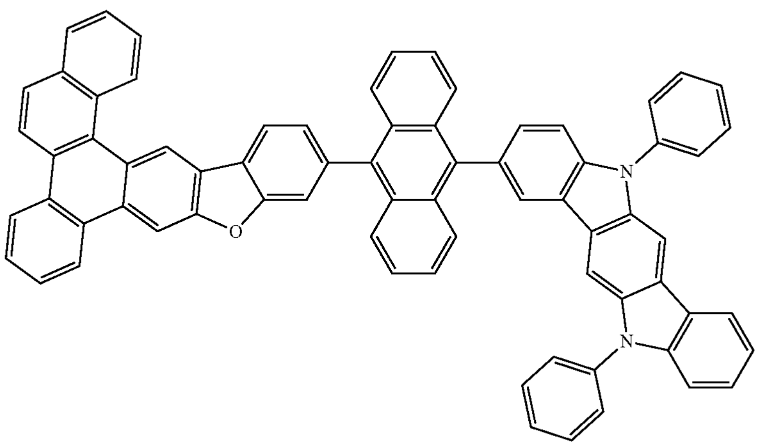
EX192
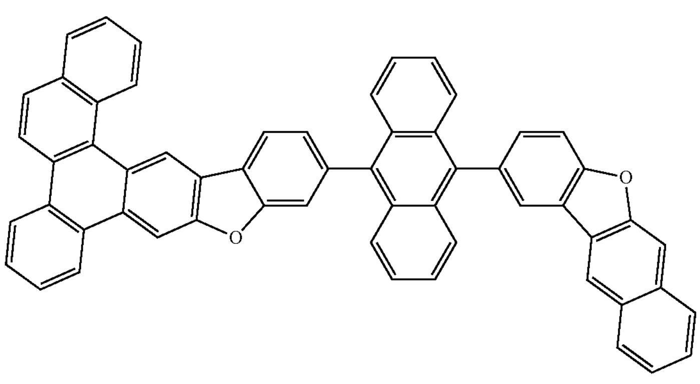

-continued
EX193
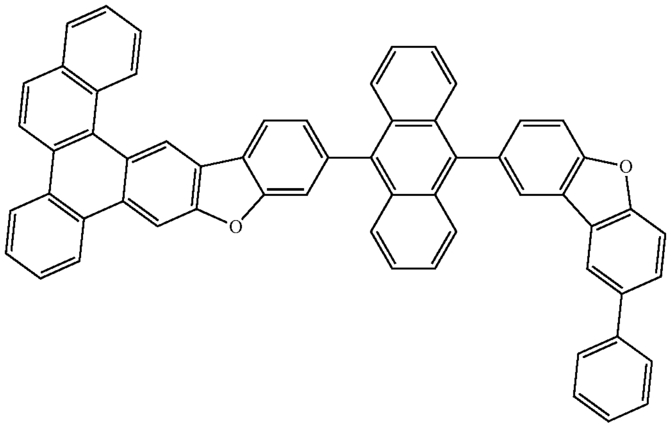
EX194
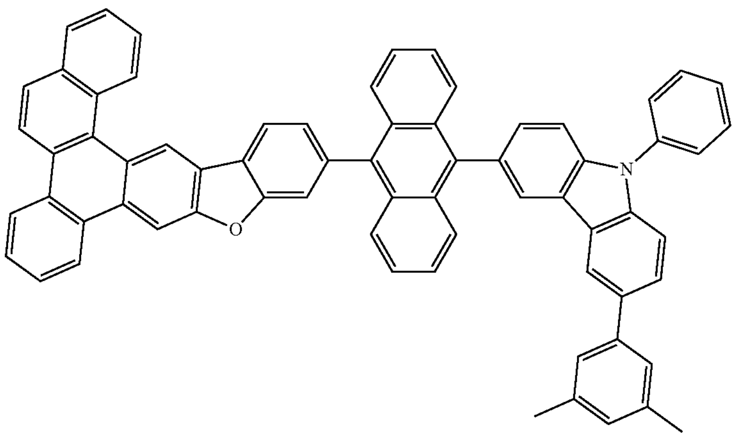
EX195
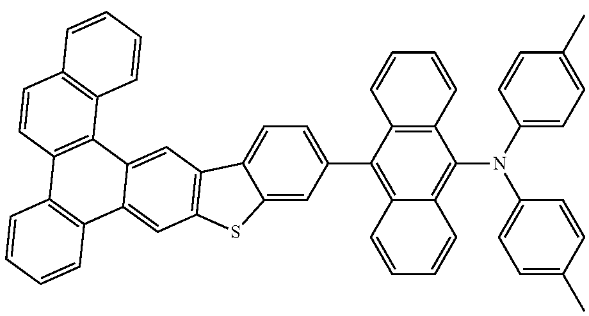
EX196
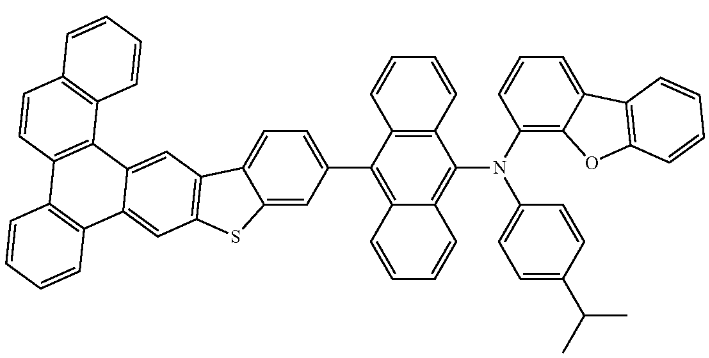

-continued
EX197
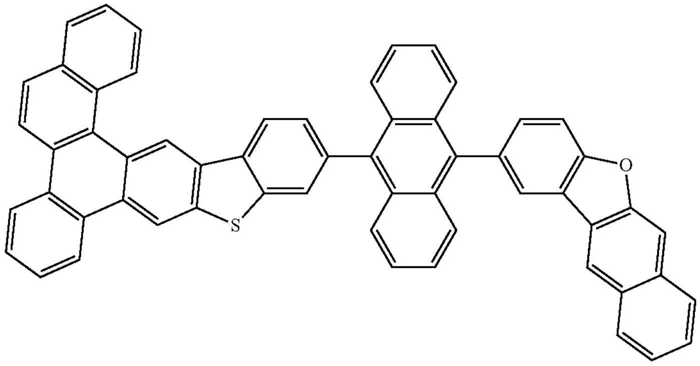
EX198
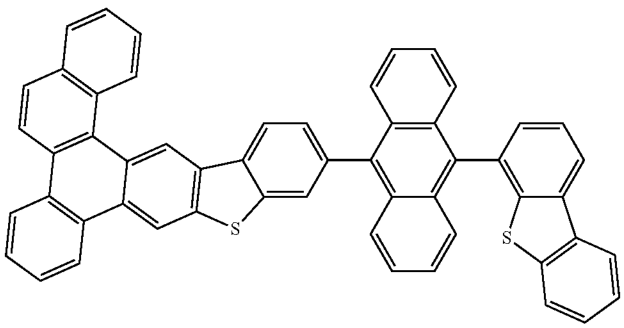
EX199
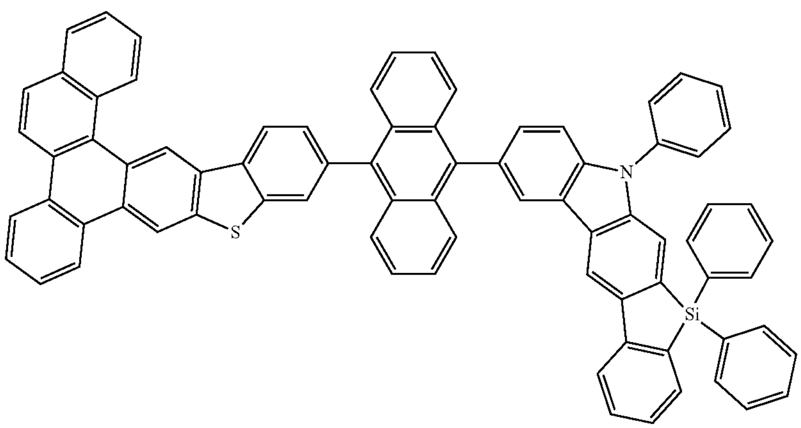
EX200
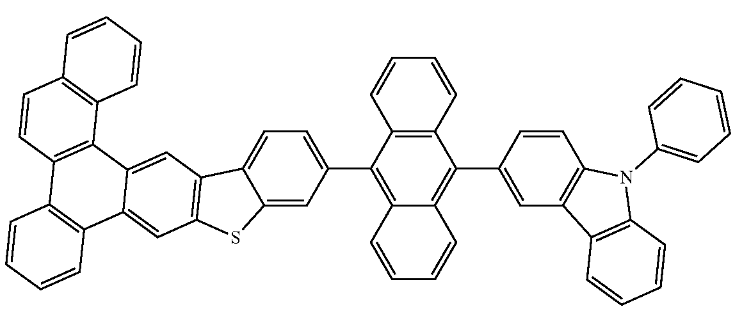

-continued
EX201
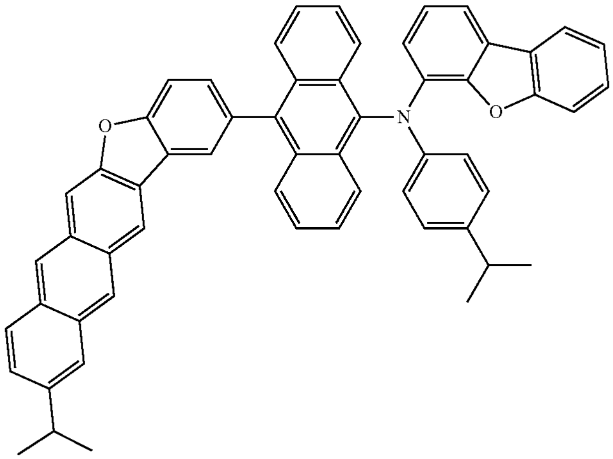
EX202
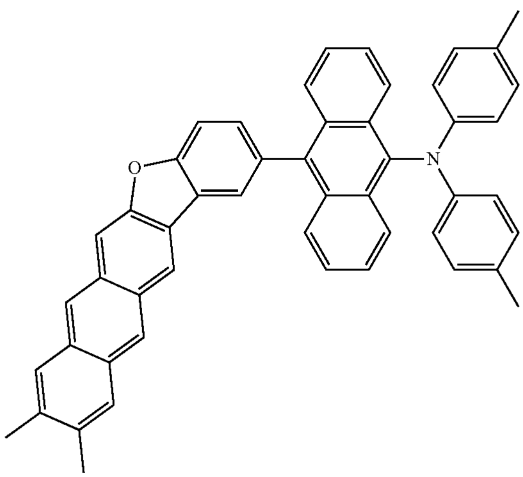
EX203
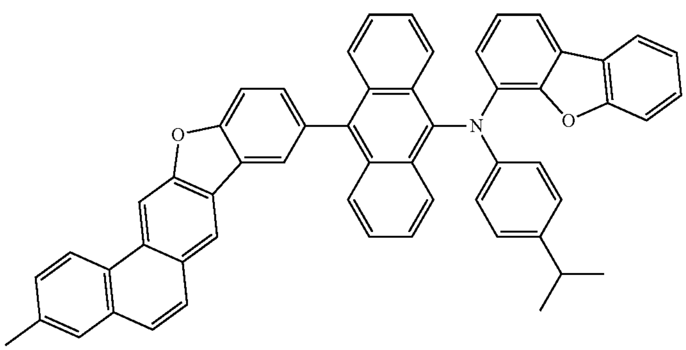
and
EX204
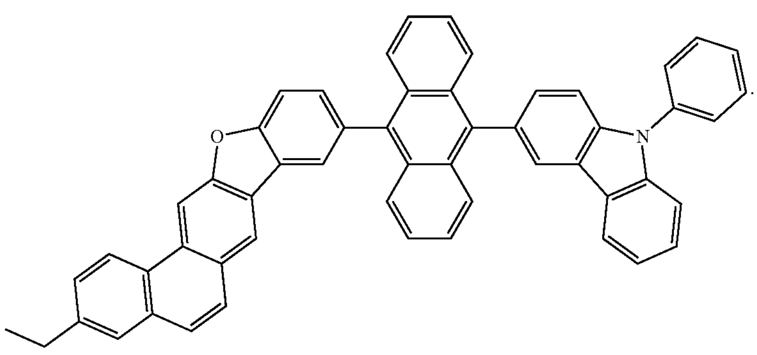
* * * * *